(12) United States Patent
Hunsaker et al.

(10) Patent No.: US 10,325,063 B2
(45) Date of Patent: Jun. 18, 2019

(54) MULTI-VALUED DECISION DIAGRAM FEATURE STATE DETERMINATION

(71) Applicant: FORD MOTOR COMPANY, Dearborn, MI (US)

(72) Inventors: Melinda Kaye Hunsaker, Canton, MI (US); David Mark Newton, Cologne (DE); Essam Mahmoud Sabbagh, Dearborn Heights, MI (US)

(73) Assignee: Ford Motor Company, Dearborn, MI (US)

( * ) Notice: Subject to any disclaimer, the term of this patent is extended or adjusted under 35 U.S.C. 154(b) by 432 days.

(21) Appl. No.: 15/294,217

(22) Filed: Oct. 14, 2016

(65) Prior Publication Data

US 2017/0206576 A1    Jul. 20, 2017

Related U.S. Application Data

(60) Provisional application No. 62/352,463, filed on Jun. 20, 2016, provisional application No. 62/280,609, filed on Jan. 19, 2016.

(51) Int. Cl.
  *G06F 17/50*    (2006.01)
  *G06F 16/951*    (2019.01)
  (Continued)

(52) U.S. Cl.
  CPC ...... *G06F 17/5095* (2013.01); *G06F 11/1469* (2013.01); *G06F 16/951* (2019.01); *G06Q 30/0621* (2013.01)

(58) Field of Classification Search
  CPC .. G06F 17/5009; G06F 17/50; G06F 17/5095; G06F 11/1469; G06F 17/30864;
  (Continued)

(56) References Cited

U.S. PATENT DOCUMENTS 4,479,197 A    10/1984    Haag et al.
4,591,983 A    5/1986    Bennett et al.
(Continued)

FOREIGN PATENT DOCUMENTS

CA    2303634 A1    6/2001
CA    2158153 C    7/2001
(Continued)

OTHER PUBLICATIONS

Berndt et al., "MDD based verification of car manufacturing data", IEEE 2011.*
(Continued)

*Primary Examiner* — Kandasamy Thangavelu
(74) *Attorney, Agent, or Firm* — Gregory P. Brown; Brooks Kushman P.C.

(57) ABSTRACT

A system is provided with memory and a processor. The memory is configured to store data representative of a multi-valued decision diagram (MDD). The processor is in communication with the memory and is programmed to receive a current selection of one or more of the features, and to determine a feature state for each of the one or more features, based on the current selection and the possible configurations defined by the MDD. The processor is further programmed to calculate an availability bitset indicative of which features as available for further selection, consistent with the valid configurations and without violating existing constraints of the current selection.

20 Claims, 60 Drawing Sheets

(51) Int. Cl.
*G06Q 30/06* (2012.01)
*G06F 11/14* (2006.01)

(58) Field of Classification Search
CPC .......... G06Q 30/0621; G06Q 10/0633; G06N 99/002; G06N 7/005; G06N 5/04; H04L 41/0893; H04L 41/50; H04L 41/0806; H04L 41/0853; H04L 41/0813; H04L 63/20
See application file for complete search history.

(56) References Cited

U.S. PATENT DOCUMENTS

| | | | |
|---|---|---|---|
| 4,827,423 A | 5/1989 | Beasley et al. |
| 4,873,643 A | 10/1989 | Powell et al. |
| 4,875,162 A | 10/1989 | Ferriter et al. |
| 5,119,307 A | 6/1992 | Blaha et al. |
| 5,165,015 A | 11/1992 | Coggins |
| 5,225,987 A | 7/1993 | Thompson |
| 5,233,513 A | 8/1993 | Doyle |
| 5,255,356 A | 10/1993 | Michelman et al. |
| 5,257,387 A | 10/1993 | Richek et al. |
| 5,260,866 A | 11/1993 | Lisinski et al. |
| 5,283,865 A | 2/1994 | Johnson |
| 5,293,479 A | 3/1994 | Quintero et al. |
| 5,295,067 A | 3/1994 | Cho et al. |
| 5,295,242 A | 3/1994 | Mashruwala et al. |
| 5,307,261 A | 4/1994 | Maki et al. |
| 5,311,424 A | 5/1994 | Mukherjee et al. |
| 5,311,437 A | 5/1994 | Leal et al. |
| 5,353,432 A | 10/1994 | Richek et al. |
| 5,367,622 A | 11/1994 | Coggins |
| 5,367,627 A | 11/1994 | Johnson |
| 5,369,566 A | 11/1994 | Pfost et al. |
| 5,394,522 A | 2/1995 | Sanchez-Frank et al. |
| 5,428,791 A | 6/1995 | Andrew et al. |
| 5,434,791 A | 7/1995 | Koko et al. |
| 5,487,135 A | 1/1996 | Freeman |
| 5,499,357 A | 3/1996 | Sonty et al. |
| 5,500,802 A | 3/1996 | Morris et al. |
| 5,515,269 A | 5/1996 | Willis et al. |
| 5,515,524 A | 5/1996 | Lynch et al. |
| 5,546,575 A | 8/1996 | Potter et al. |
| 5,552,995 A | 9/1996 | Sebastian |
| 5,579,529 A | 11/1996 | Terrell et al. |
| 5,586,039 A | 12/1996 | Hirsch et al. |
| 5,590,319 A | 12/1996 | Cohen et al. |
| 5,594,651 A | 1/1997 | St. Ville |
| 5,621,905 A | 4/1997 | Jewson et al. |
| 5,630,025 A | 5/1997 | Dolby et al. |
| 5,675,748 A | 10/1997 | Ross |
| 5,740,425 A | 4/1998 | Povilus |
| 5,745,765 A | 4/1998 | Paseman |
| 5,761,063 A | 6/1998 | Jannette et al. |
| 5,777,877 A | 7/1998 | Beppu et al. |
| 5,781,906 A | 7/1998 | Aggarwal et al. |
| 5,815,395 A | 9/1998 | Hart et al. |
| 5,825,651 A | 10/1998 | Gupta et al. |
| 5,844,554 A | 12/1998 | Geller et al. |
| 5,850,539 A | 12/1998 | Cook et al. |
| 5,864,660 A | 1/1999 | Hamameh et al. |
| 5,877,966 A | 3/1999 | Morris et al. |
| 5,963,953 A | 10/1999 | Cram et al. |
| 5,987,473 A | 11/1999 | Jorgensen |
| 5,991,826 A | 11/1999 | McGee et al. |
| 6,002,854 A | 12/1999 | Lynch et al. |
| 6,035,305 A | 3/2000 | Strevey et al. |
| 6,055,529 A | 4/2000 | Furlani |
| 6,115,547 A | 9/2000 | Ghatate et al. |
| 6,122,560 A | 9/2000 | Tsukishima et al. |
| 6,125,408 A | 9/2000 | McGee et al. |
| 6,137,499 A | 10/2000 | Tesler |
| 6,151,697 A | 11/2000 | Moeller |
| 6,167,380 A | 12/2000 | Kennedy et al. |
| 6,167,383 A | 12/2000 | Henson |
| 6,177,942 B1 | 1/2001 | Keong et al. |
| 6,192,355 B1 | 2/2001 | Skovgaard |
| 6,205,446 B1 | 3/2001 | Mittal et al. |
| 6,208,987 B1 | 3/2001 | Nihei |
| 6,223,094 B1 | 4/2001 | Muehleck et al. |
| 6,223,170 B1 | 4/2001 | Skovgaard |
| 6,247,128 B1 | 6/2001 | Fisher et al. |
| 6,259,451 B1 | 7/2001 | Tesler |
| 6,272,390 B1 | 8/2001 | Skovgaard |
| 6,278,982 B1 | 8/2001 | Korhammer et al. |
| 6,282,537 B1 | 8/2001 | Madnick et al. |
| 6,300,948 B1 | 10/2001 | Geller et al. |
| 6,324,534 B1 | 11/2001 | Neal et al. |
| 6,349,274 B1 | 2/2002 | Kay et al. |
| 6,366,922 B1 | 4/2002 | Althoff |
| 6,377,956 B1 | 4/2002 | Hsu et al. |
| 6,405,308 B1 | 6/2002 | Gupta et al. |
| 6,407,761 B1 | 6/2002 | Ching et al. |
| 6,412,012 B1 | 6/2002 | Bienganski et al. |
| 6,430,730 B1 | 8/2002 | Ghatate et al. |
| 6,519,588 B1 | 2/2003 | Leschner |
| 6,523,040 B1 | 2/2003 | Lo et al. |
| 6,536,014 B1 | 3/2003 | McClannahan et al. |
| 6,549,908 B1 | 4/2003 | Loomans |
| 6,556,991 B1 | 4/2003 | Borkovsky |
| 6,557,002 B1 | 4/2003 | Fujieda et al. |
| 6,581,068 B1 | 6/2003 | Bensoussan et al. |
| 6,615,220 B1 | 9/2003 | Austin et al. |
| 6,633,788 B1 | 10/2003 | Riley et al. |
| 6,647,305 B1 | 11/2003 | Bigelow |
| 6,678,882 B1 | 1/2004 | Hurley et al. |
| 6,687,705 B2 | 2/2004 | Agrawal et al. |
| 6,757,678 B2 | 6/2004 | Myllymaki |
| 6,810,401 B1 | 10/2004 | Thompson et al. |
| 6,836,766 B1 | 12/2004 | Gilpin et al. |
| 6,839,711 B1 | 1/2005 | Reddy et al. |
| 6,850,895 B2 | 2/2005 | Brodersen et al. |
| 6,850,921 B1 | 2/2005 | Becker et al. |
| 6,853,996 B1 | 2/2005 | Chen et al. |
| 6,898,472 B2 | 5/2005 | Crampton et al. |
| 6,918,124 B1 | 7/2005 | Novik et al. |
| 6,937,966 B1 | 8/2005 | Hellerstein et al. |
| 6,938,038 B2 | 8/2005 | Weinberg et al. |
| 6,965,887 B2 | 11/2005 | Huelsman et al. |
| 6,986,104 B2 | 1/2006 | Green et al. |
| 6,988,014 B2 | 1/2006 | Kraemer et al. |
| 7,003,360 B1 * | 2/2006 | Dillon .................... G06F 17/50 700/103 |
| 7,039,602 B1 | 5/2006 | Kapadia et al. |
| 7,043,309 B2 | 5/2006 | Jackson et al. |
| 7,050,956 B2 | 5/2006 | Uysal et al. |
| 7,062,478 B1 | 6/2006 | Huelsman et al. |
| 7,065,499 B1 | 6/2006 | Seth et al. |
| 7,069,537 B2 | 6/2006 | Lazarov |
| 7,076,507 B1 | 7/2006 | Tarin |
| 7,076,521 B2 | 7/2006 | Davison |
| 7,082,426 B2 | 7/2006 | Musgrove et al. |
| 7,093,010 B2 | 8/2006 | Ostrup et al. |
| 7,096,350 B2 | 8/2006 | Graves et al. |
| 7,096,465 B1 | 8/2006 | Dardinski et al. |
| 7,107,297 B2 | 9/2006 | Yellepeddy et al. |
| 7,127,424 B2 | 10/2006 | Kemp, II et al. |
| 7,188,333 B1 | 3/2007 | Lamotta et al. |
| 7,188,335 B1 | 3/2007 | Darr et al. |
| 7,200,582 B1 * | 4/2007 | Smith .................... G06F 17/50 706/45 |
| 7,225,038 B2 | 5/2007 | Kind |
| 7,225,197 B2 | 5/2007 | Lissar et al. |
| 7,233,885 B1 | 6/2007 | Larabee et al. |
| 7,237,187 B2 | 6/2007 | Neal et al. |
| 7,246,087 B1 | 7/2007 | Ruppelt et al. |
| 7,328,177 B1 | 2/2008 | Lin-Hendel |
| 7,337,174 B1 | 2/2008 | Craig |
| 7,337,179 B1 | 2/2008 | Plain |
| 7,343,212 B1 | 3/2008 | Brearley et al. |
| 7,343,584 B1 | 3/2008 | Plain et al. |
| 7,386,562 B2 | 6/2008 | Long |
| 7,424,444 B1 | 9/2008 | Condon et al. |
| 7,461,049 B2 | 12/2008 | Thompson et al. |

(56) References Cited

U.S. PATENT DOCUMENTS

| | | |
|---|---|---|
| 7,464,064 B1 * | 12/2008 | Smith .................... G06F 17/50 706/14 |
| 7,487,072 B2 | 2/2009 | Semple et al. |
| 7,509,326 B2 | 3/2009 | Krabel et al. |
| 7,516,103 B1 | 4/2009 | Peitrucha, Jr. et al. |
| 7,567,922 B1 | 7/2009 | Weinberg et al. |
| 7,580,871 B2 | 8/2009 | Brunner et al. |
| 7,584,079 B2 | 9/2009 | Lichtenberg et al. |
| 7,650,296 B1 | 1/2010 | Brunner et al. |
| 7,698,170 B1 | 4/2010 | Darr et al. |
| 7,760,746 B2 | 7/2010 | Betts et al. |
| 7,797,177 B2 | 9/2010 | Chung et al. |
| 7,809,758 B2 | 10/2010 | Thurnhofer et al. |
| 7,860,690 B2 | 12/2010 | Gadamsetty et al. |
| 7,869,981 B2 | 1/2011 | Pendyala et al. |
| 7,873,503 B2 | 1/2011 | Loomans et al. |
| 7,882,057 B1 | 2/2011 | Little et al. |
| 7,930,149 B2 | 4/2011 | Haag et al. |
| 7,953,639 B2 | 5/2011 | Keil et al. |
| 7,953,767 B2 | 5/2011 | Shaburov |
| 7,953,779 B1 | 5/2011 | Ragusa et al. |
| 7,992,145 B2 | 8/2011 | Emerson et al. |
| 7,996,329 B1 | 8/2011 | Schierholt |
| 8,078,489 B1 | 12/2011 | Marsten |
| 8,249,885 B2 | 8/2012 | Berkowitz et al. |
| 8,280,700 B2 | 10/2012 | Pendyala et al. |
| 8,306,795 B2 | 11/2012 | Atkinson |
| 8,463,682 B1 | 6/2013 | Gilpin |
| 8,665,731 B1 | 3/2014 | Ramesh et al. |
| 8,805,825 B1 | 8/2014 | Showers et al. |
| 8,918,750 B1 | 12/2014 | Moffitt |
| 9,020,880 B2 | 4/2015 | Little et al. |
| 9,098,854 B2 | 8/2015 | Lin et al. |
| 2002/0013775 A1 | 1/2002 | Skovgaard |
| 2002/0035463 A1 | 3/2002 | Lynch et al. |
| 2002/0052803 A1 | 5/2002 | Amidhozour et al. |
| 2002/0095348 A1 | 7/2002 | Hiroshige et al. |
| 2002/0107861 A1 | 8/2002 | Clendinning et al. |
| 2002/0116417 A1 | 8/2002 | Weinberg et al. |
| 2002/0124005 A1 | 9/2002 | Matson et al. |
| 2002/0143653 A1 | 10/2002 | Dilena et al. |
| 2002/0161668 A1 | 10/2002 | Lutz et al. |
| 2002/0165701 A1 * | 11/2002 | Lichtenberg .......... G06F 17/5095 703/7 |
| 2002/0177911 A1 | 11/2002 | Waugh et al. |
| 2002/0184308 A1 | 12/2002 | Levy et al. |
| 2003/0041088 A1 | 2/2003 | Wilson et al. |
| 2003/0046047 A1 | 3/2003 | Dong et al. |
| 2003/0055751 A1 | 3/2003 | Sasnowitz |
| 2003/0061238 A1 | 3/2003 | Atkinson |
| 2003/0069737 A1 | 4/2003 | Koubenski et al. |
| 2003/0130749 A1 | 7/2003 | Haag et al. |
| 2003/0177412 A1 | 9/2003 | Todd |
| 2003/0195806 A1 | 10/2003 | Willman et al. |
| 2003/0216951 A1 | 11/2003 | Ginis et al. |
| 2004/0064441 A1 | 4/2004 | Tow |
| 2004/0068485 A1 | 4/2004 | Thompson et al. |
| 2004/0073436 A1 | 4/2004 | Vaishnavi |
| 2004/0073448 A1 | 4/2004 | Barts et al. |
| 2004/0102995 A1 | 5/2004 | Boppana |
| 2004/0162835 A1 | 8/2004 | Ghouri |
| 2004/0167906 A1 | 8/2004 | Smith et al. |
| 2005/0071146 A1 | 3/2005 | Kind |
| 2005/0080648 A1 | 4/2005 | Huelsman et al. |
| 2005/0114158 A1 | 5/2005 | Albaugh et al. |
| 2005/0163143 A1 | 7/2005 | Kalantar et al. |
| 2005/0268255 A1 | 12/2005 | Hrastnik et al. |
| 2006/0064685 A1 | 3/2006 | Defolo |
| 2006/0095711 A1 | 5/2006 | Aridor et al. |
| 2006/0100829 A1 | 5/2006 | Lynch et al. |
| 2007/0094204 A1 * | 4/2007 | Huelsman ................ G06N 5/04 706/47 |
| 2009/0323539 A1 | 12/2009 | Wang et al. |
| 2011/0082675 A1 | 4/2011 | Little et al. |
| 2012/0253754 A1 | 10/2012 | Goswami et al. |
| 2014/0019739 A1 | 1/2014 | Catthoor et al. |
| 2015/0120490 A1 | 4/2015 | Subbarayan et al. |
| 2015/0331974 A1 * | 11/2015 | Subbarayan ........ G06F 17/5009 703/2 |
| 2015/0379442 A1 * | 12/2015 | Samanthapudi ... G06Q 10/0633 705/7.27 |

FOREIGN PATENT DOCUMENTS

| | | |
|---|---|---|
| CA | 2431209 A1 | 6/2002 |
| CN | 1403999 A | 3/2003 |
| DE | 3911465 A1 | 10/1990 |
| DE | 19614789 C1 | 9/1997 |
| DE | 19937975 A1 | 2/2001 |
| DE | 19954609 A1 | 5/2001 |
| DE | 10028688 A1 | 6/2001 |
| DE | 10103368 A1 | 8/2001 |
| DE | 10120869 A1 | 12/2001 |
| DE | 10138174 A1 | 2/2003 |
| DE | 10217648 A1 | 1/2004 |
| EP | 0439341 A2 | 7/1991 |
| EP | 0520927 A2 | 12/1992 |
| EP | 0566105 A2 | 10/1993 |
| EP | 0598476 A2 | 5/1994 |
| EP | 0747847 A2 | 12/1996 |
| EP | 0770239 B1 | 10/1998 |
| EP | 1118952 A2 | 7/2001 |
| EP | 1178377 A1 | 2/2002 |
| EP | 1239418 A2 | 9/2002 |
| FR | 2798753 A1 | 3/2001 |
| FR | 2851354 A1 | 8/2004 |
| GB | 2365579 A | 2/2002 |
| JP | 6482225 A | 3/1989 |
| JP | 05274378 A | 10/1993 |
| JP | 05289876 A | 11/1993 |
| JP | 086777 A | 1/1996 |
| JP | 0832203 A | 2/1996 |
| JP | 09293076 A | 11/1997 |
| JP | 2000148814 A | 5/2000 |
| JP | 2002361527 A | 12/2002 |
| JP | 2003186888 A | 7/2003 |
| SE | 00023358 L | 2/2002 |
| SE | 520367 C2 | 7/2003 |
| WO | 9423372 A1 | 10/1994 |
| WO | 9508494 A1 | 3/1995 |
| WO | 9534866 A1 | 12/1995 |
| WO | 9855949 A1 | 12/1998 |
| WO | 0036544 A1 | 6/2000 |
| WO | 0045319 A1 | 8/2000 |
| WO | 0106414 A2 | 1/2001 |
| WO | 0147172 A2 | 6/2001 |
| WO | 0175729 A2 | 10/2001 |
| WO | 0198896 A1 | 12/2001 |
| WO | 0246980 A2 | 6/2002 |
| WO | 02067151 A1 | 8/2002 |
| WO | 03056470 A1 | 7/2003 |
| WO | 03058541 A1 | 7/2003 |
| WO | 03081465 A2 | 10/2003 |
| WO | 2003081465 A3 | 10/2003 |

OTHER PUBLICATIONS

Anderson et al., "Interactive cost configuration over decision diagrams", Journal of artificial Intelligence, 20107.*

Berndt et al., "Multi-valued decision diagrams for the verification of consistency in automotive product data", IEEE 2012.*

Hardzic et al., "Uncovering functional dependencies in MDD-compiled product catalogues", ACM, 2009.*

Brayton et al., "Multi-valued Logic Synthesis", IEEE, 1999.*

Ka ßmeyer et al., "A Formal Model for Stateful and Variant-rich Automotive Functions", IEEE, 2016.*

Rice et al., "A Survey of Static Variable Ordering Heuristics for Efficient BDD/MDD Construction", University of California, Riverside, 2008.*

Timo Soininen, et al., "Developing a Declarative Rule Language for Applications in Product Configuration," 1998 G. Gupta (Ed.):

(56) References Cited

OTHER PUBLICATIONS

PADL'99, LNCS 1551, Springer-Verlag Berlin Heidelberg, pp. 305-319.
Juha Tiihonen, et al., "Modeling Configurable Product Families," Oct. 22-23, 1998, 4th WDK Workshop on Product Structuring, Delft University of Technology, Delft, The Netherlands. (22 pp.).
Reidar Conradi, et al., "Version Models for Software Configuration Management," Norwegian University of Sciece and Technology, Trondheim, and Technical University of Aachen. (Date Unknown) (60 pp.).
Gerhard Fischer, et al., "Supporting the Evolution of Design Artifacts with Representations of Context and Intent," 1995 ACM, DIS 95 Ann Arbor, MI. (9 pp.).
S.M. Fohn, et al., "Configuring computer systems through constraint-based modeling and interactive constraint satisfaction," 1995, Computers in Industry 27, Elsevier Science B.V. (19 pp.).
Michael Gertz, et al., "A Diagnostic Approach to Repairing Constraint Violations in Databases," 1995, Institut fur Informatick, Universitaet Hannover, Hannover, Germany. (8 pp.).
S. H. Masood, et al., "Concurrent intelligent rapid prototyping environment," 1995, Journal of Intelligent Mfg., Chapman & Hall. (pp. 291-310).
S. K. Ong, et al., "An object-oriented approach to computer-aided design of a platic injection mould," 1995, Journal of Intelligent Mfg., pp. 1-10.
Lisa Purvis, et al., "Adaptation Using Constraint Satisfaction Techniques," National Science Foundation. (Date Unknown) (pp. 1-9).
Mark Stefik, "Introduction to Knowledge Systems," 1995, Morgan Kaufmann Publishers, Inc. (340 pp.).
Sanjai Tiwari, et al., "Constraint Management on Distributed Design Configurations," 1995, Engineering with Computers, Springer-Verlag London Ltd., pp. 199-211.
Sankar Virdhagriswaran, et al., "Manufacturing Collaboration Resource Discovery System (McRDS)," 1995, IEEE. (10 pp.).
Nagarjun V. Yetukuri, et al., "Knowledge-based hand tool selection in concurrent design of mechanical systems," 1995, Journal of Intelligent Mfg., pp. 203-214.
Bei Yu, et al., "A Product Structure Methodology to Support Configuration Design," Jun. 1995, WDK International Workshop, Product Structuring, Delft, The Netherland. (pp. 1-20).
"Classys Sales Automation Overview," Classys Sales Automation. (Date Unknown) (pp. 1-22).
"Classys Sales Automation User's Guide," 1995, Classys Sales Autmoation. (pp. 1-120).
UNISYS, "PW2 Advantage Series SVD Dual Processor Pentium Models," 1995, UNISYS (pp. 1-4).
Michele Morris, "Volvo GM Heavy Truck implements CLASSYS configuration solution for sales support," Oct. 5, 1995, Business Wire. http://www.thefreelibrary.com/_/print/PrintArticle.aspx?id=17533581. (2 pp.).
Jun-Ichi Aoe, et al., "A Trie Compaction Algorithm for a Large Set of Keys," Jun. 1996, IEEE Transactions on Knowledge and Data Engineering, vol. 8, No. 3. (16 pp.).
Tomas Axling, et al., "A Tool for Developing Interactive Configuration Applications," 1996, The Journal of Logic Programming, Elsevier Science, Inc. (22 pp.).
Michel Benaroch, "Knowledge Reuse in Mass Customization of Knowledge-Intensive Services," 1996, Artificial Intelligence in Economics & Management, EIN-DORP (ED.), Kluwer Academic Publishing Boston. (18 pp.).
R. D. Braun, et al, "Development and Application of the Collaborative Optimization Architecture in a Multidisciplinary Design Environment," Jul. 25, 1996, NASA Langley Research Center, Hampton, VA and Stanford University, Stanford, CA. (19 pp.).
Susan E. Carlson, "Genetic Algorithm Attributes for Component Selection," 1996, Research in Engineering Design, pp. 33-51.
Walid Dabbous, et al., "Generating efficient protocol code from an abstract specification," 1996, ACM Digital Library. (13 pp.).
Albert D'Andrea, et al., "UNISQL'S Next-Generation Object-Relational Database Management System," Sep. 1996, SIGMOD Record, vol. 25, No. 3. (7 pp.).
Halldor Fossa, et al., "Implementing Interactive Configuration Management for Distributed Systems," 1996,, IEEE. (8 pp.).
Dick Johnson, "Batch Software Brings Help to the 'Chef,'" Sep. 1996, Control Engineering. (1 p.).
Jessie Kennedy, et al., "Interfaces to Databsed (IDS-3," and Thomas Schweickert, et al., "A Graphical User Interface to the Object-Oriented Database System VODAK on the Basis of the Generic Visualisation Toolkit Lyberworld," 1996 Electronic Workshops in Computing. (12 pp.).
Yi-Jing Lin, et al., "Configuration Management with Logical Structures," 1996, IEEE. (10 pp.).
A. McKay, et al., "Relating Product Definition and Product Variety," 1996, Research in Engnineering Design, pp. 63-80.
Robert T. Monroe, et al., "Style-Based Reuse for Software Architectures," 1996 Carnegie Mellon University Research Showcase, Tepper School of Business. (12 pp.).
Klas Orsvarn, "Knowledge Modelling with Libraries of Task Decomposition Methods," Jun. 1996, Swedish Institute of Computer Science, Sweden. (192 pp.).
David Rosen, et al., "Towards computer-aided configuration design for the life cycle," 1996, Journal of Intelligent Mfg. (17 pp.).
Stephan Rudolf Schwarze, "Configuration of Multiple-Variant Products: Application Orientation and Vagueness in Customer Requirements," 1996, Swiss Federal Insitute of Technology Zurich. (147 pp.).
Ian Sobieski, et al., "Aircraft design using collaborative optimization," 1996, American Institute of Aeronautics and Astronautics, Inc. (12 pp.).
Michael Spenke, et al., "FOCUS: The Interacitve Table for Product Comparison and Selection," 1996 ACM, GMD-German National Research Center for Information Technology. (10 pp.).
Gene Thomas, "Product Configuration for 'To-Order' Industries," Mar. 1996, IIE Solutions. (4 pp.).
J. Tiihonen, et al, "State-of-the-practice in product configuration—a survey of 10 cases in the Finnish industry," 1996, IIA-Research Centre, Helsinki University of Technology, Espoo, Finland. (20 pp.).
Peter Van Den Hamer, et al., "Managing Design Data: The Five Dimensions of CAD Frameworks, Configuration Management, and Product Data Management," Jan. 1996, Proceedings of the IEEE, vol. 84, No. 1. (15 pp.).
Bei Yu, et al., "Product Structure Based Reason Maintenance for Product Configuration," Apr. 1996, AAAI Technical Report FS-96-03. (11 pp.).
"Antalys Releases Classys Advanced Configuration Solution Version 4, Continues to Improve Industry_Leading Configuration Software," Feb. 1996, Internet Archive Wayback Machine. (1 p.).
W. Close, "Case Study: Developing a Sales Configuration System," Feb. 14, 1996, Research Note, Case Studies, CS-580-215, Gartner Group. (2 pp.).
CLASSYS Advanced Configuration Solutions, "Administrator's Guide, Version 4.2," 1994-1996, Antalys Real World Solutions. (979 pp.).
Michael Morris, Business Wire, "Harris Digital Telephone Systems Calls on Antalys to implement the Classys Advanced Configuration Solution," Jun. 28, 1996, www.thefreelibrary.com/ /print/PrintArticle. aspx?id=18434317. (2 pp.).
Tesuo Tomiyama, et al., "Knowledge Intensive CAD vol. 1," 1996, Chapman and Hall, London, UK. (54 pp.).
Anonymous, "Software Smoothes On-Demand Service," Sep. 1996, Graphic Arts Monthly. (2 pp.).
Hannu Peltonen, et al., "Concepts for Modelling Configurable Products," Jan. 1998, Helsinki University of Technology, Hut, Finland. (12 pp).
Daniel Sabin, et al., "Product Configuration Frameworks-A Survey," 1998, IEEE Intelligent Systems. (8 pp.).
Bei Yu, et al., "A Configuration Tool to Increase Product Competitiveness," 1998 IEEE Intelligent Systems. (8 pp.).

(56) References Cited

OTHER PUBLICATIONS

L. Ardissono, et al., "Customer-Adaptive and Distributed Online Product Configuration in the CAWICOMS Project," 1999 CAWICOMS and the Australian Federal Ministry of Education, Science and Culture. (7 pp.).
Mittal, et al., "Towards a generic model of configuration tasks," IJCAI'89 Proceedings of the 11th International join conference on Artificial Intelligence, vol. 2, pp. 1395-1401, (1989).
E. Gelle, et al., "Interactive Configuration based on Incremental Constraint Satisfaction," Swiss Federal Institute of Technology (EPFL) IN-Ecublens, Lausanne, Switzerland. (Date Unknown) (10 pp).
Michael R. Genesereth, et al., "Infomaster: An Information Integration System," Computer Science Dept., Stanford University. (Date Unknown) (4 pp).
S. R. Gorti, et al., "An object-oriented representation for product and design processes," (Date Unknown) (13 pp).
Saurabh Gupta, et al., "Product Family-Based Assembly Sequence Design Methodology," Dept. of Management, The University of Texas at Austin. (Date Unknown) (36 pp).
Tarik Hadzic, et al., "Fast Backtrack-Free Product Configuration Using a Precompiled Solution Space Representaton," Dept. of Innovation, IT University of Copenhagen, Denmark and Configit Software A/S, of Copenhagen, Denmark. (Date Unknown) (8 pp).
William S. Havens,et al., "Platypus: a Constraint-Based Reasoning System," Computer Research Laboratory, Tektronix, Inc., Beaverton, OR. (Date Unknown) (6 pp).
Mikko Heiskala, et al., "A Tool for Comparing Configurable Products," Helsinki University of Technology, Hut, Finland, and Kauppalehti, of Helsinki, Finland. (Date Unknown) (6 pp).
Lothar Hotz, et al., "A Short History of Configuration Technologies," HITeC e.V., University of Hamburg, Hamburg, Germany, Graz University of Technology, Graz, Austrai, and Aalto University, Aalto, Finland. (Date Unknown) (29 pp).
Jernej Kovse, et al., "Supporting Mass Customization by Generating Adjusted Repositories for Product Configuration Knowledge," Dept. of Computer Science, University of Kaiserslautern, Kaiserslautern, Germany. (Date Unknown) (10 pp).
Thorsten Krebs, et al., "Knowledge-based Configuration for Configuring Combined Hardware/Software Systems," (Date Unknown) (6 pp).
James Bennett, et al., "Sacon: A Knowledge-Based Consultant for Structural Analysis," Sep. 1978, StandfordHeuristic Programming Project, Memo HHP-78-23, Computer Science Dept., Report No. STAN_CS-78-669. (67 pp).
John McDermott, "R1: A Rule-Based Configurer of Computer Systems," Apr. 1980, Dept. of Computer Science, Carnegie-Mellon University. (56 pp).
Charles L. Forgy, OPS5 User's Manual, 1981, Carnegie Mellon Univeristy, Research Showcase @CMU, Computer Science Dept., School of Computer Science. (63 pp).
John McDermott, Domain Knowledge and the Design Process, 1981, IEEE, 18th Design Automation Conference. (9 pp).
William Van Melle, et al., "The EMYCIN Manual," Nov. 1981, Heuristic Programming Project, Report No. HPP-81-16, Computer Science Dept., Report No. STAN-CS-81-885. (18 pp).
John McDermott, "XSEL: a computer sales person's assistant," Carnegie-Mellon University, Pittsburgh, USA. (Date Unknown) (13 pp).
Motoi Suwa, et al., "An Approach to Verifying Completeness and Consistency in a Rule-Based Expert System," 1982, AI Magazine, vol. 3, No. 4. (6 pp).
"The Handbook of Artificial Intelligence," 1982. (45 pp).
Mark Stefik, et al., "Knowledge Programming in Loops: Report on an Experimental Course," Fall 1983, The AI Magazine. (11 pp).
William P. Birmingham, et al., "MICON: A Knowledge Based Single Board Computer Designer," 1984, IEEE, 21st Design Automation Conference, Paper 34.2. (7 pp).
Judith Bachant, et al., "R1 Revisited: Four Years in the Trenches," Fall 1984, The AI Magazine, vol. 5, No. 3. (12 pp).

Dan E. Willard, "New Trie Data Structures Which Support Very Fast Search Operations," 1984, Journal of Computer and System Sciences 28, pp. 379-394. (16 pp.).
Virginia E. Barker, et al., "Expert Systems for Configuration AT Digital: XCON and Beyond," Mar. 1989, Communications of the ACM, vol. 32, No. 3. (12 pp).
William P. Birmingham, et al., "The MICON System for Computer Design," 1989, 26th ACM/IEEE Design Automation Conference. (6 pp).
R. Cunis, et al., "PLAKON—An Approach to Domain-Independent Construction," 1989, ACM 0-89791-320-5/89/0006/866. (9 pp.).
Sanjay Mittal, et al., "Towards a generic model of configuration tasks," Xerox Palo Alto Research Center, and Hewlett-Packard Laboratories. (Date Unknown) (7 pp).
Sanjay Mittal, et al., A Knowledge-level analysis of the Cossack expert system for configuration tasks, Jan. 1989, Xerox PARC, SSL Tech Report Draft, University of California, Irvine, CA. (48 pp).
Bernd Nordhausen, et al., "An integrated approach to empirical discovery," 1989, Information and Computer Science Technical Report. (29 pp).
Samir Emdanat, et al., "Solving Form-Making Problems Using Shape Algebras and Constraint Satisfaction," Doctoral Program in Architecture, CAUP, Artifical Intelligence Laboratory, EECS, Ann Arbor, MI. (Date Unknown) (6 pp).
Alexander Felfernig, et al., "Configuration Knowledge Representation using UML/OCL," Institut fur Wirtschaftsinformatick und Auwendungssysteme, Producktionsinformatick, Klagenfurt, Austria. (Date Unknown) (14 pp).
Alexander Felfernig, et al., "Generating product configuration knowledge bases from precise domain extended UML models," Institut fur Wirtschaftsinformatik und Anwendungssysteme, University of Klagenfurt, Klagenfurt, Austria. (Date Unknown) (11 pp).
Alexander Felfernig, et al., "Hierarchical diagnosis of large configurator knowledge bases," University of Klagenfurt, Klagenfurt, Austria, and Technical University, Vienna, A-1040 Wien. (Date Unknown) (8 pp.).
Alexander Felfernig, et al., "Rapid Knowledge Base Development for Product Configuration Systems using the Unified Modeling Language," Institut fur Wirtschaftsinformatick und Awendungssysteme, Universitat Klagenfurt. (Date Unknown)(19 pp).
Alexander Felfernig, et al., "Towards Distributred Configuration," Institut fur Wirtschaftsinformatick und Awendungssysteme, Universitat Klagenfurt. (Date Unknown)(15 pp).
Karen Kukich, "Explanaton Structures in XSEL," Computer Science Dept., Carnegie-Mellon University, Pittsburgh, PA. (Date Unknown)(10 pp).
Wenqian Liu, et al., "Rule-Based Detection of Inconsistency in UML Models," Dept. of Computer Science, University of Toronto, Toronto, CA. (Date Unknown) (18 pp).
Donia Scott (ED.), "Artificial Intelligence: Methodology, Systems, and Applications," 10th International Conference, AIMSA 2002, Varna, Bulgaria, Sep. 2002 Proceedings. (10 pp).
Diego Magro, et al., "Problem Decomposition in Configuration," (Date Unknown) (6 pp).
Tomi Maennistoe, et al., "A Framework for Long Term Information Management of Product Configurations," Helsinki University of Technology, Department of Computer Science, Espoo, Finland. (Date Unknown) (13 pp).
Tomi Maennistoe, et al., "Evolution of Schema and Indivisuals of Configurable Products," (Date Unknown) Springer Link, Advances in Conceptual Modeling, vol. 1727 of the series Lecture Notes in Computer Science pp. 12-23.
John McDermott, et al., "Extending a Knowledge-Based System to Deal with Ad Hoc Constraints," Carnegie-Mellon University, Pittsburgh, PA. (Date Unknown) (10 pp).
F. Frayman, et al., "COSSACK: A Constraints-Based Expert System for Configuration Tasks," Intelligent Systems Laboratory, Xerox Palo Alto Research Center, Palo Alto, CA. (Date Unknown) (26 pp).
Jesper Moller, et al., "Product Configuration over the Internet," The IT University of Copenhagen and Configilt Software. (Date Unknown) (7 pp).

(56) References Cited

OTHER PUBLICATIONS

Hannu Peltonen, et al., "An Object Model for Evolutionary Configuration Management," Helsinki University of Technology, Dept of Computer Science, Espo, Finland., (Date Unknown) (18 pp).
Paul Singleton, et al., "Storage and Retrieval of First-order Terms Using a Relational Database," Dept. of Computer Science, Keele University, Newcastle, UK. (Date Unknown) (21 pp).
Michael Stonebraker, et al., "Mariposa: A New Architecture for Distributed Data," Computer Science Div., Dept. of EECS, University of California, Berkeley, CA. (Date Unknown) (17 pp).
Sathiamoorthy Subbarayan, et al., "Comparing Two Implementations of a Complete and Backtrack-Free Interactive Configurator," Dept. of Innovation, IT University of Copenhagen, Copenhagen, Denmark, and Cofigit Software A/S, Copenhagen, Denmark. (Date Unknown) (15 pp).
Jing Sun, et al., "Formal Semantics and Verification for Feature Modeling," Dept. of Computer Science, The University of Auckland, New Zealand, School of Computer Science and Information Technology RMIT Unversity, Australia, School of Computing, National University of Singapore, Singapore, and Dept. of Computer Science, University of Manchester, United Kingdom. (Date Unknown) (10 pp).
Thomas Von Der Maben, et al., "Deficiencies in Feature Models," Research Group Software Construction, RWTH Aachen. (14 pp).
Bryan M. Kramer, "Knowledge-based Configuration of Computer Systems Using Hierarchical Partial Choice," Nov. 1991, Int. Conf. on Tools for AI, San Jose, CA. (8 pp).
Andreas Guenter, et al., "Separating Control from Structural Knowledge in Construction Expert Systems," 1990, Dept. of Computer Science, University of Hamburg, Germany, ACM 089791-372-8/90/0007//0601. (10 pp.).
Thomas Rose, et al., "A Decision-Based Configuration Process Model," 1990, University of Passau, Germany, IEEE. (10 pp.).
Kyo C. Kang, et al., "Feature-Oriented Domain Analysis (FODA) Feasibility Study," Nov. 1990, Technical Report, CMU/SEI-90-TR-21, ESD-90-TR-222, (161 pp.).
Sanjay Mittal, et al., "Dynamic Constraint Satisfaction Problems," 1990, AAA 90 Proceedings, www.aaa.org. (8 pp.).
Hausi A. Mueller, et al., "Composing Subsystem Structures using (k,2)-partite Graphs," Mar. 1990, Department of Computer Science, University of Victoria, Canada. (10 pp.).
Timothy J. O'Leary, et al., "Validating Expert Systems," Jun. 1990, IEEE, Tools & Techniques. (8 pp.).
S. Akagi, edited by D.T. Pham, PhD, "Expert System for Engineering Design Based and Object-Oriented Knowledge Representation Concept," 1991, Artificial Intelligence in Design, Springer-Verlag, Artificial Intelligence in Industry. (41 pp.).
Chitta Baral, et al., "Combining Multiple Knowledge Bases," 1991, IEEE Transactions on Knowledge and Data Engineering, vol. 3, No. 2. (13 pp.).
T. Bardasz, et al., "Applying analogical problem solving to mechanical design," 1991, Butterworth-Heinemann Ltd., Computer Aided Design. (11 pp.).
Grady Booch, "Objected Oriented Design with Applications," 1991, The Benjamin/Cummings Publishing Company, Inc. (605 pp.).
H. A. Elmaraghy, edited by D.T. Pham, PhD, Intelligent Product Design and Manufacture, 1991, Artificial Intelligence in Design, Technical Report Cmulsei-91-TR, ESD-91-TR-7, Springer-Verlag, Artificial Intelligence in Industiy. (28 pp.).
Peter H. Feiler, "Configuration Management Models in Commercial Environments," Mar. 1991, Software Engineering Institute, Software Development Environments Project. (59 pp.).
R. Koenig, et al., "Combining Rules and State Space Objects in a Configuration Expert System," 1991, IEEE. (5 pp.).
Harry S. Delugach, et al., "Dependency Language Respresentation Using Conceptual Graphs," Aug. 2001, Autonomic Information Systems, Sensors Directorate, Air Force Research Laboratory, Air Force Materiel Command, Wright-Patterson Air Force Base, OH. (84 pp.).

Stefan Esbjoerner, et al., Examensarbete, Den virtuella foersaeljaren—interaktiv konfigurering av komplexa produkter, 2001, Chalmers, Goeteborgs Universitet. (66 pp.).
Alexander Felfernig, et al., "Conceptual modeling for configuration of mass-customizable products," Apr. 2001, Artificial Intelligence in Engineering, vol. 15, Iss. 2, pp. 165-176.
Alexander Felfernig, et al., "Distributed Configuring," 2001, Universitaet Klagenfurt, Austria. (7 pp.).
Eric Gregoire, et al., "Logic-based approaches to information fusion," 2006, Elsevier, Information Fusion 7. (15 pp.).
Cipriano Forza, et al., "Product configuration and inter-firm coordination: an innovative solution from a small manufacturing enterprise," (Date Unknown), University of Padova, Dept. of Management and Engineering, et al. (Date Unknown) (6 pp.).
Eugene C. Freuder, et al., "Explanation and Implication for Configuration Problems," Constraint Computation Center, Dept. of Computer Science, University of New Hampshire, Durham, NH. (Date Unknown) (7 pp.).
Eugene C. Freuder, et al., "Modeling and Generating Tradeoffs for Constraint-Based Configuration," Constraint Computation Center, Dept. of Computer Science, University of New Hampshire, Durham, NH, et al. (Date Unknown) (7 pp.).
Laurent Geneste, et al., "Experience based configuration," Equipe Production Automattsee—Laboratore Genie de Production, Ecole Nationale d'Ingenieurs de Tarbes. (Date Unknown) (5 pp.).
Ulrich Junker, "Preference Programming for Configuration," ILOG, Valbourne, France. (Date Unknown) (7 pp.).
Hyung Min Kim, "Target Cascading in Optimal System Design," 2001, The University of Michigan. (169 pp.).
Diego Magro, et al., "Interactive Configuration Capability in a Sale Support System: Laziness and Focusing Mechanisms," Dipartimento di Informatica, Universita di Torino, Italy. (Date Unknown) (7 pp.).
Tomi Maennistoe, et al., "Modelling Configurable Products and Software Product Families," May 2001, Software Configuraton Workshop, Toronto, Canada. (7 pp.).
LCSIS, Life Scyle Support Information System, "Training Guide" 2004, Visible Systems Corporation. (46 pp.).
Youchon Oh, et al., "Mapping product structures between CAD and PDM systems using UML," 2001, Computer Aided Design, Elsevier. (9 pp.).
Alun Preece, "Supporting Virtual Organisations through Knowledge Fusion," University of Aberdeen, Computing Science Dept., Aberdeen, Scotland. (Date Unknown) (16 pp.).
N. Shyamsundar, et al., "Internet-based collaborative product design with assembly features and virtual design spaces," 2001, Computer Aided Design, Elsevier. (15 pp.).
Carsten Sinz, et al., "Dealing with Temporal Change in Product Documentation for Manufacturing," Symbolic Computation Group, WSI Computer Science, University of Tubingen, Germany. (Date Unknown) (7 pp.).
Carsten Sinz, et al., "Detection of Inconsistencies in Complex Product Configuration Data Using Extended Propositional SAT-Checking," 2001, Flairs-01 Proceedings, American Association of Artificial Intelligence. (5 pp.).
Drs. Silvie Spreeuwenberg, et al., "VALENS: A Knowledge Based Tool to Validate and Verify an Aion Knowledge Base," Jun. 9-11, 1999, 5th European Symposium on Validation and Verification of Knowledge Based Systems—Theory, Tools and Practice, pp. 67-78.
Tommi Syrjaenen, "Version Spaces and Rule-Based Configuration Management," Helsinki University of Technology, Dept. of Computer Science and Eng., Latoratory for Theoretical Computer Science, Hut, Finland. (Date Unknown) (7 pp.).
Naken Wongvasu, et al., "Trie Representation for Expressing the Capability Between Items in a Logical Bill of Material Structure," 2001, Intelligent Systems in Design and Mfg. IV, Angappa Gunasekaran, Bhaskaran Gopaliakrishman, Editors, Proceedings of SPIE vol. 4565. (7 pp.).
Luca Anselma, "Strategie di decomposizione per la risoluzione automatica di problemi di configurazione," 2001/2002, Universita Degli Studi di Torino, Facolta di Scienze M.F.N., Corso di Laurea in Informatica. (209 pp.).

(56) References Cited

OTHER PUBLICATIONS

Mathias Bauer, "The MAUT-machine: an adaptive recommender system," Jan. 2002, ResearchGate, Article. Http://www.researchgate.net/publication/228782617. (9 pp.).
Martin Bichler, et al., "RECO: Representation and Evaulation of Configurable Offers," Jan. 2002, IBM Research Report RC 22288. (23 pp.).
Siobhan Clarke, "Extending standard UML with model composition semantics," 2002, Science of Computer Programming 44, Elsevier. (30 pp.).
Frank Echinger, "Aufbereitung von Producktdaten su einheitlichen Katalogen fur eProcurement," Studienarbeit. (Date Unknown) (16 pp.).
Liliana Ardissono, et al., "A Framework for Rapid Development of Advanced Web-based Configurator Applications," 2002, 15th European Conference on Artificial Intelligence—Prestigious Applications of Intelligent Systems (PAIS), Lyon, France. pp. 618-622.
Cipriano Forza, et al., "Managing for variety in the order acquisition and fulfilment process: The contribution of product configuration systems," 2002, Elsevier, Int. J. Production Economics 76. (12 pp.).
Wilhelm Hasselbring, "Web Data Integration for E-Commerce Applications," 2002, IEEE Feature Article. (11 pp.).
Alessandro Maccari, et al., "Architectural Evoluation of Legacy Product Families," 2002, F. van der Linden (Ed.): PFE-4, 2001, LNCS 2290, Springer-Verlag Berlin, Heidelberg. pp. 64-69.
Diego Magro, et al, "Decomposing and Distributing Configuration Problems," 2002,D. Scott (Ed.): AIMSA, 2002, LNAI 2443. Springer-Verlag Berlin, Heidelberg. pp. 81-90.
Juha Tiihonen, et al., "A Practical Tool for Mass-Customising Configurable Products," Aug. 19-21, 2003, International Conference of Engineering Design ICED 03 Stockholm. (10 pp.).
Magro, D., et al., "Decomposition strategies for configuration problems," Jan. 2003, (AI EDAM) Artificial Intelligence for Engineering, Analysis and Manufacturing, vol. 17, No. 1, pp. 51-73.
Andreas Wimmer, et al., "Produktmodellierung und Produktkonfiguration im Financial Planning," 2003, Seite 43—BIT. (10 pp.).
Dr. Thorsten Blecker, et al, "An Advisory System for Customer's Objective Needs Elicitation in Mass Customization," 2004, Proceeding of the 4th Workshop on Information Systems for Mass Customization (ISMC 2004) and the fourth International (ICSC Symposium on Engineering of Intelligent Systems (EIS 2004). (10 pp.).
Brian Corbett, et al., "A configuration design based method for platform commonziation for product families," Jan. 2004, Artificial Intelligence for Engineering, Analysis and Manufacturing, AIE EDAM. (http://journals2.scholarsportal.info/browse/08900604). (20 pp.).
Alexander Felfernig, et al., "Consistency-based diagnosis of configuration knowledge bases," 2004, Artificial Intelligence, Elsevier, pp. 213-234.
Timothy W. Simpson, "Product platform design and customization: Status and promise," 2004, Artificial Intelligence for Engineeering Design, Analysis and Manufacturing 18, Cambridge University Press. pp. 3-20.
Buy It Best Practice Network, "Content and Catalogue Management, The Key to Effective Supplier Enablement," Jul. 2004, A BuyIt e-Procurement Guideline issued by the BuyIt Best Practice Network. (24 pp.).
Timothy P. Darr, et al., "An Agent Architecture and Algorithm for Solving Distributed Configuration-Design Problems," 1996, AAAI Technical Report FS-96-03. (9 pp.).
Dr. Dragan Domazet, "Enablling Engineering Collaboration in Inter-Enterprise Design Chains Using Collaborative Agents," 2000, Singapore Institute of Mfg. Technology. (12 pp.).
Andrew Estabrooks, "A Combination Scheme for Inductive Learning from Imbalanced Data Sets," 2000, Dalhousie University—Daltech, Halifax, Nova Scotia. (119 pp.).
Alexander Felfernig, et al., "An Integrated Development Environment for the Design and Maintence of Large Configuration Knowledge Bases," 2000, J.S. Gero (ed.) Artificial Intelligence in Design, Kluwer Academic Publishers, Dordrecht. (pp. 169-189).
Alexander Felfernig, et al., "Consistency-based Diagnosis of Configuration Knowledge Bases," 2000, ECA1, 14th European Conference on Artificial Intelligence, Published in 2000 by IOS Press. (5 pp.).
Alexander Felfernig, et al., "Contextual Diagrams as Structuring Mechanisms for Designing Configuration Knowledge Bases in UML," 2000 Springer-Verlag Berlin Heidelberg, LNCS 1939, pp. 240-254.
Alexander Felfernig, et al., "Diagrammatic Acquisition of Functional Knowledge for Product Configuration Systems with the Unified Modeling Language," 2000 Springer-Verlag Berlin Heidelberg, LNAI 1889, pp. 361-375.
Alexander Felfernig, et al., "UML as Domain Specific Language for the Construction of Knowledge-Based Configuration Systems," 2000, World Scientific Publishing Company, International Journal of Software Engineering and Knowledge Engineering vol. 10, No. 4, pp. 449-469.
Erich Gamma, et al., "Design Patterns: Abstraction and Reuse of Object-Oriented Design," ECOOP '93 Conference Proceedings, Springer-Verlag Lecture Notes in Computer Science. (Date Unknown) (21 pp.).
Jianxin Jiao, et al., "Generic Bill-of-Materials-and-Operations for High-Variety Production Management," 2000, Concurrent Engineering: Research and Application, vol. 8, No. 4, pp. 297-322.
Manfred Kopisch,et al., "Knowledge-based Support for the Layout Development of the AIRBUS-A340 Passenger Cabin," (Date Unknown) Labor fur Kuenstliche Intelligenz, Fachbereich Informatik Universitat Hamburg, Germany. (13 pp.).
Wolfgang Kuechlin, et al., "Proving Consistency Assertions for Automotive Product Data Management," 2000, Kluwer Academic Publishers. (22 pp.).
John F. Lacher, "Sample Excel Macros and Applications," 2000, John F. Lacher & Associates, LLC, Custom Application and Design and Development. (10 pp.).
Zhang Jinsong, et al., "Configuration-oriented product modelling and knowledge management for made-to-order manufacturing enterprises," 2005 Int. J. Adv. Manuf. Technol. pp. 41-52.
Davor Pavlic, et al., "The Integrated Development of a Configurable Product," Aug. 15-18, 2005, International Conference on Engineering Design, ICED 05, Melbourne. (8 pp.).
Steve Pepper, "The TAO of Topic Maps, Seamless Knowledge in Practice," 2005, XML Topic Maps, Ontopia AS. (77 pp.).
Cipriano Forza, et al., "Product Information Management for Mass Customization," 2006, Palgrave Macmillan. (242 pp.).
Authors et al., Disclosed Anonymously, "Method and System for Selectively Displaying Configuration Options," Sep. 12, 2011, IP.Com Electronic Publication, IP.com No. IPCOM000210846D. (4 pp.).
Joy Batchelor, et al., "Bridging the Product Configuration Gap Between PLM and ERP—An Automotive Case Study," 2012, Jaguar Land Rover, et al. (20 pp.).
"Data Modeling," (Date Unknown) (59 pp.).
"Decomposition Strategies for Configuration Problems," (Date Unknown) (57 pp.).
Luca Anselma et al., "Dynamic Problem Decomposition in Configuration," Dipartimento di Informatica, Universita di Torino, Torino; Italy. (Date Unknown) (6 pp).
Luca Anselma, "Decomposition Strategies for Automatically Solving Configuration Problems," Dipartimento di Informatica, Universita di Torino, Torino; Italy. (Date Unknown) (7 pp).
Augustin A. Araya et al., "Compiling Design Plans From Descriptions of Artifacts and Problem Solving Heuristics," Intelligent Systems Laboratory, Xerox Palo Alto Research Center, Palo Alto, CA 94304. (Date Unknown) (7 pp).
N. Baker, et al., "Design Patterns for Description-Driven Systems," Lapp, IN2P3, Annecy-le-Vieux, France, et al. (Date Unknown) (6 pp).
Franklyn Berry et al., "The Spex Shell: An Approach to Automatic Application and Sales Engineering Processes," Carnegie Group, Inc., Pittsburgh, PA. (Date Unknown) (12 pp).

(56) References Cited

OTHER PUBLICATIONS

Richard Coester, et al., "Enhancing web-based configuration with recommendations and cluster-based help," Swedish Institute of Computer Sicence, SICS, Kista, Sweden. http://www.sics.se/ (Date Unknown) (10 pp).
Ivica Crnkovic, et al., "The Different Aspects of Component Based Software Engineering," Malardalen University, Dept. of Computer Engineering, Vasteras, Sweden, ABB Automation Products AB, Vasteras, Swenden, Magnus.Larsson/Frank. (Date Unknown) (4 pp).
"The Baan Company Acquires Antalys, Conifiguration Software Innovator," Nov. 18, 1996, Internet Archive Wayback Machine. (1 p.).
Aaron Armstrong, et al., "Dynamic Prioritization of Complex Agents in Distributed Constraint Satisfaction Problems," 1997, AAAI Technical Report WS-97-05. (6 pp.).
Halldor Fossa, et al., "Interactive Configuration Management for Distributed Object Systems," 1997, IEEE. (11 pp.).
Prashant Jain, et al., "Service Configurator A Pattern for Dynamic Configuration of Services," Jun. 1997, Third USENIX Conference on Object-Oriented Technologies and Systems, Portland, Oregon. (12 pp.).
Anssi Karhinen, et al., "Configuring Designs for Reuse," 1997 ACM, ICSE 97, Boston, MA. (10 pp.).
Giuseppe Attardi, et al., "Web-based Configuration Assistants," Dipartimento di Informatica, Universita di Pisa, Italy. (Date Unknown) (12 pp.).
Bryan Dobson, et al., "Oracle Product Configurator User's Guide" Release 11, Mar. 1998, Oracle Corporation. (95 pp.).
Frank Feldkamp, et al., "SyDeR—System design for reusability," 1998, Artificial Intelligence for Engineering Design, Analysis and Manufacturing, Cambridge University Press, USA (10 pp).
Gerhard Fleischanderl, et al., "Configuring Large Systems Using Generative Constraint Satisfaction," Jul./Aug. 1998, Configuration, IEEE. (10 pp.).
David W. Franke, "Configuration research and commerical solutions," 1998, Articificial Intelligence for Engineering Design, Analysis and Mfg. Cambridge University Press, USA, pp. 295-300.
Eugene C. Freuder, et al., "The role of configuration knowledge in the business process," Jul./Aug. 1998, Configuration Roundtable, IEEE.(3 pp.).
Albert Haag, "Sales Configuration in Business Processes," 1998, Configuration, IEEE Intelligent Systems. (8 pp.).
Torben Hansen, et al., "Product Configurators in Electronic Commerce—Extension of the Configurator Concept towards Customer Recommendation," Chemnitz University of Technology, Information Systems and Management, Chemnitz, Germany, et al. (Date Unknown) (18 pp.).
Goerel Hedin, et al., "Product Configuration Using Object Oriented Grammars," Jul. 20-21, 1998, 8th International Symposium on Systems Configuration Management (SCM-8), Brussels. (19 pp.).
Werner E. Juengst, et al., "Using Resource Balancing to Configure Modular Systems," 1998, Configuration, IEEE Intelligent Systems. (9 pp.).
Tomi Mannisto, et al., "Modeling generic product structures in Step," 1999, Elsevier Science Ltd., Computer-Aided Design, vol. 30, No. 14, pp. 1111-1118.
Deborah L. McGuinness, et al., "An Industrial_Strength Desription Logic-Based Configurator Platform," Jul./Aug. 1998, Configuration, IEEE. (9 pp.).
Stephen Prata, "C++Primer Plus Fourth Edition," 2002, Sams Publishing. (7 pp.).
Claus Rautenstrauch, et al., "Moving into Mass Customization, Information Systems and Management Principles," 2002, Springer-Verlag Berlin Heidelberg, New York. (23 pp.).
Frank Van Harmelen, "Prestigious Applications of Intelligent Systems (PAIS 2002), Proceedings," 2002 ECAI, 15th European Conference on Artificial Intelligence. (9 pp.).
Li Weiji, et al., "A New Effective Multidisciplinary Design Optimization Algorithm," 2002 ICAS Congress. (5 pp.).

Robert I. Whitfield, et al., "Identifying Component Modules," 2002, Artificial Intelligence in Design '02. (14 pp.).
Shen-Chou Yen, et al., "Step-based data schema for implementing product data management system," 2002, Taylor and Francis Group, Int. J. Computer Integrated Manufacturing, vol. 15, No. 1, pp. 1-17.
Michel Aldanondo, et al., "Configuration," Jul. 22-23, 2002, 15th European Conference on Artificial Intelligence. (135 pp.).
Peoplesoft, "EnterpriseOne JDE5, Sales Configurator PeopleBook," May, 2002, PeopleSoft, Inc. (142 pp.).
Luca Anselma, et al., "Automatically Decomposing Configuration Problems," 2003, Springer-Verlag Berlin Heidelberg, A. Cappelli and F. Turini (Eds.): AI*IA 2003, LNAI 2829, pp. 39-52.
Carsten Sinz, et al., "Formal Methods for the Validation of Automotive Product Configuration Data," Apr. 5, 2003, Computer Science, Symbolic Computation Group and Steinbeis Technology Transfer Center OIT, University of Tuebingen, Tuebingen, Germany. (37 pp.).
Rob Belfer, FSA, MAAA, "Product Configuration Tools," Jun. 2003, Actuaries' Club of the Southwest Meeting, CSC Financial Services Group. (27 pp.).
Ulrich Junker, "Quickxplain: Confict Detection for Arbitrary Constraint Propagation Algorithms," 2001, IJCAI '01 Workshop on Modelling and Solving Problems with Constraints (CONS-1), Seattle, WA, USA.
Alexander Felfernig, et al., "Configuration knowledge representations for Semantic Web applications," 2003, Artificial Intelligence for Engineering Design, Analysis and Manufacturing, Cambridge Univeristy Press. (20 pp.).
Esther Gelle, et al., "Solving Mixed and Conditional Constraint Satisfaction Prolems," 2003, Constraints, 8, pp. 107-141, Kluwer Adademic Publishers, The Netherlands. (35 pp.).
Natalya F. Noy, et al., "The Prompt Suite: Interactive Tools for Ontology Merging and Mapping," Aug. 5, 2003, Stanford Medical Informatics, Stanford University, Stanford, CA. (69 pp.).
Leo Obrst, et al., "Ontologies for Coprorate Web Applications," 2003, AI Magazine, vol. 24, No. 3. (14 pp.).
Rachel A. Pottinger, et al., "Merging Models Based on Given Correspondences," 2003, Proceedings of the 29th VLDB Conference, Berlin, Germany. (12 pp.).
Chitta Baral, et al., "Cobining Knowledge Bases Consisting of First Order Theories," Sep. 1990, Institute for Advanced Computer Studies and Dept. of Computer Science, University of Maryland, UMIACS-TR-90-117, CS-TR-2531. (28 pp.).
Peter Clark, "A Comparison of Rule and Exemplar-Based Learning Systems," 1990, In: Machine Learing, Meta-reasoning and Logics, pp. 159-186, Eds: P. B. Brazdil and K. Konolige, (199), Boston: Kluwer., http://www.cs.utexas.edu/users/pclark/papers. (15 pp.).
L. Ardissono, et al, "Personalising On-Line Configuration of Products and Services," 1999, Universita of Torino, Italy, et al. (5 pp.).
Raymond Reiter, "A Theory of Diagnosis from First Priciples," 1987, Artificial Intelligence 32, pp. 57-95.
Frank Feldkamp, et al., "Product Models and Reusability," 1999, American Association for Artificial Intelligence (www.aaai.org.), AAAITechnical Report WS-99-05, Compilation. (4 pp.).
Alexander Felfernig, et al., "Consistency based diagnosis of configuration knowledge-bases," 1999, AAAI Technical Report WS-99-05, Compilation. (www.aaai.org).
A. Felfernig, et al., "Intelligent support for interactive configuration of mass-customized products," 1999, Computer Science and Manufacturing, University Klagenfurt. (10 pp.).
Gerhard Friedrich, et al., "Consistency-Based Configuration," 1999, AAAI Technical Report WS-99-05, Compilation. (www.aaai.org.) (6 pp.).
Andreas Guenter, et al., "Knowledge-Based Configuration—Survey and Future Directions," 1999, Dep. Computer Sicence, University of Hamburg, and DaimlerChrysler AG, Stuttgart. (20 pp.).
Andreas Guenter, et al., "Kommerzielle Software-Werkzeuge fur die Konfigurierung von technishen Systemen," 1999, Kuenstliche Intelligenz, Heft Mar. 1999, Seiten 61-65, ISSN 0933-1875, arenDTaPVerlag, Bremen. (5 pp.).
Dan Heiderscheit, et al., "Visualization of Configurations: Simplifying Configuration User Interfaces," 1999, AAAI Technical Report WS-99-05, Compilation. (www.aaai.org) (5 pp.).

(56) References Cited

OTHER PUBLICATIONS

Zhengfu Rao, et al., "Design Composition and Coordination of Multidisciplinary System Optimisation," Aug. 24-26, 1999, International Conference of Engineering Design, ICED 99 Munich. (8 pp.).
Nestor Michelena, et al., "A System Partitioning and Optimization Approach to Target Cascading," Aug. 24-26, 1999, International Conference on Engineering Design, ICED 99 Munich. (6 pp.).
Robert J. Muller, "Database Design for Smarties Using UML for Data Modeling," 1999, Morgan Kaufmann Publishers. (268 pp.).
Klas Orsvaern, PhD, et al., "The Tacton View of Configuration Tasks and Engines," 1999, AAAI Technical Report WS-99-05, Compilation. (www.aaai.org.) (4 pp.).
Sartaj Sahni, "Data Structures, Algorithms, and Applications in Java Tries," 1999, www.cise.ufl.edu/sahni/dsaaj/enrich/c16/tries.htm#compress. (21 pp.).
Paul J. P. Slater, "PCONFIG: a Web-based configuration tool for Configure-To-Order products," Mar. 1999, Knowleged-Based Systems 12. (8 pp.).
Timo Soininen, et al., "Dynamic Constraint Satisfaction in Configuration," 1999, AAAI Technical Report WS-99-05, compilation. (www.aaai.org.) (6 pp.).
Tommi Syrjanen, "A Rule-Based Formal Model for Software Configuration," 1999, Espoo, Helsinki University of Technology, Dept. of Computer Science Laboratory for Theoretical and Engineering Computer Sciencei. (81 pp.).
Dr. Patric Timmermans, "The Business Challenge of Configuration," 1999, AAAI Technical Report WS-99-05, Compilation. (www.aaai.org.) (4 pp.).
J-M. Legoff, et al., "Design Patterns for Description-Driven Systems," Jun. 30, 1999, Centre for Complex Cooperative Systems, Univ. West of England, Available on CMS information server, CMS Note 1999/045. (14 pp.).
Shen-Chou Yeh, et al., "Implementation of STEP_Based Product Data Exchange and Sharing," 2000, Concurrent Engineering, Sage Publications, http;://cer.sagepub.com/cgi/content/abstract/8/1/50. (12 pp.).
Jan Daciuk, et al., "Incremental Construction of Minimal Acyclic Finite-State Automata," 2000, Association of Computational Linguistics. (14 pp.).
T. Mannisto, "A Conceptual Modelling Approach to Product Families and their Evoluation," 2000, Acta Polytechnical Scandinavica, Mathematics and Computing Series, No. 106, Espoo, 166 p. Published by the Finnish Academies of Technology ISBN 951-666-543-8. ISSN 1456-9418. (86 pp).
F. Ohata, et al., "Analyzing dependence locality for efficient construction of program dependence graph," 2000, Elsevier Information and Software Technology. (12 pp.).
A. Preece, et al., "The KRAFT architecture for knowledge fusion and transformation," Apr. 2000, Knowledge-Based Systems, vol. 13, Issues 2-3, pp. 113-120.
John A. Reed, et al., "Improving the Aircraft Design Process Using Web-based Modeling and Simulation," May 2000, Nasa Center for Aerospace Information, NASA/TM 2000-209953. (39 pp.).
Melissa A. Schilling, "Toward a General Modular Systems Theory and Its Application to Interfirm Product Modularity," Apr. 2000, The Academy of Management Review. vol. 25, No. 2, (pp. 312-334).
Zahed Siddique, et al., "Product Family Configuration Reasoning Using Discrete Design Spaces," Sep. 10-13, 2000, Proceedings of DETC'00, ASME Design Engineering Technical Confererences and Computers and Information in Engineering Conference. (12 pp.).
Armin Stahl, et al., "A Customization Approach for Structured Products in Electronic Shops," Jun. 19-21, 2000, Electronic Commerce: The End of the Beginning, 13th International Bled Electronic Commerce Conference, Bled Slovenia. (9 pp.).
Tommi Syrjaenen, "Including Diagnostic Information in Coinfiguration Models," 2000, Appears in J. Loyd, et al, (Eds.): CL2000, LNAI 1861, 2000, Springer-Verlag, Berlin Heidelberg. (15 pp.).
Humboldt Univeristy, Berlin, Germany, "Configuration," Papers from the Workshop at ECAI 2000, Aug. 21-22, 2000, 14th European Conference on Artificial Intelligence, Humboldt University, Berlin, Germany. (106 pp.).
SAP AG, "Variant Configuration (LO-VC)," 2000, SAP AG. (332 pp.).
Michel Aldanondo, et al., "Configurator and CAD modeler: gathering the best of two worlds," (Date Unknown) DRGI Ecole des Mines d' Albi, Campus Jarlard, France. (7 pp.).
K. Narayanaswamy, et al., "Maintaining Configurations of Evolving Software Systems," Mar. 1987, IEEE Transactions on Software Engineering, vol. SE-13, No. 3. (11 pp).
Liliana Ardissono, et al., "Intelligent Interfaces for Distributed Web-Based Product and Service Configuration," Jan. 2001, ResearchGate, Conference Paper. http://www.researchgate.net/publication/221158582. (6 pp.).
S. Bergamaschi, et al., "A Data Integration Framework for e-Commerce Product Classification," Dec. 2001, ResearchGate, Chapter. http:/www.researchgate.net/publication/226011431. (16 pp.).
Ping Yi Chao, et al., "Analysis of assembly through product configuration," Mar. 2001, Computers in Industry, vol. 44, Issue 2, pp. 189-203.
Li Chen, et al., "Concurrent Parametric Design Using a Multifunctional Team Approach," Sep. 9-12, 2001, Proceedings of DETC'01, ASME 2001 Design Engineering Technical Conferences and Computers and Information Engineering Conference, Pittsburgh, PA. (12 pp.).
Dr. F. L. Bauer, "Wissensbasierte Systeme," Oct. 28-29, 1985, Springer-Verlag, Internationaler GI-Kongress'85. (416 pp).
Hans Haugeneder, et al., "Knowledge-Based Configuration of Operating Systems—Problems in Modeling the Domain Knowledge," (Date Unknown), Siemens AG, Zentralbereich Forschung und Technik, Muenchen. (14 pp).
Jeff Kramer, et al., "Dynamic Configuration for Distributed Systems," Apr. 1985, IEEE Transactions on Software Engineering, vol. Se-11, No. 4. (13 pp).
E. Lehmann, et al., "Siconfex ein Expertensystem fuer die Konfigurierung eines Betriebssystems," 1985, H.R. Hansen (ed.), GI/0CG/OEGI-Jahrestagung, Springer-Verlag, Berlin Heidelberg. (14 pp).
E. Lehmann, et al., "Siconfex an Expert System for the Configuration of an Operating System," 1985, Siemens AG, Information Technology Center, Munich. (24 pp).
Michael D. Rychener, PSRL: An SRL-Based Production Rule System Reference Manual for PSRL Version 1.2, Dec. 1984, Intelligent Systems Latoratory, The Robotics Institute, Carnegie-Mellon University, CMU-RI-TR-85-7. (116 pages).
Mark Stefik, et al., "Object-Oriented Programming:Themes and Variations," 1985, AI Magazine, vol. 6, No. 4. (23 pp).
Vasant Dhar, et al., "Rule-Based versus Structure-Based Models for Explaining and Generating Expert Behavior," Jun. 1987, Communication of the ACM, vol. 30, No. 6. (14 pp).
William P. Birmingham, et al., "MICON: A Single-Board Computer Synthesis Tool," Jan. 1988, IEEE, 8755-3996/88/0100-003751.00. (10 pp).
Kam et al., Multi-valued decision diagrams: theory and Applications:, Multi-valued logic, 1998.
E. Kroll, et al., Edited by D.T. Pham, PhD., "Intelligent Analysis and Synthesis Tools for Assembly-Oriented Design," 1991, Aritificial Intelligence in Design, Springer-Verlag, Artificial Intelligence in Industry. (27 pp.).
Alexander G. M. Smith, et al., "Handyman—A Multiuser Puppeteering System for Computer Graphics Motion control," Aug. 1, 1991, School of Computer Science, Carleton University, Ottawa, Ontario. (40 pp.).
Richard J. Waldinger, et al., "Proving Properties of Rule-Based Systems," 1991, Artificial Intelligence Center, SRI International, IEEE. (8 pp.).
Esther Dyson, "Release 1.0 Smart Recognition: The Brain Behind the Screen," A Monthly Report, Oct. 31, 1991, Trilogy Development Group, EDventure Holdings, Inc., New York, NY. (20 pp.).

(56) References Cited

OTHER PUBLICATIONS

N. R. Ball, et al., "The Integrated Design Framework, Supporting the design process using a blackboard system," 1992 Kluwer Academic Publishers, J.S. Gero (ed.), Artificial Intelligence in Design, pp. 327-348.
S. Bhansali, et al., "Kase: An Integrated Environment for Software Design," Knowledge Systems Laboratory, Stanford University, 1992 Kluwer Academic Publishers, J.S. Gero (ed.), Artificial Intelligence in Design, pp. 371-389.
Joerg Biethahn, et al., "Wissenbasierte Systeme in der Wirtschaft," 1992, Gabler (218 pp.).
D. P. Finn et al., "An Intelligent Modelling Assistant for Preliminary Analysis in Design," 1992 Kluwer Academic Publishers, J.S. Gero (ed.), Artificial Intelligence in Design, pp. 579-596.
Hartmut Fischer, "Proo VER—A knowledge-based configuration system," 2015, info©updragshuse.se, https://translate.googleusercontent.com/translate. (23 pp.).
Andreas Guenter, et al., "Flexible Control in Expert Systems for Construction Tasks," 1992 Kluwer Academic Publishers, Boston, Journal of Applied Intelligence 2, pp. 369-385.
Manfred Kopisch, et al., "Configuration of a Passenger Aircraft Cabin based on Conceptual Heirarchy, Constraints and flexible Control," (Date Unknown) University of Hamburg, FB Informatik, Hamburg, Germany. (10 pp.).
Alexander Kott, et al., "Configuration Tree Solver: A Technology for Automated Design and Configuration," Mar. 1992, ASME Journal of Mechanical Design 114(1), (17 pp.)..
D. Loedel, et al., "Kobination von Hypermedia und wissensbasierten Elementen in einem Blektronischen Produktkatalog der Bueromaschinenindustrie," 1992. (12 pp.).
Ojelanki K. Ngwenyama, et al., "A Formal Method for Analyzing and Integrating the Rule-Sets of Multiple Experts," 1992, Pergamon Press plc, Information Systems vol. 17, No. 1, pp. 1-16.
Alun D. Preece, et al., "Verifying and Testing Expert System Conceptual Models," 1992, IEEE (6 pp.).
Alun D. Preece, et al., "Verifying Expert Systems: A Logical Framework and a Practical Tool," 1992, Pergamon Press plc, Expert Systems With Applications, vol. 5, pp. 421-436.
Gary Lee Snavely, "An Abstraction-Based Methodology for Mechanical Configuration Design," 1992, Doctor of Philosophy, (Mechanical Engineering), University of Michigan. (12 pp.).
Jyh-Cheng Yu, et al., "Computer-aided design for manufacturing process selection," 1993, Journal of Intelligent Mfg., pp. 199-208.
Tomas Axling, et al., "A Tool for Developing Interactive Configuration Applications," 1994, Elsevier Science, Inc., Journal of Logic Programming. (22 pp.).
Tomas Axling, et al., "A Tool for Developing Interactive Configuration Applications," 1993, Royal Institute of Technology, Stockholm, Sweden. (38 pp.).
David W. Banton, Captain, USAF, "A Decision Criteria to Select an Associate-Memory Organization that Minimizes the Execution Time of a Mix of Associative-Search Operations," Jul., 1993, School of Engineering, Air Force Institute of Technology, Air University. (204 pp.).
Barbara T. Blaustein, et al., "A Model of Atomicity for Multilevel Transactions," The MITRE Corporation, 1993, IEEE. (15 pp.).
M.J. Euwe, et al. "Knowledge Engineering, Configuration of complex products," 1993, Computers in Industry 21, Elsevier (10 pp.).
Anurag P. Gupta, et al., "Automating the Design of Computer Systems," Apr., 1993, IEEE Transactions on Computer-Aided Design of Integrated Circuits and Systems, vol. 12, No. 4. (15 pp.).
David Horneys, "A Better Way to Build to Order," Aug. 13, 1993, Machine Design, CAD/CAM/DFM, Engineering and Technology Guide. (2 pp.).
Musa Jafar, et al., "Interactive Verification of Knowledge-Based Systems," Feb. 1993, IEEE Special Feature. (8 pp.).
D. Xue, et al. "Developing a quantitative intelligent system for implementing concurrent engineering design," 1994, Journal of Intelligent Mfg-5, pp. 251-267.
Alan C. Lin, et al, "3D Maps: Three-dimensional mechanical assembly planning system," 1993, Journal of Mfg. Systems 12.6. (28 pp.).
Bashar Nuseibeh, et al., "Expressing the Relationships Between Multiple Views in Requirements Specification," May 1993, IEE CS Press, 15th Intl Conference on Software Engineering. (10 pp.).
Hannu Peltonen, et al., "Product Configurations—An Application for Prototype Object Approach," 1994, Object-Driented Programming, M. Tokoro, et al. (Eds.), 8th ECOOP Conference, Lecture Notes in Computer Science 821, Springer-Verlag, pp. 513-534.
Faruk Polat, et al., "UVT: A Unification-Based Tool for Knowledge Base Verification.," Jun., 1993, Validation and Verification of Knowledge-Based Systems, IEEE. (7 pp.).
Gary L. Snavely, et al., "Abstraction as a Configuration Design Methodology," (Date Unknown) Dept. of Mechanical Engineering and Applied Mechanics, The University of Michigan, Ann Arbor, MI. (22 pp.).
A. R. R Venkatachalam, et al., "A knowledge-based approach to design for manufacturability," 1993, Journal of Intelligent Mfg., pp. 355-366.
Jeffrey Weiss, et al, "Putting data on a diet," Aug. 1993, Communications Turorial, Telco Systems, IEEE Spectrum. (4 pp.).
G. Winstanely, et al., "A computer-based configuration and planning system," May 1993, Butterworth-Heinemann Ltd., vol. 11, No. 2. (8 pp.).
Jon R. Wright, et al., "A Knowledge-Based Configurator That Supports Sales, Engineering, and Manufacturing at At&T Network Systems," 1993, Al Magazine, vol. 14, No. 3. (12 pp.).
Tomas Axling, et al., "A Tool for Developing Interactive Configuration Applications," Mar. 8, 1994, Swedish Institute of Computer Science, Kista, Sweden. (19 pp.).
Israel Z. Ben-Shaul, et al., "A Configuration Process for a Distributed Software Development Environment," 1994, IEEE. (12 pp.).
S. Bradley, et al, "Intelligent Engineering Component Catalogs," 1994, Kluwer Academic Publishers, J.S. Gero, et al, (eds.), Artificial Intelligence in Design, pp. 641-658.
Yon-Chun Chou, et al., "Automatic Design of Machining Fixtures: Conceptual Design," 1994, Advanced Mfg Technology, Springer-Verlag London Ltd. (10 pp.).
M. J. Clayton, et al., "Interpretation Objects for Multi-Disciplinary Design," 1994 Kluwer Academic Publishers, J.S. Gero, et al. (eds.), Artificial Intelligence in Design, pp. 573-590.
G. Cleland, et al., "A Knowledge-Based Systems Approach to the Layout Design of Large Made-to-Order Products," 1994 Kluwer Academic Publishers, J.S. Gero, et al. (eds.), Artificial Intelligence in Design, pp. 257-274.
Timothy P. Darr, et al., "An Attribute-Space Representation and Algorithm for Concurrent Engineering," Oct., 1994, The University of Michigan, Dept. of Electrical Engineering and Computer Science, Ann Arbor, MI. (21 pp.).
George Demetriou, "PAP'94: 2nd International Conference on the Practical Application of Prolog," Mar., 1995, Conference Reports, AICOM vol. 8, Nr. 1. (2 pp.).
Jacky Estublier, et al., "The Adele Configuration Manager," 1994, Configuration Management, John Wiley & Son Ltd. (35 pp.).
Robert George, "Configurators Provide a Tool for Cyle Time Reduction," (Date Unknown) (13 pp.).
A. Kamel, et al., "Multiple Design: An Extension of Routine Design for Generating Multiple Design Alternatives," 1994 Kluwer Academic Publishers, J.S. Gero, et al. (eds.), Artificial Intelligence in Design, pp. 275-292.
Robert Kramer, et al., "The Combining DAG: A Technique for Parallel Data Flow Analysis," Aug. 1994, IEEE Transactions on Parallel and Distributed Systems, vol. 5, No. 8. (9 pp.).
Hao Yang, et al., "Procase: a case-based process planning system for machining of rotational parts," 1994, Journal of Intelligent Mfg., pp. 411-430.
Al Roth, et al., "Proceedings of the Second International Conference on the Practical Application Prolog," Apr. 1994, Royal Society of Arts, London, UK. (6 pp.).

\* cited by examiner

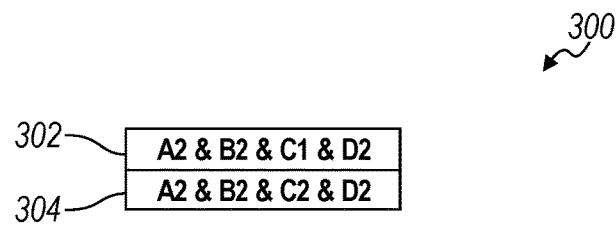
FIG. 3
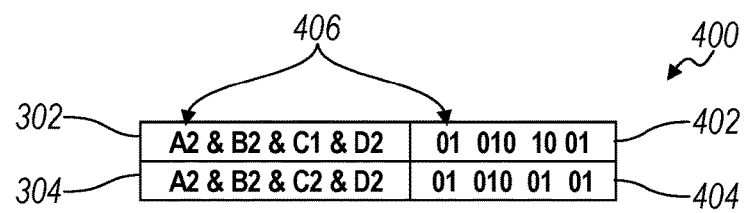
FIG. 4
| COLUMN | 0 | 1 | 2 | 3 | 4 | 5 | 6 | 7 | 8 |
|---|---|---|---|---|---|---|---|---|---|
| FAMILY | A | A | B | B | B | C | C | D | D |
| FEATURE | A1 | A2 | B1 | B2 | B3 | C1 | C2 | D2 | D2 |
FIG. 5

FIG. 6

| | | | |
|---|---|---|---|
| 602 → | CONFIGURATION #1 | A2 & B2 & C1 & D2 | 01 010 10 001 |
| 604 → | CONFIGURATION #2 | A1 & B2 & C1 & D2 | 10 010 10 001 |
| 606 → | SUPERCONFIGURATION | (A1\|A2) & B2 & C1 & D2 | 11 010 10 001 |

| | | | |
|---|---|---|---|
| 702 → | SUPERCONFIGURATION #1 | (A1\|A2) & (B2\|B3) & C1 & D2 | 11 011 10 010 |
| 704 → | SUPERCONFIGURATION #2 | (A1\|A2) & (B2\|B3) & C1 & D3 | 11 011 10 001 |
| 706 → | SUPERCONFIGURATION #3 | (A1\|A2) & (B2\|B3) & C1 & (D2\|D3) | 11 011 10 011 |

802 →  OR  10 110 11 010        AND  10 110 11 010  ← 804
              10 010 01 011              10 010 01 011
         =    10 110 11 011         =    10 010 01 010

|   | A | B | C | D | | | | | | | | |
|---|---|---|---|---|---|---|---|---|---|---|---|---|
|   | 01 | 100 | 10 | 11 | (A2) | & | (B1) | & | (C1) | & | (D1\|D2) |
| AND | 01 | 011 | 10 | 01 | (A2) | & | (B2\|B3) | & | (C1) | & | (D2) |
| = | 01 | 000 | 10 | 01 | (A2) | & | ( ) | & | (C1) | & | (D2) |

| | PKG.400 | PKG.401 | PKG.402 | RADIO.STD | RADIO.DLX | RADIO.NAV | PAINT.WHITE | PAINT.RED | PAINT.BLUE | TRIM.STONE | TRIM.CHARCOAL | TRIM.RUBY | MOONRF.LESS | MOONRF.VISTA |
|---|---|---|---|---|---|---|---|---|---|---|---|---|---|---|
| 1308 → | 1 | 0 | 0 | 1 | 0 | 0 | 1 | 1 | 0 | 1 | 0 | 0 | 1 | 0 |
| | 0 | 1 | 1 | 0 | 1 | 1 | 0 | 0 | 1 | 0 | 1 | 0 | 1 | 1 |
| | 0 | 1 | 1 | 0 | 1 | 0 | 0 | 1 | 1 | 0 | 0 | 1 | 1 | 1 |
| | 0 | 1 | 0 | 0 | 0 | 1 | 0 | 1 | 1 | 0 | 0 | 1 | 1 | 1 |
| | 0 | 0 | 1 | 0 | 0 | 1 | 0 | 1 | 0 | 0 | 0 | 1 | 1 | 1 |

*1000*

|   | A | B | C | D | | | | |
|---|---|---|---|---|---|---|---|---|
| SC1 | 01 | 110 | 10 | 11 | [A2] | [B1,B2] | [C1] | [D1,D2] |
| SC2 | 11 | 011 | 10 | 01 | [A1,A2] | [B2,B3] | [C1] | [D2] |
| OVERLAP | 01 | 010 | 10 | 01 | [A2] | [B2] | [C1] | [D1,D2] |

1102 → SC1
1104 → SC2
1106 → OVERLAP
1108
1100

FIG. 11

| FEATURE COMBINATION | FEATURE MASK | | | | |
|---|---|---|---|---|---|
|  | A | B | C | D | E |
| A2 OR A3 | 011 | 111 | 111 | 111 | 11 |
| B3 | 111 | 001 | 111 | 111 | 11 |
| (A2 OR A3) AND B3 | 011 | 001 | 111 | 111 | 11 |

| VEHICLE | # FAMILIES | # CONFIGURATIONS | MATRIX ROWS | MDD NODES | MATRIX SIZE | MDD SIZE |
|---|---|---|---|---|---|---|
| VEHICLE A | 28 | 813,568 | 19 | 19 | 20KB | 20KB |
| VEHICLE B | 84 | 147,348,398,616,576 | 264,358 | 11,960 | 23,026KB | 766KB |
| VEHICLE C | 92 | 27,254,571,868,219,300 | OUT OF MEMORY | 4,860 | N/A | 313KB |

| PKG.400 | PKG.401 | PKG.402 | RADIO.STD | RADIO.DLX | RADIO.NAV | PAINT.WHITE | PAINT.RED | PAINT.BLUE | TRIM.STONE | TRIM.CHARCOAL | TRIM.RUBY | MOONRF.LESS | MOONRF.VISTA |
|---|---|---|---|---|---|---|---|---|---|---|---|---|---|
| 0 | 1 | 0 | 0 | 0 | 1 | 0 | 1 | 1 | 0 | 0 | 1 | 0 | 1 |
| 0 | 0 | 1 | 0 | 0 | 1 | 0 | 1 | 0 | 0 | 0 | 1 | 0 | 1 |

| TIMES (MS) FOR 1000 OPERATIONS | | | QUICK-RESTRICT WITH DOMAIN AND RESET | | READ-ONLY RESTRICTED DOMAIN | |
|---|---|---|---|---|---|---|
| MARKET | VEHICLE | MDD # NODES | TOTAL | AVERAGE | TOTAL | AVARAGE |
| US | A | 1,023 | 79 | 0.079 | 75 | 0.075 |
| US | B | 8,842 | 604 | 0.604 | 194 | 0.194 |
| US | C | 96,576 | 5,656 | 5.656 | 1,319 | 1.319 |
| GREAT BRITAIN | D | 235,508 | 13,494 | 13.494 | 3,672 | 3.672 |
| GERMANY | E | 491,712 | 24,608 | 24.608 | 6,418 | 6.418 |

FIG. 29

| 3000 | | | | | |
|---|---|---|---|---|---|
| PKG.400 | PKG.401 | PKG.402 | TRIM.STONE | TRIM.CHARCOAL | TRIM.RUBY |
| 1 | 0 | 0 | 1 | 0 | 0 |
| 0 | 1 | 1 | 0 | 1 | 0 |
| 0 | 1 | 1 | 0 | 0 | 1 |
| 0 | 1 | 0 | 0 | 0 | 1 |
| 0 | 0 | 1 | 0 | 0 | 1 |

| 3100 | | | | | |
|---|---|---|---|---|---|
| PKG.400 | PKG.401 | PKG.402 | TRIM.STONE | TRIM.CHARCOAL | TRIM.RUBY |
| 1 | 0 | 0 | 1 | 0 | 0 |
| 0 | 1 | 1 | 0 | 1 | 1 |

| 3300 |
|---|
| [BLUE, CHARCOAL] |
| [BLUE, RUBY] |
| [RED, RUBY] |
| [RED, STONE] |
| [WHITE, STONE] |

FIG. 35

|   | PKG.400 | PKG.401 | PKG.402 | RADIO.STD | RADIO.DLX | RADIO.NAV | PAINT.WHITE | PAINT.RED | PAINT.BLUE | TRIM.STONE | TRIM.CHARCOAL | TRIM.RUBY | MOONRF.LESS | MOONRF.VISTA |
|---|---|---|---|---|---|---|---|---|---|---|---|---|---|---|
| 1 | 1 | 0 | 0 | 1 | 0 | 0 | 1 | 1 | 0 | 1 | 0 | 0 | 1 | 0 |
| 2 | 0 | 1 | 1 | 0 | 1 | 1 | 0 | 0 | 1 | 0 | 1 | 0 | 1 | 1 |
| 3 | 0 | 1 | 1 | 0 | 1 | 0 | 0 | 1 | 1 | 0 | 0 | 1 | 1 | 1 |
| 4 | 0 | 1 | 0 | 0 | 0 | 1 | 0 | 1 | 1 | 0 | 0 | 1 | 1 | 1 |
| 5 | 0 | 0 | 1 | 0 | 0 | 1 | 0 | 1 | 0 | 0 | 0 | 1 | 1 | 1 |

FIG. 36

| | SELECTIONS | RESTRICTED DOMAIN | | | | | AVAILABLE |
|---|---|---|---|---|---|---|---|
| | | PKG | RADIO | PAINT | TRIM | MOONRF | |
| SELECTED | RED,RUBY | 011 | 011 | 010 | 001 | 11 | [401,402] [DLX,NAV] [RED] [RUBY] [LESS,VISTA] |
| SELECTED-RUBY | RED | 111 | 111 | 010 | 101 | 11 | [STONE,RUBY] |
| SELECTED-RED | RUBY | 011 | 011 | 011 | 001 | 11 | [RED,BLUE] |
| | | 011 | 011 | 011 | 101 | 11 | |

AVAILABILITY BITSET

FIG. 37

| | SELECTIONS | RESTRICTED DOMAIN | | | | | INCLUDED |
|---|---|---|---|---|---|---|---|
| | | PKG | RADIO | PAINT | TRIM | MOONRF | |
| SELECTED-RED | PKG.401 | 010 | 011 | 011 | 011 | 11 | |
| SELECTED-401 | PAINT.RED | 111 | 111 | 010 | 101 | 11 | |
| SELECTED | PKG.401 & PAINT.RED | 010 | 011 | 010 | 001 | 11 | TRIM.RUBY |

FIG. 38

| STATE | FEATURES |
|---|---|
| SELECTED | PAINT.RED TRIM.RUBY |
| INCLUDED | |
| AVAILABLE | PKG.401, PKG.402, RADIO.DLX, RADIO.NAV, PAINT.BLUE, TRIM.STONE, MOONRF.LESS, MOONRF.VISTA |
| EXCLUDED | PKG.400, RADIO.STD, PAINT.WHITE, TRIM.CHARCOAL |

| PRIOR CONFIG | SELECTED (400) INCLUDED (STD, STONE, LESS) DEFAULT (WHITE) |
|---|---|
| NEW CONFIG | SELECTED (CHARCOAL) INCLUDED (BLUE) DEFAULT (401,DLX, LESS) |

| RETURN DELTA | ADDITIONS AND SUBSTRACTIONS |
|---|---|
| FALSE | <ADDITIONS> |
| | <FEATURE ID = "BLUE" GROUP = "PAINT" DESCRIPTION = "BLUE" STATE = "INCLUDED"/> |
| | </ADDITIONS> |
| | <SUBTRACTIONS> |
| | <FEATURE ID = "400" GROUP = "PACKAGE" DESCRIPTION = "400" STATE = "SELECTED"/> |
| | </SUBTRACTIONS> |
| TRUE | <ADDITIONS> |
| | <FEATURE ID = "401" GROUP = "PACKAGE" DESCRIPTION = "401" STATE = "DEFAULT"/> |
| | <FEATURE ID = "DLX" GROUP = "RADIO" DESCRIPTION = "DELUXE" STATE = "DEFAULT"/> |
| | <FEATURE ID = "BLUE" GROUP = "PAINT" DESCRIPTION = "BLUE" STATE = "INCLUDED"/> |
| | <FEATURE ID = "CHARCOAL" GROUP = "TRIM" DESCRIPTION = "CHARCOAL" STATE = "SELECTED"/> |
| | </ADDITIONS> |
| | <SUBTRACTIONS> |
| | <FEATURE ID = "400" GROUP = "PACKAGE" DESCRIPTION = "400" STATE = "SELECTED"/> |
| | <FEATURE ID = "STD" GROUP = "RADIO" DESCRIPTION = "STANDARD" STATE = "INCLUDED"/> |
| | <FEATURE ID = "WHITE" GROUP = "PAINT" DESCRIPTION = "WHITE" STATE = "DEFAULT"/> |
| | <FEATURE ID = "STONE" GROUP = "TRIM" DESCRIPTION = "STONE" STATE = "INCLUDED"/> |
| | </SUBTRACTIONS> |

FIG. 53

CONFLICT RESOLUTION
TO SELECT TRIM CHARCOAL, YOU MUST:
- REMOVE PACKAGE 400
- ADD PAINT BLUE

[ OK ] [ CANCEL ]

FIG. 54

CONFLICT RESOLUTION
TO SELECT TRIM CHARCOAL, YOU MUST CHANGE:
- PACKAGE FROM 400 TO 401
- RADIO FROM STANDARD TO DELUXE
- PAINT FROM WHITE TO BLUE

[ OK ] [ CANCEL ]

| 010 011 001 010 10 | [401, DLX, BLUE, CHARCOAL, LESS] |
| | [401, NAV, BLUE, CHARCOAL, LESS] |
| 001 011 001 010 10 | [402, DLX, BLUE, CHARCOAL, LESS] |
| | [402, NAV, BLUE, CHARCOAL, LESS] |

| CONFLICT RESOLUTION |
|---|
| TO ADD CHARCOAL, YOU MUST: |
| CHANGE PACKAGE 400 TO ONE OF:<br>☑ 401<br>☐ 402<br><br>CHANGE RADIO STD TO ONE OF:<br>☐ DELUXE<br>☑ NAVIGATION<br><br>CHANGE PAINT FROM WHITE TO BLUE.<br><br>                          OK   CANCEL |

FIG. 57

FIG. 65 — 6500
| INVALID CONFIG | | | | |
|---|---|---|---|---|
| 010 | 100 | 100 | 100 | 10 |

FIG. 66 — 6600
| MINIMUM EDIT SPACE | | | | |
|---|---|---|---|---|
| PKG | RADIO | PAINT | TRIM | MOONRF |
| 010 | 011 | 010 | 001 | 10 |
| 010 | 011 | 001 | 011 | 10 |

FIG. 67 — 6700
| PKG | RADIO | PAINT | TRIM | MOONRF | |
|---|---|---|---|---|---|
| 010 | 011 | 011 | 011 | 10 | MINIMUM EDIT |
| 010 | 100 | 100 | 100 | 10 | INVALID CONFIG |
| 010 | 000 | 000 | 000 | 10 | AND |

6702

FIG. 68 — 6800
| TRIMMED MINIMUM EDIT SPACE | | |
|---|---|---|
| RADIO | PAINT | TRIM |
| 011 | 010 | 001 |
| 011 | 001 | 011 |

FIG. 69 — 6900
| TRIMMED MINIMUM EDIT SPACE | | |
|---|---|---|
| RADIO | PAINT | TRIM |
| 011 | 010 | 001 |

FIG. 70 — 7000
| TRIMMED MINIMUM EDIT SPACE | | |
|---|---|---|
| RADIO | PAINT | TRIM |
| 011 | 001 | 011 |

FIG. 71 — 7100

```
RESOLUTION {
 ACTIONS [
  ACTION { RADIO, [STD], [DLX, NAV] } }
  ACTION { PAINT, [WHITE], [RED, BLUE],
   BRANCHES {
    RED ->  RESOLUTION {
              ACTIONS [ ACTION { TRIM, [STONE], [RUBY] } ]
            }
    BLUE -> RESOLUTION {
              ACTIONS [ ACTION { TRIM, [STONE], [CHARCOAL, RUBY] } ]
            }....
```

```
┌─────────────────────────────────────┐      7200
│ CONFLICT RESOLUTION                 │      ↙
├─────────────────────────────────────┤
│ TO SELECT PACKAGE 401, YOU MUST:    │
├─────────────────────────────────────┤
│ CHANGE RADIO FROM STANDARD TO ONE OF:│
│    ☐ DELUXE                         │
│    ☐ NAVIGATION                     │
│                                     │
│ CHANGE PAINT FROM WHITE TO ONE OF:  │
│    ☐ RED                            │
│    ☐ BLUE                           │
│                                     │
│               [ OK ] [ CANCEL ]     │
└─────────────────────────────────────┘
```

FIG. 72

```
┌─────────────────────────────────────┐      7300
│ CONFLICT RESOLUTION                 │      ↙
├─────────────────────────────────────┤
│ TO SELECT PACKAGE 401, YOU MUST:    │
├─────────────────────────────────────┤
│ CHANGE INTERIOR TRIM COLOR          │
│ FROM STONE TO RUBY                  │
│                                     │
│                                     │
│               [ OK ] [ CANCEL ]     │
└─────────────────────────────────────┘
```

FIG. 73

```
┌─────────────────────────────────────┐      7400
│ CONFLICT RESOLUTION                 │      ↙
├─────────────────────────────────────┤
│ TO SELECT PACKAGE 401, YOU MUST:    │
├─────────────────────────────────────┤
│ CHANGE INTERIOR TRIM COLOR          │
│ STONE TO ONE OF:                    │
│    ☐ CHARCOAL                       │
│    ☐ RUBY                           │
│                                     │
│               [ OK ] [ CANCEL ]     │
└─────────────────────────────────────┘
```

FIG. 74

| PATH | TARGET CONFIG | WEIGHT |
|---|---|---|
| 2-10-11-12-13-14-T | D2 A1 E2 B2 C2 F2 | 010100 |
| 2-10-11-15-16-14-T | D2 A1 E3 B3 C2 F2 | 000110 |

| E | F | Y | T | R | P | S | A |
|---|---|---|---|---|---|---|---|
| 01 | 10 | 001001 | 10 | 1000 | 101 | 000011 | 01 |
| 10 | 01 | 000110 | 11 | 0100 | 100 | 001000 | 01 |
| 10 | 01 | 001001 | 11 | 1000 | 101 | 000011 | 01 |
| 10 | 01 | 001001 | 11 | 0001 | 111 | 000100 | 10 |
| 10 | 01 | 110000 | 11 | 0010 | 111 | 110000 | 01 |

FIG. 77

| E | F | Y | T | R | P | S | A |
|---|---|---|---|---|---|---|---|
| 10 | 01 | 000110 | 01 | 0100 | 100 | 001000 | 01 |
| 10 | 01 | 001001 | 01 | 1000 | 101 | 000011 | 01 |
| 10 | 01 | 001001 | 01 | 0001 | 111 | 000100 | 10 |
| 10 | 01 | 110000 | 01 | 0010 | 111 | 110000 | 01 |

FIG. 78

| E | F | Y | T | R | P | S | A |
|---|---|---|---|---|---|---|---|
| 10 | 01 | 001000 | 01 | 1000 | 100 | 000010 | 01 |

FIG. 79

| | | | | | | | |
|---|---|---|---|---|---|---|---|
| INVALID | E2 | F1 | Y3 | T2 | R1 | P1 | S5 | A2 |
| TARGET 1 | E1 | F2 | Y1 | T2 | R3 | P1 | S1 | A2 |

FIG. 80

| | | | | | | | |
|---|---|---|---|---|---|---|---|
| INVALID | E2 | F1 | Y3 | T2 | R1 | P1 | S5 | A2 |
| TARGET 2 | E1 | F2 | Y3 | T2 | R1 | P1 | S5 | A2 |

FIG. 81

| ALT SEQUENCE STRUCTURE | | |
|---|---|---|
| FEATURE | INDEX IN FAMILY | INDEX IN STRUCTURE |
| PKG.400 | 0 | 0 |
| PKG.401 | 1 | 1 |
| PKG.402 | 2 | 2 |
| RADIO.STD | 0 | 3 |
| RADIO.DLX | 1 | 4 |
| RADIO.NAV | 2 | 5 |
| PAINT.WHITE | 0 | 6 |
| PAINT.RED | 1 | 7 |
| PAINT.BLUE | 2 | 8 |
| TRIM.STONE | 0 | 9 |
| TRIM.CHARCOAL | 1 | 10 |
| TRIM.RUBY | 2 | 11 |
| MOONRF.LESS | 0 | 12 |
| MONNRF.VISTA | 1 | 13 |

| PATH | WEIGHT |
|---|---|
| 6-T | 000 000 001 000 00 |
| 10-6-T | 000 000 001 010 00 |
| 9-10-6-T | 001 000 001 010 00 |

| PATH | WEIGHT |
|---|---|
| 5-RUBY-7-T | 000 000 001 001 00 |
| 5-CHARCOAL-6-T | 000 000 001 010 00 |

—8702

Table 9100

| | | | | | | | | | BUILDABLE SPACE | | | | | | | | | |
|---|---|---|---|---|---|---|---|---|---|---|---|---|---|---|---|---|---|---|
| PKG.400 | PKG.401 | PKG.402 | RADIO.STD | RADIO.DLX | RADIO.NAV | PAINT.WHITE | PAINT.RED | PAINT.BLUE | TRIM.STONE | TRIM.CHARCOAL | TRIM.RUBY | MOONRF.LESS | MOONRF.VISTA | DICE.NODICE | DICE.FUZZYDICE | TEMP.LESSTEMP | TEMP.HEAT | TEMP.HEATCOOL |
| 1 | 0 | 0 | 1 | 0 | 0 | 0 | 1 | 0 | 1 | 0 | 0 | 1 | 0 | 0 | 1 | 1 | 0 | 0 |
| 0 | 1 | 0 | 0 | 1 | 1 | 0 | 1 | 0 | 0 | 0 | 1 | 1 | 1 | 0 | 1 | 0 | 1 | 0 |
| 0 | 1 | 0 | 0 | 1 | 1 | 0 | 0 | 1 | 0 | 1 | 1 | 1 | 1 | 0 | 1 | 0 | 1 | 0 |
| 0 | 0 | 1 | 0 | 1 | 0 | 0 | 1 | 0 | 0 | 0 | 1 | 1 | 1 | 0 | 1 | 0 | 0 | 1 |
| 0 | 0 | 1 | 0 | 1 | 0 | 0 | 0 | 1 | 0 | 1 | 1 | 1 | 1 | 0 | 1 | 0 | 0 | 1 |
| 0 | 0 | 1 | 0 | 0 | 1 | 0 | 1 | 0 | 0 | 0 | 1 | 1 | 1 | 0 | 1 | 0 | 0 | 1 |
| 0 | 0 | 1 | 0 | 0 | 1 | 0 | 0 | 1 | 0 | 1 | 0 | 1 | 1 | 0 | 1 | 0 | 0 | 1 |
| 1 | 0 | 0 | 1 | 0 | 0 | 1 | 0 | 0 | 1 | 0 | 0 | 1 | 0 | 1 | 0 | 1 | 0 | 0 |

FIG. 91

Table 9200

| | | | | | | | | | | STANDARD FEATURE CONDITIONS | | | | | | | | | |
|---|---|---|---|---|---|---|---|---|---|---|---|---|---|---|---|---|---|---|---|
| | | PKG.400 | PKG.401 | PKG.402 | RADIO.STD | RADIO.DLX | RADIO.NAV | PAINT.WHITE | PAINT.RED | PAINT.BLUE | TRIM.STONE | TRIM.CHARCOAL | TRIM.RUBY | MOONRF.LESS | MOONRF.VISTA | DICE.NODICE | DICE.FUZZYDICE | TEMP.LESSTEMP | TEMP.HEAT | TEMP.HEATCOOL |
| 9202 | PKG | 1 | 0 | 0 | 1 | 1 | 1 | 1 | 1 | 1 | 1 | 1 | 1 | 1 | 1 | 1 | 1 | 1 | 1 | 1 |
| 9204 | RADIO | 1 | 0 | 0 | 1 | 0 | 0 | 1 | 1 | 1 | 1 | 1 | 1 | 1 | 1 | 1 | 1 | 1 | 1 | 1 |
| | | 0 | 1 | 1 | 0 | 1 | 0 | 1 | 1 | 1 | 1 | 1 | 1 | 1 | 1 | 1 | 1 | 1 | 1 | 1 |
| | MOONRF | 1 | 1 | 1 | 1 | 1 | 1 | 1 | 1 | 1 | 1 | 1 | 1 | 1 | 0 | 1 | 1 | 1 | 1 | 1 |
| 9206 | DICE | 1 | 1 | 1 | 1 | 1 | 1 | 1 | 0 | 0 | 1 | 1 | 1 | 1 | 1 | 1 | 0 | 1 | 1 | 1 |
| | | 1 | 1 | 1 | 1 | 1 | 1 | 0 | 1 | 1 | 1 | 1 | 1 | 1 | 1 | 0 | 1 | 1 | 1 | 1 |
| 9208 | TEMP | 1 | 0 | 0 | 1 | 1 | 1 | 1 | 1 | 1 | 1 | 1 | 1 | 1 | 1 | 1 | 1 | 1 | 0 | 0 |
| | | 0 | 1 | 0 | 1 | 1 | 1 | 1 | 1 | 1 | 1 | 1 | 1 | 1 | 1 | 1 | 1 | 0 | 1 | 0 |
| 9210 | | 0 | 0 | 1 | 1 | 1 | 1 | 1 | 1 | 1 | 1 | 1 | 1 | 1 | 1 | 1 | 1 | 0 | 0 | 1 |

FIG. 92

RESTRICT BUILDABLE SPACE TO MINIMALLY COMPLETE CONFIGURATION
FOR (EACH FAMILY FA$_i$ TO AUTOCOMPLETE, IN PRIORITY ORDER) {   ←—9301
   // IDENTIFY POSSIBLE CHOICES
   POSSIBLE = [ ];   ←—9302
   FOR (EACH FEATURE FEAT$_j$ IN FA$_i$) {
     IF (STD$_j$ ! = NULL && MDD.CONTAINSANY (STD$_j$)) {   ←—9304
       POSSIBLE.ADD (FEAT$_j$)
     }
   }
   IF (POSSIBLE.ISEMPTY) {
     POSSIBLE = MDD.FINDDOMAIN.TOLISTACTIVE(FA$_i$)   ←—9306
   }
   // MAKE SELECTION
   COLLECTION.SORT(POSSIBLE, ALTSEQUENCE)   ←—9308
   CHOICE = POSSIBLE.GET(0)
   // RESTRICT SPACE
   MDD.QUICKRESTRICT(CHOICE)
}

FIG. 93

| GLOBAL SPACE | | | | | | | | | | | | |
|---|---|---|---|---|---|---|---|---|---|---|---|---|
| | V | K | I | M | E | F | Y | T | R | P | S | A | B |
| MAIN | 111 | 11 | 11 | 1111 | 01 | 10 | 001001 | 10 | 1000 | 101 | 000011 | 01 | 11 |
| | 111 | 11 | 11 | 1111 | 10 | 01 | 000110 | 11 | 0100 | 100 | 001000 | 01 | 11 |
| | 111 | 11 | 11 | 1111 | 10 | 01 | 001001 | 11 | 0001 | 111 | 000100 | 10 | 11 |
| | 111 | 11 | 11 | 1111 | 10 | 01 | 001001 | 11 | 1000 | 101 | 000011 | 01 | 11 |
| | 111 | 11 | 11 | 1111 | 10 | 01 | 110000 | 11 | 0010 | 111 | 110000 | 01 | 11 |
| B <- [Y] | 111 | 11 | 11 | 1111 | 11 | 11 | 101100 | 11 | 1111 | 111 | 111111 | 11 | 01 |
| | 111 | 11 | 11 | 1111 | 11 | 11 | 010011 | 11 | 1111 | 111 | 111111 | 11 | 10 |
| V <- [Y] | 010 | 11 | 11 | 1111 | 11 | 11 | 001001 | 11 | 1111 | 111 | 111111 | 11 | 11 |
| | 001 | 11 | 11 | 1111 | 11 | 11 | 000110 | 11 | 1111 | 111 | 111111 | 11 | 11 |
| | 100 | 11 | 11 | 1111 | 11 | 11 | 110000 | 11 | 1111 | 111 | 111111 | 11 | 11 |
| I <- [S] | 111 | 11 | 01 | 1111 | 11 | 11 | 111111 | 11 | 1111 | 111 | 011101 | 11 | 11 |
| | 111 | 11 | 10 | 1111 | 11 | 11 | 111111 | 11 | 1111 | 111 | 100010 | 11 | 11 |
| K <- [A,S] | 111 | 10 | 11 | 1111 | 11 | 11 | 111111 | 11 | 1111 | 111 | 110000 | 01 | 11 |
| | 111 | 01 | 11 | 1111 | 11 | 11 | 111111 | 11 | 1111 | 111 | 000100 | 10 | 11 |
| | 111 | 01 | 11 | 1111 | 11 | 11 | 111111 | 11 | 1111 | 111 | 001011 | 01 | 11 |
| M <- [S] | 111 | 11 | 11 | 0010 | 11 | 11 | 111111 | 11 | 1111 | 111 | 000100 | 11 | 11 |
| | 111 | 11 | 11 | 0100 | 11 | 11 | 111111 | 11 | 1111 | 111 | 001000 | 11 | 11 |
| | 111 | 11 | 11 | 1000 | 11 | 11 | 111111 | 11 | 1111 | 111 | 000011 | 11 | 11 |
| | 111 | 11 | 11 | 0001 | 11 | 11 | 111111 | 11 | 1111 | 111 | 110000 | 11 | 11 |

FIG. 100

| STANDARD FEATURE CONDITION SPACES | | | | | | | | | | | | |
|---|---|---|---|---|---|---|---|---|---|---|---|---|
| | V | K | I | M | E | F | Y | T | R | P | S | A | B |
| V3 | 001 | 11 | 11 | 1111 | 11 | 11 | 111111 | 11 | 1111 | 111 | 111111 | 11 | 11 |
| K1 | 100 | 10 | 11 | 1111 | 11 | 11 | 111111 | 11 | 1111 | 111 | 111111 | 11 | 11 |
| K2 | 011 | 01 | 11 | 1111 | 11 | 11 | 111111 | 11 | 1111 | 111 | 111111 | 11 | 11 |
| M1 | 010 | 11 | 11 | 1000 | 11 | 11 | 111111 | 11 | 1111 | 111 | 111111 | 01 | 11 |
| M2 | 001 | 11 | 11 | 0100 | 11 | 11 | 111111 | 11 | 1111 | 111 | 111111 | 11 | 11 |
| M3 | 010 | 11 | 11 | 0010 | 11 | 11 | 111111 | 11 | 1111 | 111 | 111111 | 10 | 11 |
| M4 | 100 | 11 | 11 | 0001 | 11 | 11 | 111111 | 11 | 1111 | 111 | 111111 | 11 | 11 |
| E1 | 111 | 11 | 11 | 1111 | 10 | 01 | 111111 | 11 | 1111 | 111 | 111111 | 11 | 11 |
| E2 | 010 | 11 | 11 | 1111 | 01 | 10 | 111111 | 11 | 1111 | 111 | 111111 | 11 | 11 |
| F2 | 111 | 11 | 11 | 1111 | 11 | 01 | 111111 | 11 | 1111 | 111 | 111111 | 11 | 11 |
| T1 | 111 | 11 | 11 | 1111 | 11 | 11 | 111111 | 10 | 1111 | 111 | 111111 | 11 | 11 |
| A1 | 010 | 11 | 11 | 1111 | 11 | 11 | 111111 | 11 | 0001 | 111 | 111111 | 10 | 11 |
| A2 | 101 | 11 | 11 | 1111 | 11 | 11 | 111111 | 11 | 1111 | 111 | 111111 | 01 | 11 |
| | 010 | 11 | 11 | 1111 | 11 | 11 | 111111 | 11 | 1000 | 111 | 111111 | 01 | 11 |
| B2 | 111 | 11 | 11 | 1111 | 11 | 11 | 111111 | 11 | 1111 | 111 | 111111 | 11 | 01 |
| FAMILY PRIORITY ORDER | | | | | | | | | | | | |
| V,R,K,B,A,Y,F,E,M,T,I,S,P | | | | | | | | | | | | |

FIG. 101

| CONFIGURATION | RELEVANT MDDs | CALL |
|---|---|---|
| {E1, T1} | MASK,MAIN | MAIN.CONTAINSANY (MASK) |
| {B1, E1, I1,T1} | MASK,MAIN,RELB,RELI | MAIN.CONTAINSANYPARRALLEL (MASK,RELB,RELI) |
| {K1, V1} | MASK,MAIN,RELK,RELV | MAIN.CONTAINSANYPARRALLEL (MASK,RELK,RELV) |

FIG. 102

| REL B ||||||||||||
|---|---|---|---|---|---|---|---|---|---|---|---|
| V | K | I | M | E | F | Y | T | R | P | S | A | B |
| 111 | 11 | 11 | 1111 | 11 | 11 | 010011 | 11 | 1111 | 111 | 111111 | 11 | 10 |

FIG. 103

| MAIN SPACE ||||||||||||
|---|---|---|---|---|---|---|---|---|---|---|---|
| V | K | I | M | E | F | Y | T | R | P | S | A | B |
| 111 | 11 | 11 | 1111 | 01 | 10 | 000001 | 10 | 1000 | 101 | 000011 | 01 | 10 |
| 111 | 11 | 11 | 1111 | 10 | 01 | 000010 | 11 | 0100 | 100 | 001000 | 01 | 10 |
| 111 | 11 | 11 | 1111 | 10 | 01 | 000001 | 11 | 0001 | 111 | 000100 | 10 | 10 |
| 111 | 11 | 11 | 1111 | 10 | 01 | 000001 | 11 | 1000 | 101 | 000011 | 01 | 10 |
| 111 | 11 | 11 | 1111 | 10 | 01 | 010000 | 11 | 0010 | 111 | 110000 | 01 | 10 |

FIG. 104

| REL K | | | | | | | | | | | |
|---|---|---|---|---|---|---|---|---|---|---|---|
| V | K | I | M | E | F | Y | T | R | P | S | A | B |
| 111 | 01 | 11 | 1111 | 11 | 11 | 111111 | 11 | 1111 | 111 | 001011 | 01 | 11 |
| 111 | 01 | 11 | 1111 | 11 | 11 | 111111 | 11 | 1111 | 111 | 000100 | 10 | 11 |

| MAIN SPACE | | | | | | | | | | | |
|---|---|---|---|---|---|---|---|---|---|---|---|
| V | K | I | M | E | F | Y | T | R | P | S | A | B |
| 111 | 01 | 11 | 1111 | 10 | 01 | 000010 | 11 | 0100 | 100 | 001000 | 01 | 10 |
| 111 | 01 | 11 | 1111 | 10 | 01 | 000001 | 11 | 1000 | 101 | 000011 | 01 | 10 |
| 111 | 01 | 11 | 1111 | 10 | 01 | 000001 | 11 | 0001 | 111 | 000100 | 10 | 10 |
| 111 | 01 | 11 | 1111 | 10 | 01 | 010000 | 11 | 0010 | 111 | 110000 | 01 | 10 |
| 111 | 01 | 11 | 1111 | 01 | 10 | 000001 | 10 | 1000 | 101 | 000011 | 01 | 10 |
| RELWORK | | | | | | | | | | | |
| 111 | 01 | 11 | 1111 | 11 | 11 | 111111 | 11 | 1111 | 111 | 001011 | 01 | 11 |
| 111 | 01 | 11 | 1111 | 11 | 11 | 111111 | 11 | 1111 | 111 | 000100 | 10 | 11 |

| REL M | | | | | | | | | | | |
|---|---|---|---|---|---|---|---|---|---|---|---|
| V | K | I | M | E | F | Y | T | R | P | S | A | B |
| 111 | 11 | 11 | 0100 | 11 | 11 | 111111 | 11 | 1111 | 111 | 001000 | 11 | 11 |

| RELWORK | | | | | | | | | | | |
|---|---|---|---|---|---|---|---|---|---|---|---|
| 111 | 01 | 11 | 0100 | 11 | 11 | 111111 | 11 | 1111 | 111 | 001000 | 01 | 11 |

| MAIN SPACE | | | | | | | | | | | |
|---|---|---|---|---|---|---|---|---|---|---|---|
| V | K | I | M | E | F | Y | T | R | P | S | A | B |
| 111 | 01 | 11 | 0100 | 10 | 01 | 000010 | 11 | 0100 | 100 | 001000 | 01 | 10 |
| RELWORK | | | | | | | | | | | |
| 111 | 11 | 11 | 1111 | 11 | 11 | 111111 | 11 | 1111 | 111 | 111111 | 11 | 11 |

```
RESTRICT BUILDABLE SPACE TO MINIMALLY COMPLETE CONFIGURATION          ← 11001
FOR (EACH FAMILY FA_i TO AUTOCOMPLETE, IN PRIORITY ORDER) {
    POSSIBLE = [ ];                                                    ← 11002
    FOR (EACH FEATURE FEAT_j IN Faj) {
        IF (STD_j ! = NULL && SPACE.CONTAINSANY (STD_j)) {              ← 11004
            POSSIBLE.ADD (FEAT_j)
        }
    }
    IF (POSSIBLE.ISEMPTY) {
        POSSIBLE = SPACE.FINDDOMAIN(FA)                                 ← 11006
    }
    COLLECTION.SORT(POSSIBLE, ALTSEQUENCE)                              ← 11008
    CHOICE = POSSIBLE.GET(O)
    SPACE.RESTRICT(CHOICE_j)
}
```

FIG. 110

| MAIN SPACE | | | | | | | | | | | |
|---|---|---|---|---|---|---|---|---|---|---|---|
| V | K | I | M | E | F | Y | T | R | P | S | A | B |
| 111 | 11 | 11 | 1111 | 10 | 01 | 001000 | 11 | 0001 | 100 | 000100 | 10 | 11 |
| 111 | 11 | 11 | 1111 | 10 | 01 | 001000 | 11 | 1000 | 100 | 000011 | 01 | 11 |
| RELWORK | | | | | | | | | | | |
| 111 | 11 | 11 | 1111 | 11 | 11 | 111111 | 11 | 1111 | 111 | 111111 | 11 | 11 |

FIG. 111

| MAIN SPACE | | | | | | | | | | | |
|---|---|---|---|---|---|---|---|---|---|---|---|
| V | K | I | M | E | F | Y | T | R | P | S | A | B |
| 010 | 11 | 11 | 1111 | 10 | 01 | 001000 | 11 | 0001 | 100 | 000100 | 10 | 11 |
| 010 | 11 | 11 | 1111 | 10 | 01 | 001000 | 11 | 1000 | 100 | 000011 | 01 | 11 |
| RELWORK | | | | | | | | | | | |
| 111 | 11 | 11 | 1111 | 11 | 11 | 111111 | 11 | 1111 | 111 | 111111 | 11 | 11 |

FIG. 112

| MAIN SPACE | | | | | | | | | | | |
|---|---|---|---|---|---|---|---|---|---|---|---|
| V | K | I | M | E | F | Y | T | R | P | S | A | B |
| 010 | 11 | 11 | 1111 | 10 | 01 | 001000 | 11 | 1000 | 100 | 000011 | 01 | 11 |
| RELWORK | | | | | | | | | | | |
| 111 | 11 | 11 | 1111 | 11 | 11 | 111111 | 11 | 1111 | 111 | 111111 | 11 | 11 |

FIG. 113

| MAIN SPACE | | | | | | | | | | | |
|---|---|---|---|---|---|---|---|---|---|---|---|
| V | K | I | M | E | F | Y | T | R | P | S | A | B |
| 111 | 01 | 11 | 1111 | 10 | 01 | 001000 | 11 | 1000 | 100 | 000011 | 01 | 11 |
| RELWORK | | | | | | | | | | | |
| 111 | 01 | 11 | 1111 | 11 | 11 | 111111 | 11 | 1111 | 111 | 000100 | 10 | 11 |
| 111 | 01 | 11 | 1111 | 11 | 11 | 111111 | 11 | 1111 | 111 | 001011 | 01 | 11 |

FIG. 114

| MAIN SPACE | | | | | | | | | | | |
|---|---|---|---|---|---|---|---|---|---|---|---|
| V | K | I | M | E | F | Y | T | R | P | S | A | B |
| 010 | 01 | 11 | 1111 | 10 | 01 | 001000 | 11 | 1000 | 100 | 000011 | 01 | 01 |
| RELWORK | | | | | | | | | | | |
| 111 | 01 | 11 | 1111 | 11 | 11 | 111111 | 11 | 1111 | 111 | 000100 | 10 | 11 |
| 111 | 01 | 11 | 1111 | 11 | 11 | 111111 | 11 | 1111 | 111 | 001011 | 01 | 11 |

FIG. 115

| MAIN SPACE | | | | | | | | | | | |
|---|---|---|---|---|---|---|---|---|---|---|---|
| V | K | I | M | E | F | Y | T | R | P | S | A | B |
| 010 | 01 | 11 | 1000 | 10 | 01 | 001000 | 11 | 1000 | 100 | 000011 | 01 | 01 |
| RELWORK | | | | | | | | | | | |
| 111 | 11 | 11 | 1111 | 11 | 11 | 111111 | 11 | 1111 | 111 | 111111 | 11 | 11 |

FIG. 116

| MAIN SPACE | | | | | | | | | | | |
|---|---|---|---|---|---|---|---|---|---|---|---|
| V | K | I | M | E | F | Y | T | R | P | S | A | B |
| 010 | 01 | 10 | 1000 | 10 | 01 | 001000 | 10 | 1000 | 100 | 000010 | 01 | 01 |
| RELWORK | | | | | | | | | | | |
| 111 | 11 | 11 | 1111 | 11 | 11 | 111111 | 11 | 1111 | 111 | 111111 | 11 | 11 |

FIG. 117

MULTI-VALUED DECISION DIAGRAM FEATURE STATE DETERMINATION

CROSS-REFERENCE TO RELATED APPLICATIONS

This application claims the benefit of U.S. provisional application Ser. No. 62/280,609 filed Jan. 19, 2016 and U.S. provisional application Ser. No. 62/352,463 filed Jun. 20, 2016, the disclosures of which are hereby incorporated in their entirety by reference herein.

TECHNICAL FIELD

One or more embodiments generally relate to systems and methods for configuring a product.

BACKGROUND

Product configuration is an aspect of industries that offer customizable products with a wide variety of features. The process of selecting a configuration, or features that include a configuration, is used in multiple aspects of marketing and sales, order management and production planning, and product development. Examples include virtually constructing an ideal product (e.g., a vehicle) using a build-and-price application or selecting features for a prototype.

The product definition or product offering in the automotive industry is often of staggering dimensionality and size. It is common for a vehicle to be offered with thirty or more optional feature categories, such as paint color, engine size, radio type, and wheel style. Allowing a user to quickly explore a complex space that could include more than $10^{30}$ valid configurations is a challenging problem in constraints programming.

SUMMARY

In one embodiment, a method to determine feature states is provided for storing data representative of a multi-valued decision diagram (MDD). The MDD indicates a Boolean function specifying a buildable space of all possible configurations of features of a vehicle. The MDD includes a root node, a truth node, a false node, and at least one level of intervening nodes between the root node and either the truth node or the false node. Each level of the MDD corresponds to a family of mutually-exclusive features represented by at least one node, and each node except for the truth node and the false node connects to nodes of a next adjacent level by outgoing edges having labels each indicating one or more features of the family that are available for the valid configurations including the node, when there are no long edges. Each node except for the root node connects to nodes of a prior adjacent level by incoming edges that are outgoing edges of the prior adjacent level, such that a complete path from the root node through the outgoing edges to the truth node defines at least one of the valid configurations, when there are no long edges. And each complete path from the root node to the truth node is of the same length in nodes when there are no long edges. A feature state for each of the one or more features is determined based on a current selection and the possible configurations defined by the MDD. And an availability mapping indicative of which features are available for further selection is calculated, consistent with the valid configurations and without violating constraints imposed by the current selection.

In another embodiment, a system is provided with memory and a processor. The memory is configured to store data representative of a multi-valued decision diagram (MDD) indicating a Boolean function specifying a buildable space of all possible configurations of features of a vehicle. The MDD includes a root node, a truth node, a false node, and at least one level of intervening nodes between the root node and either the truth node or the false node. Each level of the MDD corresponds to a family of mutually-exclusive features and is represented by at least one node, when there are no long edges. Each node of a level connecting to nodes of a next adjacent level by outgoing edges has labels that each indicate one or more features of the family that are active for the configurations including the node, such that a complete path from the root node through the outgoing edges to the truth node defines at least one of the valid configurations, when there are no long edges. And each complete path from the root node to the truth node is of the same length in nodes when there are no long edges. The processor is in communication with the memory and is programmed to receive a current selection of one or more of the features, and to determine a feature state for each of the one or more features, based on the current selection and the possible configurations defined by the MDD. The processor is further programmed to calculate an availability bitset indicative of which features as available for further selection, consistent with the valid configurations and without violating existing constraints of the current selection.

In yet another embodiment, a non-transitory computer-readable medium comprising instructions that are executed by a processor is provided. The instructions cause the processor to store data representative of a multi-valued decision diagram (MDD) indicating a Boolean function specifying a buildable space of all possible configurations of features of a vehicle. The MDD includes a root node, a truth node, a false node, and at least one level of intervening nodes between the root node and either the truth node or the false node. Each level of the MDD corresponds to a family of mutually-exclusive features and is represented by at least one node, when there are no long edges. Each node of a level connecting to nodes of a next adjacent level by outgoing edges having labels each indicating one or more features of the family that are active for the configurations including the node, such that a complete path from the root node through the outgoing edges to the truth node defines at least one of the valid configurations, when there are no long edges. Each complete path from the root node to the truth node is of the same length in nodes when there are no long edges. The instructions further cause the processor to receive a current selection of one or more of the features; determine a feature state for each of the one or more features, based on the current selection and the possible configurations defined by the MDD; and calculate an availability bitset indicative of which features as available for further selection, consistent with the valid configurations and without violating existing constraints of the current selection.

BRIEF DESCRIPTION OF THE DRAWINGS

FIG. 3 is a table illustrating configurations expressed in conjunctive normal form;

FIG. 4 is a table illustrating configurations expressed in conjunctive normal form and in binary form;

FIG. 5 is a table illustrating mappings of the configurations of FIG. 4;

FIG. 6 is a table illustrating multiple configurations and a superconfiguration;

FIG. 7 is a table illustrating multiple superconfigurations;

FIG. 8 is a table illustrating the interaction of superconfigurations;

FIG. 9 is another table illustrating the interaction of superconfigurations;

FIG. 10 is a table depicting a buildable space according to one or more embodiments;

FIG. 11 is a table depicting overlapping configurations;

FIG. 12 is a table depicting a feature mask;

FIG. 29 is a comparison table;

FIG. 35 is a table illustrating a set of superconfigurations;

FIG. 36 is an example of a table illustrating a restricted domain after various steps of the method of FIG. 34;

FIG. 37 is another example of a table illustrating a restricted domain after various steps of the method of FIG. 34;

FIG. 38 is a table illustrating an example of the results of the method of FIG. 34;

FIG. 53 is a table illustrating an example of additions and subtractions for the diagram of FIG. 49 according to various steps of the method of FIG. 47;

FIG. 54 is a window illustrating an example of additions and subtractions that are displayed to the user based on various steps of the method of FIG. 47 according to one embodiment;

FIG. 55 is a window illustrating an example of additions and subtractions that are displayed to the user based on various steps of the method of FIG. 47 according to another embodiment;

FIG. 56 is a table illustrating a compression of three superconfigurations to two superconfigurations, according to one embodiment;

FIG. 57 is a window illustrating an example of a resolution object that is displayed to the user based on various steps of the method of FIG. 47 according to another embodiment;

FIG. 65 is a table listing an invalid configuration as a bitset;

FIG. 66 is a table illustrating the minimum edit space of the configuration of FIG. 65 converted to a matrix, as determined by various steps of the method of FIG. 47;

FIG. 67 is a table illustrating a bitwise conjunction (AND) of the domain of the edit space from FIG. 66 with the invalid configuration from FIG. 65;

FIG. 68 is a table illustrating the minimum edit space from FIG. 66 after it is trimmed to the families to change from FIG. 67;

FIG. 69 is an example target matrix for a selection of a feature as determined by various steps of the method of FIG. 47;

FIG. 70 is an example target matrix for a selection of another feature as determined by various steps of the method of FIG. 47;

FIG. 71 is software code illustrating an example final resolution object, according to one or more embodiments;

FIG. 72 is a window illustrating an example prompt provided to the user as part of a guided resolution;

FIG. 73 is a window illustrating an example of another prompt provided to the user as part of the guided resolution;

FIG. 74 is a window illustrating an example of yet another prompt provided to the user as part of the guided resolution;

FIG. 77 is a table illustrating an example of various steps of the minimum edit space calculation of FIG. 48;

FIG. 78 is another table illustrating an example of various steps of the minimum edit space calculation of FIG. 48;

FIG. 79 is yet another table illustrating an example of various steps of the minimum edit space calculation of FIG. 48;

FIG. 80 is still yet another table illustrating an example of various steps of the minimum edit space calculation of FIG. 48;

FIG. 81 is another table illustrating an example of various steps of the minimum edit space calculation of FIG. 48;

FIG. 91 is a table illustrating a matrix that defines the same buildable space as the diagram of FIG. 17;

FIG. 92 is a table illustrating the standard feature conditions for the product definition defining the buildable space of FIG. 91;

FIG. 93 is software code illustrating a method for automatically completing a configuration using a maximally standard algorithm according to one or more embodiments;

FIG. 100 is a table illustrating a buildable space;

FIG. 101 is a table illustrating standard feature conditions;

FIG. 102 is a table illustrating an example of various steps of the method of FIG. 95;

FIG. 103 is another table illustrating an example of various steps of the method of FIG. 95;

FIG. 104 is yet another table illustrating an example of various steps of the method of FIG. 95;

FIG. 105 is still yet another table illustrating an example of various steps of the method of FIG. 95;

FIG. 106 is another table illustrating an example of various steps of the method of FIG. 95;

FIG. 107 is yet another table illustrating an example of various steps of the method of FIG. 95;

FIG. 108 is still yet another table illustrating an example of various steps of the method of FIG. 95;

FIG. 109 is another table illustrating an example of various steps of the method of FIG. 95;

FIG. 110 is software code illustrating an example of various steps of the method of FIG. 95;

FIG. 111 is another table illustrating an example of various steps of the method of FIG. 95;

FIG. 112 is yet another table illustrating an example of various steps of the method of FIG. 95;

FIG. 113 is still yet another table illustrating an example of various steps of the method of FIG. 95;

FIG. 114 is another table illustrating an example of various steps of the method of FIG. 95;

FIG. 115 is yet another table illustrating an example of various steps of the method of FIG. 95;

FIG. 116 is still yet another table illustrating an example of various steps of the method of FIGS. 95; and FIG. 117 is another table illustrating an example of various steps of the method of FIG. 95.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
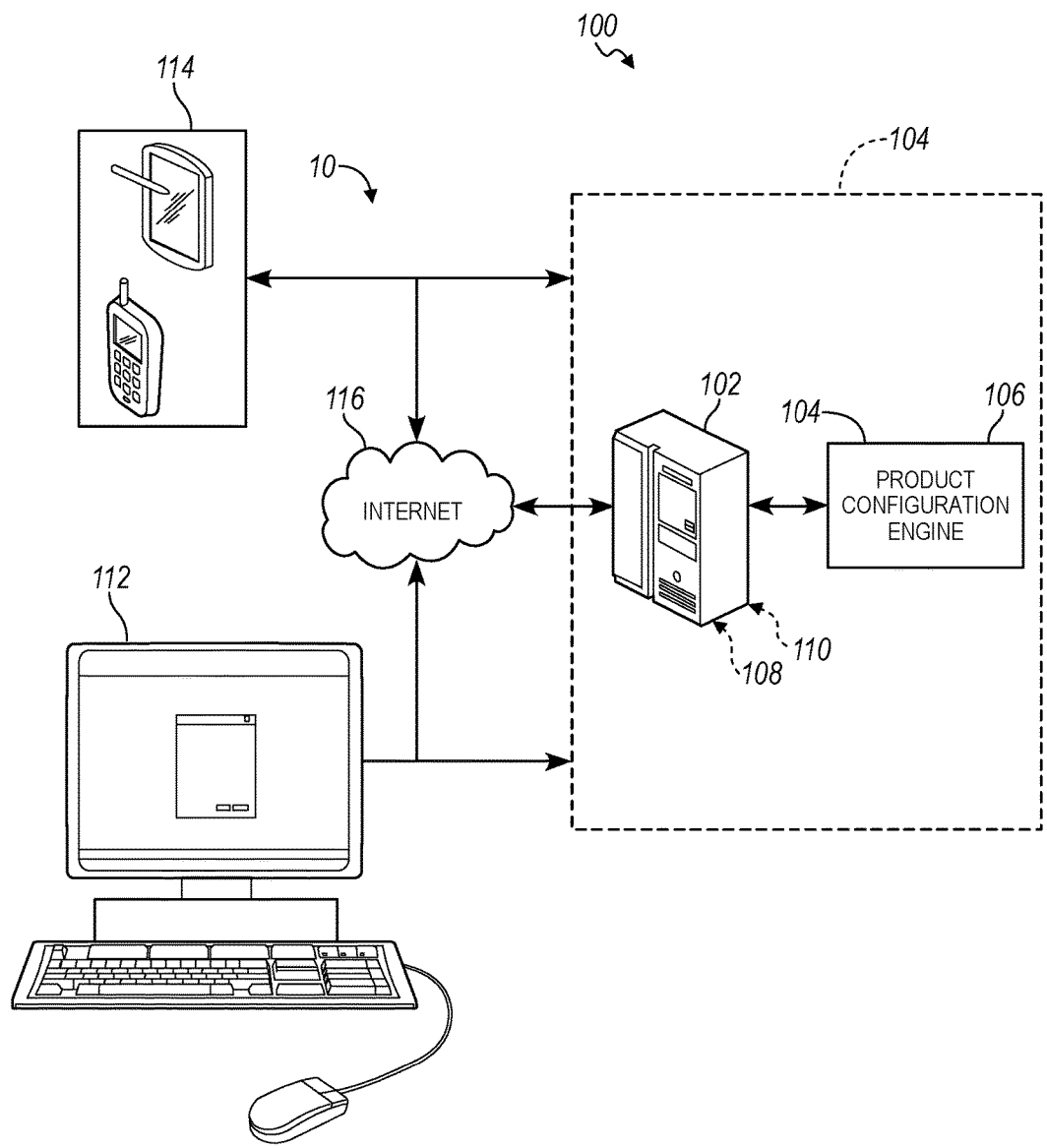
FIG. 1 is a block diagram of a product configuration system, according to one or more embodiments.

With reference to FIG. 1, a product configuration system is illustrated in accordance with one or more embodiments and generally referenced by numeral 100. The product configuration system 100 includes a server 102 and a configurator application 104. The configurator application 104 includes a configuration engine 106. The server 102 includes memory 108 and a processor 110 for storing and operating the configurator application 104. The product configuration system 100 communicates with a user device, such as a personal computer 112 and/or a mobile device 114 (e.g., a tablet, a mobile phone, and the like), each of which include memory and a processor. The configurator application 104 includes a "front-end" application (shown in FIG. 2) that may be installed to the user device 112, 114 from a computer-readable storage medium such as a CD-ROM, DVD or USB thumb drive. Alternatively, the front-end application may be downloaded from the server 102 to the client device 112, 114 via an internet connection 116. The design and efficiency of the application 104 therefore allows it to be optimized to run on multiple various operating system platforms and on devices having varying levels of processing capability and memory storage.

The configurator application 104 allows a user to explore a product offering, where the product is defined by selecting multiple features. A common example is a build-and-price website that allows a user to customize a product by choosing features such as size and color. The configuration engine 106 validates the customized product (i.e., the configuration) as the user selects different features.

The product offering, or product definition, includes all of the allowed ways of combining features (or parts, options, or attributes) in order to make a complete product. For example, a company might sell a product in two levels (e.g., base and luxury), A1 and A2, and in three colors, B1, B2 and B3. Further, the company only offers the base model, A1, in one color, B1. Features are grouped into families, in this case family A-"level" and family B-"color." The product configuration space includes the following four configurations: A1B1, A2B1, A2B2, and A2B3. Product definition often comprises rules or constraints that limit or allow relationships between features. In this example the rule might be "A1 requires B1." A complex product can be defined by thousands or even tens of thousands of rules.

The configurator application 104 allows the user to select options or features to create or modify a configuration. When a user changes a configuration by adding and/or removing a feature, the configuration engine 106 validates the new configuration. To perform this validation, the configuration engine 106 determines if the selected configuration fits within the allowed product space. If the new configuration is invalid, the configuration engine 106 either prompts the user to make changes, or make the changes itself according to a predefined hierarchy. For example, the monitor of the personal computer 112 shown in FIG. 1 depicts a message window that is displayed to the user indicating changes to resolve the conflict between selected features. The validation and conflict resolution is performed quickly (e.g., less than 2 seconds) and uses little memory and processing. Ideally, this allows the user to explore the buildable space of allowable product configurations, often while viewing information associated with the configuration such as price or images.

Users interact with front-end applications that present the product information, e.g., on the monitor of their pc 112, and allow them to explore the buildable space. Although, the configuration engine 106 is different from the front-end application that is displayed on the pc 112, the applications interact closely with each other. Examples of front-end applications include build-and-price websites, mobile shopping applications, interactive shopping kiosks, and back-office order entry and management systems. When these front-end applications populate product information, they can communicate with the configuration engine 106. The only people who interact directly with the configuration engine 106 are back-office users tending to the data stored in the server 102. The product configuration application 104 primarily interacts with other applications.

In the computer science field, exploration of a configuration space that is defined by rules or constraints is called constraint programming. A configuration space can also be defined by a model that is a representation of the possible product configurations. Many methods exist in the literature to solve configuration problems, with some using a constraints programming approach and others operating on product definition models.

Figure 2:
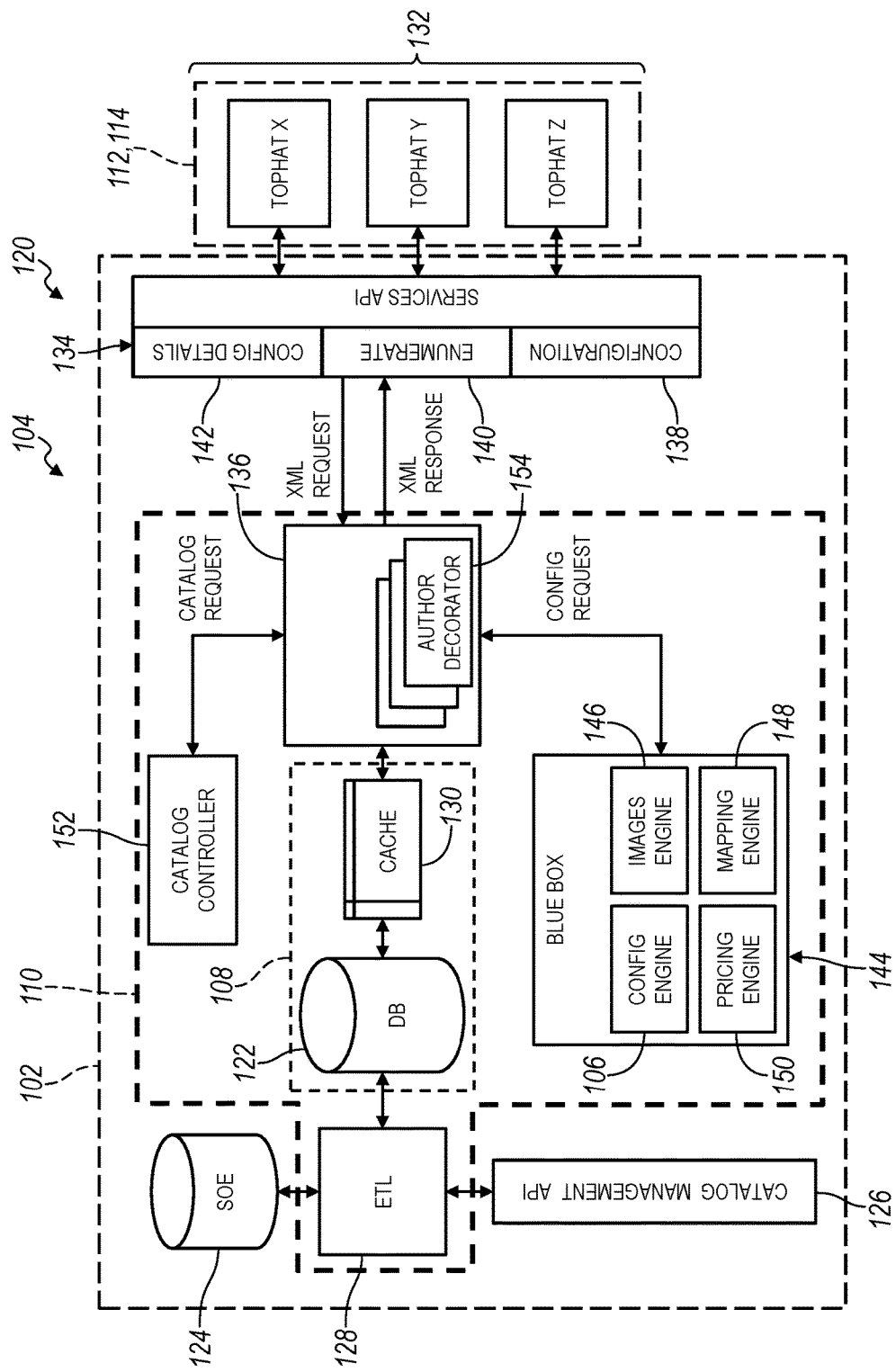
FIG. 2 is an application programming interface illustrating an application of the product configuration system of FIG. 1 including a configuration engine.

Referring to FIG. 2, an application programming interface (API) is illustrated in accordance with one or more embodiments, and generally referenced by numeral 120. The API 120 illustrates the inputs, steps, and outputs of the configurator application 104. The configurator application 104 is contained within the server 102 and the user device (pc 112 and/or mobile device 114) according to one embodiment, and may be implemented using hardware and/or software control logic as described in greater detail herein.

The configurator application 104 includes a database (DB) 122 for storing data as a catalog entry. Each catalog entry will store the vehicle attributes (make, model, year, etc.), buildable product space, and extended feature attributes (images, prices, detailed descriptions, sales codes, etc.). The data may be directly processed as is shown by a product definition data source 124, or it may come through a catalog management API 126. The configurator application 104 also includes an extract, transform and load (ETL) process 128 that provides an interface between the DB 122 and the product definition data source 124 and the catalog management API 126. The configurator application 104 accesses data from the DB 122 and temporarily saves a copy of it in cache memory 130.

The configurator application 104 includes one or more "front-end" applications or "top hats" 132 that are accessible from the user device 112, 114. Examples of such "front-end" applications 132 include consumer build and price sites, management lease ordering sites, and dealer ordering applications.

The configurator application 104 includes a service API 134 and a web service controller 136 for coordinating the user's requests. The service API 134 includes a configuration service 138, an enumeration service 140 and a configuration details service 142.

The configurator application 104 includes a plurality of processing engines 144, for optimizing the data provided to the front-end applications 132. The engines include: the configuration engine 106, an image engine 146, a mapping engine 148 and a pricing engine 150. The image engine 146 provides one or more images associated with features of the configuration. The mapping engine 148 provides feature codes from one or more feature code dictionaries. For example, manufacturing systems and sales systems may use different codes for the same feature, and the mapping engine translates between the different coding schemes. The pricing engine 150 provides pricing associated with the complete configurations and with individual features. The pricing engine 150 can also provide changes in pricing associated with changes in the configuration or features.

The configurator application 104 also includes a catalog controller 152 that lists which product definitions are available. The catalog controller 152 receives a catalog request (e.g., what products are available), and provides a response (e.g., product A, product B and product C). Then the user selects a product, and the front end application 132 submits a configuration load request. Then the web service controller 136 returns a default configuration.

The web service controller 136 is a simple object access protocol (SOAP) web service using XML messages, according to one embodiment. The service API 134 provides an XML request to the web service controller 136 based on each user selection made in the front-end applications 132. In other embodiments the web service controller 136 uses other protocol.

The web service controller 136 provides an XML response to the service API 134 in response to each XML request. The web service controller 136 parses each XML request, makes appropriate calls to the processing engines 144 or catalog controller 152, and transforms the output of the configuration engine 106, the image engine 146, the mapping engine 148 and the pricing engine 150 into the appropriate XML response. The web service controller 136 includes author decorators 154 that are responsible for building up each portion of the response, and includes logic to retrieve data from the database 122 via the cache 130 and save the data as a working copy.

The configuration engine 106 operates with reference to a valid buildable space. The buildable space is also referred to as the product offering and is defined in terms of features that are grouped into mutually exclusive family sets. All of the possible features are grouped into families such that a valid configuration will contain one and only one feature from each family.

In one example product definition of a vehicle, (Vehicle A), exterior paint color is defined by the family PAA and its features are Green (PNWAD), Magnetic (PN4DQ), Blue1 (PNMAE), Red1 (PN4A7), Red2 (PNEAM), Black (PN3KQ), Silver (PN4AG), Orange (PN4AH), White (PNYW3), and Blue2 (PN4MAG).

The configurator application 104 uses extended feature attributes, or metadata associated with a feature, such as feature name and feature description when presenting the information to a user. However, the configuration engine 106 uses feature and family codes. A fully qualified feature is its "family dot feature" code, such as PAA.PNEAM to represent the paint family with paint color Red2.

Each point of variation in the product specification can be considered a dimension where a value is selected. The large number of these variation points on a motor vehicle results in many valid configurations. Traditionally the large number of valid configurations in this buildable space has been responsible for much computational effort to perform the configuration process, which may be referred to as "the curse of dimensionality." The configuration system 100 provides improvements over traditional systems because it operates efficiently even on highly complex buildable spaces, e.g. those containing more than $10^{24}$ valid configurations.

A configuration is a particular product instance specified by a set of features. Each feature belongs to exactly one family. There may be at most one feature selected from each family. A complete configuration contains exactly one feature from each and every family. A partial configuration will include features from a subset of the families, and one or more families will not have a feature choice specified.

In a build and price application, the configuration engine 106 will typically work in complete configurations. Partial configurations are useful for searching or filtering configurations, as would be done to find and amend orders in an order management system.

Some features are optional, such as moonroof, and a user may order a vehicle without the feature. But, a complete configuration must still contain a choice for the family. A "less feature" is used to specify the absence of an option. For example, Vehicle A, which has an optional power moonroof, the family (CHA) contains two features: without the moonroof (i.e., "less moonroof"-CHAAA) and with the moonroof (i.e., "moonroof"-CHAAC). The buildable space defines all valid configurations.

With reference to FIGS. 3-5, a configuration can be expressed in a variety of different forms. A configuration can be expressed in conjunctive normal form (CNF). For example, in one embodiment, a product is defined by four families: A, B, C and D; where A, C, and D each have two possible choices, and B has three possible choices. If there are no restrictions on what features can occur together (other than a single feature choice for each family), the set of choices can be defined as (A1|A2) & (B1|B2|B3) & (C1|C2) & (D1|D2). For a full configuration, each clause will reduce to a single literal or selection for each family (e.g., A1, B1, C1, D1).

FIG. 3 depicts a CNF Table 300 with two possible configurations. The CNF table 300 includes a first CNF configuration 302 and a second CNF configuration 304.

With reference to FIG. 4, a configuration can also be expressed in binary form by a string of 0's and 1's, as depicted by Table 400. In binary form, a zero (0) indicates the absence of a feature in a configuration, and a one (1) indicates the presence of a feature in the configuration. For example, a first binary configuration 402 illustrates the first CNF configuration 302 in binary form, and a second binary configuration 404 illustrates the second CNF configuration 304 in binary form. The literal A2 is replaced with "01", as generally referenced by numeral 406. Each column maps to a feature in the family: '0' in the first position indicates the feature A1 is not present in the first binary configuration 402, and '1' in the second position indicates the feature A2 is present in the first binary configuration 402. The first CNF configuration 302 (A2 & B2 & C1 & D2) is represented by the first binary configuration 402, where the ampersand (&) symbol is replaced by a space as a delimiter between each family, i.e., "01 010 10 01."

A configuration space can be very large. For example, a product definition with around 100 independent features could have over $10^{27}$ possible configurations. If each configuration was stored as an uncompressed set of 0's and 1's, it would take more than 12 billion Exabytes of memory to represent them all—which is not practical with the present day state of the art computer hardware. Therefore the configurator application 104 uses compressed representation to facilitate computational tractability and efficiency within available memory.

A bit is the basic unit of information in computing. It can only have one of two values and is commonly represented as 0 or 1, or the Boolean values of false and true. A bit set represents a vector or array of bits. For example, Java has a native utility class called "BitSet" that stores a set of bits with an array of values of a primitive 64-bit datatype called long.

With the rightmost position of the bit set index 0 and leftmost position index 8, 100101001 is equal to $1*2^8 + 1*2^5 + 1*2^3 + 1*2^0 = 256+32+8+1 = 297$. Thus the bit set 100101001 can be stored using the long (or integer) 297. An array of 2 long values (−8929791190748339525, 8791258171646) can represent a bit set of 107 features: 11 01 11 010 100 01 10 00010 00010 111 01 010 01 11 000100 000011 00100 00010 00010 11111 1100 01000001 001 01 11 11 11 01 10 11 11 11.

The Java BitSet class allows for varying bit set lengths. But, for the configurator application 104, the set of features is fixed for a given vehicle. Thus, the configuration engine 106 defines its own fixed length bit set object. To store a configuration, a feature bit set is used. The feature bit set associates a feature object with each bit position. This mapping is defined in a structure object that defines a list of families with each family defining a list of features.

FIG. 5 illustrates a table 500 that defines the mappings for the bit sets in table 400. The bit sets shown in table 400 are printed in blocked format. The bits for each family are grouped together with no delimiter and family blocks are separated by a space. The bit sets can also be printed in strict binary format with no extra spacing, e.g., the first binary configuration 402 of Table 400 could be rewritten as 010101001. Alternatively, the bit sets can be printed in strict binary format with the same delimiter between every feature and no extra delimiter between families, e.g., the first binary configuration 402 of Table 400 could be rewritten as 0 1 0 1 0 1 0 0 1. Blocked format allows for better human readability; however, space-delimited is a viable option when viewing the data in a table with labeled columns and importing bit set data into an Excel worksheet for analysis.

With reference to FIGS. 6-10, one or more configurations may be compressed and represented by a "superconfiguration." FIG. 6 includes a table 600 listing a first configuration 602: (A2, B2, C1, D2), and a second configuration 604: (A1, B2, C1, D2). Because the values are identical in all but one family 'A', the configurations 602, 604 can be compressed into a single superconfiguration 606. The table 600 shows both the CNF and bit set forms of the configurations and superconfigurations. Thus, a configuration is just a superconfiguration with only one possible value per family.

Referring to FIG. 7, two superconfigurations can also be compressed as shown in table 700. A first superconfiguration 702 and a second superconfiguration 704 are compressed into a third superconfiguration 706.

With reference to FIG. 8, bit sets, configurations and superconfigurations can be interacted using bitwise steps as shown in table 800. Referring to "OR" step 802, when OR-ing two superconfigurations the resulting value for each family is the union of the family set from each superconfiguration. Thus, if any value in a family set (column) is "1", then the union of the family set is "1." And referring to "AND" step 804, when AND-ing two superconfigurations the resulting value for each family is the intersection of the family set from each superconfiguration. Thus, if all values in a family set (column) are "1", then the union of the family set is "1."

Referring to FIG. 9, when AND-ing two superconfigurations, the resulting superconfiguration is invalid if any family has no active bits, as shown in table 900. The intersection for family B is empty causing the configuration to be invalid, as referenced by numeral 902.

With reference to FIG. 10, the configuration system 100 expresses buildable space with a set of superconfigurations that define all valid configurations, according to one or more embodiments. This compressed representation allows for more efficient storing and processing of a buildable space. A non-overlapping set of super configurations can be stored in a matrix 1000, with each row stored as a bit set.

Referring to FIG. 11, the configuration engine 106 does not use overlapping superconfigurations because they include redundant information which could lead to incorrect calculations. Thus, all basic steps performed by the configuration engine 106 rely on the fact that the buildable space contains no overlap. Two superconfigurations are said to overlap if there exists one or more configurations that are defined by both superconfigurations. Table 1100 shows a first superconfiguration 1102 that overlaps with a second superconfiguration 1104. Row 1106 identifies all of the overlapping features. For example, both superconfigurations 1102, 1104 include feature A2, as represented by numeral 1108, and therefore overlap.

With reference to FIG. 12, a superconfiguration can be used to define a feature mask. A feature mask for a single family is created by setting the active bits in the family to zero to define the constrained features and setting all bits to 1 for the remaining families. A feature mask for multiple families is the AND of the masks for each family. Table 1200 shows several examples. A feature mask can be used to search a configuration space (contains) or limit a configuration space (restrict). Feature masks can be used to encode a feature condition in order to associate data with features, such as descriptions, prices and images.

Figures 13, 14:
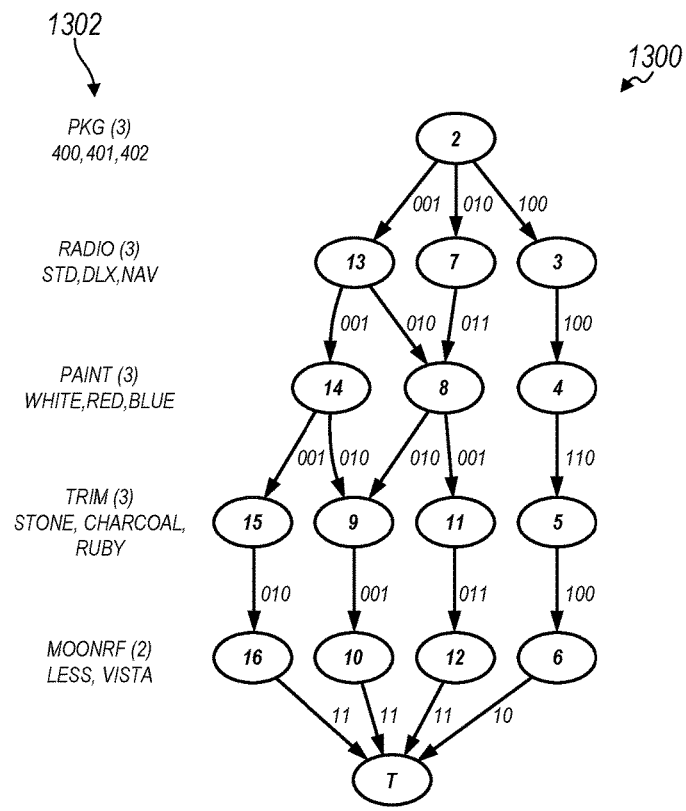
FIG. 13 is a multi-valued decision diagram (MDD) representing the buildable space of FIG. 10, according to one or more embodiments.
FIG. 14 is a comparison table.

Referring to FIG. 13, the configuration system 100 uses a multi-valued decision diagram (MDD) to represent the buildable space, according to one or more embodiments. An MDD representing the same buildable space as the superconfigurations matrix 1000 (FIG. 10) is shown in accordance with one or more embodiments, and generally referenced by numeral 1300. An MDD is capable of representing the configuration space for large and highly complex product offerings much more compactly than a matrix.

The MDD 1300 includes nodes, such as a root node (2), a terminal, Truth or True node (T) and a plurality of intervening nodes (3-16) arranged on a plurality of paths. Each path includes the root node (2), the true node (T) and some of the intervening nodes connected by "edges" or arrows. In terms of superconfigurations, a complete path from the root node (2) to the true node (T) defines a superconfiguration. The superconfiguration shown in the top row 1308 of the matrix 1000 in FIG. 10 (i.e., 100 100 110 100 10), is defined by a right path (2-3-4-5-6-T) in the MDD 1300.

Each level of the MDD 1300 is associated with one family and the edges define the path for each feature. Each node will have at most one outgoing path for each feature, thus the features are mutually exclusive. Where there is a path between two nodes for more than one feature, a single edge is shown, but the edge label includes more than one ("1"). The edge labels correspond to a family's superconfiguration bits, where a "1" indicates the presence of a feature and a "0" indicates the absence of a feature. Where a feature is inactive, its edge points to the false terminal node, which is not shown in the diagram. Each complete path from the root node to the truth node is of the same length in nodes when the nodes are expanded, e.g., there are no long edges. An MDD that does not include any long edges may be referred to as a quasi-reduced MDD.

The MDD 1300 includes five different families 1302: package (Pkg), radio (Radio), paint (Paint), trim (Trim) and moonroof (MoonRf). Each family includes multiple features. For example, the package (Pkg) family includes a 400 package, a 401 package and a 402 package; and the radio family includes: a Standard (Std) radio, a Deluxe (Dlx) radio and a Navigation (Nav) radio. The root node (2) is connected to intervening node 13 by edge label "001", which indicates the presence of the third package (402) and the absence of the first two packages (400 and 401). Again, some edge labels include more than one "1", which means that more than one feature is available. For example, intervening node (7) is connected to intervening node (8) by an edge with a label "011." This indicates that path 2, 7, 8 is a superconfiguration that includes the 401 package, and the Deluxe (Dlx) and/or the Navigation (Nav) radio.

FIG. 14 is a table 1400 that illustrates a comparison of the size of a matrix based product configuration (e.g., table 1000, FIG. 10) and an MDD based product configuration (e.g., MDD 1300, FIG. 13). For small product definitions (e.g., Vehicle A with 28 families) a matrix and an MDD have comparable size (20 KB). However, for medium product definitions (e.g., Vehicle B with 84 families) the matrix size (23,026 KB) is much larger than the MDD size (766 KB). For large product definitions (e.g., Vehicle C with 92 families) the matrix runs out of memory, but the MDD size (313 KB) is sufficient. Therefore table 1400 illustrates that an MDD is a useful tool when analyzing large product configurations. Using the MDD format, the minimum number of superconfigurations required to represent the buildable space of all possible configurations may be calculated. For complex products that number exceeds reasonably available memory.

Figure 15:
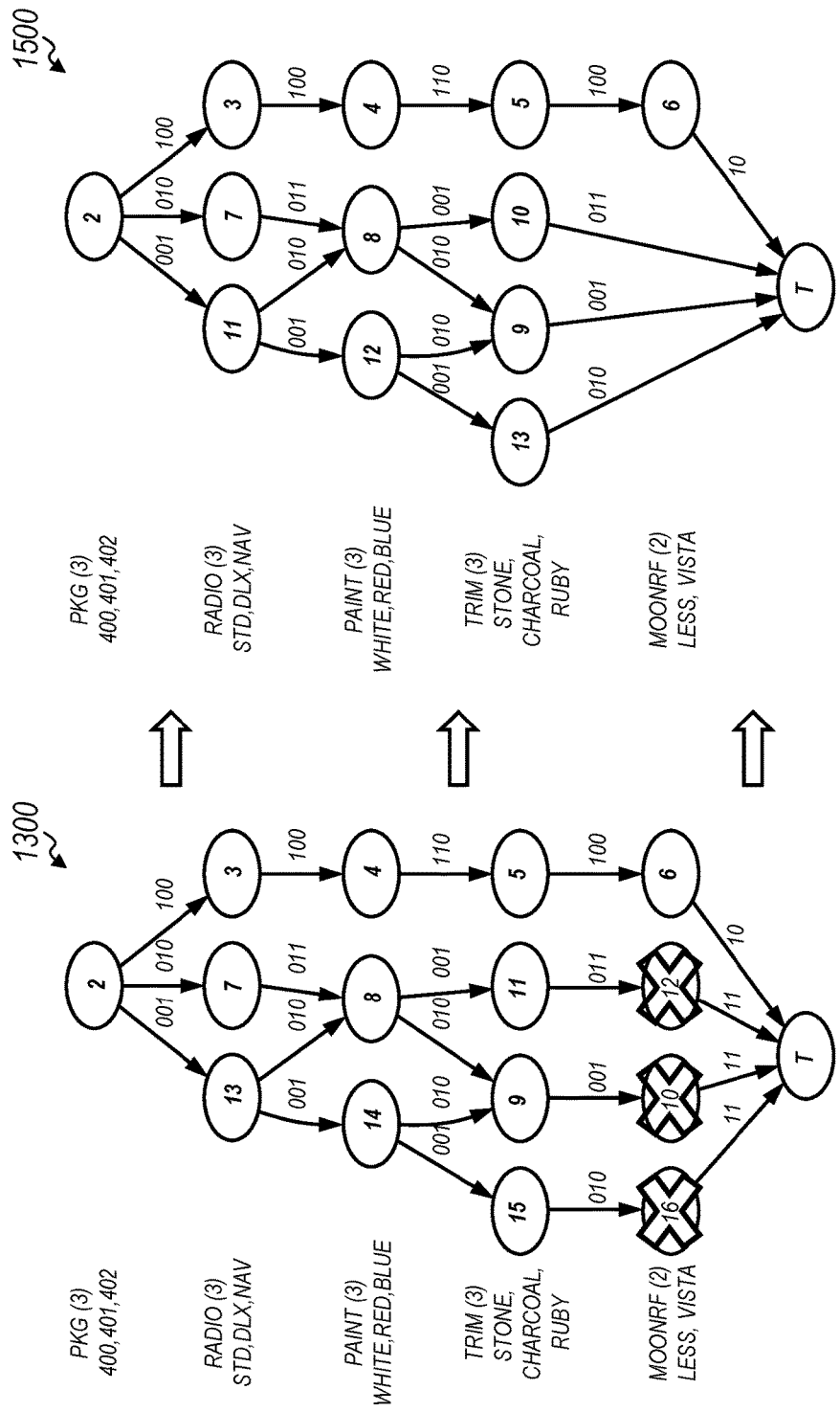
FIG. 15 is a diagram illustrating a reduction of the MDD of FIG. 13.

With reference to FIG. 15, the configuration engine 106 performs steps using reduced MDDs, such as reduced MDD 1500, in one or more embodiments. FIG. 15 includes the MDD 1300 of FIG. 13 and a reduced MDD 1500. In an MDD, a redundant node may be removed and its incoming and outgoing edges may be combined to form a "long edge." A redundant node is a node that corresponds to a family in which all features are active, i.e., its outgoing edge label includes only "1"s. For example, intervening node 16 in MDD 1300 corresponds to the moonroof (MoonRf) family, and its outgoing edge label "11" indicates that both the moonroof (Vista) and no moonroof (Less) features are active. Therefore node 16 is redundant and it can be removed, as depicted by the "X" disposed over it in FIG. 15. Nodes 10 and 12 of MDD 1300 are also redundant and may be removed, as depicted by the X's over them in FIG. 15. The reduced MDD 1500 shows the result of removing redundant nodes 16, 10 and 12 and collapsing their respective incoming and outgoing edges into long edges. The paths from 13-T, 9-T, and 10-T do not include a node for the moonroof (MoonRf) family. By collapsing the long edges, the reduced MDD 1300 has 3 fewer nodes, and some of its nodes have been renumbered. For example, since node 10 of MDD 1300 was removed, node 11 of MDD 1300 was renumbered as node 10 in reduced MDD 1500. By reducing MDDs, the configuration system 100 reduces memory and processing usage.

In one or more embodiments, the configuration engine 106 performs steps using an expanded (not reduced) MDD, such as MDD 1300, e.g., during a "Quick-Restrict" step, as described below. For a very large buildable space, the number of nodes added to expand long edges can be quite significant. As an example, an MDD may have 17,283 nodes when long edges are compressed, but grow to 47,799 nodes when long edges are expanded. Therefore good compression reduces the number of long edges significantly. However, the savings generated by the quick-restrict step are generally sufficient to justify the long edge expansion.

In the expanded MDD 1300, nodes 10, 12, and 16 are not only redundant; they are also duplicated. Duplicate nodes are two nodes for a family (i.e., within a common row) that have identical outgoing edge labels. The reduced MDD 1500 is in canonical form, i.e., there are no duplicated nodes. The configuration engine 106 creates MDDs in canonical form. Canonical form helps to minimize the number of nodes required to represent the buildable space.

Figure 16:
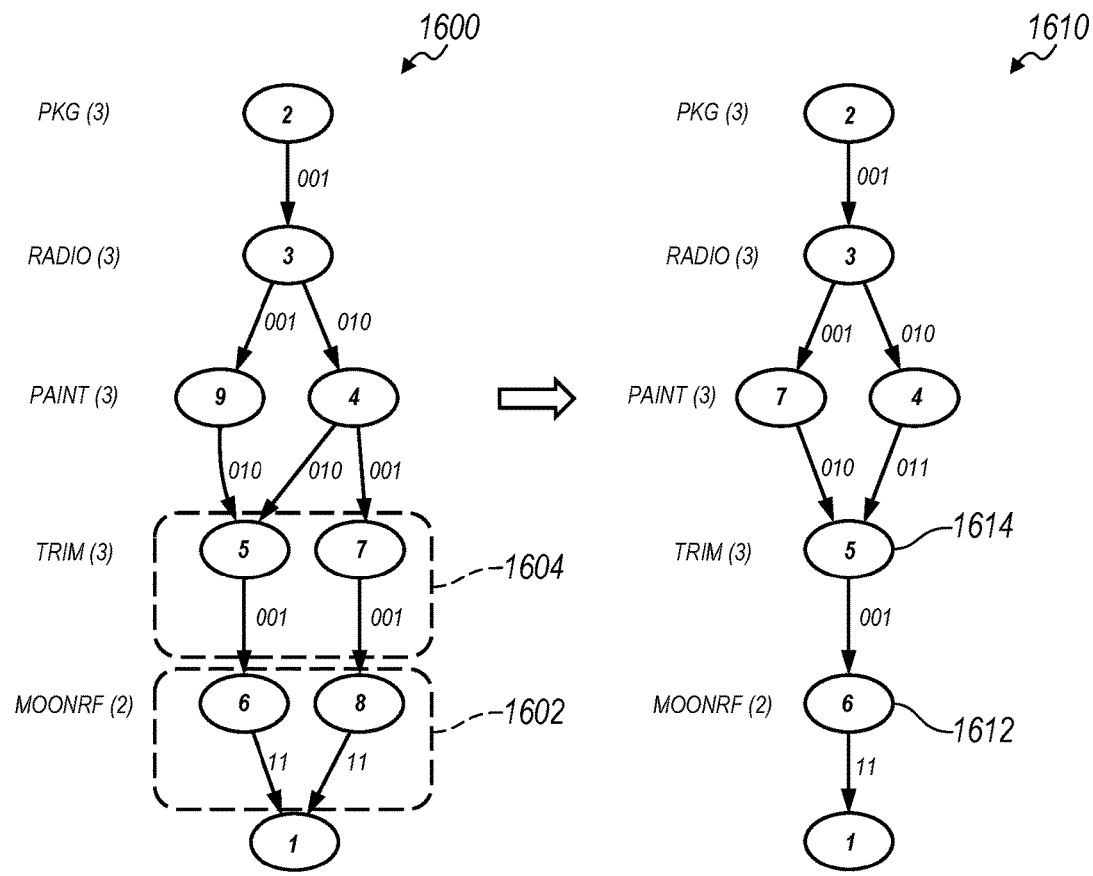
FIG. 16 is a diagram illustrating merging of duplicate MDD nodes.

FIG. 16 includes a non-canonical MDD 1600 with duplicate nodes. Node 6 and node 8 include identical outgoing edge labels, and therefore are duplicates of each other, as referenced by numeral 1602. Similarly, node 5 and node 7 are duplicates, as referenced by numeral 1604. FIG. 16 also includes a canonical MDD 1610. The duplicate nodes of MDD 1600 are merged in the canonical MDD 1610. For example, the first duplicate nodes 1602 are merged to form a canonical node 6, as referenced by numeral 1612. And the second duplicate nodes 1604 are merged to form a canonical node 5, as referenced by numeral 1614. The MDDs, e.g., MDD 1600, 1610, are serialized as plain text for storage in a database, such as the DB 122 shown in FIG. 2. Such text serialization ensures backwards compatibility across software versions and implementations.

Figure 17:
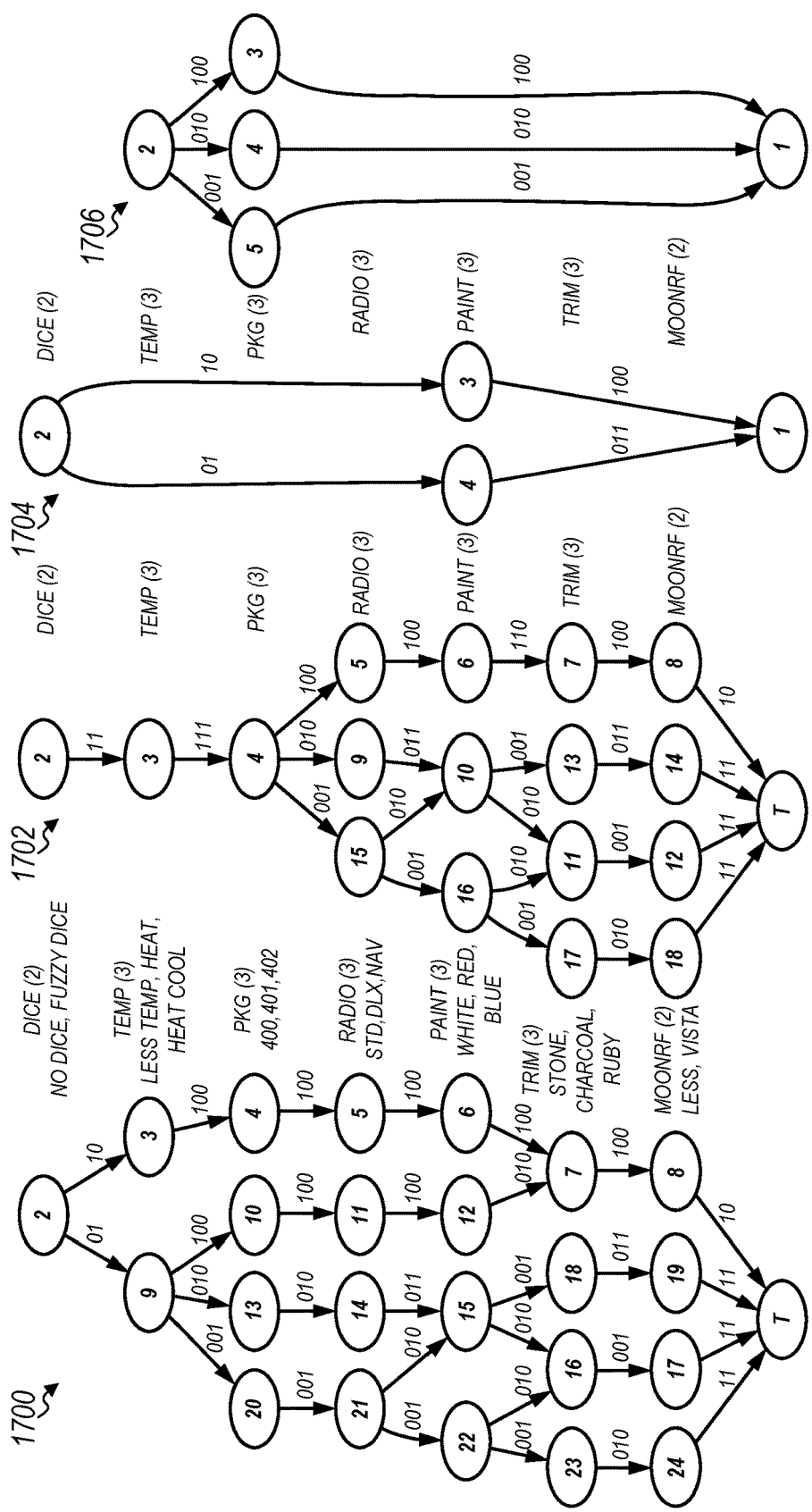
FIG. 17 is a diagram illustrating MDD compression with deterministic families.

With reference to FIG. 17, when a family's values in the configuration space can be determined by the values from one or more other families, the family is said to be deterministic. Deterministic relationships are used to minimize the size of an MDD to allow for scaling to complex vehicle configurations.

FIG. 17 includes an MDD 1700 that is similar to the MDD 1300 of FIG. 13, with the addition of two deterministic families: seat temperature control (Temp) and the presence of dice (Dice). The presence of dice is determined by the paint color. Thus, once the paint color (Paint) is known, there is just one choice for dice. If paint is White, then dice are not present (NoDice); however if paint is Red or Blue, then Fuzzy dice are present (FuzzyDice). The seat temperature control (Temp) is determined by the package (Pkg). If Pkg is 400, then the seat temperature control is not available (LessTemp); if Pkg is 401, then heated seat temperature control is included (Heat); and if Pkg is 402, then heat and cool temperature control (HeatCool) is included. In these examples Paint color and Pkg are the determinant families while Dice and Seat temp are deterministic. This is because their state is fully specified by the state of the determinant.

The presence of deterministic features has a negative impact on MDD compression. The MDD 1700 represents twenty-four configurations. However, the deterministic families cause the MDD 1700 to increase from sixteen nodes to twenty-four nodes. Generally, the number of nodes in an MDD is a good predictor of its performance. Thus, it is ideal to have an MDD with as few nodes as possible. To aid in MDD compression, the configuration system 100 extracts the relationship defining a deterministic family's values to form one or more external relationship MDDs, which allows for greater compression in the main MDD, i.e., MDD 1700.

The configuration system 100 extracts the two deterministic families (Temp and Dice) from MDD 1700 to form reduced an MDD 1702, a first external relationship MDD 1704 corresponding to the Dice family, and a second external relationship MDD 1706 corresponding to the Temp family. The deterministic families (Temp and Dice) remain in the MDD 1702, but are trivialized—made all 1s—allowing the main MDD 1702 and the external relationship MDDs 1704, 1706 to share the same structure.

The combination of the main MDD 1702 and all its external relationship MDDs 1704, 1706 is referred to as a Global MDD. A Global MDD can be operated in the same way as an MDD; but, each step must account for both the main space and the relationships.

The configuration service 138 abstracts the implementation from any specific application and state management does not depend on the implementation being either "stateful" or "stateless", according to one or more embodiments. The configuration service 138 remembers a user's session history in a stateful implementation, and does not remember a user's session history in a stateless implementation. However, the front-end application 132 treats the configuration service 138 as stateless in so far as it does not need to handle session synchronization.

Each XML response to the front-end application 132 from the configuration service 138 includes a state object that is included in the next call. The content of the state object is not dictated by the configuration service 138, but it contains any information necessary to maintain a user session. The state object is not modified by the front-end application 132.

A configuration session begins with an XML request to load initial content (i.e., a "Load Request") to populate a starting point of initial screens on the front-end applications 132. This is followed by additional XML requests to update the content ("Update Request") as user changes the configuration by selecting different options in the front-end application. The web service controller 136 responds with an XML configuration response that includes updated configuration content.

Each feature included in such configuration responses includes a selection or feature state attribute. In one embodiment, there are six different feature state values: Selected, Available, Included, Default, Excluded and Forbidden.

A Selected feature state is a feature that has been explicitly selected by the user and generated in response to a Load or Update XML request. The configuration service 138 cannot unselect this feature as a result of another selection without performing a conflict resolution procedure, except for features in a mutually exclusive feature group.

An Available feature state is a feature that is not currently selected by the user. But the user is free to select it without causing a conflict resolution procedure to be triggered. In a mutually exclusive group of features (e.g. exterior color), although only one feature can be selected at a time, the other features in that group will be marked as "Available"—they will only be marked as "Excluded" if they conflict with a user selected feature in another family.

An Included feature state is a feature which is the only available choice in the family. For example, this can occur when a selection of a feature requires another feature. This can be the result of either a package selection that includes this feature (e.g. "Climate Pack" includes "Air Conditioning"), or a "must"/"requires" relationship (e.g. "Heated Seats" requires "Leather Seats).

A Default feature state is a feature that was selected by the configuration service 138 as part of an automatic completion function, as described in detail below with reference to FIGS. 82-117.

An Excluded feature state is a feature that conflicts with another user selection. Selecting this feature will prompt a conflict resolution procedure.

A Forbidden feature state is a feature that violates a constraint that cannot be resolved if selected. Attempting to select this feature will result in an error. This state has been introduced to support external constraints that restrict the valid buildable configurations.

The front-end application 132 alters the display of features based on their configuration state, in one or more embodiments. For example, in one embodiment, the front-end application 132 shows a symbol next to an excluded feature to indicate that it conflicts with a prior selection or it may choose not to display excluded or forbidden features.

In one embodiment, the configuration system 100 changes a feature from the Default feature state to the Selected feature in response to a user implicitly selecting the feature. For example, if Default features are presented as checkboxes or radio buttons, there is no action the user can take to check an already checked item. This means that while the user intended to select the feature, it is still marked as Default. Such an implicitly selected Default feature may complicate conflict resolution strategies. Thus, the configuration system 100 includes an option to change a feature from a Default feature state to the Selected feature state in response to a user viewing a default selection and not changing it.

The configuration service 138 will return a complete configuration to the front-end application 132 in response to any load or update request, according to one or more embodiments. This feature is referred to as "automatic completion." Default feature selections will be added to any Selected features or Included features to create a complete configuration with respect to displayable families. A feature is "displayable" if it can be displayed to the user, e.g. on the user's pc 112; whereas a feature that cannot be displayed to the user is described as "no-display" or "not displayable." The front-end application 132 may choose to distinguish the automatic feature selections from those explicitly selected by the user, using each feature's state value returned in the configuration response.

Alternatively, in other embodiments the automatic completion feature is disabled. When the automatic completion feature is disabled, no default selections are made and the response will typically include an incomplete configuration. This enables different front-end application 132 designs where a user is prompted to actively select each feature in the configuration.

The configurator application 104 includes a conflict resolution procedure in which, in response to an update request to select a feature that leads to an invalid configuration; the configuration service 138 returns a new valid configuration with the newly selected feature and the minimum other changed features required to make the configuration valid. If the auto completion feature is enabled, the new configuration will include any necessary Default features. The web service controller 136 implements the conflict resolution feature to provide details on what features must be added and removed to resolve the conflict, as well as a "reject state" that is used if the user cancels the requested change.

Figure 18:
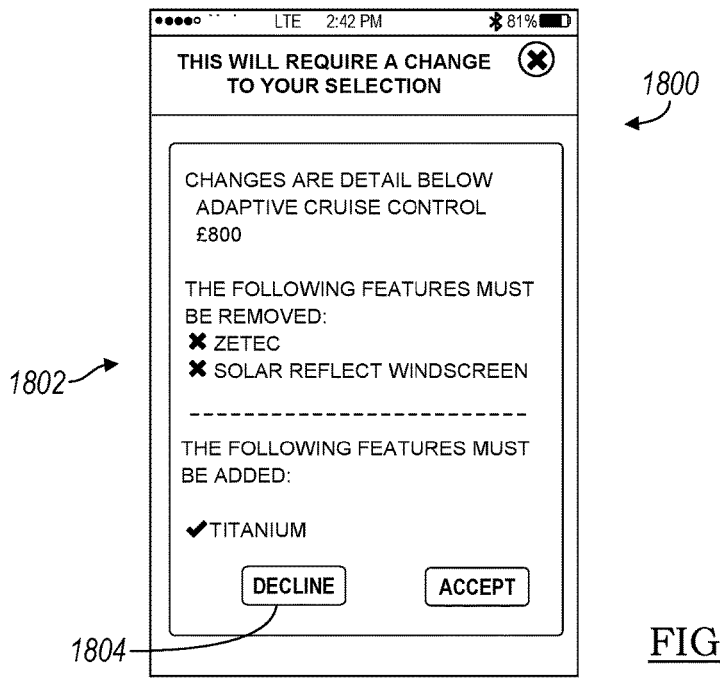
FIG. 18 is a window displayed to a user based on a conflict resolution procedure of the configuration engine of FIG. 2 according to one embodiment.

With reference to FIG. 18, the configurator application 104 includes a "single" conflict resolution strategy, according to one or more embodiments. The configuration service 138 resolves the conflict by finding a single valid configuration containing the new selection. FIG. 18 depicts a user interface 1800 that is displayed to the user on the user device (e.g., on the monitor of the PC 112) by the front-end application 132 as part of the conflict resolution procedure. The user interface 1800 includes a message 1802 that alerts the user of a conflict (i.e., by selecting the adaptive cruise control feature, the Zetec package and the solar reflect windscreen features must be removed, and the titanium package must be added) and asks for confirmation that they still want to make the change. If the user cancels the change, e.g., by selecting the decline button 1804, the subsequent view request includes a reject state to undo the prior selection (i.e., adaptive cruise control) in the configurator application 104. The update request may unselect a feature. Since all families must have one feature selected to form a valid configuration, unselecting a feature is often equivalent to selecting the "less" feature in the family. Removing a feature from the configuration can also lead to a conflict. For example, if the user removes an included feature, the selected feature which includes it will also be removed.

Figure 19:
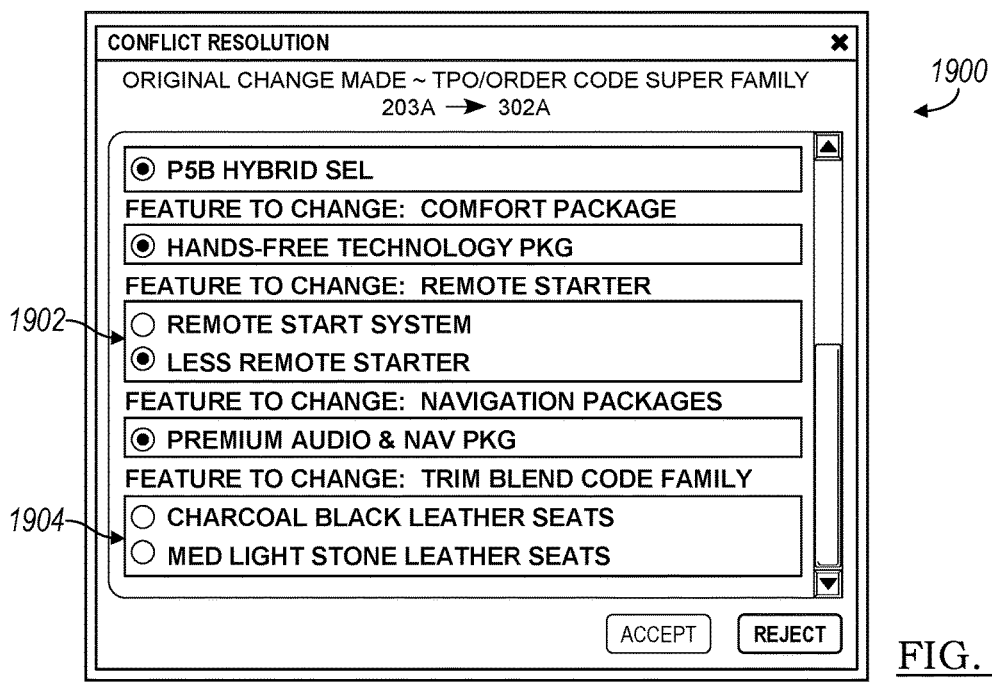
FIG. 19 is a window displayed to the user based on a conflict resolution procedure of the configuration engine of FIG. 2 according to another embodiment.

Referring to FIG. 19, the configurator application 104 includes a branched conflict resolution strategy, according to one or more embodiments. In branched conflict resolution, the configuration service 138 presents the user with a series of choices to help them select from a set of valid configurations. For example, FIG. 19 depicts a user interface 1900 that is displayed to the user on the user device (e.g., on the monitor of the PC 112) by the front-end application 132. The user interface 1900 includes a series of choices for a remote starter option (e.g., with or without (less) the remote starter), as referenced by numeral 1902, and a series of choices for the color of the seats (e.g., Charcoal Black or Medium Light Stone), as referenced by numeral 1904. In one embodiment, the branched conflict resolution strategy may be enabled by setting a return guided resolution flag (not shown), which is included in the communication between the front-end application 132 and the service API 134.

With respect to state management, when a branched conflict resolution is returned in the response to the service API 134, there will be no feature state because the new configuration isn't known until the user traverses the resolution tree, (i.e., selects from the options shown in the user interface 1900). Once selections have been made, the front-end application 132 sends a second update request with all the changes made during resolution. At this time the response will include the new configuration state. Optionally, if there is only one target configuration, the response could include the new configuration state to save one call to the service.

In one or more embodiments, the conflict resolution strategy employed by the configurator application 104, may add a feature or subtract a feature, which is referred to as "return delta" functionality. In one or more embodiments, the conflict resolution subtractions only contain Selected features removed from the configuration; and conflict resolution additions only contain Included features added to the configuration. If the new configuration caused a change in a Default feature, this is not included in the prompt to the user (e.g., not shown in the user interfaces 1800, 1900). If all changes are for default choices, there are no changes to report, and the response will not include conflict resolution.

Alternatively, in other embodiments, the response will include all additions and subtractions regardless of feature state when the request has set the return delta flag to true. This allows the front-end application 132 to inspect the resolution and apply some additional logic when deciding whether to prompt the user for a conflict or to silently make the changes.

The configuration engine 106 "validates" each configuration. A load request from the services API 134 may include a full or partial configuration as a starting point. When a configuration is submitted to the configuration engine 106 with the load request, it is validated. By default, or when a validate flag is True, conflict resolution will be triggered and the response will include a valid configuration. However, if the request has set the validate flag to False, conflict resolution is not performed and an error message will be included in the response if the submitted configuration is not valid.

The configuration engine 106 performs steps on a buildable space in order to process a configuration request and generate data to build a response. The configuration engine 106 uses data structures and algorithms, including those based on multivalued decision diagrams (MDD) to perform the configuration steps. For comparison, some matrix based steps are also described.

In many cases the configuration engine 106 uses MDD steps to search the product space in the same way a structured query language (SQL) query searches a database. Both are preforming relational algebra. As appropriate, the SQL equivalent of each MDD step is described.

The configuration engine 106 checks if the buildable space defines a specific full configuration or a partial configuration, which is referred to as a "contains any" step.

In terms of SQL, this step is equivalent to performing a search and evaluating if there is at least one row in the result set. For example, consider the partial configuration (Dlx, Vista). If a database stored each configuration as a separate row, and each family choice as a string column, the SQL query would be SELECT * FROM mdd WHERE Radio='Dlx' AND Moonrf='Vista'.

For efficient storage, matrix and MDDs represent the product with superconfigurations. If each row in the database stored a superconfiguration with each feature as a Boolean column, the SQL would be SELECT * FROM mdd WHERE Dlx=TRUE AND Vista=TRUE.

For example, in one embodiment, the configuration engine 106 searches an MDD by stating the query as a feature mask. For example, to search for the partial configuration (Dlx, Vista) the mask would be 111 010 111 111 01. The radio family includes the following features: Standard (Std), Deluxe (Dlx) and Navigation (Nav). Since the search is limited to (Dlx), the only active bit corresponds to Dlx (i.e., 010) for the radio family. Additionally, the moonroof family includes: without a moonroof (Less) and with a moonroof (Vista). Since the search is limited to (Vista), the only active bit corresponds to Vista (i.e., 01). All other families are all 1s.

When the configuration engine 106 is performing a step to check for a partial configuration, one or more families will have all 1s. This means that the mask defines multiple configurations. The configuration engine 106 is querying the space to determine if any of the individual configurations defined in the feature mask superconfiguration are contained in the space. Thus the step is called "containsAny."

Figures 20, 21:
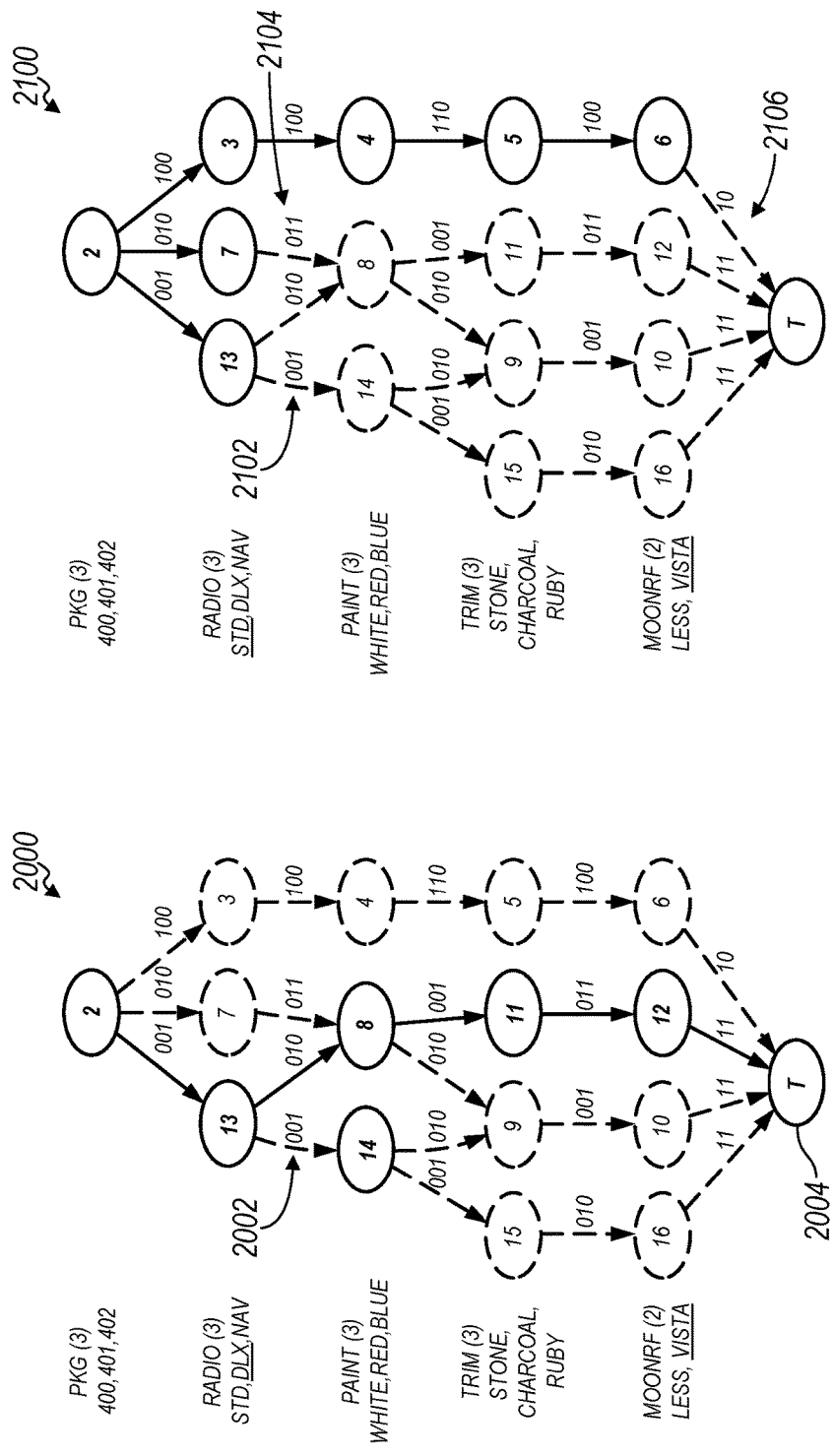
FIG. 20 is a diagram illustrating a containsAny operation performed by the configuration engine according to one embodiment.
FIG. 21 is another diagram illustrating a containsAny operation performed by the configuration engine according to another embodiment.

With reference to FIGS. 20 and 21, the configuration engine 106 performs an MDD-based "containsAny" step using a depth-first search of the space to look for the first valid path defining at least one of the configurations from the mask. In a depth-first search, the configuration engine 106 starts at the root node, and traverses the edges in descending order of its features; an edge of 011 will be processed by first inspecting 001 and then 010.

FIG. 20 is an MDD 2000 that illustrates an example of the configuration engine 106 performing an MDD-based "containsAny" step for the partial configuration (Dlx, Vista). To determine if this partial configuration is valid, the configuration engine 106 performs a depth-first search using the feature mask 111 010 111 111 01. The search begins with the path 2-13. This path is aborted when the Radio feature Dlx is inactive on edge 13-14, as shown by the dashed edge 2002. Next, the configuration engine 106 searches path 2-13-8-11-12-T. This path, highlighted by nodes in solid line, ends in True node 2004, indicating a valid path has been found containing the partial configuration (Dlx, Vista). Note there are three additional paths containing (Dlx, Vista), 2-13-8-9-10-T, 2-7-8-11-12-T, 2-7-8-9-10-T; but, the configuration engine 106 stops the "containsAny" step after the first path is found.

FIG. 21 is an MDD 2100 that illustrates an example of the configuration engine 106 performing an MDD-based "containsAny" step for the partial configuration (Std, Vista). To determine if this partial configuration is valid, the configuration engine 106 performs a depth-first search using the feature mask 111 100 111 111 01. The search begins with path 2-13 which is aborted because neither edge 13-14, nor 13-8 is active for the standard radio feature (i.e., neither of the edge labels include a "1" in their first digit), as shown by dashed edges 2102. Next the configuration engine 106 searches path 2-7, which is also aborted because Std is not active, as shown by dashed edges 2104. Finally, the configuration engine 106 searches path 2-3-4-5-6 and aborts the search because 6-T is not valid for MoonRf.Vista, as shown by dashed edge 2106. No paths are found containing both Std and Vista, thus this combination is found to be invalid.

The domain of a buildable space defines all the Available features—those features contained in one or more configurations. The domain can be represented as a bit set where each 1 (active feature) denotes a feature contained in the domain and each zero (inactive feature) denotes a feature absent from the domain. For any active bit in the domain, the space contains one or more configurations with that feature. If there is an inactive bit in the domain, the space contains no configurations with that feature. For a matrix, the domain is calculated by the OR of all superconfigurations in the space. The domain of the space shown in FIG. 10 is 111 111 111 11, because every feature is available in at least one configuration.

With an MDD, the configuration engine 106 calculates the domain by traversing the MDD in either a breadth-first or a depth-first manner, and using the active features on the edges to define the domain. In a breadth-first search, the configuration engine 106 starts with a root node, then explores neighbor nodes first before evaluating the next family. For example, the configuration engine 106 evaluates the MDD 2100 of FIG. 21 using a breadth-first strategy by starting with the root node 2 and evaluating path 2-13. Although path 2-13 is valid, the configuration engine evaluates neighbor nodes 7 and 3, i.e., paths: 2-7 and 2-3, before evaluating the next family, i.e., nodes: 14, 8 and 4. Once a path is determined to be invalid, the configuration engine 106 stops evaluating nodes farther down the path. For example, once path 13-14 is found to be invalid, the configuration engine 106 does not continue along the path to evaluate nodes 15 and 16. And as described above, in a depth-first search, the configuration engine 106 starts at the root node, and traverses the edges in descending order of its features. In the depth-first search, levels (families) are not back-tracked until an invalid path, or the truth node, is encountered. In the configuration engine 106, the full domain is not usually called, but rather domain is called on a restricted space. The domain of a restricted space is used in determining feature states.

The configuration engine 106 restricts a space by keeping only those configurations containing a specific feature or combination of features. With respect to a database query, the restrict step is equivalent to searching the table to find only those rows that match the query. The restricted features define the WHERE clause. Consider the partial configuration (Nav, Ruby, Vista). In terms of SQL, the query would be SELECT * FROM mdd WHERE Radio='Nav' AND Trim='Ruby' AND MoonRf='Vista'. In terms of superconfigurations, the step begins with creating a feature mask defining the query. This is the same feature mask that would be used for a containsAny step. For restrict, a space is created with the feature mask as its only superconfiguration. Then, the restricted space is created by the AND of the original space with the feature combination space.

Figures 22, 23:
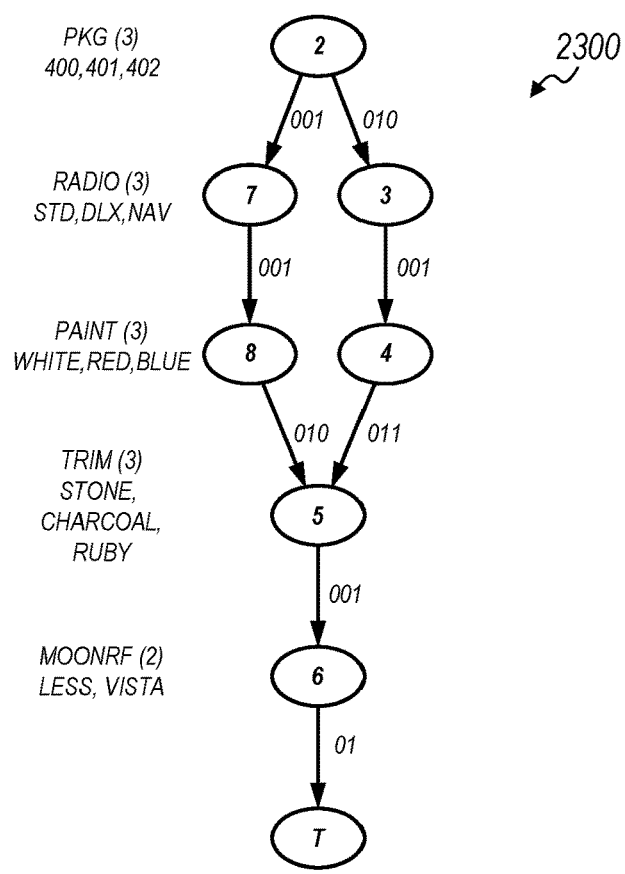
FIG. 22 is a table listing a restricted buildable space of the buildable space in FIG. 10.
FIG. 23 is a diagram illustrating a restricted buildable space of the buildable space in FIG. 13 and the table of FIG. 22.

FIGS. 22 and 23 show restrictions of the space defined in FIGS. 10 and 13. In the table 1000 shown in FIG. 10, the last two rows of superconfigurations contain the radio feature (Nav), the trim feature (Ruby) and both moonroof features (Vista and Less), which indicates that Nav and Ruby are available with the moonroof (Vista) or without the moonroof (Less). FIG. 22 is a table 2200 that depicts a restricted version of table 1000, in which the five superconfigurations of table 1000 are restricted to two superconfigurations, and the Moonrf.Less bit is set to zero to remove the configurations for (Nav and Ruby and MoonRf.Less). FIG. 23 is a restricted MDD 2300 illustrating the restricted superconfigurations of table 2200.

For some algorithms, successive restricts will be performed on the same space. When an MDD is restricted, a new set of nodes is created and the edges are updated for the nodes to keep only the constrained features. When many restrict operations are performed, many node objects must be created as the MDD is replicated. For large MDDs, this can cause the memory usage or "footprint" to increase, and may also incur performance problems from "garbage collection", i.e., reclaiming memory occupied by objects that are no longer in use by the program. The configuration engine 106 addresses these issues using a "quick-restrict" strategy.

Figure 24:
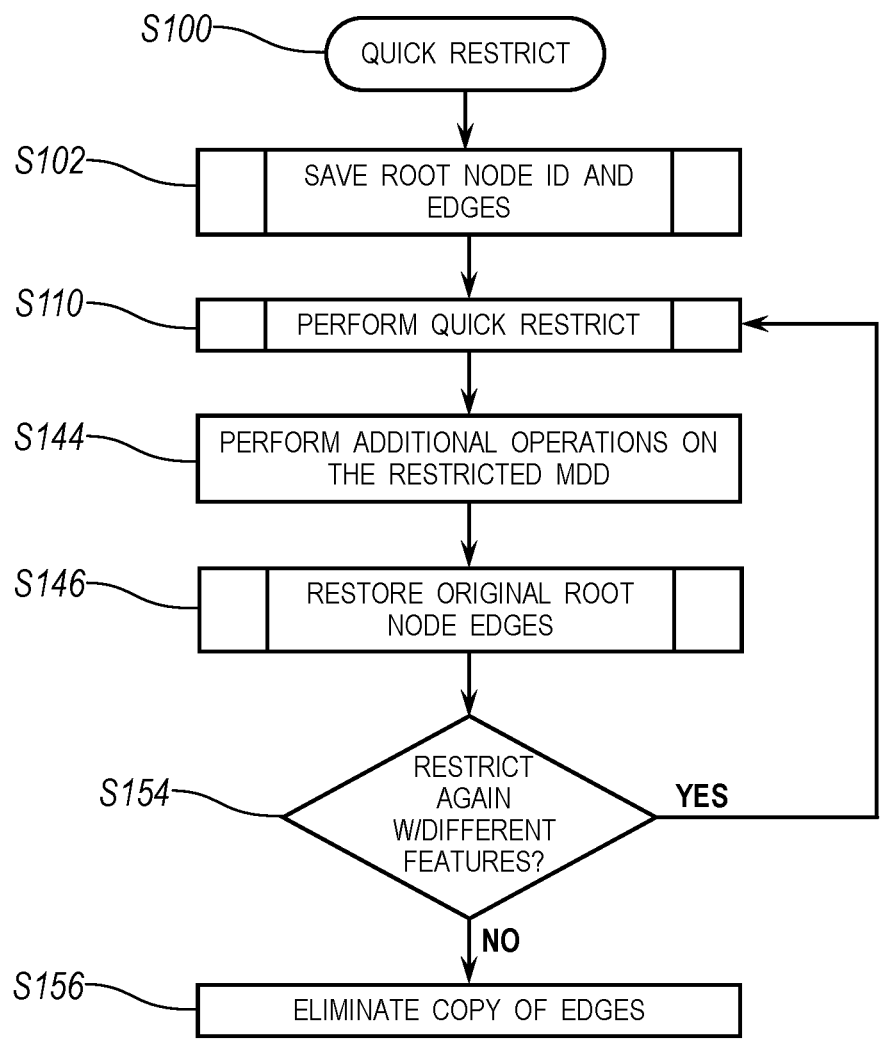
FIG. 24 is a flowchart illustrating a method for evaluating an MDD using reversible restrictions, according to one or more embodiments.
Figure 25:
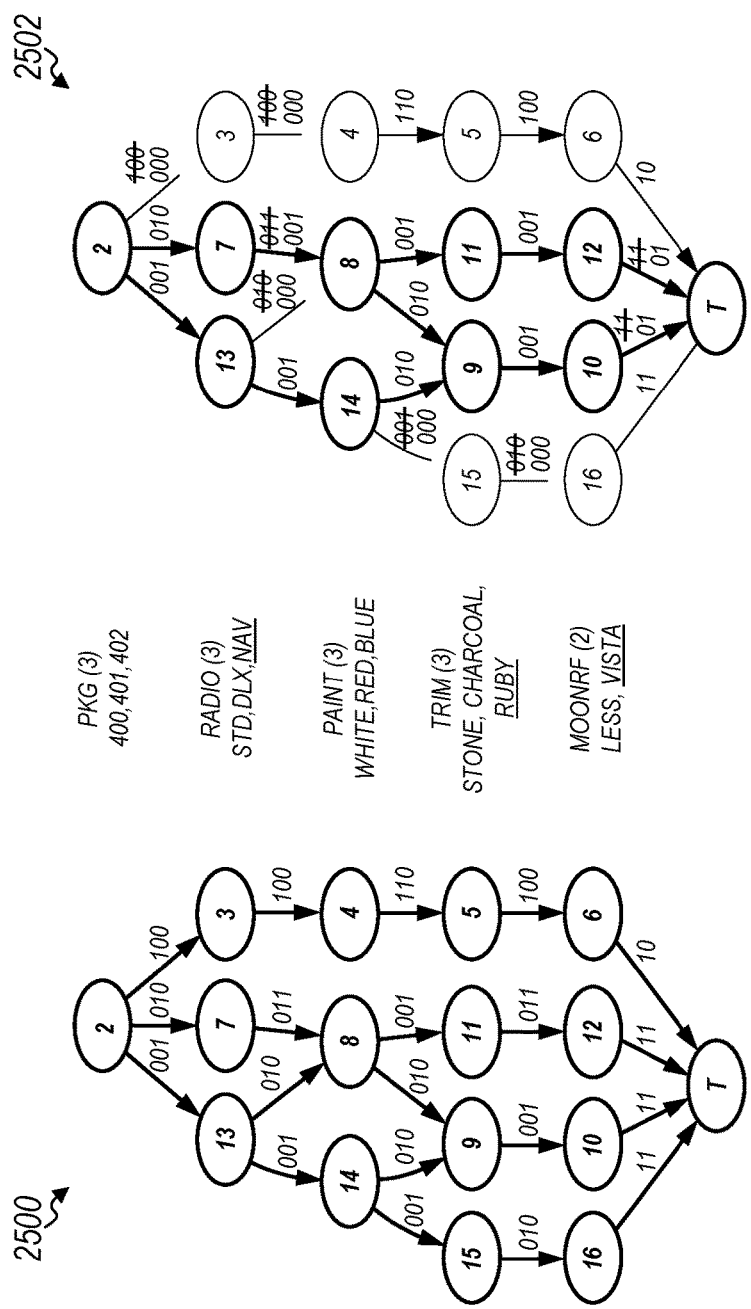
FIG. 25 is a diagram illustrating an example of various steps of the method of FIG. 24.

With reference to FIG. 24, a method for evaluating an MDD using reversible restrictions (i.e., "quick-restrict") is illustrated in accordance with one or more embodiments and generally referenced by S100. The quick-restrict method S100 is implemented as an algorithm within the configuration engine 106 using software code contained within the server 102, according to one or more embodiments. In other embodiments the software code is shared between the server 102 and the user devices 112, 114. FIG. 25 illustrates an original MDD 2500, and an MDD 2502 after it is "quick-restricted" to the partial configuration (Nav, Ruby, Vista) by the configuration engine 106 according to the quick-restrict method S100 of FIG. 24.

Figure 26:
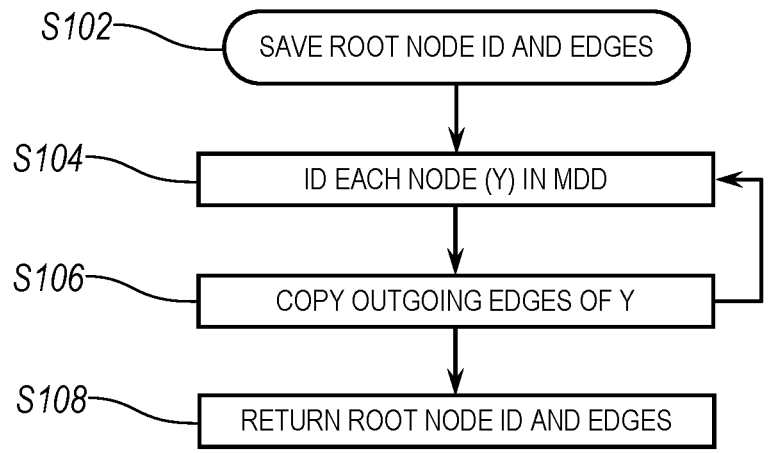
FIG. 26 is a flowchart illustrating a subroutine of the method of FIG. 24.

At S102, the configuration engine 106 saves a copy of the root node identity and a set of the node edges to the memory 108 (shown in FIG. 2). The subroutine of S102 is shown in the flowchart of FIG. 26. At step S104 the configuration engine identifies each node (y). Then at step S106 the configuration engine copies or clones each outgoing edge of the node (y), and returns to step S104 until each node (y) in the MDD 2500 is copied. Then at step S108, the configuration engine 106 returns the edge set and the identity of the root node to the main routine of FIG. 24.

Figure 27:
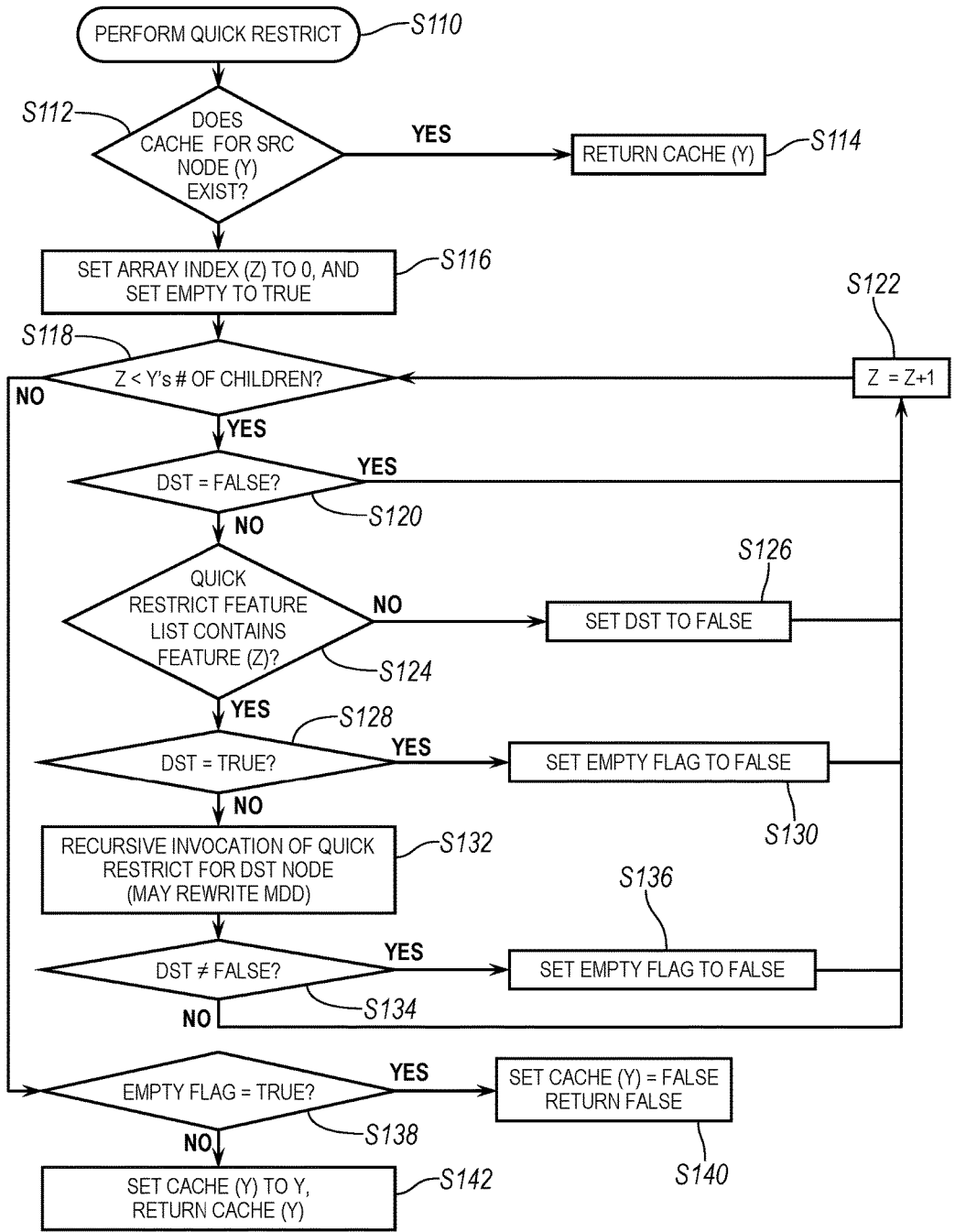
FIG. 27 is another flowchart illustrating a subroutine of the method of FIG. 24.

At step S110, the configuration engine 106 performs the quick-restrict subroutine for the given selected features. The subroutine of step S110 is shown in the flowchart of FIG. 27. At step S112 the configuration engine 106 examines the cache memory for source (SRC) node (y) to determine if the quick-restrict subroutine has already been performed on node (y), (i.e., does cache(y) exist?) If cache(y) exists, then the configuration engine 106 proceeds to step S114 and returns to the main routine. If cache(y) does not exist, the configuration engine 106 proceeds to step S116.

At step S116, the configuration engine 106 starts with array index zero, and sets the empty flag to true. By setting the empty flag to true, the configuration engine 106 assumes that there are no valid paths from the node, i.e., that all edges point to the false node. At step S118, the configuration engine 106 evaluates the array index (z) to determine if (z) is less than the number of node (y)'s children. A positive determination at step S118 indicates that the configuration engine 106 has not analyzed all array indexes of node (y). If the determination is positive, the configuration engine 106 proceeds to step S120.

At step S120, the configuration engine 106 checks if y's child, or destination (DST) node, at array index (z) is false. If the configuration engine 106 determines that the child is false, then it proceeds to step S122, increments the array index (z) by one, and returns to step S118. With reference to FIG. 25, the MDD 2500 does not show false nodes, but they are still present. For example, node 9 shows only one outgoing edge with the label "001." This indicates that array indexes zero and one are both false, but they are not shown extending to the false node on the MDD 2500 to avoid clutter. When analyzing node 9, the configuration engine 106 makes a positive determination at S120 for array indexes zero and one, but makes a negative determination for array index two. If the determination at step S120 is negative, the configuration engine 106 proceeds to step S124.

At step S124, the configuration engine 106 evaluates the quick-restricted features list for node (y) to determine if it contains feature (z). Otherwise, the configuration engine 106 sets y's child node along z to false at S126 and then proceeds to step S122 to increment the array index(z) by one.

At step S128, the configuration engine 106 check's if y's child (DST) at array index (z) is true. For example, with reference to MDD 2500, node 16 connects to the true node (T) along array indexes zero and one. If the configuration engine 106 determines that the child node is the true node, then it proceeds to step S130 and sets the empty flag to false (empty=false), which indicates that there is at least one edge that is connected to the true node (T), and then proceeds to step S122. If the determination at step S128 is negative, the configuration engine proceeds to step S132.

For example, referring to MDD 2500, node 3 is illustrated with one outgoing edge with the label "100", which indicates that node 3 includes the Standard radio, but does not include the Deluxe radio or the Navigation radio. Since the Navigation radio was selected by the user, the configuration engine 106 determines that none of node 3's outgoing edges contain (z)'s corresponding feature. Therefore the configuration engine 106 sets node 3's children to false at S126, which is illustrated by disconnecting the outgoing edge to node 4 (as shown in MDD 2502) and the edge label for path 3-4 is replaced with an edge label of "000." However, referring to MDD 2500, node 7 includes two array indexes (011), which indicate that node 7 includes the Deluxe radio and the Navigation radio. Since the Navigation radio was selected by the user, the configuration engine 106 determines that one of node 7's outgoing edges contain (z)'s corresponding feature at S124, therefore the outgoing edge is not disconnected from node 8 (as shown in MDD 2502) and the edge label for path 7-8 is replaced with an edge label of "001".

As shown in MDD 2502, the configuration engine 106 removes the edge pointer for path 13-8 because Navigation is not an active feature for the Radio family (i.e., there was not a "1" in the third digit of the edge label); and removes the edge pointer for path 15-16 because Ruby is not an active feature for the Trim family at S126. Since only Vista is constrained for the moonroof family; the configuration engine 106 modifies the edge labels for paths 10-T and 12-T from "11" to "01". If the determination at step S128 is negative, the configuration engine 106 proceeds to step S132.

At step S132, y's children, or (DST) nodes, are rewritten by the result of recursive invocation of the quick-restrict method on the child. All nodes of the MDD are processed in this manner.

At step S134, the configuration engine 106 checks y's child at array index (z) to determine if it's not a false node. If the determination is positive (e.g., if node (y) is connected to a valid node), then the configuration engine 106 proceeds to step S136 and sets the empty flag to false, before incrementing the array index (z) at S122. However, if node (y) is connected to the false node along array index (z) then then the configuration engine 106 proceeds directly to S122 to increment the array index (z).

The quick restrict method S110 operates on the nodes in a depth first search fashion. Steps S118-S136 demonstrate an iterative process that operates on each array index (z) of a node (y) before proceeding to the next node. Once the configuration engine 106 has evaluated all array indexes (z) for a node (y), it will make a negative determination at step S118 (i.e., z will be greater than or equal to the number of y's children), and proceeds to step S138.

At step S138 the configuration engine 106 checks if all children (DST) of node (y) are false, i.e., it evaluates the empty flag to determine if any valid configurations were found. If all of y's children are false, the configuration engine 106 proceeds to step S140, sets node (y) to the false node, set cache(y) to y, and then returns the cache(y), i.e., saves the analysis of node (y) and returns to the main routine of FIG. 24. Further, if the node does not contain any edges that conform to the constraint, then the edge pointer is disconnected from the child node in the MDD. If not all of the children nodes are false, then the configuration engine 106 proceeds to step S142, sets the cache(y) to (y), and then returns the cache(y), i.e., saves the analysis of node (y) and returns to the main routine of FIG. 24.

For example, referring to FIG. 25, the configuration engine 106 determines that node 3's features do not contain the Selected radio feature (Nav) at S124, and therefore sets node 3's child (node 4) to false at S126. Setting node 4 to false is represented by disconnecting the edge pointer between node 3 and node 4 in MDD 2502. The configuration engine 106 determined that all of node 3's children were set to false at S138, and therefore set node 3 to false at S140. Setting node 3 to false is represented by disconnecting the incoming edge pointer to node 3 in the MDD 2502.

Similarly, the configuration engine 106 disconnects the incoming edge pointer to node 15 at S140, because all of node 15's children were set to false at S126, which is depicted by the disconnected outgoing edge pointer of node 15 in MDD 2502. Although the edge label for path 7-8 was revised at S126, the edge pointer was not disconnected. Therefore the configuration engine 106 determines that not all of node's 7 children are false at S138, and proceeds to S142 without setting node 7 to false or disconnecting its incoming edge pointer in the MDD 2502.

The quick-restrict subroutine S110 is a recursive process. This process continues until all nodes are analyzed. The edges for complete paths from the root node (node 2) to the truth node (T) define the restricted configuration space.

At step S144 the configuration engine 106 performs additional steps on the restricted MDD 2502. In one embodiment, after completing a traversal of the MDD in a first direction (e.g., downward), the configuration engine 106 determines the domain for a restricted space by traversing the MDD again in the same direction (i.e., the configuration engine repeats S110 for all nodes).

In another embodiment, the configuration engine 106 determines the domain at the same time as traversing the MDD in the first direction (i.e., during S110). Then at step S144, the configuration engine 106 changes direction (i.e., reverses) and traverses the MDD in a second direction, e.g., upwards from the truth node (T) to the root node (2). On the downward traversal, the configuration engine 106 trims the edges to conform to the constraint. On the upward traversal, the domain bit set is created from the remaining edges. Combining quick-restrict and domain in a single operation saves one traversal of the MDD. However, the operation modifies the MDD and the edges must be reset to undo the quick-restrict.

Figure 28:
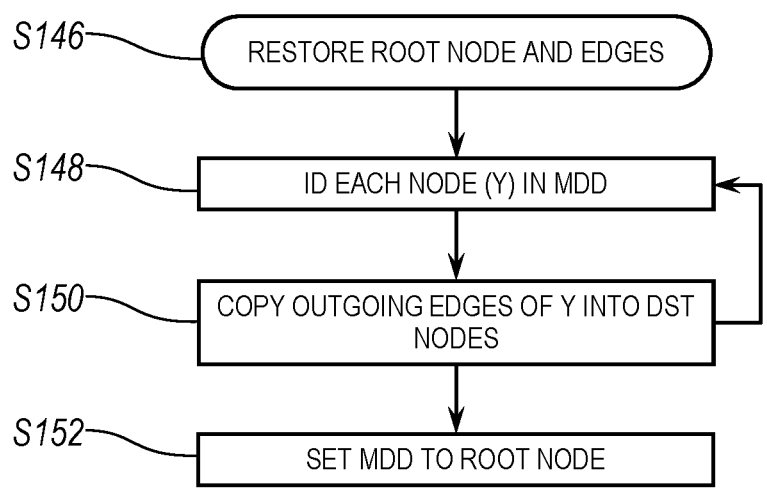
FIG. 28 is yet another flowchart illustrating a subroutine of the method of FIG. 24.

At S146, the configuration engine 106 restores the original set of node edges to the memory 108 (shown in FIG. 2). The subroutine of S146 is shown in the flowchart of FIG. 28. At S148 the configuration engine identifies each node (y). Then at step S150 the configuration engine 106 copies each outgoing edge of the node (y), and returns to step S148 until each node (y) in the MDD 2500 is copied. Then at step S152, the configuration engine 106 sets the MDD to the identity of the root node and returns to the main routine of FIG. 24.

At step S154 the configuration engine 106 determines if the user has selected different features. If the user has selected new features, the configuration engine 106 returns to S110. If the user has not selected new features, then the configuration engine 106 proceeds to step S156 and deletes the copy of each node from S102 to free memory.

As shown in MDD 2502, paths 9-10-T and 11-12-T are duplicate paths, because they include the same features. As described above with reference to FIGS. 22-23, the restrict operation will reuse nodes to avoid duplicate nodes or sub-paths. Although, the quick-restricted MDD 2502 may contain more nodes than the restricted MDD 2300, the configuration spaces defined by each are identical.

The quick-restrict method S100 provides advantages over existing methods by performing successive restricts without creating a new MDD for every step. The configuration engine 106 saves the original edge pointers at S102 and then quickly resets the MDD 2500 using the original edge pointers.

There are some cases, where a more efficient algorithm can perform the same operation without having to do the quick-restrict method, eliminating the time needed to reset the edge pointers. This time savings, while small, can be significant when working with extremely large configuration spaces. A "Restricted Domain" algorithm is one such algorithm.

In other embodiments, the configuration engine 106 determines a read-only restricted domain using an external set of edges (not shown). Instead of modifying the original MDD node edges the external edges are modified to reflect the restricted space. The configuration engine 106 restricts on the downward traversal and then updates the domain on the upward traversal. Such a method is a read-only, thread-safe operation, because the MDD is not modified.

The quick-restrict with domain operation method S100 is slightly slower than this read-only approach for the same calculation; however, the time saved in the read-only operation is due to not having to reset the edges. FIG. 29 is a table 2900 illustrating a comparison of the performance of the quick-restrict with domain operation method S100 to the read-only method. The larger and more complex the buildable space, the more nodes in the MDD, and the more time it requires to reset the edges after the quick-restrict method S100.

Figures 30, 31, 32, 33:
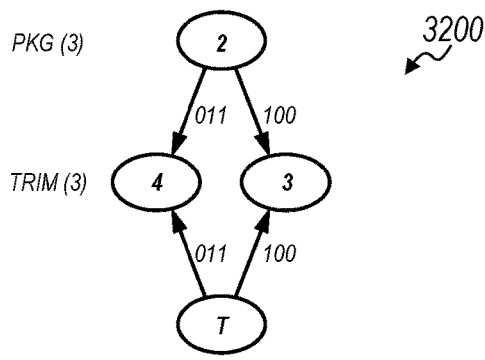
FIG. 30 is a table illustrating a reduction of the buildable space of FIG. 10.
FIG. 31 is a table illustrating a projected space after the overlap has been removed and the space has been compressed.
FIG. 32 is a diagram illustrating the table of FIG. 30.
FIG. 33 is a table illustrating combinations of features of the buildable space of FIG. 13.

With reference to FIGS. 30-32, the configuration engine 106 performs a "project" operation of an MDD to trim a space to a subset of the families while keeping all unique configurations, according to one or more embodiments. In terms of SQL, the projection operation is equivalent to specifying which columns of a table are returned in the query. To project the space to the package (Pkg) and the trim (Trim) families, the equivalent SQL would be: SELECT DISTINCT Pkg and Trim FROM mdd.

Selecting distinct configurations means that the resulting space should contain no duplicated configurations. During the MDD project operation, the configuration engine 106 removes any duplicated configurations (also called overlapping superconfigurations).

FIG. 30 is a table 3000 that shows the result of the configuration engine 106 reducing the buildable space in FIG. 10 to keep only the columns for the package and trim families. This space contains duplicate configurations. For example a configuration including the 401 package and Ruby trim is defined in Row 3 and in Row 4. Likewise a configuration including the 402 package and Ruby trim is defined in Row 3 and in Row 5. Therefore Row 4 and Row 5 are duplicates of Row 3 and can be removed. Further, Row 2 and Row 3 can be compressed to a single row. FIG. 31 is a table 3100 that shows the projected space after the overlap (duplicated configurations) has been removed and the space has been compressed. FIG. 32 is an MDD 3200 that represents table 3000.

With reference to FIG. 33, the configuration engine 106 lists, or enumerates all valid configurations that are utilized in conjunction with a constraint restricting the families to a subset of all families, according to one or more embodiments. Given a subset of families, enumeration will return all valid combinations of the features in those families. In terms of superconfigurations, enumeration is the opposite of compression.

The configuration engine 106 works with individual features which are added or removed from a current single configuration. While this suits the requirements of most ordering and build and price applications, in some cases, the configuration engine 106 enumerates the valid combinations of those features without working through all the possible paths.

The total number of possible permutations of features in a configuration model can be very large, so this configuration service is restricted to enumerating a reasonable subset of feature families. The configuration engine 106 can impose limits on the number of families that can be enumerated, however, it should be expected that a request resulting in more products than can be stored in a storage medium will not succeed.

FIG. 33 is a table 3300 that shows all valid combinations of paint and trim defined in FIG. 13. The configuration engine 106 generates this list by first projecting the space to paint and trim. Next the configuration engine 106 traverses the MDD paths and expands each superconfiguration into individual configurations.

The configuration engine 106 determines if a new configuration is valid, in response to every configuration request. Where auto-completion is enabled, the configuration request will contain a full configuration, otherwise it will be a partial configuration. In either case, the configuration engine 106 validates the configuration request using the MDD "containsAny" operation. A configuration is valid if the containsAny operation returns true.

Each feature included in the configuration response will have a feature state attribute, e.g. Selected, Available, Included, Default, Excluded or Forbidden. For a given set of selected features, the configuration engine 106 calculates the feature states for the remaining features.

There are multiple approaches for calculating feature states. In one embodiment, the configuration engine 106 calculates feature states using a basic algorithm that includes restricted domain steps which can be applied to both Matrices and MDDs. In another embodiment, the configuration engine 106 calculates feature states for MDDs using dynamic programming techniques.

Figure 34:
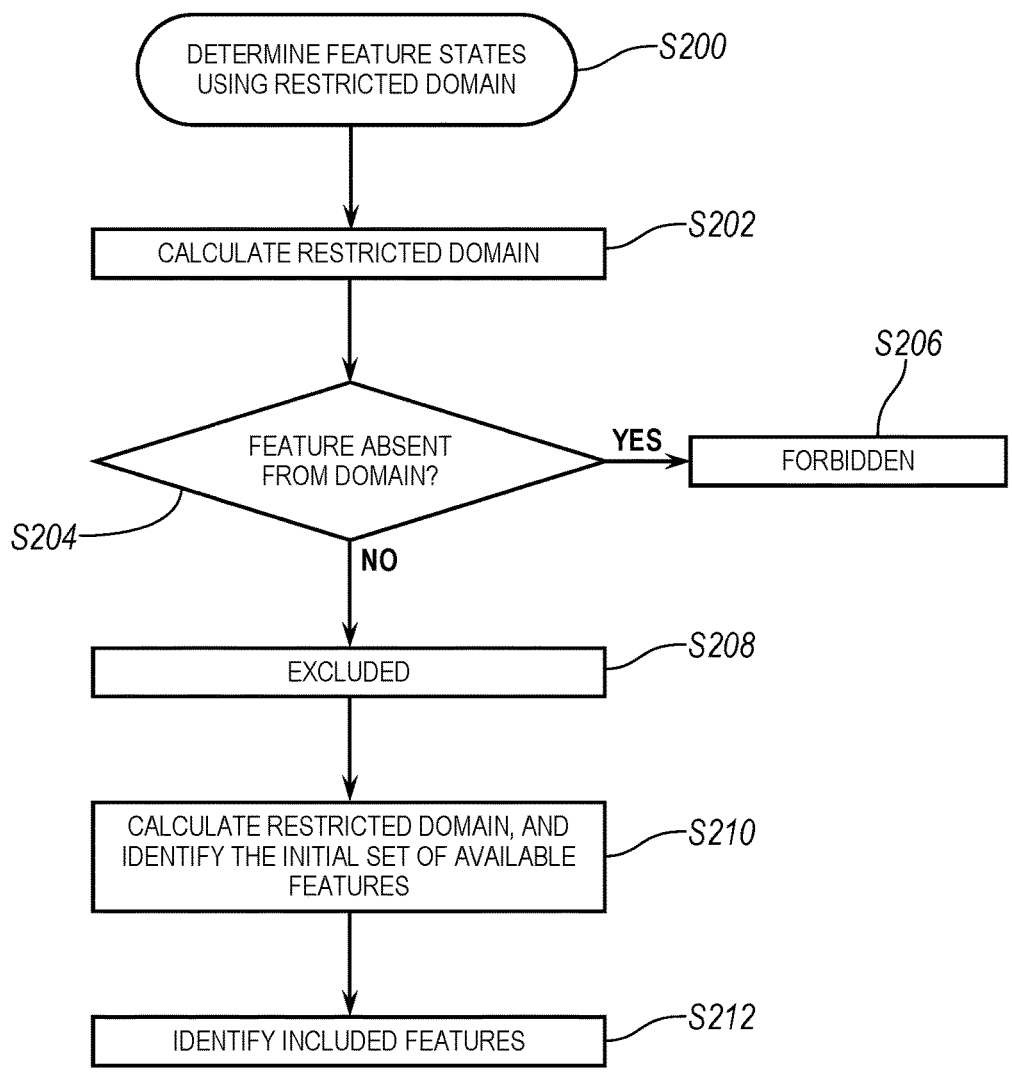
FIG. 34 is a flowchart illustrating a method for determining MDD feature states according to one or more embodiments.

With reference to FIG. 34, a method for determining feature states using a restricted domain is illustrated in accordance with one or more embodiments and generally referenced by S200. The method S200 is implemented as an algorithm within the configuration engine 106 using software code contained within the server 102, according to one or more embodiments. In other embodiments the software code is shared between the server 102 and the user devices 112, 114.

First the configuration engine 106 identifies Forbidden features and Excluded features. At step S202 the configuration engine 106 determines the restricted domain with respect to any initial locked features imposed on the user. For example, the initial restriction can be timing point feature(s) which are features used to control the effectivity and visibility of configurations. For example, a new feature (e.g., new engine x) may be available only after the start of a new model year. Thus the first day of the new model year would be such a visible timing point. At step S204, the configuration engine 106 identifies features that are absent from the restricted domain, and classifies them as Forbidden features at S206. At step S208, the configuration engine 106 classifies any feature that is not Forbidden, as an Excluded feature unless it is assigned another feature state (i.e., Available, Included or Default) in the remaining steps of the algorithm.

At step S210, the configuration engine 106 first determines the restricted domain of all selections to identify an initial set of Available features. Then, for each selection $F_j$, the configuration engine 106 checks the restricted domain (selected—$F_j$) to identify Available features for Family j.

For example, FIG. 35 is a table 3500 illustrating a set of superconfigurations that define all valid configurations. FIG. 36 is a table 3600 that depicts the restricted domains used to determine the Available features and the Excluded features when the Selected features are Red paint and Ruby trim. A bit value of zero in table 3600 indicates that a feature is not Available, whereas a bit value of one indicates that the feature is Available.

First, the configuration engine 106 determines the restricted domain of all selections to identify an initial set of Available features at S210. For example, Red paint and Ruby trim are both available for the configurations listed in rows 3-5 of the table 3500. Packages 401 and 402 are Available, but package 400 is not Available for the configuration listed in rows 3-5, as referenced by numeral 3502. Therefore the restricted domain for the package family is "011", as referenced by numeral 3602, which indicates that package 400 is not Available (i.e., "0"), and package 401 and 402 are Available (i.e., "11"). Any feature that is active in this domain is set as active in the availability bit set. Thus, the configuration engine 106 identifies package 401 and package 402 as being Available features, as referenced by numeral 3604, and these features are set as active ("1") in the availability bit set, as referenced by numeral 3606.

Next, the configuration engine 106 evaluates the restricted domain (selected—Ruby) to identify Available features for the trim family. To evaluate (selected—Ruby), the configuration evaluates configurations in which Red paint is Available. For example, Red paint is Available for the configurations listed in rows 1 and 3-5 of the table 3500. Stone trim and Ruby trim are Available for the configurations listed in rows 1, and 3-5; but Charcoal trim is not Available, as referenced by numeral 3508. Therefore the restricted domain for the trim family is "101", as referenced by numeral 3608. The availability bit set for the trim family is revised to "101" based on this step, as referenced by numeral 3610.

Then, the configuration engine 106 evaluates the restricted domain (selected—Red) to identify Available features for the paint family. To evaluate (selected—Red), the configuration evaluates configurations in which Ruby trim is Available. For example, Ruby trim is Available for the configurations listed in rows 3-5 of the table 3500. Red paint and Blue paint are Available for the configurations listed in rows 3-5, but White paint is not Available, as referenced by numeral 3512. Therefore the restricted domain for the trim family is "011", as referenced by numeral 3612. The availability bit set for the paint family is revised to "011" based on this step, as referenced by numeral 3614.

As shown in the availability bit set of table 3600, the restricted domain for Red paint includes both Stone trim and Ruby trim. Both of these selections are Available without having to change the Red paint selection. The selection of Ruby trim excludes White paint, and shows that both Red and Blue paint are Available. Thus White paint would require the trim selection to be changed to something other than Ruby.

The resulting availability can be defined as bit set 011 011 011 101 11. The state of Red paint and Ruby trim will be Selected, all other active features will be Available and the inactive features, such as White paint and Charcoal trim, will be Excluded.

Referring back to FIG. 34, the configuration engine 106 identifies any Included features at step S212. A feature is Included if there is only one Available feature for a non-Selected feature family. The non-Selected feature families listed in table 3600 are packaging (Pkg), radio (Radio) and moonroof (MoonRf). All of these feature families include more than one Available feature (i.e., each family includes more than one "1" in each cell). Thus, table 3600 shows no such Included features for a selection of Red paint and Ruby trim.

FIG. 37 is a table 3700 that depicts the restricted domains used to determine the Available features and the Excluded features when the Selected features are the 401 package (Pkg.401) and Red paint (Paint.Red). An Included feature can be the result of the interactions between multiple features. For example, table 3700 shows that if the 401 package and Red paint are Selected, then Ruby trim is an Included feature, as referenced by numeral 3720, because it is the only possible trim choice that is compatible with the 401 package and Red paint.

Thus, the configuration engine 106 determines the feature states e.g. Selected, Available, Included, Excluded and Forbidden for a given set of selections using the method S200. This initial feature state determination is referred to as "Minimum Completion." FIG. 38 is a table 3800 that summarizes the results of the Minimum Completion determination when Red paint and Ruby trim have been selected from the product definition in FIG. 35.

The configuration engine 106 determines the restricted domain by traversing the MDD. Performing the Minimum Completion operation using restricted domain means that for each additional selection, another restricted domain operation is performed. Thus, for N selections, N+2 restricted domain determinations are performed. These restricted domain operations include an initial restriction at S202, a restriction for the initial available set, followed by one for each feature at S210.

For MDDs, there is an alternate approach for determining the Available features using dynamic programming principles with a single operation that includes one downward traversal and one upward traversal of the MDD. This approach is more memory efficient and faster, especially for larger MDDs.

Figure 39:
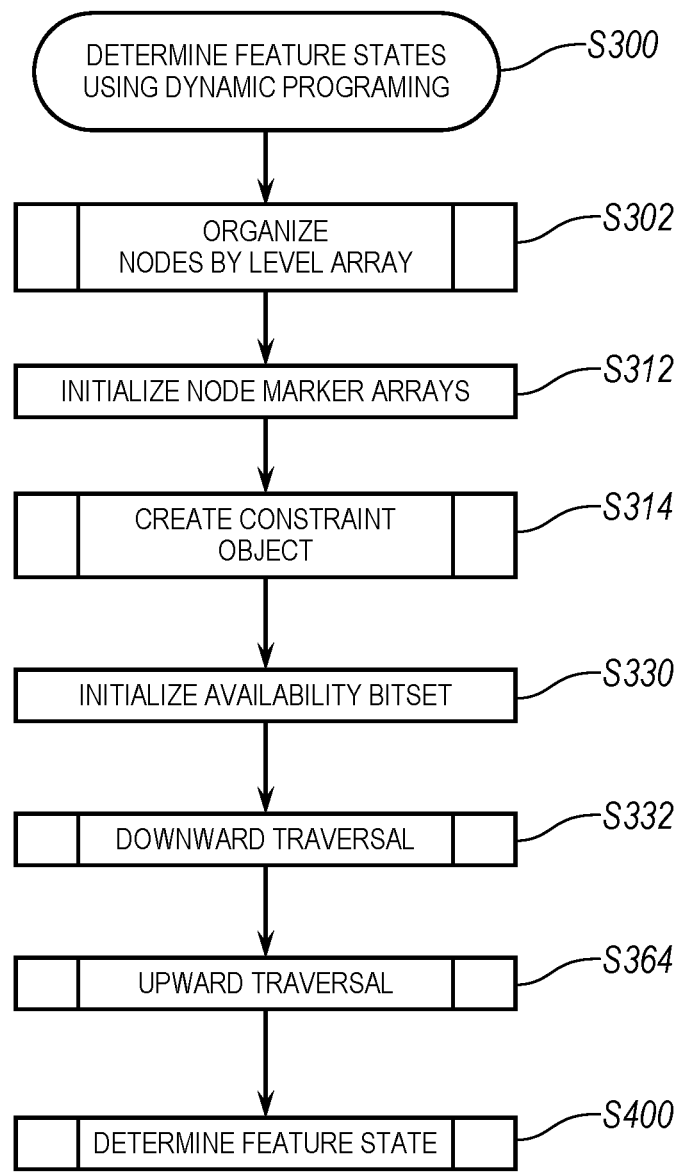
FIG. 39 is a flowchart illustrating another method for determining MDD feature states according to one or more embodiments.

With reference to FIG. 39, a method for determining feature states using dynamic programming is illustrated in accordance with one or more embodiments and generally referenced by S300. The method S300 is implemented as an algorithm within the configuration engine 106 using software code contained within the server 102, according to one or more embodiments. In other embodiments the software code is shared between the server 102 and the user devices 112, 114.

Figure 40:
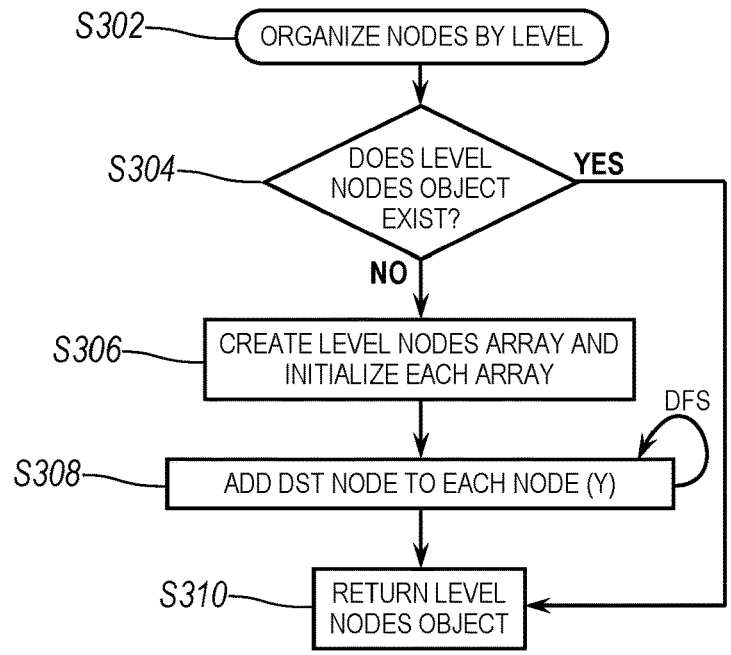
FIG. 40 is a flowchart illustrating a subroutine of the method of FIG. 39.

At S302, the configuration engine 106 organizes the data into nodes by family and level. The subroutine of S302 is shown in the flowchart of FIG. 40. At step S304, the configuration engine 106 determines if a level node object exists, i.e., if the nodes are already organized by level. Otherwise, the configuration engine 106 proceeds to step S306 and organizes the nodes into a level node array where the length of the array is equal to the number of families. The configuration engine 106 initializes each level array with an empty nodes list, i.e., sets the empty flag to true. At step S308, for each node (y) analyzed, the configuration engine 106 appends a node (e.g., adds a child node) to the analyzed node's level node list. Step S308 is a recursive step, therefore the configuration engine 106 repeats S308 until it finds the True node. After step S308 the configuration engine 106 proceeds to step S310 and returns to the main routine of FIG. 39 to analyze the nodes by level.

Figure 45:
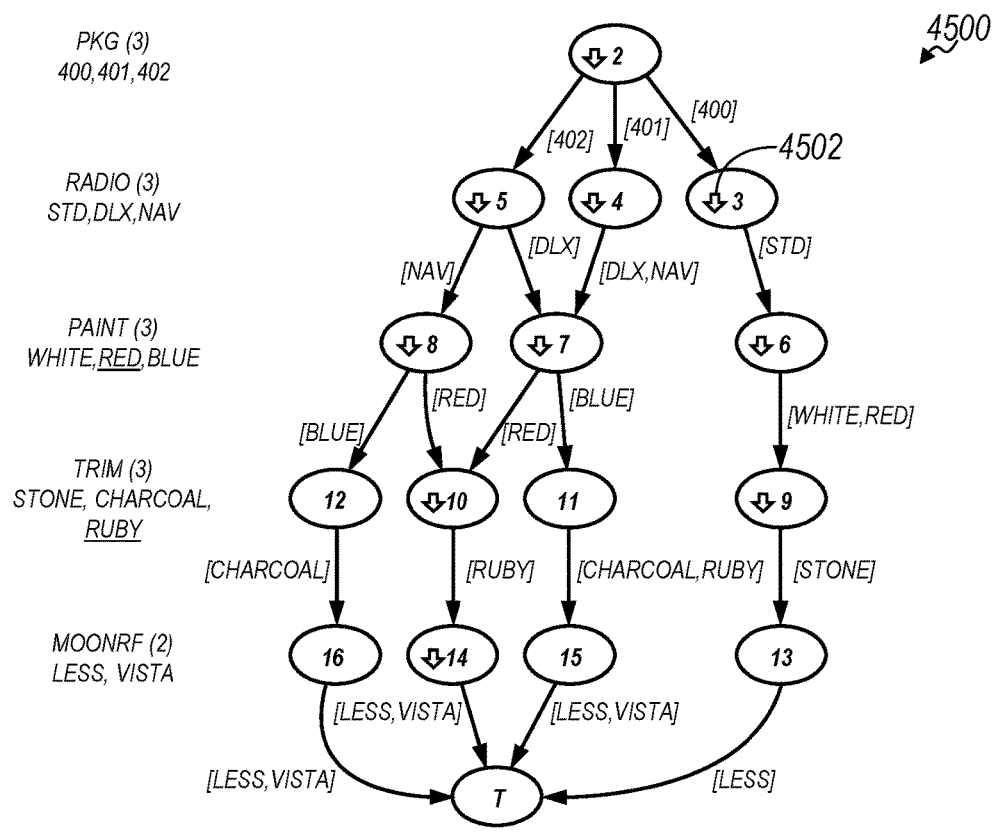
FIG. 45 is a diagram illustrating an example of various steps of the method of FIG. 39.

FIG. 45 is an MDD 4500 illustrating the data organized by level according to S302 and a selection of Red paint and Ruby trim. The MDD 400 includes five levels. Level zero represents the package (Pkg) family, which includes three package features: 400, 401 and 402 that are depicted by edges (level arrays) 001, 010 and 100, respectively, that extend from node 2. Level one represents the Radio family, which includes three radio features: Std, Dlx and Nav that are depicted by edges (level arrays) 001, 010 and 100, respectively, that extend from nodes 3-5. Level two represents the Paint family, which includes three paint features: White, Red and Blue, that are depicted by edges (level arrays) 001, 010 and 100, respectively, that extend from nodes 6-8. Level three represents the trim family, which includes three trim features: Stone, Charcoal and Ruby, that are depicted by edges (level arrays) 001, 010 and 100, respectively, that extend from nodes 9-12. Level four represents the moonroof (MoonRf) family, which includes two moonroof features: Less and Vista, that are depicted by edges (level arrays) 01 and 10, respectively, that extend from nodes 13-16. Node 1 is the true node and node 0 is the false node (not shown).

At step S312, the configuration engine 106 initializes the state, or marking of each node, by creating a place for each value. For example, by default, all features are initially set to false (i.e., not marked) except the root node 2 and the true node 1. The root node 2 is set to true for the downward traversal (i.e., marked with a downward arrow); and the true node 1 is set to true for the upward traversal (i.e., marked with an upward arrow). Marking a node with a downward arrow indicates a valid partial configuration from the root node 2 down to the marked node and any intervening downward marked nodes along the path. Similarly, marking a node with an upward arrow indicates a valid partial configuration from the true node 1 up to the marked node and any intervening upward marked nodes along the path.

Figure 41:
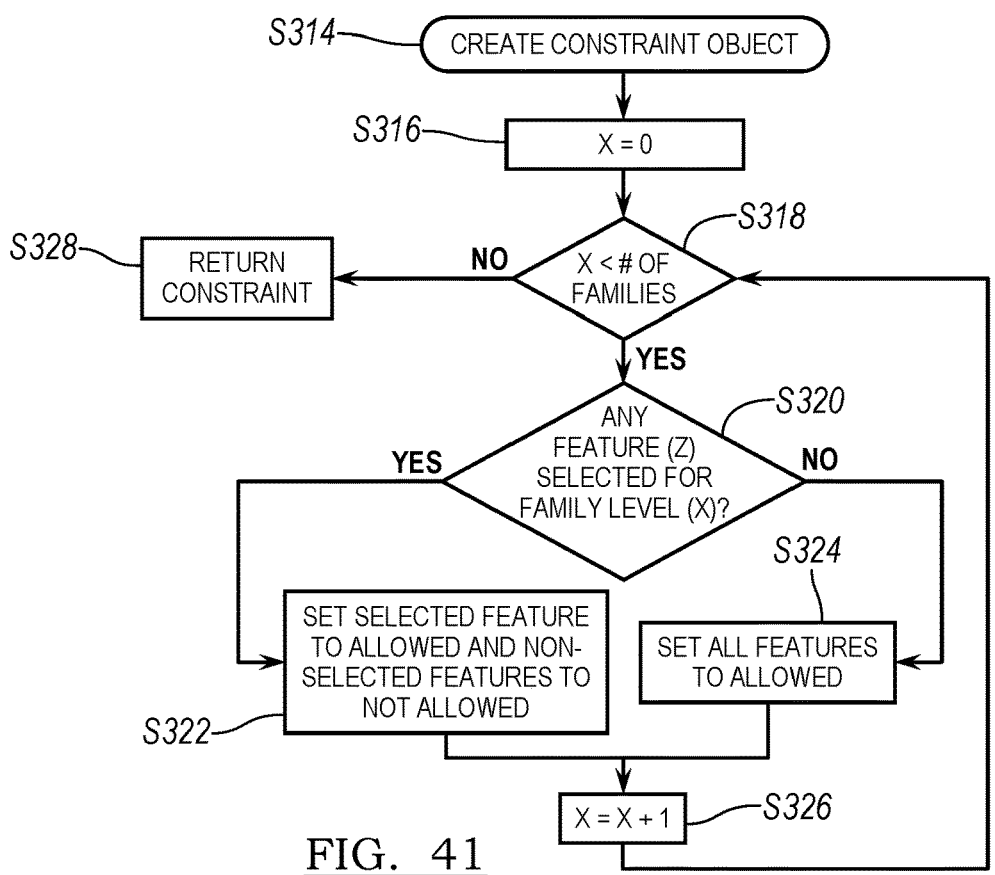
FIG. 41 is another flowchart illustrating a subroutine of the method of FIG. 39.

At S314, the configuration engine 106 creates a constraint object. The subroutine of S314 is shown in the flowchart of FIG. 41. The configuration engine 106 starts analyzing family level zero of the MDD 4500 (i.e., the package family) at step S316. At step S318, the configuration engine 106 determines if the family level (x) is less than the total number of families included in the MDD. If so, the configuration engine 106 proceeds to step S320.

At step S320 the configuration engine 106 determines if the user has selected a feature for family level (x). If the user has selected a feature for family level (x), the configuration engine 106 proceeds to step S322 and sets the Selected feature to the Allowed feature state and sets the non-selected features for family level (x) to not allowed. If no features are selected for family level (x), the configuration engine 106 proceeds to step S324 and sets all features to the Allowed feature state. After steps S322 and S324, the configuration engine 106 proceeds to step S326 to evaluate the next family by incrementing family level (x) by one (i.e. x=x+1), then returns to step S318.

Once the configuration engine 106 has created a full constraint object using subroutine S314, the family level (x) will no longer be less than the total number of families, and the configuration engine 106 will make a negative determination at step S318. For example, after the configuration engine 106 evaluates the moonroof family (level 4), it will set x to five at step S326. Since there are five families in the MDD 4500, the configuration engine 106 will determine that x (5) is not less than the number of families (5) at step S318 and then proceed to step S328 and then return to the main routine of FIG. 39.

At step S330 the configuration engine 106 initializes an availability bit set. The configuration engine 106 initializes the availability bit set by setting all bits to zero, which indicates that the features are Excluded. Whereas a bit set value of one indicates that a feature is Available.

Figure 42:
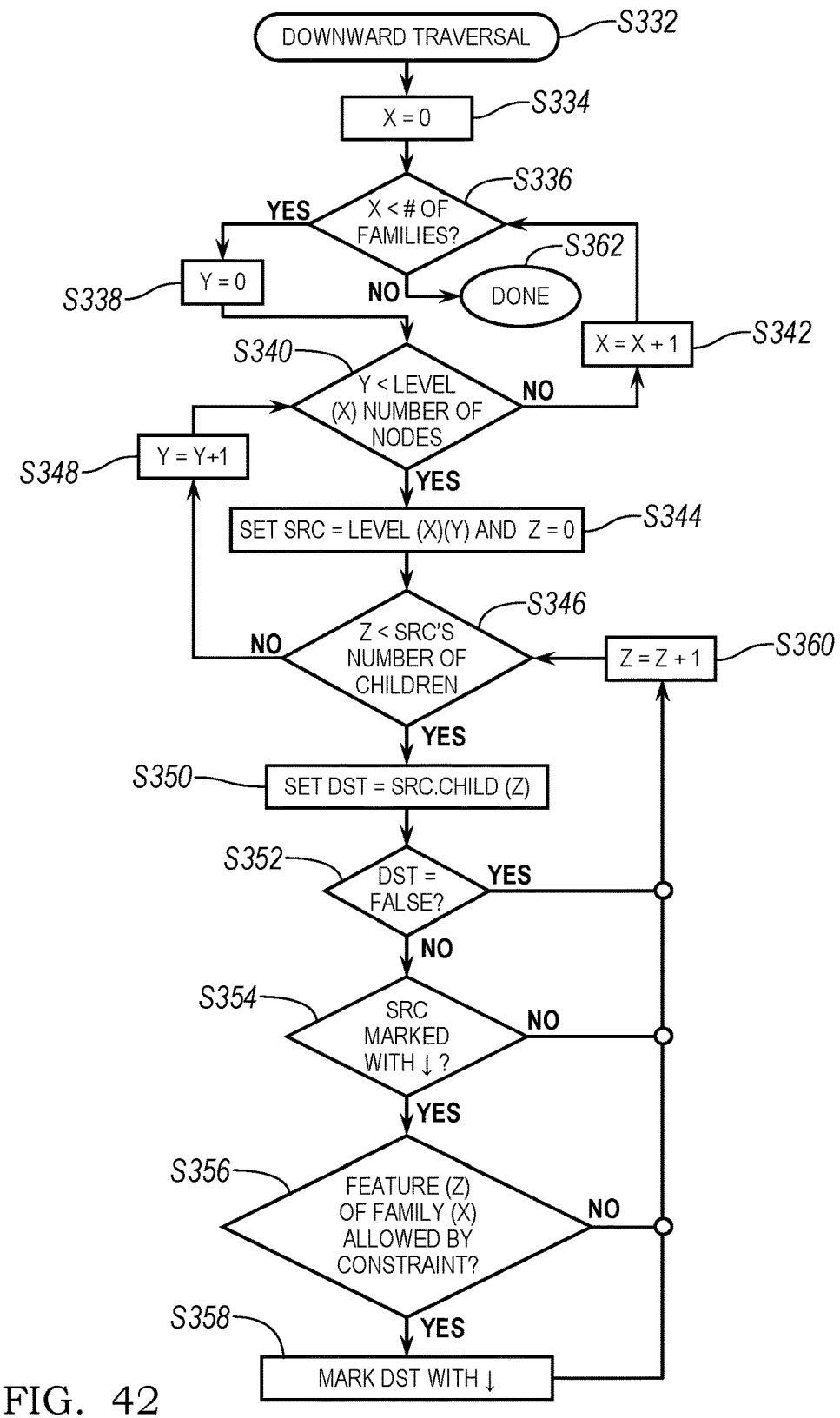
FIG. 42 is yet another flowchart illustrating a subroutine of the method of FIG. 39.

At S332, the configuration engine 106 traverses the MDD 4500 in a downward direction. The subroutine of S332 is shown in the flowchart of FIG. 42. The configuration engine 106 starts analyzing the nodes included in family level zero of the MDD 4500 (i.e., the package family) at step S334. At step S336, the configuration engine 106 determines if the family level (x) is less than the total number of families included in the MDD. If so, the configuration engine 106 proceeds to step S338.

At step S338, the configuration engine 106 starts analyzing node zero. At step S340 the configuration engine 106 compares the node number (y) to the number of nodes at the current level (x) to determine if y<Level (x) number of nodes. For example, initially, x is equal to zero and Level (0) has one node, therefore y is less than 1. If y is not less than the number of nodes at level (x), the configuration engine proceeds to step S342 and increments the level (x) by one.

After a positive determination at step S340, the configuration engine 106 proceeds to step S344 and sets the currently analyzed node or source node (SRC) to level(x) node (y); and sets the array index (z) extending from SRC to zero. The array index (z) corresponds to a feature of the family (x). At step S346 the configuration engine 106 compares the array index (z) to the SRC's number of children. If z is not less than SRC's number of children, the configuration engine 106 proceeds to step S348 and increments the node (y) by one. If the determination at step S346 is positive, the configuration engine 106 proceeds to step S350.

At step S350, the configuration engine 106 sets the destination node (DST) to be the child node of node (y) along array index (z) (DST =SRC.child(z)). The configuration engine 106 analyzes three conditions to determine whether or not to mark the destination node with a downward arrow:
1) the destination node is not a false node;
2) the source node was previously marked with a downward arrow; and
3) the feature of array index (z) is allowed by constraint. These three conditions are illustrated by steps S352-S358 in FIG. 42.

At step S352, the configuration engine 106 evaluates the DST node to determine if it is a false node. Otherwise, the configuration engine 106 proceeds to step S354 to determine if the source node (i.e., the parent of the currently analyzed destination node) was previously marked with a downward arrow.

After a positive determination at S354, the configuration engine 106 determines if the feature of array index (z) is allowed by constraint at step S356, which was previously determined in steps S320-S324 (FIG. 41). If the conditions of steps S352, S354 and S356 are met, the configuration engine 106 proceeds to step S358 and marks the destination node with a downward marker, by setting mark.down(DST) to true. If any of the conditions of steps S352, S354 and S356 are not met, the configuration engine 106 proceeds to step S360 and increments the array index (z) by one.

Referring to FIG. 45, the MDD 4500 illustrates the marked nodes after the downward traversal subroutine S332 of FIG. 42 for a selection of Red paint and Ruby trim. The configuration engine 106 marks Node 2 with a downward marker at S312 because the root node is a special case that always has a valid downward path. On the downward traversal of the MDD 4500, a node is marked at S358 if the conditions of steps S352-S356 are met for the analyzed node. For example, the configuration engine 106 marks destination node 3 with a downward marker or arrow 4502 at S356 because node 3 was determined to not be a false node at S352; node 3's source node (node 2) was previously marked with a downward arrow at S354; and the feature of the array index connecting node 2 and node 3 (i.e., Pkg.400) was determined to be allowed by constraint at S356. Since the user has not selected a packaging feature for this example, all packaging features are set to Allowed (see steps S320, S324 of FIG. 45.) Similarly, the configuration engine 106 determines that the remaining radio nodes and the paint family nodes (nodes 4, 5, 6, 7, and 8) have valid downward markers because the package (Pkg) family and the Radio family are not constrained. With respect to the partial configurations of Pkg and Radio, all features are Available because the user has not selected a feature from either family.

Regarding the trim level nodes (9-12), nodes 9 and 10 have downward markers because they were determined to not be false nodes at S352; their source nodes were marked with a downward arrow at S354; and they were determined to be on a valid path with Red paint at S356. However, nodes 11 and 12 do not have downward markers because they are not on a valid path with Red paint. Since the user has selected Red paint, the non-selected paint features (White and Blue) are set to not allowed at step S322 (FIG. 41) and thus the condition of step S356 is not met for nodes 11 and 12.

Regarding the moonroof level nodes (13-16), node 14 has a downward marker because it is valid with Ruby trim; however node 13 does not have a downward marker because it is not on a valid path with Ruby trim. Since the user has selected Ruby trim, the non-selected trim features (Stone and Charcoal) are set to not allowed at step S322 (FIG. 41) and thus the condition of step S356 is not met. Additionally, nodes 15 and 16 are not marked because their source nodes (11 and 12) were not marked, and thus nodes 15 and 16 do not satisfy the condition of step S354.

The downward traversal subroutine S332 includes three for-loops. Once the configuration engine 106 has analyzed all paths it will make a negative determination at step S336, i.e., the level (x) will not be less than the number of families; and the configuration engine 106 will proceed to step S362 and return to the main routine of FIG. 39.

Figure 43:
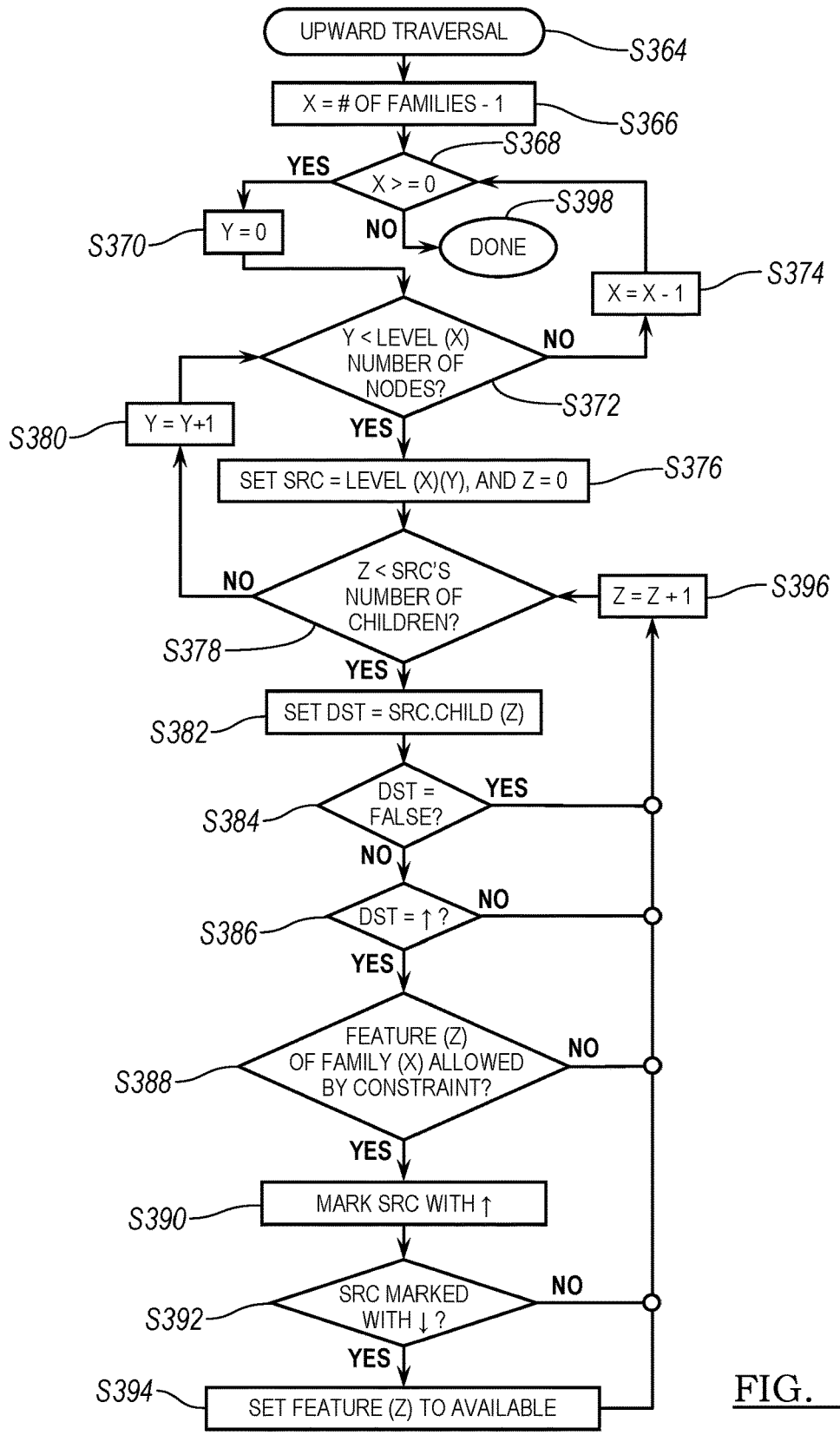
FIG. 43 is another flowchart illustrating a subroutine of the method of FIG. 39.
Figure 46:
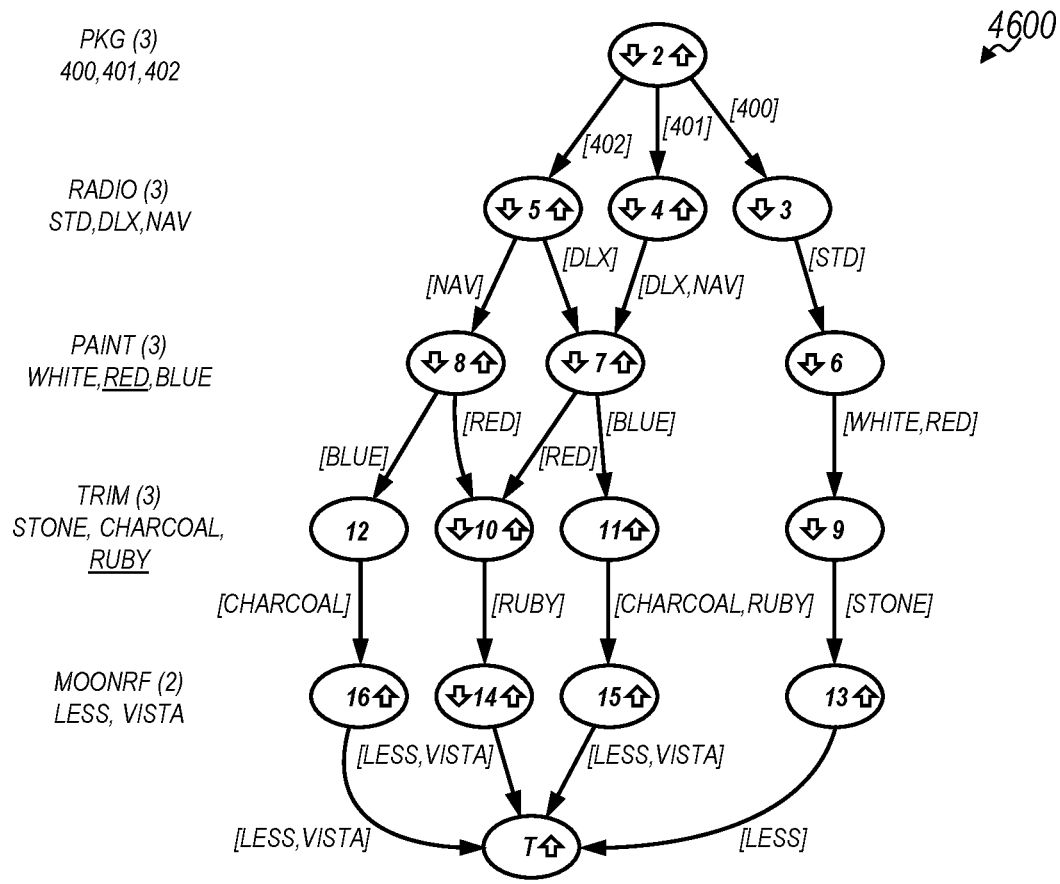
FIG. 46 is another diagram illustrating an example of various steps of the method of FIG. 39.

At S364, the configuration engine 106 traverses the MDD of FIG. 45 in an upward direction, which is illustrated by MDD 4600 in FIG. 46. The subroutine of S364 is shown in the flowchart of FIG. 43. The configuration engine 106 starts analyzing the nodes included in the last family level of the MDD 4600 (i.e., the moonroof family) at step S366. At step S368, the configuration engine 106 determines if the family level (x) is greater than or equal to zero (i.e., not negative). If so, the configuration engine 106 proceeds to step S370.

At step S370, the configuration engine 106 starts analyzing node zero. At step S372 the configuration engine 106 compares the node number (y) to the number of nodes at the current level (x) to determine if y<Level (x) number of nodes. For example, initially, x is equal to zero and Level (0) has one node, and therefore y is less than 1. If y is not less than the number of nodes at level (x), the configuration engine proceeds to step S374 and decreases the level (x) by one.

After a positive determination at step S372, the configuration engine 106 proceeds to step S376 and sets the currently analyzed node or source node (SRC) to Level(x)(y); and sets the array index (z) extending from SRC to zero. At step S378 the configuration engine 106 compares the array index (z) to the SRC's number of children. If z is not less than SRC's number of children, the configuration engine 106 proceeds to step S380 and increments the node (y) by one. If the determination at step S378 is positive, the configuration engine 106 proceeds to step S382.

At step S382, the configuration engine 106 sets the destination node (DST) to be the child node of node (y) along array index (z) (DST=SRC.child(z)). The configuration engine 106 analyzes three conditions to determine whether or not to mark the destination node with an upward arrow:
1) the destination node is not a false node;
2) the destination node was previously marked with an upward arrow; and
3) the feature of array index (z) is allowed by constraint. These three conditions are illustrated by steps S384-S388 in FIG. 43.

At step S384, the configuration engine 106 evaluates the DST node to determine if it is a false node. Otherwise, the configuration engine 106 proceeds to step S386 to determine if the destination node (i.e., the child of the currently analyzed source node) was previously marked with an upward arrow.

After a positive determination at S386, the configuration engine 106 determines if the feature of array index (z) is allowed by constraint at step S388, which was previously determined in steps S320-S324 (FIG. 41). If the conditions of steps S384, S386 and S388 are met, the configuration engine 106 proceeds to step S390 and marks the source node with an upward marker, by setting mark.up(SRC) to true.

At steps S392 and S394, the configuration engine 106 identifies Available features. The configuration engine 106 evaluates the source node to determine if it was previously marked with a downward arrow at S392; and if so it proceeds to step S394 and sets the feature (z) of node (y) to Available. Thus, Available features are identified by inspecting each node on the upward traversal. If there is a valid downward path to the node, and a valid upward path from one of its destinations, the configuration engine 106 identifies this node as part of a valid path with respect to selections from other families. Any feature that is on the edge from the node to the destination is identified as Available, because it can be selected without requiring a change to the constrained features. If any of the conditions of steps S384-S388 and S392 are not met, the configuration engine 106 proceeds to step S396 and increments the array index (z) by one.

Once the configuration engine 106 has analyzed all paths it will make a negative determination at step S368, i.e., the level (x) will not be greater than or equal to zero; and the configuration engine 106 will proceed to step S398 and return to the main routine of FIG. 39.

Figure 44:
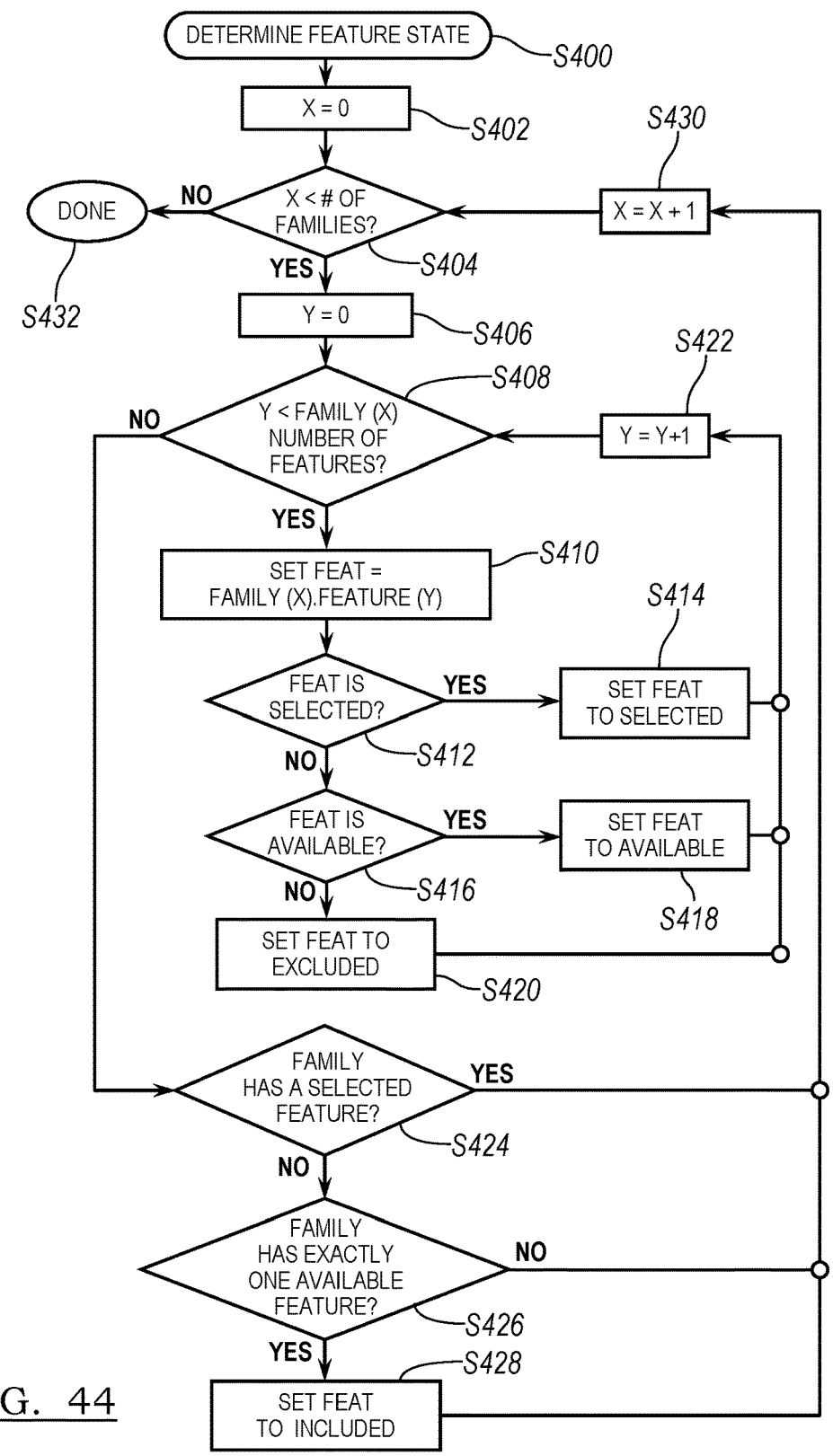
FIG. 44 is yet another flowchart illustrating a subroutine of the method of FIG. 39.

Referring to FIG. 39, after determining the availability of all features at S364, the configuration engine 106 proceeds to step S400 to determine the feature states. The subroutine of S400 is shown in the flowchart of FIG. 44. The configuration engine 106 starts analyzing the features included in family level zero of the MDD 4600 (e.g., the package family) at step S402. At step S404, the configuration engine 106 determines if the family level (x) is less than the total number of families included in the MDD. If so, the configuration engine 106 proceeds to step S406. At step S406, the configuration engine 106 starts analyzing node zero. At step S408 the configuration engine 106 compares the node number (y) to the number of features at the current family level (x) to determine if y<family (x) number of features.

After a positive determination at step S408, the configuration engine 106 proceeds to step S410 and sets the currently analyzed feature (FEAT) to Family(x).Feature(y). At step S412, the configuration engine 106 evaluates all of the features of a family, one at a time, to determine if a feature is selected. If a feature (FEAT) is selected, the configuration engine 106 sets the state of the feature to Selected at S414. If the feature is not selected, the configuration engine 106 proceeds to S416 to determine if the feature was set to Available at S394. If the feature is Available, the configuration engine 106 proceeds to operation S418 and sets the state of the feature to Available. If the feature is not Selected and not Available, the configuration engine 106 sets its state to Excluded at S420. After steps S414, S418 and S420 the configuration engine 106 proceeds to step S422 to increment the analyzed feature (y) by one. After evaluating each feature of family (x) to determine if it is Available, Selected or Excluded, the configuration engine 106 will make a negative determination at S408 and then proceed to step S424.

At steps S424-S428 the configuration engine 106 determines if family (x) has Included features. First the configuration engine 106 determines if family (x) has any Selected features at S424. Otherwise, the configuration determines if the family has exactly one Available feature at S426. If only one feature of a given family is Available, then the sole Available feature is set to Included at S428. After steps S424, S426 and S428 the configuration engine proceeds to step S430 and increments the family level (x) by one, then repeats steps S404-S428 for the next family level. Once the configuration engine 106 has determined the feature states for all families of the MDD, it makes a negative determination at S404 and then returns to the main routine at S432.

Just as the restricted domain method S200 can be performed as a read only step, the dynamic programming method S300 is also read-only and thread safe when the downward and upward markers are kept externally. Because feature state calculation operation is thread safe, multiple configuration requests could be handled simultaneously using the same MDD. Each request has its own copy of external downward and upward markers, and shares the MDD. Thread safety is a property that allows code to run in multi-threaded environments by re-establishing some of the correspondences between the actual flow of control and the text of the program, by means of synchronization. For N selections, the restricted domain calculation requires N+2 MDD traversals. An advantage of the dynamic programming method S300 over the restricted domain method S200 is that only two MDD traversals are required regardless of the number of selections. This provides the dynamic programming method S300 with superior scalability for large and complex MDDs.

Referring to FIG. 46, the MDD 4600 illustrates the marked nodes after the configuration engine 106 has performed the dynamic programming method S300 including the downward traversal subroutine of FIG. 42 and the upward traversal subroutine of FIG. 43 for a selection of Red paint and Ruby trim. The configuration engine 106 marks the truth node (T) with an upward marker at S312 because the truth node is a special case that always has a valid upward path.

On the upward traversal of the MDD 4600, a node is marked at S390 if the conditions of steps S384-S388 are met for the analyzed node. Regarding the moonroof level of nodes, the configuration engine 106 marks node 13 with a upward marker or arrow at S390 because its destination node (truth node) was determined to not be a false node at S384; node 13's destination node (truth node) was previously marked with an upward arrow at S386; and the feature of the array index connecting node 13 and the truth node (i.e., MoonRf.Less) was determined to be allowed by constraint at S388. Since the user has not selected a moonroof feature for this example, all moonroof features are set to Allowed (see steps S320, S324 of FIG. 41.) Similarly, the configuration engine 106 determines that the remaining moonroof level nodes (nodes 14, 15 and 16) have valid upward markers.

The configuration engine 106 determines the availability of the moonroof family features by evaluating the downward markers on the source moonroof nodes at S392 after evaluating the upward markers on the destination truth node (T) at S386. Since all of the moonroof nodes (13-16) were marked with a downward arrow and the truth node was marked with an upward arrow, the configuration engine 106 sets all of the moonroof features to Available at S394 and determines the initial availability bit set to be 000 000 000 000 11.

Regarding the trim level nodes (9-12), the configuration engine 106 marks node 10 with a upward marker or arrow at S390 because its destination node (node 14) was determined to not be a false node at S384; node 10's destination node (node 14) was previously marked with an upward arrow at S386; and the feature of the array index connecting node 10 and node 14 (i.e., Trim.Ruby) was determined to be allowed by constraint at S388, because it was selected by the user at S322. Similarly, the configuration engine 106 marks node 11 with an upward marker or arrow at S390. However, the configuration engine 106 does not mark nodes 9 and 12 with an upward arrow at S390 because they are not on a valid path with Ruby trim. Since the user has selected Ruby trim, the non-selected trim features (Stone and Charcoal) are set to not allowed at step S322 (FIG. 41) and thus the condition of step S388 is not met for nodes 9 and 12.

The configuration engine 106 determines the availability of the trim family features by evaluating the downward markers on the source trim nodes S392, after evaluating the upward markers on the destination moonroof nodes (13-16) at S386. Trim nodes 9 and 10 each have a downward marker and a destination with a valid upward marker (i.e., moonroof nodes 13 and 14). Therefore Ruby trim along path 10-14 and Stone trim along path 9-13 are marked as Available features at S394 because either can be on a path (in a configuration) with Red paint. However, trim nodes 11 and 12 do not have a downward marker and therefore are not marked as Available. The Trim selection can change from Ruby to Stone without requiring a change to the paint selection (Red). However, the Trim selection cannot change from Ruby to Charcoal without requiring a change to the paint (Red). Therefore the configuration engine 106 determines the Charcoal trim to be Excluded at S420. The configuration engine 106 determines the updated availability bit set to be 000 000 000 101 11.

Regarding the paint level nodes (6-8), the configuration engine 106 marks node 7 with an upward marker because its destination node (10) was determined to not be the false node at S384; its destination node (10) was previously marked with an upward arrow (S386); and the features of the array indexes connecting node 7 and node 10 (i.e., Paint.Red) were determined to be allowed by constraint at S388 because it was selected by the user at S322. Similarly, the configuration engine 106 marks node 8 with an upward marker or arrow at S390. However, the configuration engine 106 does not mark node 6 with an upward arrow at S390 because its destination node (9) was not marked with an upward arrow, and thus node 9 does not satisfy the condition of step S386.

The configuration engine 106 determines the availability of the paint family features by evaluating the downward markers on the source paint nodes (6-8) at S392, and by evaluating the upward markers on the destination trim level nodes (9-12) at S386. Paint nodes 7 and 8 each have a downward marker and a destination with a valid upward marker (i.e., trim nodes 10 and 11). Therefore Red paint along path 8-10 and path 7-10, and Blue paint along path 7-11 are marked as Available features at S394. White paint along path 6-9 is not marked as an Available feature at S394, because node 9 was not marked with an upward marker at S386. Since Red paint and Blue paint are both Available, the paint selection can be changed between Red and Blue, without requiring a change to the trim selection (Ruby). The configuration engine 106 determines the updated availability bit set to be 000 000 011 101 11.

With respect to the partial configurations of the package and radio families, all features are allowed at S324 because the user has not selected a feature from either family. Therefore nodes 2, 4 and 5 are marked with an upward arrow. But node 3 is not marked with an upward marker at S390 because its destination node (6) was not marked with an upward arrow, and thus node 3 does not satisfy the condition of step S386.

The configuration engine 106 determines the availability of the radio family by evaluating the downward markers on the source radio nodes (3-5) at S392, and by evaluating the upward markers on the destination paint nodes (6-8) at S386. Radio nodes 4 and 5 each have a downward marker and a destination with a valid upward marker (i.e., paint nodes 7 and 8). Therefore Navigation radio along path 5-8 and path 4-7, and Deluxe radio along path 5-7 and path 4-7 are marked as Available features at S394. The Standard radio along path 3-6 is not marked as an Available feature at S394, because node 6 was not marked with an upward marker at S386. Since the Navigation radio and the Deluxe radio are both Available, the radio selection can be changed between Navigation and Deluxe, without requiring a change to the paint selection (Red) or the trim selection (Ruby). The configuration engine 106 determines the updated availability bit set to be 000 011 011 101 11.

The configuration engine 106 determines the availability of the package family by evaluating the downward markers on the source package node (2) at S392, and by evaluating the upward markers on the destination radio nodes (3-5) at S386. The package node 2 has a downward marker and destinations with valid upward markers (i.e., radio nodes 4 and 5). Therefore the 401 package along path 2-4 and the 402 package along path 2-5 are marked as Available features at S394. The 400 package along path 2-3 is not marked as an Available feature at S394, because node 3 was not marked with an upward marker at S386. Since the 401 package and the 402 package are both Available, the package selection can be changed between 401 and 402, without requiring a change to the paint selection (Red) or the trim selection (Ruby). The configuration engine 106 determines the full availability bit set to be 011 011 011 101 11 using the dynamic programming method S300, which is consistent with its determination using the restricted domain method S200 as described above with reference to FIG. 34 and shown in FIG. 36.

Each time the user selects a feature, the configuration engine 106 updates the configuration by adding the new feature and removing the sibling features of the same family. Then the configuration engine 106 performs a "containsAny" operation, as described above with reference to FIGS. 20-21, to see if the MDD contains the new configuration. If the MDD does not contain the new configuration, then the new configuration is invalid and the configuration engine 106 performs a conflict resolution strategy.

Generally, there are two types of conflict resolution strategies invoked when a user selection, or change in selection, leads to a conflict: single conflict resolution and branched conflict resolution.

In single conflict resolution, the configuration engine 106 returns the single "next-closest" valid configuration and the feature additions and subtractions necessary to change the invalid configuration to a valid configuration in its response. The "closest" valid configuration would typically be determined by simply changing the newly requested feature back to its prior state. However, such a change would be inconsistent with the user's selection. Therefore the configuration engine 106 determines the next-closest valid configuration using a constraint that the newly requested feature is "locked" and not allowed to be changed, according to one or more embodiments.

In branched conflict resolution, the configuration engine 106 presents a set of configurations to the user in a resolution tree that are closest to the invalid configuration, and the user is prompted to make changes to the configuration to get to a valid configuration. When resolving conflicts there may be multiple valid configurations all at the same distance from the initial configuration. In this case there are a set of possible answers when finding the next-closest valid configuration. An option then is to use branched conflict resolution.

A strategy that is used to determine the closeness between configurations is referred to as the "minimum edit distance." In a configurator application 104, the configuration engine 106 determines the minimum edit distance between an invalid configuration selected by the user and one or more valid configurations. The minimum edit distance refers to the number of features in the configuration that must be changed in order to transform the invalid configuration into a valid configuration. When comparing the invalid configuration to a valid configuration, the configuration engine 106 considers substitute operations to identify what features must change to create a valid configuration without changing the newly requested locked feature.

Figure 47:
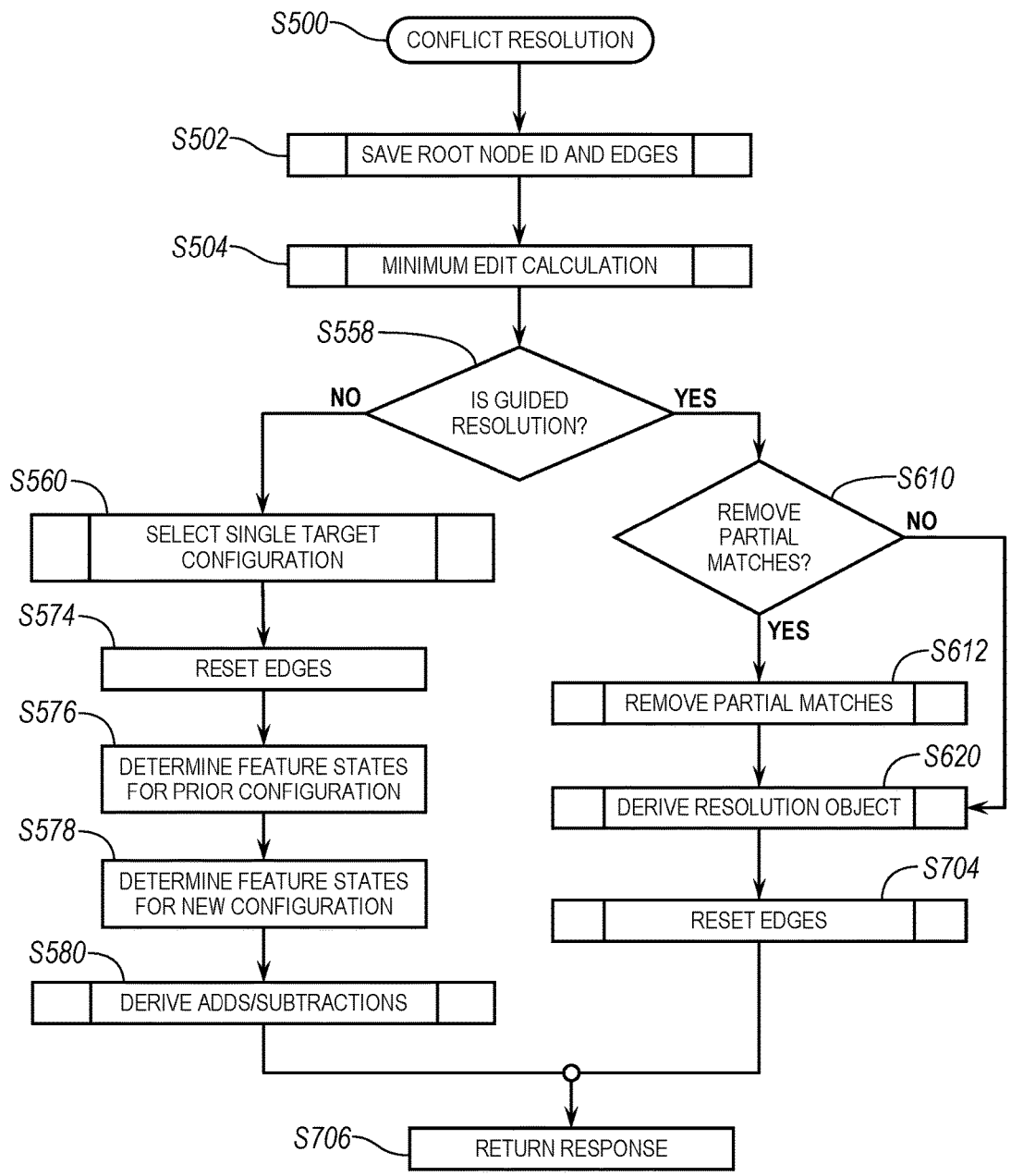
FIG. 47 is a flowchart illustrating a method for resolving conflicts between configurations according to one or more embodiments.

With reference to FIG. 47, a method for resolving conflicts between a user selected invalid configuration and one or more valid configurations is illustrated in accordance with one or more embodiments and generally referenced by S500. The method S500 is implemented as an algorithm within the configuration engine 106 using software code contained within the server 102, according to one or more embodiments. In other embodiments the software code is shared between the server 102 and the user devices 112, 114.

At step S502, the configuration engine 106 saves a copy of the root node identity and a set of the node edges to the memory 108 (shown in FIG. 2). S502 is similar to subroutine S102 described above with reference to FIG. 26. The configuration engine identifies each node (y), copies or clones each outgoing edge of each node (y) in an MDD, and then returns the edge set and the identity of the root node.

Figure 48:
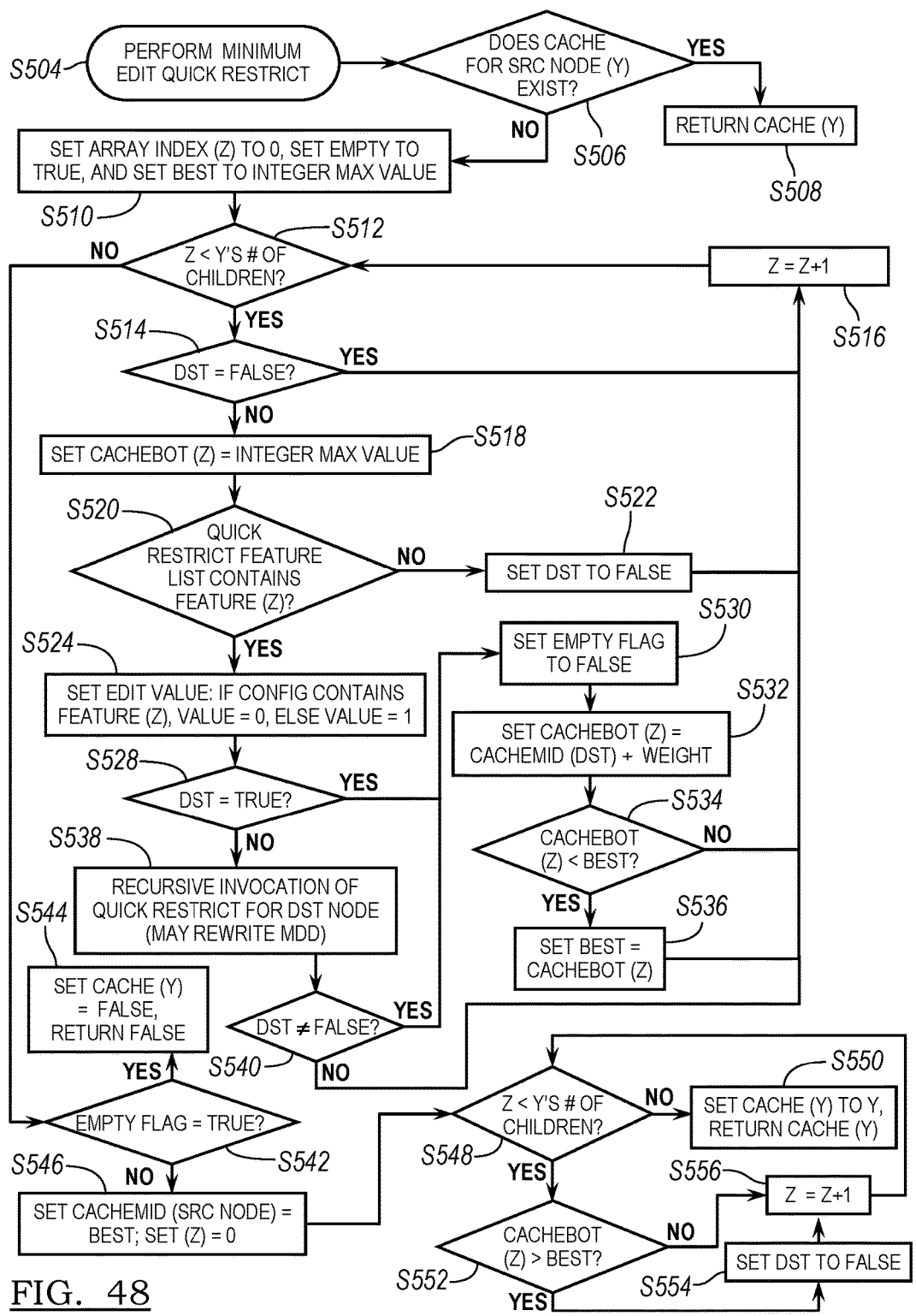
FIG. 48 is a flowchart illustrating a subroutine of the method of FIG. 47.

At step S504 the configuration engine 106 performs a minimum edit calculation of an MDD that is restricted to the configurations that contain the feature selection that triggered the conflict. In one embodiment the configuration engine 106 restricts the MDD using the restrict method as described above with reference to FIGS. 22-23. In other embodiments, the configuration engine 106 restricts the MDD using the quick-restrict method S100 described above with reference to FIGS. 24-28. The quick-restrict based minimum edit calculation subroutine of S504 is shown in the flowchart of FIG. 48.

At step S506 the configuration engine 106 examines the cache memory for source (SRC) node (y) to determine if the quick-restrict subroutine has already been performed on node (y). If cache (y) exists, then the configuration engine 106 proceeds to step S508 and returns to the main routine of FIG. 47. If cache (y) does not exist, the configuration engine 106 proceeds to step S510.

At step S510, the configuration engine 106 starts with array index zero, and sets the empty flag to true. By setting the empty flag to true, the configuration engine 106 assumes that there are no valid paths from the node, i.e., that all edges point to the false node. The configuration engine 106 also sets the minimum or best (Best) edit distance as the maximum allowable integer value (Integer Max Value).

At step S512, the configuration engine 106 evaluates the array index (z) to determine if (z) is less than the number of node (y)'s children. A positive determination at step S512 indicates that the configuration engine 106 has not analyzed all array indexes of node (y). If the determination is positive, the configuration engine 106 proceeds to step S514.

At step S514, the configuration engine 106 checks if y's child, or destination (DST) node, at array index (z) is false. If the configuration engine 106 determines that the child is false, then it proceeds to step S516, increments the array index (z) by one, and returns to step S512. If the determination at step S514 is negative, the configuration engine 106 proceeds to step S518.

At step S518 the configuration engine 106 initializes the edits for feature (z) to the maximum integer value, e.g., by setting the total edit distance (cacheBot (z)) for the path from the truth node to the source node to the Integer Max Value.

At step S520, the configuration engine 106 evaluates the quick-restricted features list for node (y) to determine if it contains feature (z). Otherwise, the configuration engine 106 sets y's child node along z to false at S522 and then proceeds to step S516 to increment the array index (z) by one.

At step S524, the configuration engine 106 sets the edit value (EDIT) for the source node at feature (z). If the configuration includes feature (z), then the configuration engine sets EDIT to zero. If the configuration does not include feature (z), then the configuration engine sets EDIT to one.

At step S528, the configuration engine 106 check's if y's child (DST) at array index (z) is true. If DST is true, the configuration engine 106 proceeds to step S530 and sets the empty flag to false. At S532, the configuration engine 106 calculates and stores the edit distance or cost (EDIT) for this feature. Then the configuration engine 106 calculates the total edit distance (cacheBot (z)) for the path from the truth node to the source node, as the sum of a previously calculated edit distance for the path (cacheMid (DST)) and EDIT. At step S534, the configuration engine 106 compares the total edit distance (cacheBot(z)) to the minimum edit distance (Best) for the given invalid configuration. If the total edit distance for the current feature (cacheBot (z)) is less than Best, the configuration engine 106 proceeds to step S536 and sets cacheBot (z) as Best. Then the configuration engine 106 proceeds to step S516 and increments feature (z) by one. If the configuration engine 106 determines that DST is not the true node at S528, it proceeds to step S538.

At step S538, y's children, or (DST) nodes, are rewritten by the result of recursive invocation of the quick-restrict method on the child. All nodes of the MDD are processed in this manner. At step S540, the configuration engine 106 checks DST to determine if it's not a false node. If the determination is negative, i.e., DST is the false node, then the configuration engine 106 proceeds directly to S516 to increment the array index (z). If the determination is positive (e.g., if node (y) is connected to a valid node), then the configuration engine 106 proceeds to steps S530-S536 to update the EDIT distance and compare it to the Best minimum edit distance.

The quick restrict based minimum edit calculation subroutine S504 operates on the nodes in a depth first search fashion. Steps S512-S540 demonstrate an iterative process that operates on each array index (z) of a node (y) before proceeding to the next node. Once the configuration engine 106 has evaluated all array indexes (z) for a node (y), it will make a negative determination at step S512 (i.e., z will be greater than or equal to the number of y's children), and proceeds to step S542.

At step S542 the configuration engine 106 checks if all children (DST) of node (y) are false, i.e., it evaluates the empty flag to determine if any valid configurations were found. If all of y's children are false, the configuration engine 106 proceeds to step S544, sets node (y) to the false node, and then returns the cache (y), i.e., saves the analysis of node (y) and returns to the main routine of FIG. 47. Further, if the node does not contain any edges that conform to the constraint, then the edge pointer is disconnected from the child node in the MDD. If not all of the children nodes are false, then the configuration engine 106 proceeds to step S546, sets the cacheMid (SRC Node) to Best, and then sets feature (z) to zero.

At step S548, the configuration engine 106 again evaluates the array index (z) to determine if (z) is less than the number of node (y)'s children. Otherwise, the configuration engine 106 proceeds to step S550, sets the cache (y) to (y), and then returns the cache (y), i.e., saves the analysis of node (y) and returns to the main routine of FIG. 47. A positive determination at step S548 indicates that the configuration engine 106 has not analyzed all array indexes of node (y). If the determination is positive, the configuration engine 106 proceeds to step S552.

At step S552, the configuration engine 106 compares the total edit distance (cacheBot (z)) to the minimum edit distance (Best) for the given invalid configuration. If the total edit distance for the current feature (cacheBot (z)) is greater than Best, the configuration engine 106 proceeds to step S554 and sets DST node to false at step S554, and then increments feature (z) by one at step S556 and then returns to S548.

The quick-restrict based minimum edit calculation subroutine S504 is a recursive process. This process continues until all nodes are analyzed, then the configuration engine 106 returns to the main routine of FIG. 47. The edges for complete paths from the root node (node 2) to the truth node (T) define the restricted configuration space.

Thus, the configuration engine 106 calculates the minimum edit distance of all paths, and identifies the minimum edit distance using subroutine S504. The configuration engine 106 calculates the minimum edit distance on the way back up the MDD, i.e., during an upward traversal. When a new minimum edit distance is found, prior minimum edit paths are trimmed from the MDD by setting the minimum edit distance (Best) to the currently analyzed path (cacheBot (z)) at S536. The minimum edit distance of a path refers to the sum of the edit distances of each edge. The edit distance for each feature change is 1. Where there is more than one active feature on an edge, the path for each feature is considered separately when calculating the minimum edit distance. Then the configuration engine 106 restricts the MDD to the paths that have the minimum edit distance by setting child or destination (DST) nodes to false if the edit distance for their path (cacheBot (z)) is greater than the minimum edit distance (Best) at S554.

Figure 49:
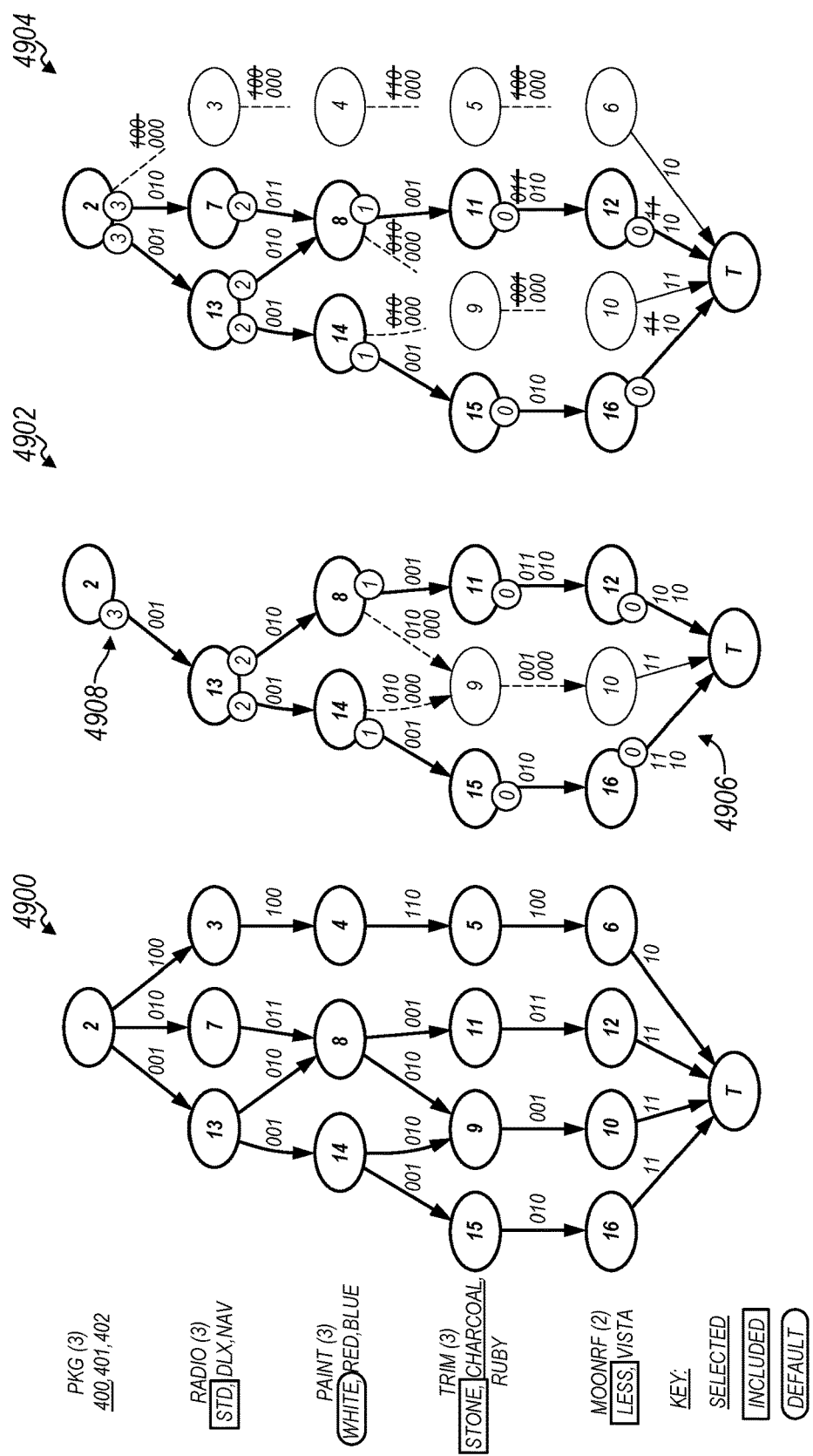
FIG. 49 is a diagram illustrating an example of various steps of the method of FIG. 47.

FIG. 49 includes an original or unrestricted MDD 4900, an intermediate MDD 4902 and a final restricted MDD 4904 illustrating the impact of various steps of subroutine S504.

In one example, the user selects the 400 package. Then the configuration engine 106 determines that the Standard (Std) radio, Stone trim and no moonroof (Less) are Included features; and that White paint is a Default feature. The states of these features are represented by underlined text, boxed text and circled text, respectively in FIG. 49. Next the user selects Charcoal trim. The new selected set (400, Charcoal) is not a valid combination because the 400 package can only occur with Stone trim. So the new configuration (400, Std, White, Charcoal, Less) is invalid.

The intermediate MDD 4902 illustrates the original MDD 4900 after the configuration engine 106 has performed the minimum edit calculation S504 on paths 2-13-. . T with respect to a newly selected Charcoal trim feature. The configuration engine 106 first traverses path 2-13-14-15-16-T. No restrict is needed on the downward traversal because the only active trim feature on partial path 15-16 is Charcoal.

The configuration engine 106 calculates the minimum edit distance at steps S530-S536 (FIG. 48) during an upward traversal of the MDD. The configuration engine 106 considers two edges for the partial path T-16: one edge with the moonroof (Vista) and one edge without the moonroof (Less).

The configuration engine 106 determines the edit distance for the partial path T-Vista-16 (i.e., with the moonroof (Vista)) to be one because it requires a change in the moonroof feature. For the partial path T-Less-16 without the moonroof (Less), no change is required, so the edit distance is zero. Because one path (T-Less-16) has a smaller edit distance than the other (T-Vista-16), the edge is restricted to keep the minimum edit path of T-Less-16. The edge from 16-T now shows "10", and the edit cost for Node 16 is 0, as referenced by numeral 4906.

Continuing on the upward traversal, the configuration engine 106 calculates the edit distance of the remaining partial paths to be: zero for 16-15, because it contains Charcoal trim; one for 15-14, because it contains Blue paint, not the Default White paint; one for 14-13, because it contains the Navigation radio, not the Included Standard radio; and one for 2-13, because it contains the 402 package, not the Selected 400 package. Therefore the configuration engine 106 calculates the cumulative minimum edit distance for path 2-13-14-15-16-T to be three, as referenced by numeral 4908.

Then the configuration engine 106 restricts the partial path 14-9-10-T because node 9 does not contain the selected Charcoal trim feature.

Next, the configuration engine 106 considers path 2-13-8-11-12-T. First, partial path 8-11-12-T is considered, and found to have edit distance of 1 because node 8 contains Blue paint and not the Default White paint. Then the configuration engine 106 restricts path 12-T to 12-Less-T; and restricts path 11-12 to 11-Charcoal-12 so that the edit distance for each is zero.

Then the configuration engine 106 considers partial path 8-9-10-T; but, because of its previous analysis of node 9, it knows that this partial path has been restricted and the 8-9 edge is removed. The cost of T-12-11-8-13 is 2. At this point the configuration engine 106 keeps both of the outgoing edges from 13 (i.e., 13-14 . .-T, and 13-8-. .-T) because they each require 2 edits. The edit distance for partial path 13-2 is 1. Thus, after traversing 2-13-. .-T, the configuration engine 106 determines that the current minimum edit distance for Node 2 is 3.

The final restricted MDD 4904 illustrates the original MDD 4900 after the configuration engine 106 has quick-restricted it to Charcoal trim at S504 and performed the minimum edit calculation for all paths.

Next the configuration engine 106 considers path 2-7-8-11-12-T. The configuration engine 106 previously determined that the minimum edit distance at node 8 is 1. The configuration engine 106 calculates the edit distance for partial path 8-7 to be one because it contains Deluxe and Navigation radio features and not the Included Standard radio feature; and calculates the edit distance for partial path 7-2 to be one, because it contains the 401 package and not the selected 400 package. The configuration engine 106 calculates the total edit distance for path 2-7-8-11-12-T to be three. Since this total edit distance is the same as that of paths 2-13-. .-T, the configuration engine 106 keeps all three paths.

Next the configuration engine 106 considers path 2-3-4-5-6-T. This path is restricted once the configuration engine 106 determines that partial path 5-6 is not compatible with the Selected Charcoal trim constraint.

The final MDD 4904 illustrates the final minimum edit space for the invalid configuration (400, Std, White, Charcoal, Less) with the Charcoal trim feature locked, after the configuration engine 106 has completed the minimum edit calculation subroutine S504. As shown in FIG. 49, the MDD 4904 contains three paths that each have a minimum edit distance of three: 2-1-14-15-16-T; 2-13-8-11-12; and 2-7-8-11-12-T.

With reference to FIG. 47, at step S558, the configuration engine 106 determines if the conflict resolution strategy selected for the application is a guided strategy, i.e., a branched resolution strategy. If a guided conflict resolution is not selected, the configuration engine 106 proceeds to operation S560. At step S560 the configuration engine 106 selects a single target configuration from the minimum edit space using an auto-completion technique such as sequence based or maximally standard. In one embodiment, the configuration engine 106 selects a single target configuration using a maximally standard auto-completion technique as described below with reference to FIGS. 93-117. In another embodiment, the configuration engine 106 selects a single target configuration using a maximum weight quick-restrict technique.

Figure 50:
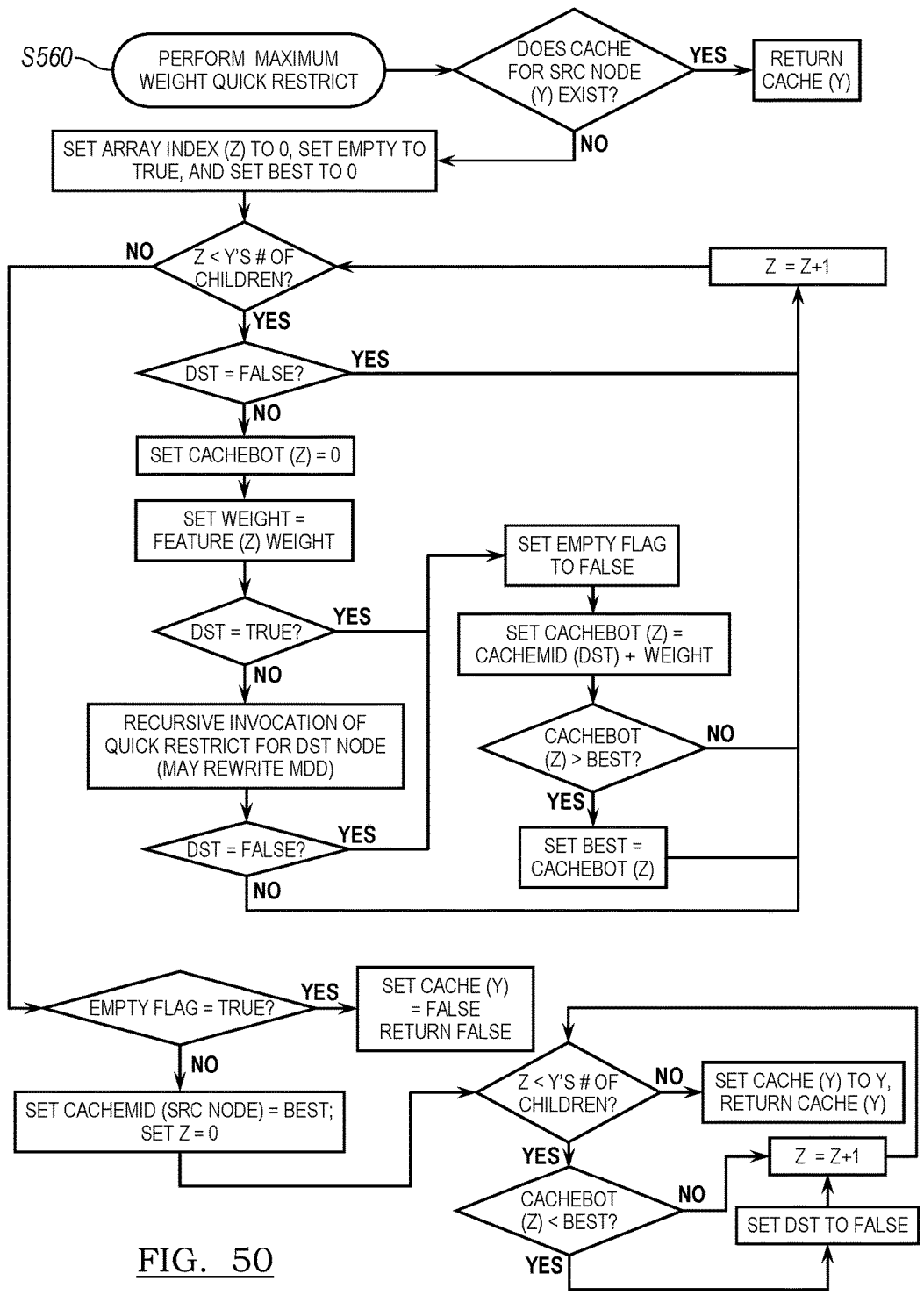
FIG. 50 is another flowchart illustrating a subroutine of the method of FIG. 47.

The maximum weight quick-restrict based single target configuration calculation subroutine of S560 is shown in the flowchart of FIG. 50. The weights used in the weight calculation are based on priorities for features such that when there is more than one feature available, the highest priority, or feature having the maximum weight, is chosen as the default. S560 is similar to the minimum edit quick restrict calculation S504 of FIG. 48. The only difference is that when the configuration engine 106 calculates the maximum weight, it 1) maximizes value instead of minimizing value (which changes the initial value of Best); and 2) calculates the weight for each path instead of the number of edits, where the weight is defined by a priority of the features.

Referring to FIG. 47, the configuration engine 106 resets or restores the original set of node edges to the memory 108 (shown in FIG. 2) at step S574. S574 is similar to S146 described above with reference to FIG. 28. At S574 the configuration engine 106 identifies each node (y), copies the outgoing edges of each node in the MDD. Then the configuration engine 106 sets the MDD to the identity of the root node.

At step S576, the configuration engine 106 determines the feature states for the prior configuration. The prior configuration refers to the prior valid configuration before the configuration engine 106 changed a feature based on a user selection; where the addition of the new feature led to an invalid configuration. S576 is similar to subroutine S300 described above with reference to FIGS. 39-44. At step S578, the configuration engine 106 determines the feature states for the new target configuration. S578 is also similar to S300.

With reference to FIG. 49, in one embodiment the configuration engine 106 selects a single target configuration (401, Dlx, Blue, Charcoal, Less) from the minimum edit space of MDD 4904 as S560. Once the target is identified, the configuration engine 106 determines feature states for the prior configuration at S576 and for the new target configuration at S578. All features start as Default features. Next, Selected features are determined by adding the previous selections that are still valid to the newly selected feature. Then, the Available, Excluded and Available calculations are determined using the new selections. In this example the new target configuration states are: Selected (Charcoal), Included (Blue) and Default (401, Dlx, Less).

Figure 51:
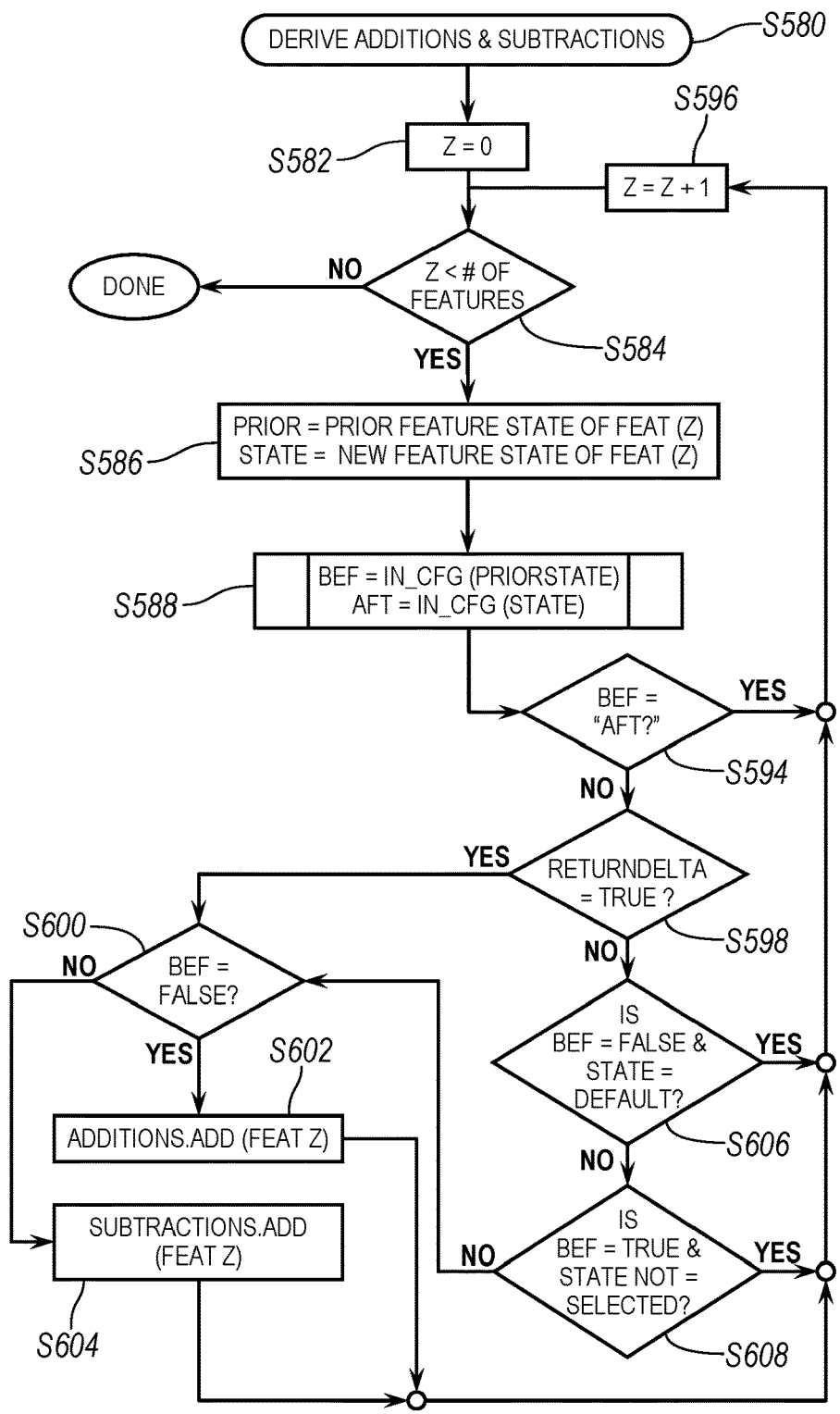
FIG. 51 is yet another flowchart illustrating a subroutine of the method of FIG. 47.

At step S580 of FIG. 47, the configuration engine 106 generates a response that includes the feature additions and subtractions to resolve the conflict. These features include feature state information—the new state for additions and the prior state for subtractions. The configuration engine 106 returns raw data including the new and prior feature state maps, the new configuration state (ConfigState), and the list of additions and subtractions. The author decorator 154 will use this data to compose the response. The derivation of additions and subtractions subroutine S580 is shown in the flowchart of FIG. 51.

At S582, the configuration engine 106 starts analyzing feature (z). At step S584, the configuration engine 106 determines if the feature (z) is less than the total number of features for the source node. If so, the configuration engine 106 proceeds to step S586. At step S586, the configuration engine 106 defines the term "Prior" as the prior feature state of feature (z) and the term "State" as the new feature state of feature (z).

Figure 52:
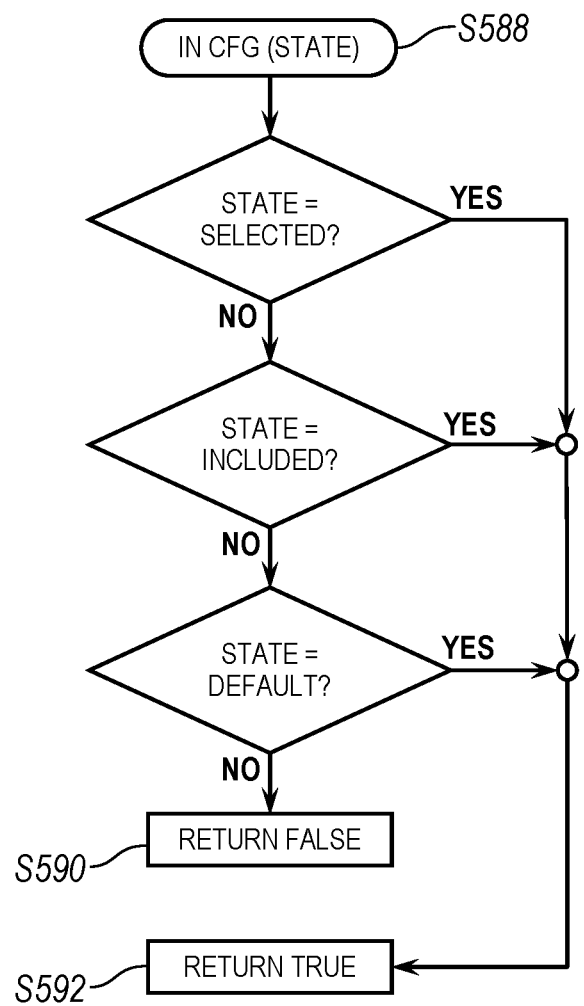
FIG. 52 is still yet another flowchart illustrating a subroutine of the method of FIG. 47.

At step S588, the configuration engine 106 evaluates the feature state term Prior (determined at S576) to determine if feature (z) was present in the prior configuration. S588 is illustrated in the flow chart of FIG. 52. If the Prior term is equal to Selected, Included or Default, then the configuration engine 106 determines that the Prior term defines a State of a feature that is present in the Prior configuration and returns true at step S592. Otherwise, the configuration engine 106 returns false at S594. Then the configuration engine 106 sets a boolean before value (BEF) equal to the determination at steps S590-S592, i.e., true or false.

Also at step S588, the configuration engine 106 evaluates the feature state term State to determine if it is present in the New configuration. If the State term is equal to Selected, Included or Default, then the configuration engine 106 returns TRUE at step S592. Otherwise, the configuration engine 106 returns false at S594. Then the configuration engine 106 sets a boolean after value (AFT) equal to the determination at steps S590-S592, i.e., true or false.

At step S594, the configuration engine 106 compares BEF to AFT for feature (z) to see if it has changed. Otherwise, i.e. if BEF equals AFT, the configuration engine 106 proceeds to step S596 and increments the family level (x) by one. If the determination is negative, then the feature was either added or subtracted, and the configuration engine 106 proceeds to step S598 to evaluate "Return Delta."

"Return Delta" refers to the amount of information provided to the user in response to a conflict. The front-end application 132 determines this level of information by setting the return delta feature to true or false. Enabling the return delta feature (i.e., setting return delta to true) results in more information being provided to the user. Conversely, setting return delta to false results in less information being provided to the user.

When the Return Delta flag is set to true, the response will include all additions and subtractions regardless of feature state. This could allow the front-end application 132 to inspect the resolution and apply some additional logic when deciding whether to prompt the user in response to a conflict or to silently make the changes. When the Return Delta flag is set to false, the conflict resolution subtractions will only contain Selected features removed from the configuration and additions will only contain Included features added to the configuration. If the new configuration caused a change in a Default feature, this is not included in the prompt to the user. If all changes are for Default choices, there are no changes to report, and the response will not include conflict resolution. The Return Delta flag is set to false by default, in one or more embodiments.

At S598, if Return Delta is set to true, the configuration engine 106 proceeds to step S600 to evaluate BEF. If BEF is set to false at S588 (which indicates that feature (z) was contained in AFT but not in BEF), the configuration engine 106 adds feature (z) to the list of additions (additions.add (feat(x))) at step S602. If BEF is set to true (which indicates that feature (z) was contained in AFT but not in BEF), the configuration engine 106 adds feature (z) to the list of subtractions (subtractions.add(feat(x))) at step S604.

If Return Delta is set to false, the configuration engine 106 proceeds to step S606. At S606, the configuration engine 106 evaluates BEF and the state of (z). If BEF is false and the state of (z) is Default, the configuration engine 106 returns to S596 to increment the family level (x) by one. If the determination at S606 is negative, the configuration engine 106 proceeds to step S608. At S608, if BEF is true and the state of (z) is Selected, the configuration engine 106 returns to S596. Otherwise, the configuration engine 106 returns to S600.

FIG. 53 is a table 5300 that illustrates the additions and subtractions for the MDD 4900 of FIG. 49 when Return Delta is true and when Return Delta is false. The MDD 4900 had a Prior configuration of Selected (400), Included (Std, Stone, Less) and Default (White), as referenced by numeral 5302. The configuration engine 106 selected a new target configuration of Selected (Charcoal), Included (Blue) and Default (401, Dlx, Less) at step S578, as referenced by numeral 5304. When Return Delta is false, the configuration engine 106 does not show changes (additions or subtractions) to Default Features, but when return delta is true, all changes are shown, as referenced by numeral 5306.

FIG. 54 is a window 5400 that is displayed to the user to convey the additions and subtractions of features to their prior configuration to accommodate the new configuration triggered by their selection of Charcoal trim, using a single target configuration when Return Delta is false. Again, when Return Delta is false, the configuration engine 106 does not show changes (additions or subtractions) to Default features.

FIG. 55 is a window 5500 that is displayed to the user to convey the additions and subtractions of features to their prior configuration when Return Delta is true. Since Return Delta is true, the configuration engine 106 shows all changes, including changes to the Default features.

Referring to FIG. 47, the configuration engine 106 determines if guided resolution (i.e., branched conflict resolution) is selected at step S558. If so, it proceeds to step S610.

In contrast to single conflict resolution, which only presents a single next-closest configuration to the user, branched conflict resolution can present the entire minimum edit space to the user, in tree format. This allows the front-end application 132 to present the user with a series of prompts to drive towards a valid configuration.

In the minimum edit example described above with reference to FIGS. 49 and 53-55, the minimum edit space contains three superconfigurations defining four configurations. This space can be compressed to two superconfigurations as shown in FIG. 56.

FIG. 56 is a table 5600 that illustrates an example in which the paint family has just one choice (Blue) and the package and radio families each have two choices (401, 402 and Dlx, Nav), but, the choices are not dependent one each other. The choice of package (401 or 402) does not change the choice of radio (Dlx, Nav). When all the family choices are independent, the configuration engine 106 can resolve the conflicts in a single step.

The configuration engine 106 derives a resolution object that describes the actions to change the invalid configuration to a valid configuration, which is transformed by the author decorators 154 into a SOAP xml response (not shown) which can be presented to a user in a single pop up window 5700, as shown in FIG. 57.

This example illustrates the advantages offered by branched conflict resolution, as compared to single conflict resolution. The configuration engine 106 presents the user with more information about how to resolve a conflict and asks them to choose the valid package and radio features, rather than the application silently selecting a valid configuration.

When there are no dependent choices, it is a relatively simple process to transform the target matrix into the conflict resolution response. However, the resolution object is more complicated when one family's choice is dependent on another family.

The configuration engine 106 makes a series of prompts or inquiries to the user when the guided choices are dependent on a prior choice. However, each prompt can include more than one independent choice. When there is a nested or dependent choice, the configuration engine 106 lists the divergent branch as the last feature group in the list.

In branched conflict resolution, the minimum edit space may include some partial matches, where a choice is present in some, but not all of the target configurations. Partial matches in the configuration space can cause the target space to be too large, and it can lead to awkward user prompts. In one or more embodiments, the configuration engine 106 trims the minimum edit space to remove partial matches.

With reference to FIG. 47, at step S610, the configuration engine 106 determines if removing partial matches functionality is enabled. If the determination at S610 is positive, the configuration engine 106 proceeds to S612. The algorithm for removing partial matches S612 is shown in the flowchart of FIG. 58.

Figure 58:
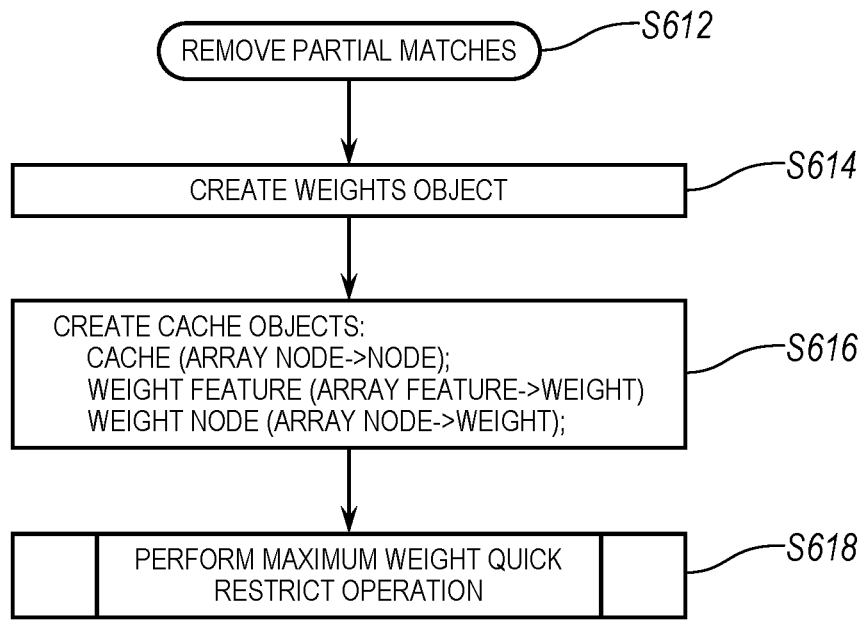
FIG. 58 is another flowchart illustrating a subroutine of the method of FIG. 47.

With reference to FIG. 58, at step S614 the configuration engine 106 creates a weight object, with positive weights for features that are contained within the configuration, and zero weight for features that are not contained within the configuration.

At step S616, the configuration engine 106 creates cache objects. The configuration engine 106 returns data from cache for node (Y) for weightFeature and for weightNode, if it already exists. WeightFeature refers to the weight from the node to the bottom of the MDD (i.e., the true node)—for a specified feature. WeightNode is a Node-based lookup instead of feature based lookup. Thus, for each node, the configuration engine 106 determines the maximum weight path feature for a given node, stores the weight for each feature. Once the configuration engine 106 knows the maximum feature weight for a node and trims its edges, then it stores the maximum node weight. The maximum node weight is used as a cache for when the configuration engine 106 analyzes subsequent nodes. It can use the previously calculated maximum weight for that node and trim the outgoing edges from the node to only those edges with the maximum weight.

At step S618, the configuration engine 106 performs the maximum weight quick-restrict operation. The maximum weight quick-restrict operation of S618 is the same as the maximum weight quick-restrict subroutine S560 described above with reference to FIG. 50. After the quick restrict operation has removed partial matches, the configuration engine 106 proceeds to S620 (FIG. 47) to derive a resolution object.

Referring back to FIG. 47, if the configuration engine 106 determines that removing partial matches functionality is not enabled at S610, it proceeds to S620 to derive a resolution object. The algorithm for deriving a resolution object S620 is shown in the flowcharts of FIGS. 59-63.

Figure 59:
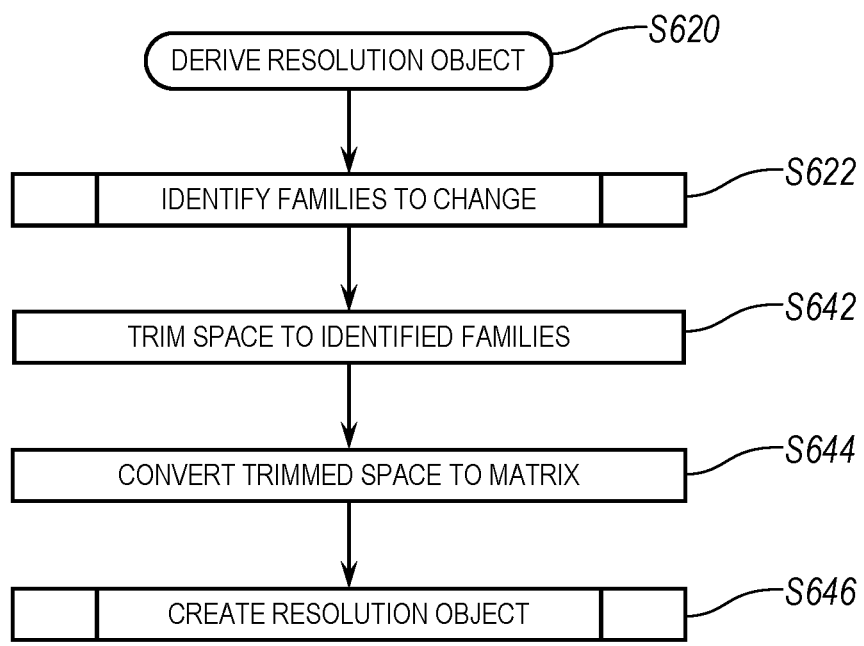
FIG. 59 is yet another flowchart illustrating a subroutine of the method of FIG. 47.
Figure 60:
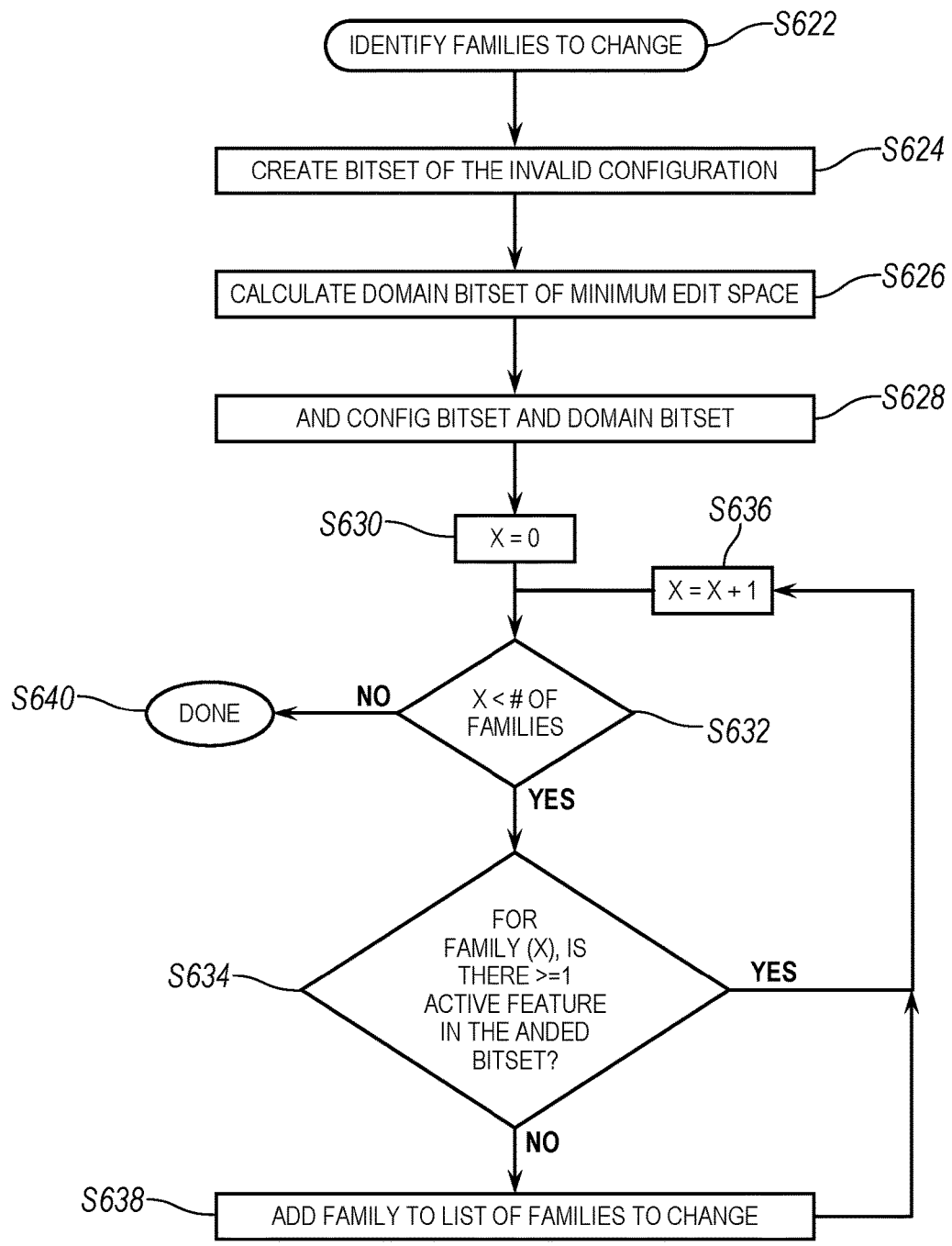
FIG. 60 is still yet another flowchart illustrating a subroutine of the method of FIG. 47.

Referring to FIG. 59, the configuration engine 106 identifies families to change at step S622. The algorithm for identifying families to change S622 is shown in the flowchart of FIG. 60. Referring to FIG. 60, the configuration engine creates a bitset of the invalid configuration at step S624. Next, the configuration engine calculates the domain bitset of the minimum edit space at step S626. Then at step S628, the configuration engine ANDs the configuration bitset and the domain bitset.

Figure 64:
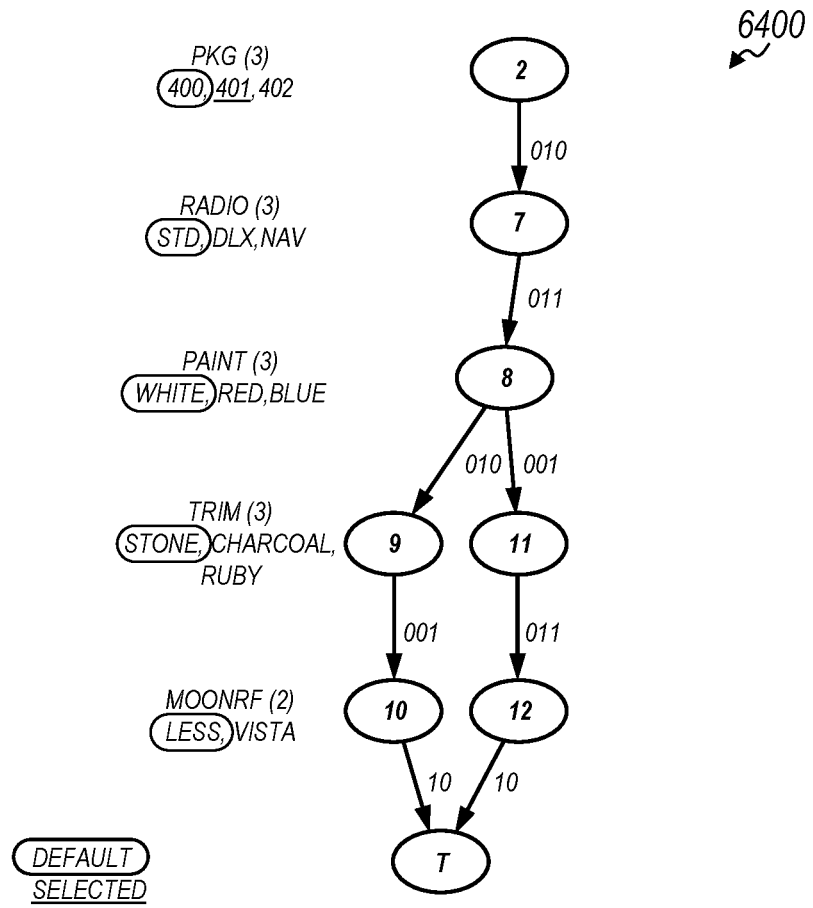
FIG. 64 is a diagram illustrating an example of various steps of the method of FIG. 47.

FIGS. 64-74 are examples illustrating the impact of various steps of the derive resolution object subroutine S620 of the branched conflict resolution method. Referring to FIG. 64, in one example, a configuration of Default (400, Std, White, Stone, Less) is modified when the user selects the 401 package. The configuration engine 106 determines the new invalid configuration to be (401, Std, White, Stone, Less) with a minimum edit space depicted by MDD 6400.

FIG. 65 is a table 6500 listing the invalid configuration (401, Std, White, Stone, Less) as a bitset (010 100 100 100 10). FIG. 66 is a table 6600 that depicts the minimum edit space of the configuration converted to a matrix, as determined in step S626 (FIG. 60).

Referring back to FIG. 60, the configuration engine 106 starts analyzing the nodes included in family level zero (x) of the MDD at step S630. At step S632, the configuration engine 106 determines if the family level (x) is less than the total number of families included in the MDD. If so, the configuration engine 106 proceeds to step S634.

At S634, the configuration engine 106 evaluates the number of active features in the intersection, or bitwise conjunction, or "ANDed" bitset for family (x). If there is at least one active feature in the ANDed bitset for family(x), the configuration engine 106 proceeds to step S636 and increments the family level (x) by one. However, if there are no active features in the ANDed bitset for family(x), the configuration engine 106 proceeds to step S638 and adds family(x) to the list of families to change, and then proceeds to step S636.

FIG. 67 is a table 6700 illustrating the bitwise conjunction (AND) of the domain of the edit space in the example from table 6600 with the invalid configuration from table 6500. The configuration engine 106 identifies any family with no active bits (i.e., only "0"s in the sum, as referenced by numeral 6702, as a family to change to transform the invalid configuration into a valid one. Thus, the configuration engine 106 determines that the radio, paint and trim families are families to change.

With reference to FIG. 60, once the configuration engine 106 has analyzed all families, it will make a negative determination at step S632, i.e., the level (x) will not be less than the number of families. Then the configuration engine 106 proceeds to step S640 and returns to the routine of FIG. 59.

Referring to FIG. 59, at step S642 the configuration engine 106 trims the edit space to the families identified in S622. Then at step S644, the configuration engine 106 converts the trimmed space to a matrix, which is represented by table 6600 (FIG. 66).

FIG. 68 is a table 6800 that illustrates the minimum edit space from table 6600 after it is trimmed to the families to change (i.e., radio, paint and trim) from table 6700.

Figure 61:
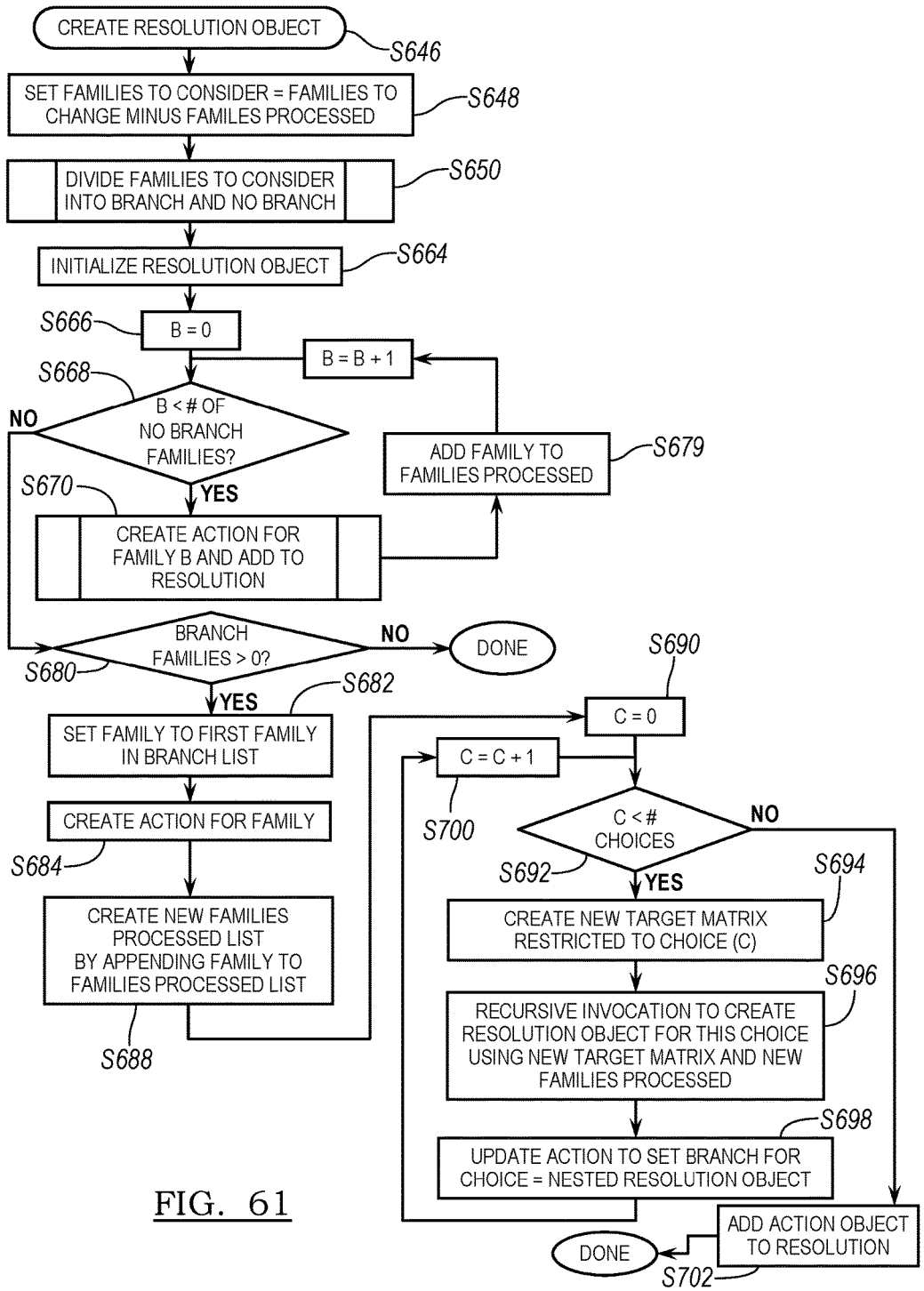
FIG. 61 is another flowchart illustrating a subroutine of the method of FIG. 47.

At step S646 (FIG. 59), the configuration engine 106 creates a resolution object that describes the actions to change the invalid configuration to a valid configuration. The algorithm for creating a resolution object S646 is shown in the flowchart of FIG. 61.

In creating a resolution object S646, the configuration engine takes as input the invalid configuration, a target matrix (i.e., the edit space), the list of families to change and the list of families that have been processed so far. The list of families to change is sorted in priority order, according to one or more embodiments. This sort can be provided by an alternate sequence, or default to the minimum edit space family structure shown in FIG. 68.

The configuration engine 106 divides the families to change into No-Branch and Branch lists. The configuration engine 106 identifies any family that is not identical in all rows of the target matrix as a Branch family. Each resolution contains a list of actions for any number of No-Branch families and a single Branch family.

An action specifies the family to change, its prior choice, and its possible choice(s). To simplify parsing of a resolution, the configuration engine 106 organizes the Branch action to be the last action. The Branch items lead to a divergent choice and the choices for the remaining families are unknown until the Branch family choice is made. Each choice of the Branch family will have an associated nested resolution object defined in a feature choice that results in resolution mapping. The nested resolution objects are derived by with a new target matrix that is restricted to the feature choice of the branching family, the original families list, and the updated processed families list.

Referring to FIG. 61, step S648 is a recursive call in which the configuration engine 106 sets the families to consider changing (Families to Consider) equal to the families list minus the families that were already processed (Families Processed).

At step S650, the configuration engine 106 divides the families to consider changing (Families to Consider) into Branch and No-Branch lists. A Branch family is a family whose bit pattern is not identical in all rows of the target matrix, whereas a No-Branch family's bit pattern is identical in all rows. The algorithm for dividing families into Branch and No-Branch S650 is shown in the flowchart of FIG. 62.

Figure 62:
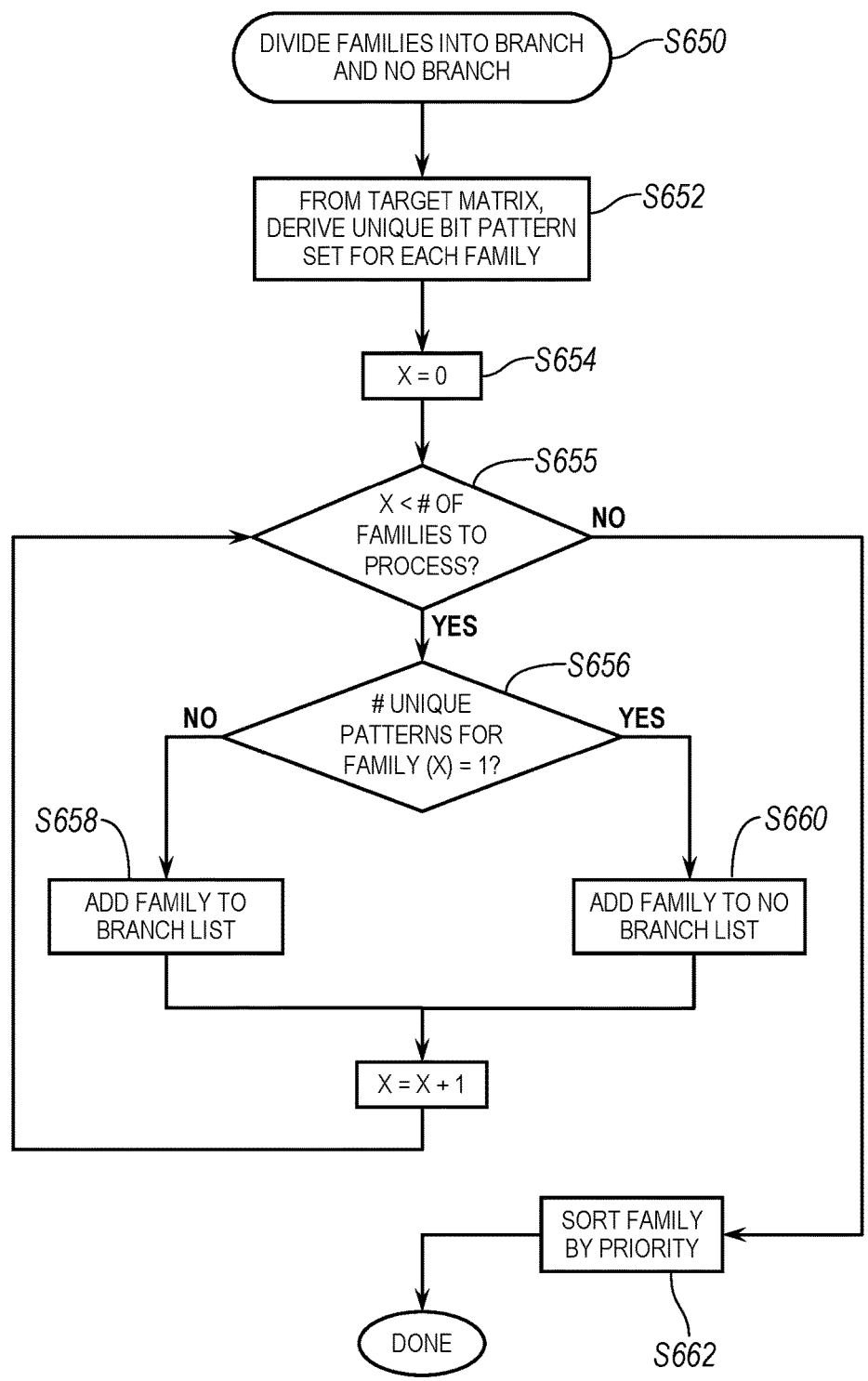
FIG. 62 is yet another flowchart illustrating a subroutine of the method of FIG. 47.

With reference to FIG. 62, the configuration engine 106 derives a unique bit pattern for each family based on the target matrix at S652. The configuration engine 106 starts analyzing the nodes included in family level zero of the MDD at step S654. At step S655, the configuration engine 106 determines if the family level (x) is less than the total number of families to consider changing in the MDD. If so, the configuration engine 106 proceeds to step S656.

At step S656 the configuration engine 106 evaluates the number of unique patterns for family (x). If there is more than one unique pattern, the configuration engine 106 proceeds to step S658 and adds the family to the Branch category. If there is only one unique pattern, the configuration engine 106 proceeds to step S660 and adds family level (x) to the No-Branch list. After steps S658 and S660, the configuration engine 106 increments the family level (x) by one and then returns to S655. Once the configuration engine 106 has organized all families into the Branch and No-Branch lists, it makes a negative determination at S655, and then sorts the families within each list by priority at step S662, with the highest priority family listed first. The priority of each family is based on its family weight and is determined by a separate system, according to one or more embodiments. After S662, the configuration engine 106 returns to the create resolution object subroutine S646 of FIG. 61.

Referring back to FIG. 68, the first call to derive the resolution method object S620 will use the invalid configuration from FIG. 65, the target matrix from FIG. 68, and will pass an empty list for the processed families list—deriveResolution (Cfg65, Matrix68, [Radio, Paint, Trim], []). As shown in table 6800, the bit pattern for radio (i.e., "011") is the same in both rows, but is different for both paint and trim. Therefore the configuration engine 106 identifies radio as a No-Branch family at S656 and S660, because it only has one unique pattern. And the configuration engine 106 identifies paint and trim as Branch families at S656 and S658, because they each have more than one unique pattern.

Referring back to FIG. 61, the configuration engine 106 initializes a resolution object at S664 by creating an empty object. The configuration engine 106 starts analyzing the first No-Branch family (b=0) at step S666. At step S668, the configuration engine 106 determines if the No-Branch family index (b) is less than the total number of No-Branch families. If so, the configuration engine 106 proceeds to S670. At step S670, the configuration engine 106 creates an action for No-Branch family index (b) and adds the action to the Resolution Object. The algorithm for S670 is shown in the flowchart of FIG. 63.

Figure 63:
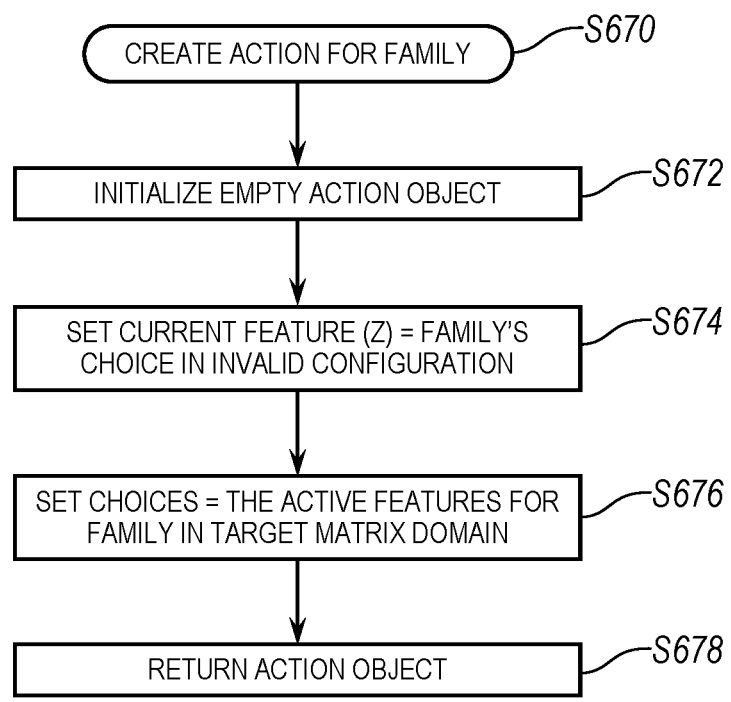
FIG. 63 is still yet another flowchart illustrating a subroutine of the method of FIG. 47.

With reference to FIG. 63, the configuration engine 106 initializes an empty Action object at step S672. Next the configuration engine 106 sets a current feature (z) equal to the family feature (Family) in the invalid configuration at step S674.

At step S676, the configuration engine 106 sets the group of valid features for the user to choose from (Choices) equal to the active features for the No-Branch family index (b) in the target matrix domain. Then at step S678, the configuration engine 106 returns the Action object to the subroutine S646 of FIG. 61. With reference to FIG. 61, the configuration engine 106 adds the No-Branch family index (b) to the families processed list at step S679, then it increments the No-Branch family index (b) by one and then returns to step S668.

Referring to FIGS. 65-71, the configuration engine 106 initializes an empty resolution and adds an action for all No-Branch families, which in this case is radio—the only No-Branch family identified from table 6800. As shown in table 6500, the invalid configuration includes the Standard radio (i.e., "100") and the trimmed minimum edit space of table 6800 shows the possible valid choices for radio include Deluxe and Navigation (i.e., "011"). The Action for radio in this example specifies the family to change (i.e., radio), its prior choice (Standard), and its possible choices (Deluxe and Navigation), which may be represented by: Action {Radio, [Std], [Dlx, Nav]} as shown in FIG. 71.

Referring back to FIG. 61, once the configuration engine 106 has analyzed all of the No-Branch families, it will make a negative determination at step S668 (i.e., the No-Branch family index (b) is greater than or equal to the number of No-Branch families) and then proceed to step S680. At S680 the configuration engine 106 evaluates the number of Branch families. If there are zero Branch families, the configuration engine 106 returns to the derive resolution subroutine S620 of FIG. 59. If there are Branch families (i.e., Branch families>0), the configuration engine 106 proceeds to step S682.

At S682 the configuration engine 106 sets Family equal to the first family (i.e., the highest priority family) in the Branch list. At step S684 the configuration engine 106 creates Action for the Family. The configuration engine 106 initializes an empty Action Object and sets the current feature equal to the Family configuration feature. Next the configuration engine updates the Action to set Choices equal to the active features for Family in the target matrix domain. At S688, the configuration engine 106 creates a new Families Processed list by appending Family to the Families Processed list.

At step S690, the configuration engine 106 starts analyzing Choice (c=0). At step S692, the configuration engine 106 compares Choice (c) to the number of choices. If Choice (c) is less than the number of choices, then the configuration engine 106 proceeds to step S694 and creates a new target matrix that is restricted to Choice (c).

At step S696, the configuration engine 106 creates a Resolution Object for Choice (c) using the new target matrix and the new Families Processed list by the result of recursive invocation. At step S698, the configuration engine 106 updates the Action to set Branch for Choice (c) equal to the nested Resolution Object. At step S700, the configuration engine 106 increments Choice (c) by one and returns to step S692. Once the configuration engine 106 has analyzed all Choices, it determines that Choice (c) is equal to the total number of choices at S692 (i.e., C is not less than # Choices). In response to a negative determination at S692, the configuration engine 106 proceeds to step S702 and adds the Action object to the Resolution. Then it returns to subroutine S620 (FIG. 59) and then back to the main conflict resolution routine S500 of FIG. 47.

With reference to FIGS. 65-71, the configuration engine 106 generates the Action for the highest priority Branch family, which in this case is the Paint family because it defaulted to using MDD/Matrix structure/family ordering where the right to left ordering defines priority values. As shown in table 6700, paint oriented to the left of trim, so paint is higher priority. For each paint Choice, the configuration engine derives a nested resolution by first creating a new target matrix by restricting to the paint choice, and making a call to derive resolution.

As shown in the trimmed minimum edit space of table 6800, there are two possible Choices for the paint family—Red (i.e., "010") and Blue ("001"). There will be two additional calls to derive resolution: one for Red paint—deriveResolution(Cfg65, Matrix.Red, [Radio, Paint, Trim], [Radio, Paint]); and one for Blue paint—deriveResolution (Cfg65, Matrix.Blue, [Radio, Paint, Trim], [Radio, Paint]). As shown in FIG. 71, the Action for paint in this example specifies the family to change (i.e., paint), its prior choice (White, i.e., "100" in table 6500), and its possible choices (Red and Blue), which may be represented by: Action {Paint, [White], [Red, Blue] }.

In both cases (Red paint and Blue paint), the configuration engine 106 uses a trimmed target matrix and the families list contains only one family (trim) because there is only one other Branch family in this example. FIG. 69 is a target matrix 6900 for the Red paint choice. The target matrix 6900 shows that there is just one choice for trim (i.e., Ruby, "001"). FIG. 70 is a target matrix 7000 for the Blue paint choice. The target matrix 7000 shows that there are two choices for trim (i.e., Charcoal and Ruby, "011"). The configuration engine 106 determines the resulting resolution of each target matrix 6900 and 7000 and adds the nested resolutions for paint to its action to determine a final resolution object 7100 (FIG. 71).

As shown in FIG. 71, the Action for the nested resolution for Red paint in this example specifies the family to change (i.e., trim), its prior choice (Stone, i.e., "100" in table 6500), and its possible choice (Ruby), which is represented by: Action {Trim, [Stone], [Ruby] }. The Action for the nested resolution for Blue paint in this example specifies the family to change (i.e., trim), its prior choice (Stone, i.e., "100" in table 6500), and its possible choices (Charcoal and Ruby), which is represented by: Action {Trim, [Stone], [Charcoal, Ruby] }.

Referring back to FIG. 47, at S704, the configuration engine 106 restores the original set of node edges to the memory 108 (shown in FIG. 2). S704 is similar to subroutine S146 of FIG. 28. The configuration engine identifies each node (y), copies each outgoing edge of each node. Then, the configuration engine 106 sets the MDD to the identity of the root node. At step S706, the configuration engine 106 returns a response by providing the resolution object 7100 to the author decorator 154; who in turn transforms the resolution object 7100 into a SOAP xml response (FIG. 2) which is presented to the user in a series of windows, as shown in FIGS. 72-74.

As described above with reference to resolution object 7100 (FIG. 71), the configuration engine 106 determined a guided resolution that includes a nested choice for trim. The Available choices for trim depend on the user's selection for paint. FIG. 72 depicts a window 7200 with a first prompt that is displayed to the user. FIG. 73 and FIG. 74 show the next prompt displayed as determined by the choice of Red or Blue paint.

If the user selects Red paint in response to the prompt shown in window 7200, the configuration engine 106 will guide them along partial path 8-9-10 (FIG. 64) and then display window 7300 to instruct them to change the trim from Stone to Ruby.

However, if the user selects Blue paint in response to the prompt shown in window 7200, the configuration engine 106 will guide them along partial path 8-11-12 (FIG. 64) and then display window 7400 to instruct them to change the trim from Stone to one of Charcoal and Ruby.

As described above with reference to FIG. 58, in branched conflict resolution the minimum edit space may include some partial matches, where a choice is present in some, but not all of the target configurations. Partial matches in the configuration space can cause the target space to be too large, and it can lead to awkward user prompts. The configuration engine 106 may trim the minimum edit space using the removing partial matches subroutine S612. This is done using the maximum weight quick-restrict operation, according to one or more embodiments. However, only the partial match features are provided with relative non-zero weights; all other features are given an equal weight of zero at S614.

Figures 75, 76:
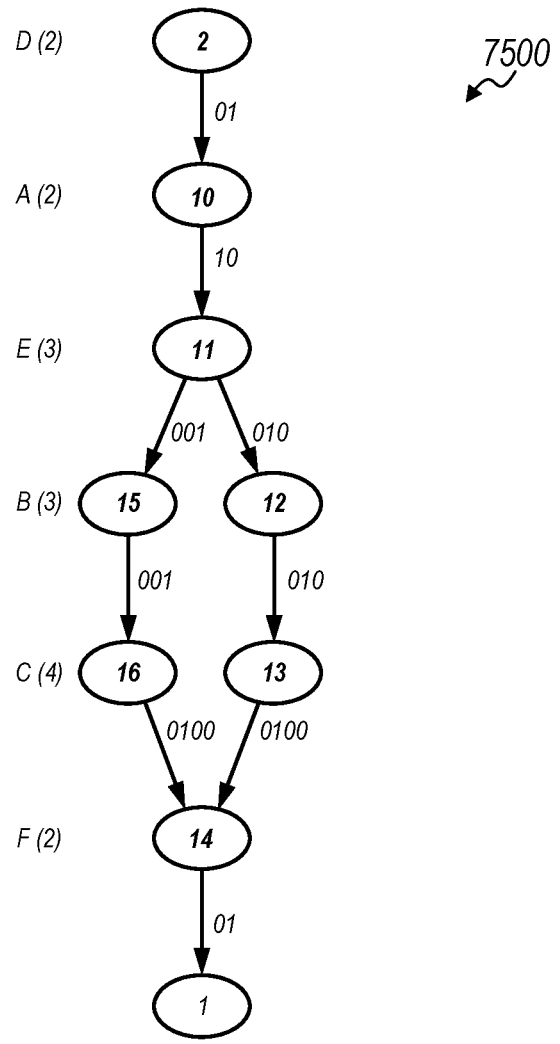
FIG. 75 is a diagram illustrating an example of various steps of the remove partial matches subroutine of FIG. 58.
FIG. 76 is a table illustrating an example of various steps of the remove partial matches subroutine of FIG. 58.

FIGS. 75-76 are examples illustrating the impact of various steps of the remove partial matches subroutine S612. In the illustrated embodiment, a selection of D2 leads to the invalid configuration (A1, B2, C3, D2, E3, F1) with the minimum edit space shown in MDD 7500 of FIG. 75. There are two partial matches—B2 (i.e., the outgoing edge "010" from node 12) and E3 (i.e., the outgoing edge "001" from node 11)—where a user selection could remain the same or be changed. If B2 remains unchanged, then E3 must change to E2, because E3 is not located along the same path as B2 (i.e., partial path 11-12-13-14). But, E3 can remain unchanged if B2 changes to B3, because E3 is located on the same path as B3 (i.e., partial path 11-15-16-14).

With an alternate sequence {A1 A2 B1 B2 B3 D1 D2 C1 C2 C3 C4 E1 E2 E3 F1 F2}, and an invalid configuration of {D2 A1 E3 B2 C3 F1}, the structure used for path weights is {A1 B2 C3 D2 E3 F1}. The maximum weight operation will ignore any edges with negative weights (A2 B1 C1 C2 C4 D1 E1 E2 F2). The weights for the two paths in the minimum edit space are shown in Table 7600 of FIG. 76.

The first row shows path 2-10-11-12-13-14-1. This path defines the configuration of {D2 A1 E2 B2 C2 F2} and a path weight bit set of 010100. There are two active bits in the path weight which correspond to the features B2 and D2—the two features on this path with non-negative weights. There are no active bits for the other features (A1, C2, E2, F2) because they have negative weights and are ignored. The second row shows path 2-10-11-15-16-13-1. This path defines the configuration of {D2 A1 E3 B3 C2 F2} and a path weight bit set of 000110. There are two active bits in the path weight which correspond to the features D2 and E3. Based on these weights, the configuration engine 106 trims the space to a single path of 2-10-11-12-13-14-T. The higher priority family B will remain unchanged, and the resolution will include a change for family E.

When an update request is made, the configuration engine 106 modifies the prior configuration by adding the newly Selected feature (while also removing the prior choice for the feature's family). As described above with reference to FIGS. 47 and 48, if the updated configuration is invalid, conflict resolution is triggered and the configuration engine 106 calculates the minimum edit space at S504. The service API 134 does not dictate how the minimum edit space is calculated. The configuration engine 106 determines the level of precedence to be given to prior Selected features.

In one embodiment, the configuration engine 106 treats all features in the invalid configuration equally, regardless of feature state. In this instance the minimum edit calculation S504 is performed using the full invalid configuration.

In another embodiment, the configuration engine 106 gives precedence to keeping the maximum number of previously selected features. The configuration engine 106 performs this strategy by performing the minimum edit calculation S504 using a partial configuration that ignores any feature whose prior state is Included or Default. Only the new and previous Selected features are kept when making the minimum edit space calculation. In one embodiment the configuration engine 106 performs the minimum edit calculation S504 after determining whether or not the resolution is guided at S558. If the resolution is not guided, the configuration engine 106 performs the minimum edit space calculation S504 using only the Selected features. However, if the resolution is guided, the configuration engine 106 performs the minimum edit space calculation S504 using the full invalid configuration.

FIGS. 77-81 are examples illustrating the impact of various steps of the minimum edit space calculation S504 using a full configuration and using a partial configuration. In the illustrated embodiments, the configuration engine 106 analyzes the full buildable space shown in Table 7700 of FIG. 77, where the features are numerically named—e.g. Family E has two features E1 and E2. If the previous configuration is Selected (F1, E2) and Included (A2, T1, R1) and Default (S5, P1, Y3) and an update request is received to select T2. The configuration engine 106 determines that the updated configuration is invalid because (F1, E2, T2) is not a valid combination. As shown in Table 7700, row 1 is the only configuration that includes both F1 and E2, but it includes T1 not T2.

The two possible minimum edit spaces are shown in Table 7800 of FIG. 78 and Table 7900 of FIG. 79. The first minimum edit space (7800) considers the partial configuration where only the new set of selected features is used in the minimum edit space calculation (F1, E2, T2) and the second minimum edit space (7900) considers the full configuration where the complete invalid configuration is used in the minimum edit space calculation (F1, E2, A2, T2, R1, S5, P1, Y3).

Using the matrix structure as the priority sequence, the configuration engine 106 identifies a single target configuration from each minimum edit space. The priority sequence is based on the matrix as is with left most bit being highest priority. So in this case, the configuration engine 106 selects a configuration by choosing features for each family in a left-to right fashion, and choosing the left-most available feature for each family. With reference to FIG. 78, since the E and F families are the same for all configurations; and the configuration in the bottom row has the highest priority feature for family Y, the first space will result in a target of E1, F2, Y1, T2, R3, P1, S1, A2 which corresponds to the bottom row of Table 7800. The second space will result in a target of E1, F2, Y3, T2, R1, P1, S5, A2. The decision on how to calculate the minimum edit space will affect the target configuration, and thus affects the number of feature edits required.

Table 8000 of FIG. 80 shows the changes required (i.e., the shaded features in target 1) when the configuration engine 106 makes the minimum edit space calculation with only the selected features, based on the minimum edit space in Table 7800. As shown in Table 8000, the features to change are: E1, F2, Y1, R3 and S1.

Table 8100 of FIG. 81 shows the changes required (i.e., the shaded features in target 2) when the minimum edit space calculation is made with the full invalid configuration, based on the minimum edit space in Table 7900. As shown in Table 8000, the features to change are: E1 and F2. In both cases the changes to families E and F are the same because T2 is only available with E1 and F2. But, if the minimum edit space calculation considers only the Selected features, there are three other required changes (i.e., Y1, R3 and S1, as shown in Table 8000).

When the configuration engine 106 performs the calculation with the full configuration, it minimizes the total edits, as shown in Table 8100. It gives no special precedence to previous Selected features.

When the configuration engine 106 performs the calculation with only the new selected set, it is attempting to minimize the changes to prior selections by giving precedence to Selected features. The side effect is that this increases the total number of edits required, as shown in Table 8000.

The other motivation to perform the minimum edit space calculation on only Selected features is to ensure that the maximally standard default is always driven by the Selected set.

The configuration engine 106 results include a Boolean flag to indicate if there is a conflict. When there is a conflict, the configuration engine 106 determines either a single conflict resolution object or a branched conflict resolution object, depending on the guided resolution flag.

Because the services API 134 dictates that a conflict resolution is returned only if there are changes required to the previous selected features, it is possible that the same configuration request will return conflict=true when guided=true, but will return conflict=false when guided=false.

Using the product definition from FIG. 10, in one example the configuration engine 106 considers a configuration where the user has selected Red paint, and autocomplete is true. One such configuration is Selected (Red) and Default (400, Std, Stone, Less). If the user updates the configuration by selecting the navigation (Nav) radio, the new configuration (Nav, Red, 400, Stone, Less) is invalid.

When guided resolution is true, the configuration engine 106 returns a conflict of false and a returns resolution such as {Actions [Action {Pkg, [400], [401,402] }, Action {Trim, [Stone], [Ruby]}]}.

However, when guided resolution is false, the API dictates that there is no conflict because the new Selected features (Nav, Red) are compatible. Even though changes are required for Pkg and Trim, because these were default choices, no conflict is reported. The configuration engine 106 will return conflict of false even though the new configuration and associated feature states show that there is a necessary change to prior default choices for the 400 package, and Stone trim—{Std=AVAILABLE, Nav=SELECTED, Stone=EXCLUDED, White=EXCLUDED, Charcoal=EXCLUDED, Vista=AVAILABLE, Dlx=AVAILABLE, Red=SELECTED, 400=EXCLUDED, 401=DEFAULT, 402=AVAILABLE, Less=DEFAULT, Blue=AVAILABLE, Ruby=INCLUDED}.

The service API 134 specifies that a request can select or unselect a feature. Selecting a feature adds it to the configuration. When a feature is unselected, the API dictates only that the feature state is no longer Selected. It does not require that the feature be removed from the configuration.

There are at least two embodiments. In a first embodiment, the configuration engine 106 removes the unselected feature from the Selected set and proceeds normally. In a second embodiment, the configuration engine 106 removes the unselected feature from the configuration entirely.

Removing the unselected feature from the Selected set follows the API specification that the feature is no longer Selected. However, the feature may not actually be removed from the configuration. In a configurator application, this could mean that the user unchecks the box to remove the feature only to have the checkbox checked again because it is not removed from the configuration. This behavior can be difficult because no matter what the user does to try and remove the feature, the feature keeps getting added back.

In this first embodiment, if a Default or Included feature is unselected, there will be no change in the configuration or feature states. The Selected set does not change because the feature being unselected wasn't in the Selected set. As such, an Included feature will remain Included and a default will remain default. Included state depends on the Selected set which did not change and auto completion is designed to give repeatable results for the same minimally complete configuration which did not change.

If a Selected feature is unselected, the feature state may change to Included or Default. If the feature is Included by the remaining Selected features, its state will change from Selected to Included. Otherwise, it is possible that the removed feature is added back during auto completion.

Depending on the front-end application 132, the user is most likely unaware of the feature states of Selected, Included and Default. If the user is unaware of feature states, it can be quite perplexing to unselect a feature only to have it remain in the configuration.

To avoid this confusion, in the second embodiment, the configuration engine 106 removes the feature from the configuration regardless of its state. This implementation will trigger conflict resolution when a feature from the configuration is unselected. To ensure the unselected feature remains absent from the new configuration, the configuration engine 106 restricts the buildable space to only those configurations that do not contain the unselected feature prior to the minimum edit calculation. This approach ensures that the unselected feature is removed from the configuration.

When auto completion is enabled, the configuration engine 106 makes Default choices until the configuration is complete with respect to displayable families. This is done by making determinations for each incomplete family that is consistent with prior Selected and Included feature states.

In one embodiment, the configuration engine 106 makes Default feature state determinations based on a priority sequence for each family and feature. Incomplete families are processed in priority order, and where more than one feature is valid with prior Selected, Included and Default feature states, the feature priority is used to make the Default determination.

Figure 82:
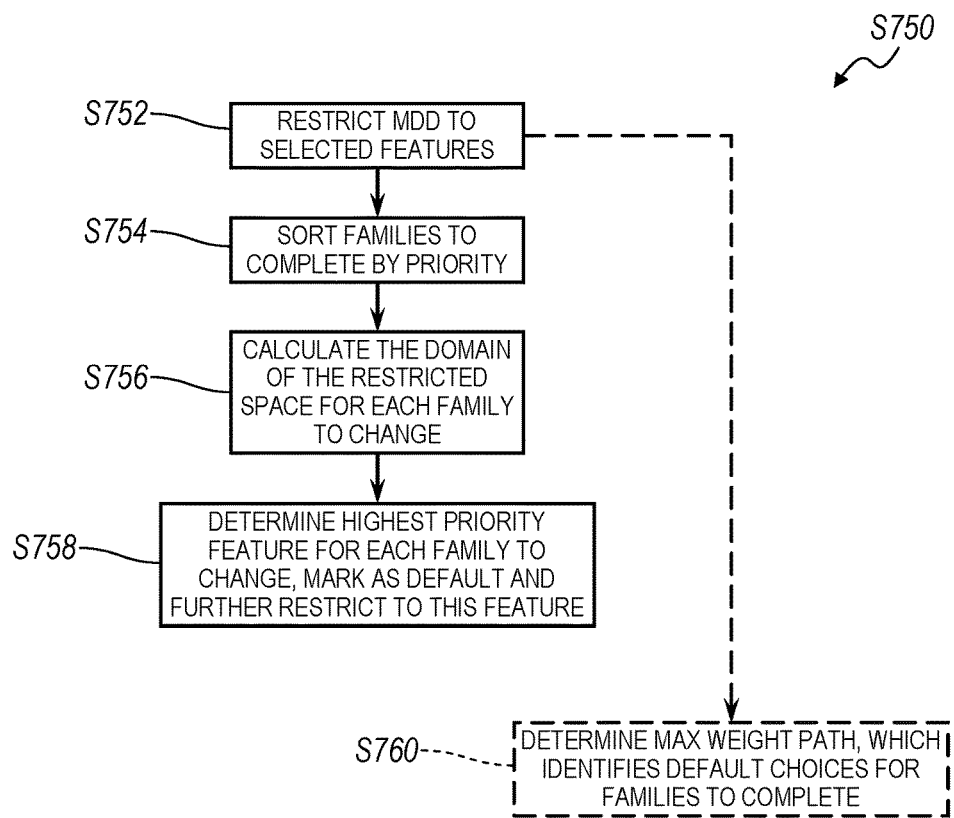
FIG. 82 is a flow chart illustrating a method for automatically completing a configuration according to one or more embodiments.

With reference to FIG. 82, a method for automatically completing a configuration using a sequence-based approach is illustrated in accordance with one or more embodiments and generally referenced by S750. The method S750 is implemented as an algorithm within the configuration engine 106 using software code contained within the server 102, according to one or more embodiments. In other embodiments the software code is shared between the server 102 and the user devices 112, 114. The method S750 uses quick-restrict and domain to make default selections.

At S752, the configuration engine 106 starts with an MDD restricted to Selected features, and a configuration defined by the Selected and Included features. At S754, the configuration engine 106 sorts families by priority. Then, at S756, for each family without Selected or Included features, that are sorted by priority, the configuration engine 106 calculates the domain of the current restricted space. At S758, the configuration engine determines the highest priority feature for the family, marks it as a Default feature, and further restricts the restricted space to this feature.

Alternatively, in another embodiment, after S752, the configuration engine 106 proceeds to S760 and uses sequences to determine the maximally weighted path in the MDD that contains the Selected and Included features, which identifies default choices for families to complete.

Path weight can be represented by a feature Bitset, where the families are ordered left to right according to priority (with the leftmost family being the highest priority), and features are also ordered left to right according to priority within each family (with the feature corresponding to the leftmost bit being the highest priority). This is analogous to sorting the features in descending priority and assigning weights by powers of 2,—1 2 4 8 16. . . . , and ensures that each path will be uniquely weighted, and that there will be exactly one maximally weighted path when each family and feature is assigned a sequence. To compare two paths, the Bitsets are sorted in descending bit order.

Initially the path weight is 0, and as an edge is added during MDD traversal, edge weight is added to the path by simply setting a corresponding bit associated with the feature on that edge.

Ideally, the MDD structure would reflect the priority sequence for features and families. However, compression of the MDD requires the family ordering to be determined by the compression algorithm, and the feature order is arbitrarily determined by feature conditions of the MDD algorithm. While the MDD structure can't be used to store priority sequence, a secondary structure can be created to store this sequencing. The MDD structure is used to determine the feature for each edge, and the alternate/secondary structure is used to set the feature's bits in the path weight Bitset.

Figures 83, 84:
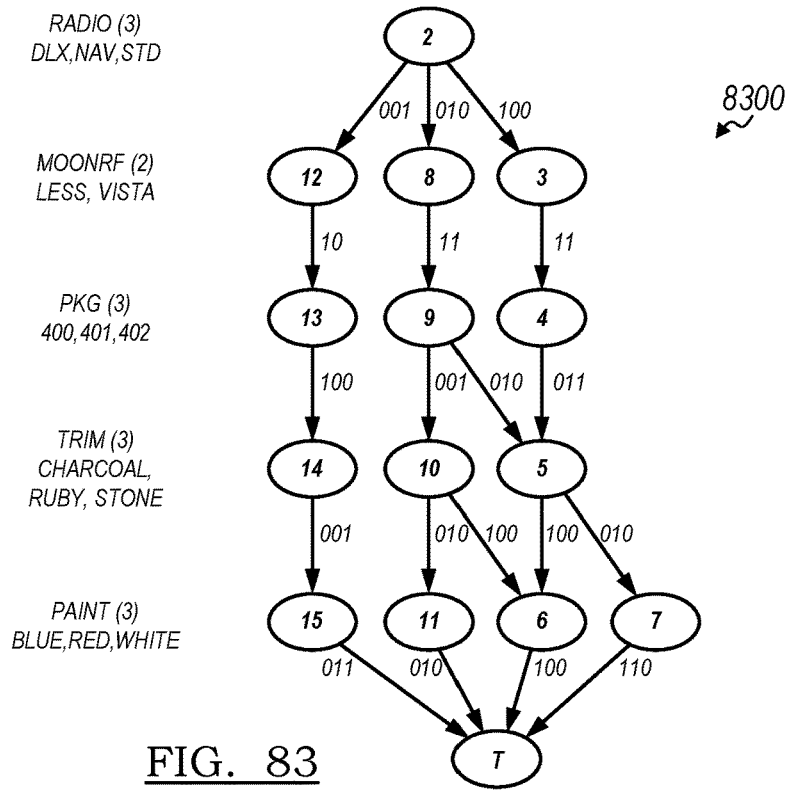
FIG. 83 is a diagram illustrating a buildable space.
FIG. 84 is a table that defines an alternate sequence structure for defining path weights of the buildable space of FIG. 83.

FIG. 83 shows an MDD 8300 that defines the same buildable space as MDD 1300 (FIG. 13), except that the features within each family are sorted alphabetically and the family order is based on MDD compression. For example, the radio features are sorted as STD, DLX and NAV in MDD 1300 and as DLX, NAV and STD in MDD 8300. FIG. 84 is a table 8400 that defines the alternate sequence structure defining path weights, which is the same as the structure of MDD 1300.

Referring back to FIG. 82, the configuration engine 106 begins the weighted operation with a minimally completed configuration, and starts with a quick-restrict operation (S752). In another embodiment, the configuration engine 106 combines the quick-restrict operation with the weighted operation (S760), as is done in Minimum Edit Distance subroutine described with reference to FIG. 48 regarding resolving configuration conflicts. On the downward traversal, no additional action is taken. On the upward traversal, the configuration engine 106 calculates the path weight with the aid of the alternate sequence structure 8400. Where a node has more than one outgoing edge, the weight is calculated separately for each feature that has a valid outgoing edge. When a new maximally weighted path is found, lesser weighted paths are trimmed from the MDD.

Figures 85, 86, 87:
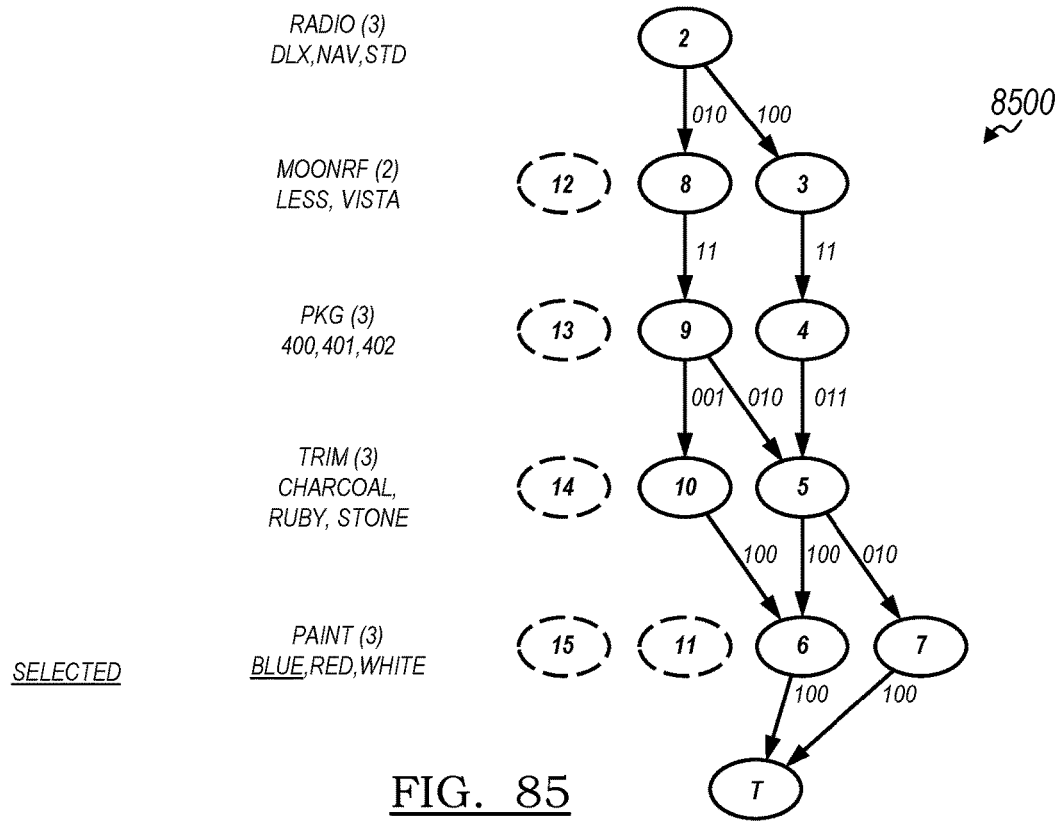
FIG. 85 is a diagram illustrating an example of various steps of the method of FIG. 82 performed on the buildable space of FIG. 83.
FIG. 86 is table illustrating path weight.
FIG. 87 is another table illustrating path weight.

FIG. 85 illustrates an MDD 8500 after the configuration engine 106 restricts the MDD 8300 (FIG. 83) to a selection of Blue paint and no Included or Default features, i.e., a minimally complete configuration: Selected{Blue}+Included{ }+Default{ }, as described with reference to S752. Then configuration engine 106 starts the weighted operation, i.e., S760, with the quick-restricted space shown in MDD 8500. Using depth-first search and traversing child edges in descending bit order, the first path traversed is 2-8-9-10-6-T.

The configuration engine 106 calculates path weight on the upward traversal beginning with partial path T-6-10-9. This path weight, along with the weight of its partial paths, is shown in Table 8600 of FIG. 86.

The configuration engine 106 continues the downward traversal from Node 9 with the 401 package (Pkg.401). There are two partial paths to consider: 9-5-7-T and 9-5-6-T. The two partial paths from Node 5 to the truth node are compared to find the maximum weight between Ruby and Charcoal Trim, as shown in Table 8700 (FIG. 87). The configuration engine 106 determines that Charcoal Trim (path 9-5-6-T) is the maximum, because 000 000 001 010 00 is greater than 000 000 001 001 00, as referenced by numeral 8702, and the edge 5-7 (Ruby Trim) is removed (shown in FIG. 89).

Figure 88:
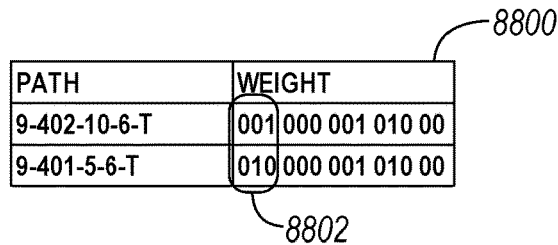
FIG. 88 is yet another table illustrating path weight.

Next, the configuration engine 106 compares the paths from Node 9 to the Truth node, as shown in Table 8800 (FIG. 88). The configuration engine 106 determines that the partial path for the 401 Package is the maximum because the corresponding bits (010) are greater than the corresponding bits of the 402 package (i.e., 001), as referenced by numeral 8802; and trims edge 9-10 from the MDD 8500. At this point the MDD will look like MDD 8900, as shown in FIG. 89.

The maximum weight path for edge 8-9 is MoonRf.Less, because the corresponding bits for Less (10) are greater than the corresponding bits for Vista (01). The configuration engine 106 determines that the configuration {Dlx,Less,401,Charcoal,Blue} is the maximum weight for path 2-8-. . .-T and that the maximum weight configuration for path 2-3-. . .-T is {Std,Less,401,Charcoal,Blue}. The edge weights for these paths are shown in Table 9000 in FIG. 90, and the maximum weight outgoing edge from node 2 is Dlx, because 010 is greater than 001 (Nav), as referenced by numeral 9002.

Figure 89:
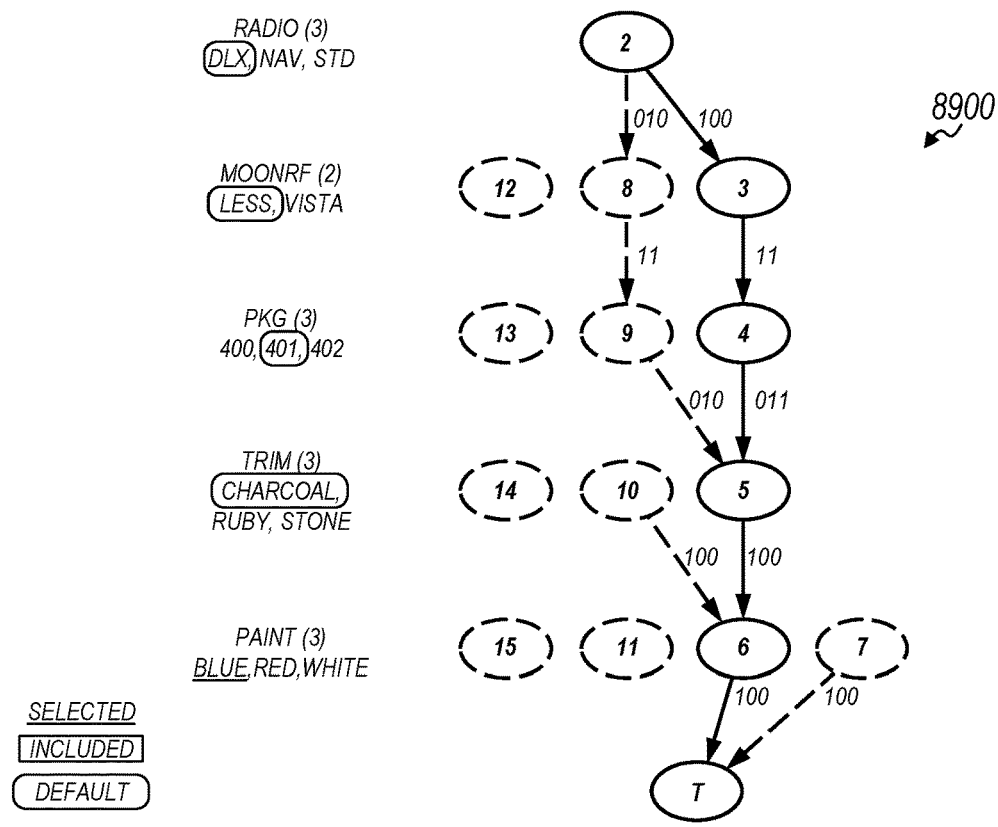
FIG. 89 is a diagram illustrating an example of various steps of the method of FIG. 82 performed on the buildable space of FIG. 85.
Figure 90:
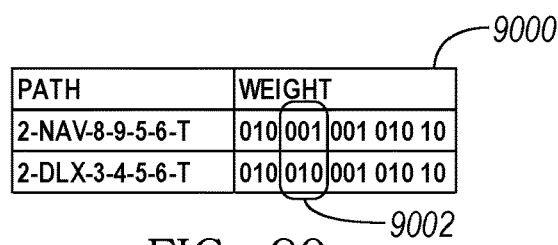
FIG. 90 is another table illustrating path weight.

The configuration engine 106 trims edges 2-8-9-5, 10-6 and 7-T as shown in MDD 8900 (FIG. 89). This leaves the maximum weight path as 2-3-4-5-6-T, and the configuration engine 106 marks Radio.Dlx, MoonRf.Less, Pkg.401 and Trim.Charcoal as Default features at S760 to generate an autocompleted configuration of: Selected {Blue}+Included{ }+Default{ Dlx,Less,401,Charcoal }.

A problem with sequence based auto completion is that it requires additional data to define the priority sequence. This requires manual setup for every vehicle in the catalog. Furthermore, it is not guaranteed to provide the maximally standard configuration.

Sequence-based auto completion is attempting to supplement the MDD with data that will allow the autocompleted configuration to be maximally standard. A "maximally standard" configuration is one where a configuration contains the most possibly standard content, where standard content is determined by the product definition. A standard feature is generally a feature that is included in the base price for a product, such as a vehicle. Whereas an optional feature is typically an upgrade and will increase the price of the product.

For simpler product definition, it is may be possible to ensure maximally standard configurations using the alternate sequence approach. However, for more complex product definition, this approach will not work.

The product definition defines a set of feature conditions that determine when a feature is available. There are three types of availability-13 as a standard feature, as an included feature, and as an optional feature. A feature could have different availability depending on the current configuration. A standard feature is a feature that is included in the base product (vehicle) configuration and an optional feature is a feature that is not included in the base product. An optional feature is typically an upgrade that will add cost to the base price, but this is not always the case as a feature could be a zero-cost option or even a less expensive option than the standard feature. An included feature is generally a feature that is associated with another feature (e.g., a package) and was added to the product by selecting the other feature. For example, leather seats and fuzzy dice may be included in the 401 package. When the user selects the 401 package, they see one change in price for the package, but the change includes both features (i.e., leather seats and fuzzy dice).

The configuration engine 106 uses the maximally standard algorithm to distinguish feature availability based on standard or optional feature conditions. A feature included in a package is a special case of a standard feature. In addition to the valid buildable space, the product definition also defines the standard feature conditions for each family. When the configuration engine 106 selects Default features using the maximally standard algorithm, it is configured to select as many standard features as possible to avoid or limit adding optional content and potentially increasing the price when the user has not explicitly selected the feature.

FIG. 91 is a Table 9100 that shows a matrix that defines the same buildable space as MDD 1700 (FIG. 17). FIG. 92 is a Table 9200 that shows the standard feature conditions for the product definition defining the buildable space.

For the package (Pkg) family, there is a single feature condition defining Pkg.400 as the standard package, as referenced by numeral 9202. For the Radio family, there are two standard feature conditions, as referenced by numeral 9204. The first (upper row) defines Radio.Std as the standard Radio for Pkg.400. The second (lower row) defines Radio.Dlx as the standard Radio for Pkg.401 and Pkg.402. The buildable space shows that Radio.Nav is also available. Because this feature condition is not included in the Standard feature conditions (i.e., Radio.Nav is not active (1) in condition 9204), the navigation radio (Nav) is defined as an optional choice that can be added in place of the deluxe radio (Dlx) for the 401 or 402 package. There is a single feature condition for the moonroof family defining no moonroof (Less) as the standard package, as referenced by numeral 9206. There are two standard feature conditions for the dice family, as referenced by numeral 9208; the first defines no dice as the standard feature for white paint; and the second defines fuzzy dice as the standard feature for red and blue paint. There are three standard features for the seat temperature (Temp) family, as referenced by numeral 9210; the first defines no seat temperature feature (LessTemp) as the standard feature for the 400 package; the second defines heated seat control (Heat) as the standard feature for the 401 package; and the third defines heated and cooled seat control (HeatCool) as the standard feature for the 402 package.

With reference to FIG. 93, a method for automatically completing a configuration using a maximally standard algorithm is illustrated as software code in accordance with one or more embodiments and generally referenced by 9300.

To automatically complete the configuration using standard feature conditions, the configuration engine 106 first restricts the buildable space to the minimally complete configuration at operation 9301. Families absent from the configuration are processed in priority order, and the space is restricted for each successive choice. To make the default choice for a family, its standard feature conditions are inspected to see what standard choice(s) are still possible at operation 9304. If no standard choices are possible, the domain of the restricted space will define possible optional choices at operation 9306. Where more than one possible choice exists for a family, alternate sequencing is used to choose the highest priority feature as the default at operation 9308.

It is uncommon, but valid, for a family to have to no standard feature conditions. This is handled as if no standard features are available, and the choice will be made from the optional content.

It is also valid for the standard feature conditions to define more than one standard feature for the same partial configuration. Where more than one standard feature is available, the highest priority feature will be chosen.

Where all feature conditions for a family are stored in a single MDD, the standard features that are still allowed with prior choices can be identified by an AND operation of this MDD with the current restricted buildable space. An AND operation generates a new MDD for each inspection of a feature condition MDD. As discussed in the Quick-Restrict section, this will incur performance problems from garbage collection. The alternate approach, as shown in FIG. 93, is to divide the standard feature conditions by feature (and not just family) and use the containsAny operation. The containsAny operation is the same logic as an AND operation, however the new space is not created.

Figure 94:
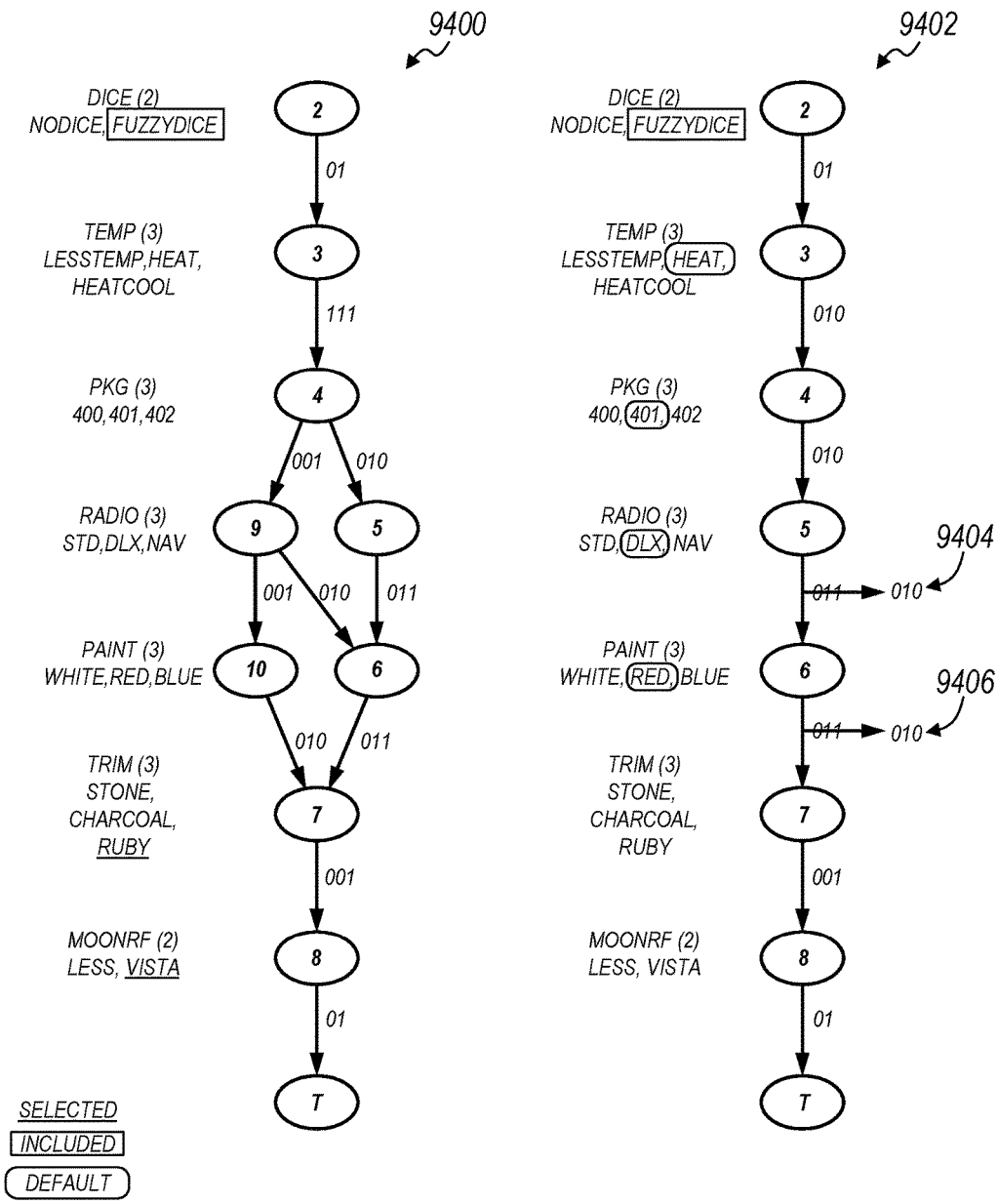
FIG. 94 is a diagram illustrating an example of various steps of the method of FIG. 93.

With reference to FIG. 94, in one embodiment, the configuration engine 106 considers a scenario where a user has selected the Vista moonroof and Ruby trim. With these two selections, Fuzy Dice is included. Given a priority order of [Pkg, Radio, Moonrf, Temp, Paint, Dice, Trim], the families to autocomplete, in order are [Pkg, Radio, Temp, Paint]. The configuration engine 106 does not auto-complete the Dice, Trim and Moonroof families because they are already "complete", i.e., they have features with Selected or Included feature states.

The configuration engine 106 restricts the MDD to the minimally complete configuration Vista, Ruby, and Fuzzy Dice as shown by MDD 9400 in FIG. 94.

First, the configuration engine 106 processes the package family (Pkg) because it has the highest priority. As described with reference to FIG. 92, there is one standard feature condition for the package family (i.e., Pkg 400, 9202). Because the 400 package (i.e., the left-most feature of Pkg) is not contained in the restricted space illustrated by MDD 9400, the standard feature is not available. MDD 9400 shows that the domain of the package family is 011 showing that both the 401 and 402 packages are available in the restricted space. The configuration engine 106 chooses the 401 package based on priority and the space is further restricted to package 401 (i.e., nodes 9 and 10 are removed) as shown by MDD 9402. The restricted space now contains a single superconfiguration.

Next, the configuration engine processes the radio family. As described with reference to FIG. 92, there are two standard feature conditions for the radio family: one for Radio.Std and one for Radio.Dlx (9204, FIG. 92). At this point the deluxe (Dlx) radio and the navigation (Nav) radio are available in the restricted space illustrated by MDD 9402. The configuration engine 106 selects Dlx as a Default feature, because it is the only standard feature remaining in the restricted space, and further restricts the buildable space to Dlx, as indicated by the modified edge label from 011 to 010 and reference by numeral 9404. However, this restriction will not change availability for other families since the space is already a single superconfiguration.

Next, the configuration engine 106 processes the seat temperature (Temp) family. There are three standard feature conditions for Temp (9210, FIG. 92). But, since Pkg 401 has already been selected, only Temp.Heat will be available, as indicated by edge label 010 in MDD 9402. Therefore the configuration engine 106 adds heated seats (Heat) to the configuration as a Default feature.

Next, the configuration engine 106 processes the paint family. There are no standard feature conditions for paint (Table 9200, FIG. 92). The domain of the restricted space has two choices—Red and Blue, as indicated by edge label 011 in MDD 9402. The configuration engine 106 adds Red as the Default choice, and further restricts the MDD 9402 to Red (010) as referenced by numeral 9406, because Red (010) has more weight than Blue (001).

Finally, the configuration engine 106 processes the dice family. There are two feature conditions for Dice (9208, FIG. 92). Because Red paint has been added to the configuration, only Fuzzy Dice is available, and fuzzy dice is already an Included feature. Therefore the configuration engine 106 does not change its feature state.

With reference to FIGS. 95-99, another method for automatically completing a configuration using a maximally standard algorithm is illustrated in accordance with one or more embodiments and generally referenced by S800. The maximally standard auto-completion method S800 is implemented as an algorithm within the configuration engine 106 using software code contained within the server 102, according to one or more embodiments. In other embodiments the software code is shared between the server 102 and the user devices 112, 114.

At S802, the configuration engine 106 generates a maximally standard data space (MsDataSpace) based on a total or global buildable space and a relationships work object (relWork). The total buildable space includes a main space that defines all possible configurations of non-deterministic features and relationships spaces that define the availability of deterministic features in terms of non-deterministic features. The intersection of the main space and the relationships spaces define all possible configurations. The main space and relationship spaces are specified by MDDs, according to one or more embodiments. The total buildable space includes the main MDD and a relationships MDD, and is quick-restricted to any Selected and Included features. RelWork is a temporary object that is used to process a specific condition that may occur based on the order families are processed. As discussed below, relWork is nontrivial if after selecting a Default feature from a deterministic family, there is more than one defining feature condition such that the configuration engine 106 cannot quick restrict the main MDD. Then at S804, the configuration engine 106 identifies any family without any Selected or Included features as a family to complete.

With reference to steps S806-811, the configuration engine 106 analyzes each family of the MDD in priority order. The configuration engine 106 starts analyzing the first family in the sorted families to complete list at step S806. At step S808, the configuration engine 106 determines if the index (x) is less than the total number of families included in the families to complete list. If not, the configuration engine 106 proceeds to S810 (Done). If so, the configuration engine 106 proceeds to step S812 to determine the possible available standard features for family (x) within the restricted buildable space (MsDataSpace). Once the configuration engine 106 has completed its analysis of family (x), it returns to S811 and starts analyzing the next family by incrementing x by 1. The subroutine of S812 is shown in the flowchart of FIG. 96.

Figure 96:
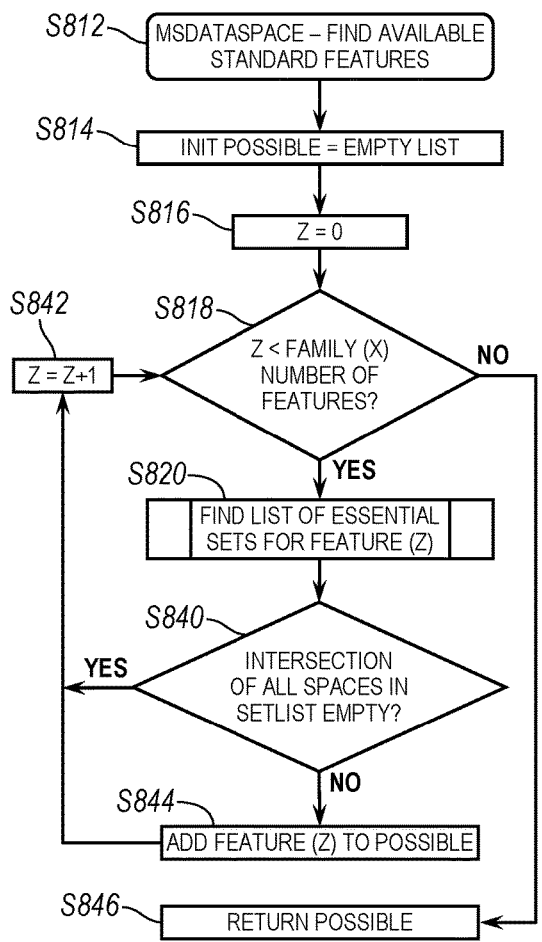
FIG. 96 is a flowchart illustrating a subroutine of the method of FIG. 95.

With reference to FIG. 96, at S814 the configuration engine 106 initializes the list of possible standard features by setting it to empty. With reference to steps S816, S818 and S842, the configuration engine 106 analyzes each feature of family(x). The configuration engine 106 starts analyzing feature zero (z=0) at S816. At step S818 the configuration engine 106 compares feature (z) to the number of features at the current family (x) to determine if z<the number of features in family (x). If the determination is positive, the configuration engine 106 proceeds to S820 to determine the essential sets for feature availability. Once the configuration engine 106 has completed its analysis of feature (z) of family (x), it returns to S842 and starts analyzing the next feature of family (x) by incrementing z by 1. The subroutine of S820 is shown in the flowchart of FIG. 97.

Figure 97:
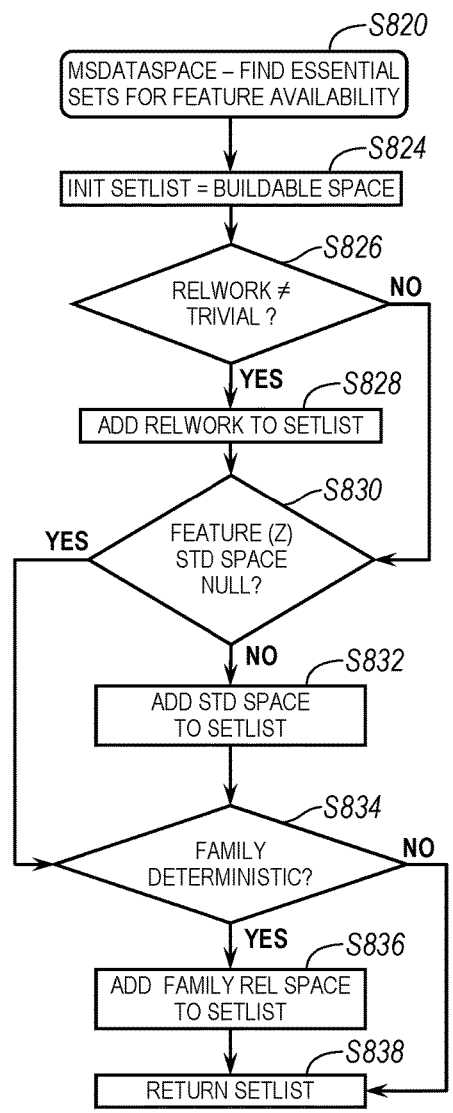
FIG. 97 is another flowchart illustrating a subroutine of the method of FIG. 95.

Referring to FIG. 97, the configuration engine 106 determines a setlist of "essential sets" for the availability of feature (z) at S820-S848. At S824 the configuration engine 106 initializes the setlist by adding the main MDD of the current buildable space (buildableSpace). Then at S826, the configuration engine 106 evaluates relWork to determine if it is not trivial (i.e., not all 1). If relWork is not all trivial, (i.e., a previous Default selection was made from a deterministic family such that the relationship defined more than one determinant condition) then the configuration engine 106 proceeds to S828 and adds relWork to the setlist. After S828, or in response to a negative determination at S826, the configuration engine 106 proceeds to S830 to determine if there are not any standard feature conditions defined for this feature. If there are no standard feature conditions defined for feature (z), then its standard space is null. If there are standard feature conditions defined for feature (z), then a negative determination is made at S830, and the configuration engine 106 proceeds to S832 and adds the standard space to the setlist. After S832, or in response to a positive determination at S830, the configuration engine 106 proceeds to S834 to determine if the family of feature (z) is deterministic. If family (x) is deterministic, the configuration engine 106 adds the relationship space for family (x) to the setlist at S836. After S836, or in response to a negative determination at S834, the configuration engine 106 proceeds to S838 and returns the setlist to the subroutine of FIG. 96.

Referring to FIG. 96, at S840 the configuration engine 106 determines if the intersection of all spaces in the setlist for feature (z) is empty (i.e., if feature (z) is not a standard feature or it is a standard feature that is not available with the current configuration). If the determination at S840 is negative, the configuration engine 106 proceeds to S844 and adds feature (z) to the list of possible available standard features (POSSIBLE). After S844, or after a positive determination at S840, the configuration engine 106 proceeds to S842 to analyze the next feature (z) of family (x). Once the configuration engine 106 has analyzed all features of family (x), it makes a negative determination at S818 and proceeds to S846 to return the possible available standard features for family (x) to the main maximally standard routine of FIG. 95.

Figure 95:
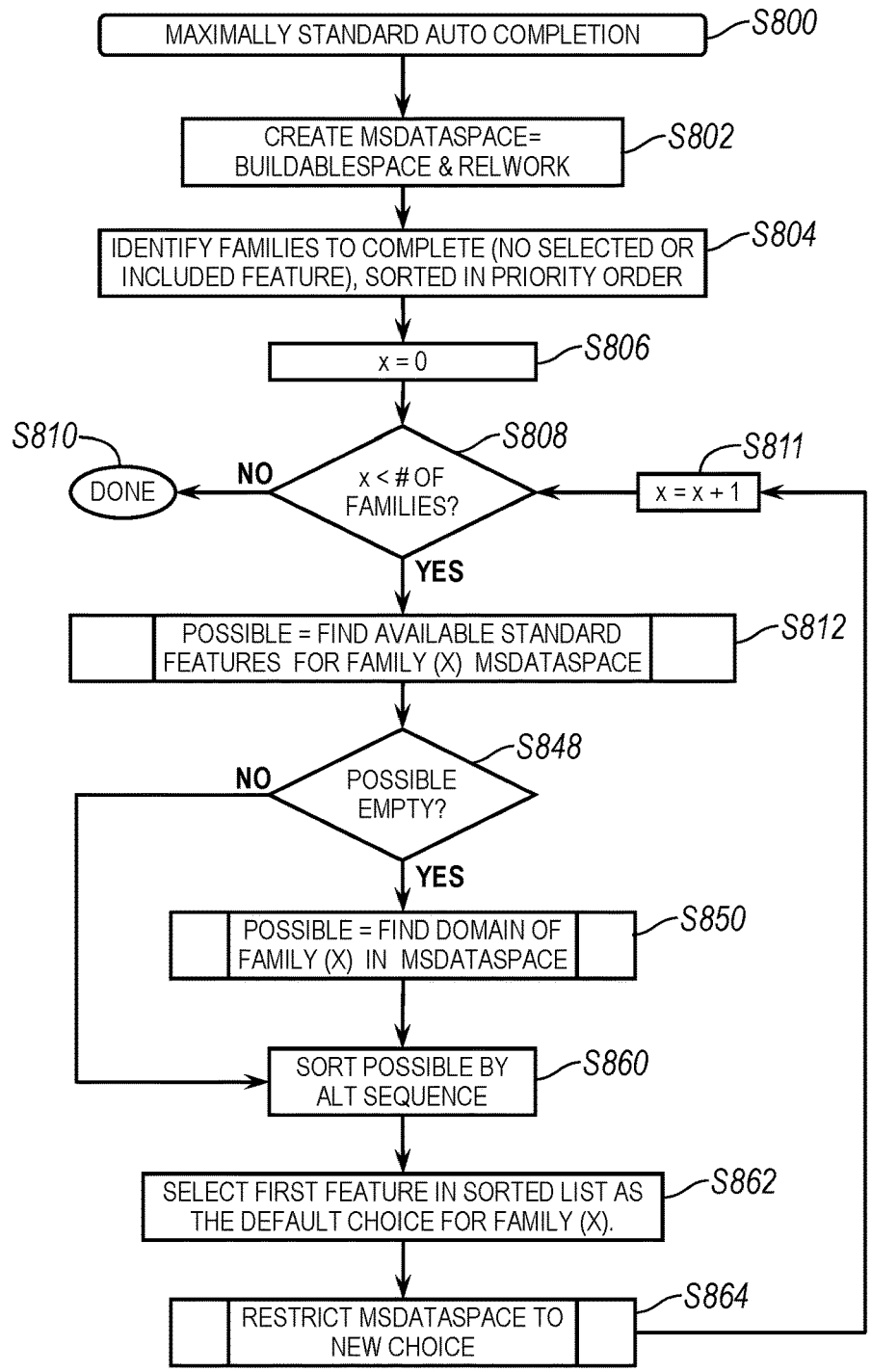
FIG. 95 is a flowchart illustrating another method for automatically completing a configuration using a maximally standard algorithm according to one or more embodiments.

With reference to FIG. 95, at S848 the configuration engine determines if there are any standard features for family (x). If there are no standard features, i.e., if POSSIBLE is empty, then the configuration engine 106 proceeds to S850 to find the domain of family (x) in the maximally standard data space (MsDataSpace). The subroutine of S850 is shown in the flowchart of FIG. 98.

Figure 98:
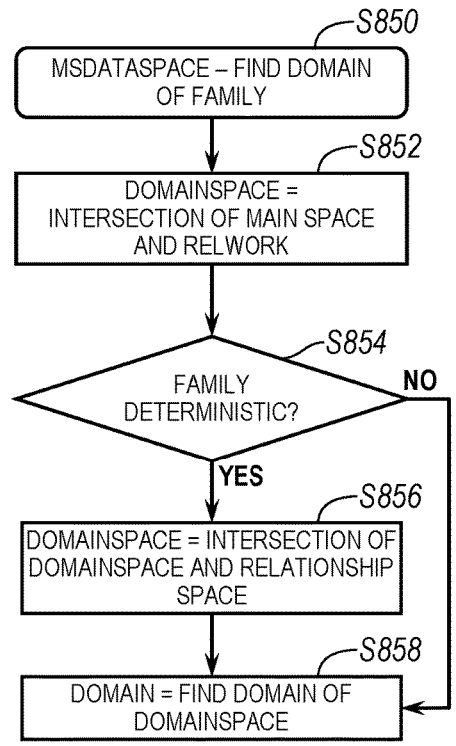
FIG. 98 is yet another flowchart illustrating a subroutine of the method of FIG. 95.

With reference to FIG. 98, the configuration engine 106 determines the domain of family (x) at S850-S858. At S852, the configuration engine 106 calculates the domain space of family (x) as the intersection of the main space and the relWork. If the configuration engine 106 determines that family (x) is deterministic at S854 based on the product definition, then it proceeds to S856. At S856 the configuration engine 106 sets the domain space equal to the intersection of the domain space and relationship space for that family. After S856, or in response to a determination that family (x) is not deterministic at S854, the configuration engine 106 proceeds to S858 and sets the Domain to the domain of the domain space, adds any feature from family (x) that is present to the Domain to the list of possible features and returns to the main maximally standard routine of FIG. 95.

Referring to FIG. 95, after determining the domain of family (x) at S850, or in response to a negative determination at S848, the configuration engine 106 proceeds to S860 and sorts POSSIBLE by an alternate sequence that defines the priority of the features. At S862 the configuration engine 106 selects the first feature in the sorted list as the Default feature for Family (x). Then the configuration engine 106 proceeds to S864 to restrict the maximally standard data space to the new Default feature. The subroutine of S864 is shown in the flowchart of FIG. 99.

Figure 99:
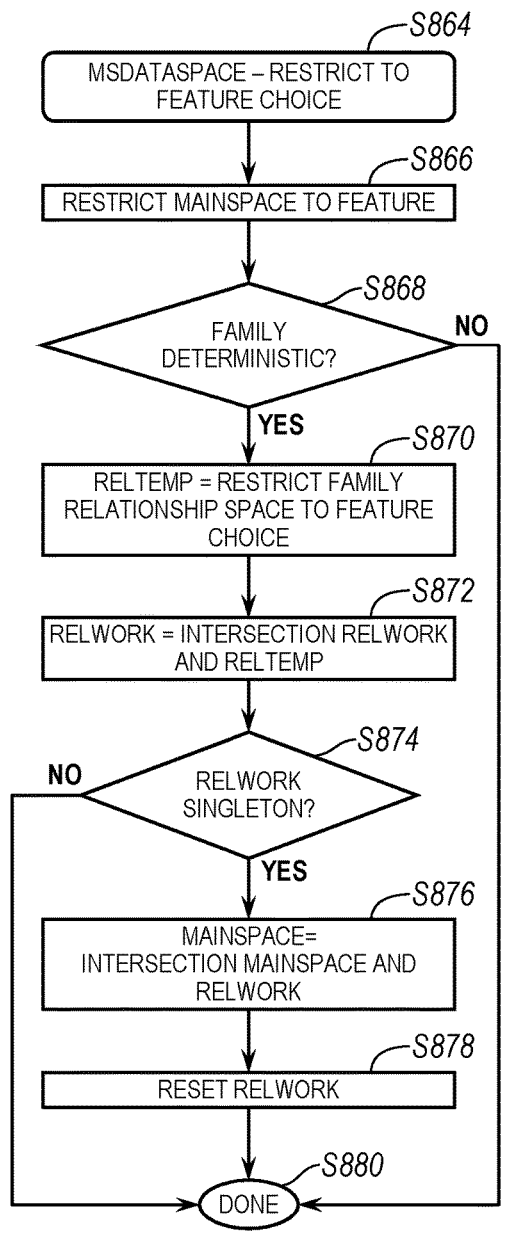
FIG. 99 is still yet another flowchart illustrating a subroutine of the method of FIG. 95.

With reference to FIG. 99, at S864-S880, the configuration engine 106 further restricts the maximally standard data space to the new Default feature. At S866 the configuration engine 106 restricts the main space to the new Default feature. Then if family (x) is deterministic, the configuration engine 106 proceeds to S870 and defines a temporary relationship (relTemp) by restricting the family relationship space to the new Default feature choice. Then at S872, the configuration engine 106 sets relWork to the intersection of relWork and relTemp. At S874, the configuration engine 106 evaluates relWork to determine if it has a single path, i.e., a "singleton." If the standard features (relWork) is a singleton, the configuration engine 106 proceeds to S876 and uses quick restrict to restrict the main space using the single bitmask from relWork; and then resets relWork to be trivial (all 1s) at S878. After S878, or in response to a negative determination at S868 or S874, the configuration engine 106 proceeds to S880 and returns to the main maximally standard routine of FIG. 95.

With reference to FIGS. 100-101, deterministic relationships are used to enable efficient creation and storage of the full buildable space. As described previously, the global buildable space can be stored in a Global MDD that has a main space (e.g., an MDD) and a set of relationship spaces (e.g., MDDs). Maximally standard auto completion requires standard feature conditions. The buildable space (FIG. 100) and Standard Feature Conditions (FIG. 101) are shown as Tables 10000 and 10100, respectfully, and combined in a single Buildable object.

There is no concept of displayable and non-displayable families during MDD generation. Displayable families refer to content this is displayed to the user, for example paint color is displayed to a user in a build and price application. Whereas non-displayable families refer to content that is not displayed to the user, such as an electrical harness in a build and price application. A Superconfiguration Generator (SCG) library (not shown) is a component of the ETL 128 (FIG. 2). The SCG library simply finds all relationships in order to generate the smallest possible main space.

Some algorithms that target displayable content (e.g., validation and feature state mapper) have been optimized to work on a single MDD, and others require all displayable content to be in a single MDD (e.g., minimum edit). Valid input for the configurator is a global space where no displayable families have been pulled to an external relationship, even if it is deterministic.

One possible way to build a global space that conforms to the configurator input is to control which families can be deterministic. The SCG algorithm includes an argument called relignore which can be used to specify which families are not allowed to be deterministic. This argument can be used to specify that displayable families are not allowed to be deterministic.

Another approach is to allow SCG to build the MDD by pulling out whatever relationships it finds. Then, an extra step is used before the space can be used by the configurator. Any relationship that defines a display family dependence on the main MDD is flattened back into the main MDD. To do this efficiently, the MDD is recompressed as the relationships are flattened.

Generally both approaches will take the same amount of processing time. In the second approach, the MDD may be generated much faster, but that any time savings is used in the extra flattening step.

The configuration engine 106 will be validating two types of configurations—a configuration of displayable features only or an expanded configuration of displayable and no display features.

To validate a configuration of displayable features the relationships can be ignored because the configuration engine 106 does not allow any displayable family to be deterministic. This means that the main MDD contains all of the information necessary to define feature combinations from the displayable families. There is no information in the relationships that will shrink the space of displayable families that is defined in the main MDD. Thus, only the main MDD is used to validate a configuration of display family features. To validate a configuration of displayable families, simply call contains operation on the main MDD.

To validate a configuration that contains displayable and no-display features, both the main MDD and the relationships are inspected. Just as the MDD containsAny operation is used to validate a configuration against an MDD, the Global MDD also has a containsAny operation that can validate a configuration against a Global MDD. The Global MDD operation utilizes the MDD containsAnyParallel operation, to validate a fully expanded configuration, the parallel operation will turn the mask into its own MDD and inspect that space along with the main space and all relationship MDDs. To validate a partial configuration of both display and no display features, the parallel operation inspects the mask MDD, the main MDD and the relationships associated with each deterministic feature in the configuration. When processing a partial configuration, relationships for families that have no feature in the configuration can be ignored.

FIG. 102 is a table 10200 that shows several example configurations, the relevant MDDs, and the containsAny call that the configuration engine 106 uses to validate the configuration.

Conflict resolution is also limited to displayable content. As with the "contains" operation, when dealing with configurations that do not contain deterministic features, the main MDD contains sufficient information for the conflict resolution without including the relationships.

As described with reference to FIG. 47, conflict resolution begins with a minimum edit distance calculation that is performed on the main MDD.

For Single Conflict Resolution, the target configuration is identified by performing auto completion in the minimum edit space. Because the main MDD includes no display content, the target configuration will also include no display content. The no-display content is stripped from the configuration engine response. Alternatively, the author decorators can be modified to ignore no-display features when adding conflict resolution to the xml response.

For Branched Conflict Resolution, the entire minimum edit space is used to build the response. The minimum edit space is projected to displayable content before building the response.

There is no concept of displayable and non-displayable families during the first stage of authoring or determining the feature conditions. As such, the feature conditions for displayable families may be determined with a dependency on no-display families. This means that when the maximally standard auto completion algorithm uses the full configuration space; it accounts for the external relationship MDDs in addition to the main MDD.

When using a Global Space (main space+relationships spaces) for maximally standard auto completion, the basic logic is the same as using an MDD. Instead of checking a single MDD, the algorithm checks the global space—both the main MDD and the relationship MDDs. The basic operations of restrict, containsAny and domain accounts for both the main space and external relationships.

During auto completion, the configuration engine 106 restricts the main space for each feature choice (S864). When the choice is deterministic, the external relationship defines the determinant conditions for each feature. The deterministic relationship space is restricted to the feature choice to determine the determinant conditions and then the main space is restricted to the corresponding determinant conditions.

When a deterministic feature has a single determinant condition, the configuration engine 106 quick-restricts the main space using the determinant condition, according to one or more embodiments (S874-S876). The buildable space as shown in Table 10000 (FIG. 100) includes a main space 10002 and a relationships space 10004. The relationships space 10004 shows that features Y2, Y5 and Y6 map to B1 as referenced by numeral 10006, and that features Y1, Y3, and Y4 map to B2 as referenced by numeral 10008. Table 10300 of FIG. 103 shows only one row remains after the relationship is restricted to the choice B1 (S870). The configuration engine 106 quick-restricts the main space using this single superconfiguration as the bitmask. After B1 is chosen, the main space is restricted to B1 (S866) and is also restricted to Y2, Y5, and Y6 (S876), as shown in Table 10400 of FIG. 104, and referenced by numeral 10402.

The quick-restrict operation accepts a single bit mask. This means that the main space cannot be quick-restricted to reflect a deterministic choice whenever a deterministic feature has multiple determinant conditions. Table 10000 (FIG. 100) shows that family K is determined by two families [A,S] as referenced by numeral 10010. Table 10500 of FIG. 105 shows the two rows defining the determinant conditions for feature K2. The first row of Table 10500 shows that A2,S3; A2,S5; A2,S6 all map to K2 and the second row shows that A1,53 also maps to K2. When K2 is chosen, the main space is restricted to K2, but the configuration engine 106 cannot quick-restrict it with the K2 determinants because the restricted relationship space defines two superconfigurations. Instead, the configuration engine 106 adds a special relWork space, as referenced by numeral 10602, to store the determinant conditions as shown FIG. 106. After restricting to K2, relWork contains the two determinant conditions for K2.

Just as the global space requires both the main MDD and all its relationships to fully define the space, relWork is necessary to fully define the restricted space. However, if relWork is trivial (i.e., all 1s) then the configuration engine 106 can ignore it because it isn't further restricting the space.

The configuration engine 106 initializes the relWork space as a trivial space, with a single superconfiguration of all 1s, according to one or more embodiments. When a deterministic choice is made that has multiple determinant conditions, relWork is AND'ed with the restricted relationship space (S872). If the result of the AND operation is a single superconfiguration (S874), the main space is restricted with that superconfiguration (S876) and relWork is trivialized (S878).

Referring to FIG. 107, if the configuration engine 106 further restricts the space to M2, then there is just one row remaining in relationship M as shown in Table 10700. When this restricted relationship space is ANDed with relWork (from FIG. 106), just one row remains as shown in Table 10800 of FIG. 108. This is used to restrict the main space, and then relWork is reset, with the final result shown in Table 10900 of FIG. 109.

The configuration engine 106 uses the containsAny operation of the maximally standard auto completion algorithm to determine if a Standard feature condition space is still valid in the restricted space, according to one or more embodiments.

For two MDDs, the operation mdd1.containsAny(mdd2) is equivalent to not(isEmpty(mdd1.and(mdd2)). The ContainsAny operation can be extended to operate on two or more MDDs and is called containsAnyParallel. For three MDDs, the operation mdd1.containsAnyParallel([mdd2, mdd3]) is equivalent to not(isEmpty(mdd1.and(mdd2).and(mdd3)).

When dealing with deterministic relationships, this contains any operation may need to include the relWork MDD.

In order for the configuration engine 106 to determine if a standard feature is available in the restricted space (S812), the containsAny operation must always operate on the standard space and the main space and may need to account for the relWork space and an external relationship space. When the family is deterministic and relWork is not trivial the operation will be standardSpace.containsAny(mainSpace, rel, relWork). The operation can skip relWork if it is trivial and will only include a relationship if the feature is deterministic (S822).

The configuration engine 106 determines if any standard features for A are still valid in the space from FIG. 103, by accounting for the A standard space and the main space in the containsAny operation. There is no relationship space because A is not deterministic and the relWork is ignored because it is trivial (i.e., A is all 1s in Table 10300).

In order for the configuration engine 106 to determine if any standard features for B are still valid in the space from FIG. 103, the containsAny operation must account for the B standard space, the main space and relationship B space. The configuration engine 106 ignores relWork because it is trivial.

The configuration engine 106 determines if any standard features for M are still valid in the space from FIG. 106, by accounting for the M standard Space, main Space, Relationship M space, and relWork in the containsAny operation.

The maximally standard auto completion algorithm uses domain calculation when the standard feature conditions do not identify a possible choice. Because only the domain of a single family is needed, not all of the relationships must be included. The domain calculation must consider the main space, the relWork space, and, if the family is deterministic, the external relationship space. This is done by first ANDing the spaces, and then calculating the domain on the resulting space (S850).

The algorithm for maximally standard auto completion without deterministic relationships was shown previously in FIG. 93.

The modifications to account for deterministic relationships are:
1) Change mdd.quickRestrict to SPACE.RESTRICT;
2) Change mdd.containsAny with SPACE.containsAny, where space defines the main MDD, the relationship MDDs, and the relWork MDD discussed above in the Restrict Global Space section; and
3) Change mdd.findDomain.toListActive(Fa) to SPACE.findDomain(Fa).

The new algorithm is shown as flowcharts in FIGS. 95-99 and as software code in FIG. 110.

The following example illustrates the modified algorithm and references steps in the flow charts and operations in the software code where applicable. This example will use the global space and standard feature conditions defined previously in Table 10000 (FIG. 100) and Table 10100 (FIG. 101). Table 10100 also lists the family priority order, as generally referenced by numeral 10102.

With reference to FIG. 111, the configuration engine 106 restricts the space starting with a minimally complete configuration of Selected {Y3,E1,P1}+Included {F2} (11001, FIG. 110; S802, FIG. 95). The configuration engine 106 makes Default choices for the remaining families in priority order as defined in Table 10100 (FIG. 101), i.e.: V, R, K, B, A, M, T, I, S (S804, FIG. 95).

Referring to FIG. 112, the configuration engine 106 determines that Family V is deterministic and includes a single standard feature condition. To determine if standard feature V3 is available, the configuration engine 106 checks the main space, standard space and deterministic relationship (S820, FIG. 97). Operation 11004 (FIG. 110) stdV3.containsAnyParallel(mainSpace, relV) returns false because V3 is not available with the current choice Y3 (see also S840, FIG. 96). The domain of V, from operation 1106 (FIG. 110) AND(relV,mainSpace), will identify only one possible choice (see also S852-S858, FIG. 98). V2 is added and the newly restricted space, as determined at S864, FIG. 96 and operation 11008, FIG. 110, is shown in Table 11200 of FIG. 112 and referenced by numeral 11202.

With reference to FIGS. 112-113, the configuration engine 106 determines that Family R has no standard feature conditions (S830-S836, FIG. 97; operation 11004, FIG. 110). The domain of the restricted space identifies two possible choices—R1, R4 as referenced by numeral 11204 (S852-S858, FIG. 98; operation 1106, FIG. 110). Without alternate sequencing, R1 is picked as the Default choice and the space is further restricted (S864, FIG. 99; operation 11008, FIG. 110) as shown in Table 11300 of FIG. 113, and referenced by numeral 11302.

Referring back to FIG. 101, the configuration engine 106 determines that Family K has two standard feature conditions (S830-S836, FIG. 97; operation 11004, FIG. 110). StdK1 defines K1 as standard for V1 and StdK2 defines K2 as standard for V2 or V3. Because V2 has been previously chosen, K2 is the only available standard choice and is added to the configuration. The configuration engine 106 further restricts the space to reflect this choice (S864, FIG. 99; operation 11008, FIG. 110). Family K is deterministic. When RelK is restricted to K2, there are two rows remaining. The main space cannot be quick-restricted and relWork is updated as shown in Table 11400 of FIG. 114.

With reference to FIG. 115, the configuration engine 106 adds B2 based on its Standard space and chooses A2 because it is standard with {R1, V2}. The restricted space after these choices is shown in Table 11500 of FIG. 115. Table 11500 shows that the configuration engine 106 could restrict relWork to A2, minimize it to one row, use it to restrict the main space and then trivialize it; however, the containsAny optimizations (operation 11004, FIG. 110) dictate that it is actually better to wait until relWork is minimized by another deterministic feature. It is actually counterproductive to restrict relWork for every choice.

Referring to FIG. 116, the configuration engine 106 determines that Family M has standard feature conditions (S830-S836, FIG. 97; operation 11004, FIG. 110). M1 is the only standard feature that is still available in the restricted space. After relWork is updated for M1, only one row remains, i.e., the second row of Table 11500 of FIG. 115. This row is used to restrict the main space and relWork is trivialized, as shown by Table 11600 of FIG. 116 (S864, FIG. 99; operation 11008, FIG. 110). The restricted space after processing family M is shown in Table 11600.

With reference to FIG. 117, the configuration engine 106 adds T1 as the Default choice from its Standard Feature Condition and I1 is chosen as the Default from the possible choices I1 and I2 (S830-S836, FIG. 97; operation 11004, FIG. 110). The deterministic relationship for I shows that I1 maps to S1 or S5. After T1 and I1 are chosen, S5 remains the only choice for family S, as shown in Table 11700 of FIG. 117.

The configuration engine's use of relWork to account for deterministic relationships when quick-restricting the main space, along with the containsAnyParallel operation, allows for a very efficient maximally standard auto completion algorithm. This allows the configuration engine 106 to support maximally standard configurations without requiring feature condition authoring to be modified in order to account for display and no display families.

Computing devices described herein, generally include computer-executable instructions where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, C#, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method to determine feature states comprising:
storing data representative of a multi-valued decision diagram (MDD), the MDD indicating a Boolean function specifying a buildable space of all possible configurations of features of a vehicle, the MDD including a root node, a truth node, a false node, and at least one level of intervening nodes between the root node and either the truth node or the false node, each level of the MDD corresponding to a family of mutually-exclusive features represented by at least one node, each node except for the truth node and the false node connecting to nodes of a next adjacent level by outgoing edges having labels each indicating one or more features of the family that are available for the possible configurations including the node, each node except for the root node connecting to nodes of a prior adjacent level by incoming edges that are outgoing edges of the prior adjacent level, such that a complete path from the root node through the outgoing edges to the truth node defines one valid configuration, wherein each complete path from the root node to the truth node is of the same length in nodes when there are no long edges;
receiving from a user a current selection of a partial configuration comprising one or more families with one feature selected for each family, wherein the partial configuration has been validated as a valid configuration;
generating an availability bitset indicative of which features are available for further selection, consistent with the valid configuration and without violating constraints imposed by the current selection;
determining a feature state for all features based on the current selection and the availability bitset;
presenting to the user features possible for selection, based on the availability bitset;
receiving from the user, selection of one of the possible features for a next family and setting that feature in the partial configuration as Selected resulting in a new partial configuration;
performing validation of the new partial configuration using a configuration engine;
if the new partial configuration is invalid, prompting the user to make changes, or allowing the configuration engine to make the changes according to a predefined hierarchy;
setting the new partial configuration as the partial configuration and the current selection:
regenerating the availability bitset indicative of which features are available for further selection, consistent with the valid configuration and without violating constraints imposed by the current selection; and
repeating the process starting from presenting to the user the features possible for selection by the user until all families are included in the valid configuration.

2. The method of claim 1, wherein the availability bitset indicates a first value of '1' for a feature when the feature is available for selection without violating the constraints imposed by the current selection, and a second value of '0' for the feature when the feature is excluded and not available for selection due to violating the constraints imposed by the current selection if selected.

3. The method of claim 1, wherein the feature state for each of the features indicates one of:
(i) selected for a feature that has been explicitly selected by a user,
(ii) available for a feature that is free for selection without violating the constraints imposed by the current selection,
(iii) included for a feature that is the only available choice in a family due to user selection of one or more features that require it,
(iv) default for a feature that is selected due to automatic completion of the configuration,
(v) excluded for a feature that conflicts with existing constraints, and
(vi) forbidden for a feature that violates an external constraint independent of the possible configurations specified by the MDD that cannot be resolved if selected.

4. The method of claim 3, wherein the external constraint is a feature that is unavailable for manufacture at a particular time.

5. The method of claim 1, farther comprising:
performing a downward traversal of the MDD from the root node to identify downward-marked nodes that are not excluded by the selection;
performing an upward traversal of the MDD from the truth node to identify upward-marked nodes that are not excluded by the selection; and
generating the availability bitset by identifying the features available for further selection, consistent with the valid configuration and without violating constraints imposed by the current selection, as the nodes that are both downward-marked and upward-marked.

6. The method of claim 1, further comprising:
performing a first restricted domain calculation using the feature state to identify which additional feature selections outside of the families having feature selections are compatible with the current selection;

performing, for each family in which a feature is selected, a second restricted domain calculation to identify which additional features in that family are compatible with the current selection; and generating the availability bitset by identifying the features available for further selection according to the first and the second restricted domain calculations.

7. The method of claim 1, further comprising identifying a feature as excluded by the selection when the feature is not selected or available.

8. The method of claim 7. further comprising identifying an included feature as a feature that is unselected but included in a family having exactly one available feature.

9. A system comprising:
a memory configured to store data representative of a multi-valued decision diagram (MDD) indicating a Boolean function specifying a buildable space of all possible configurations of features of a vehicle, the MDD including a root node, a truth node, a false node, and at least one level of intervening nodes between the root node and either the truth node or the false node, each level of the MDD) corresponding to a family of mutually-exclusive features and represented by at least one node, each node of a level connecting to nodes of a next adjacent level by outgoing edges having labels each indicating one or more features of the family that are available for the possible configurations including the node, such that a complete path from the root node through the outgoing edges to the truth node defines one valid configuration, wherein each complete path from the root node to the truth node is of the same length in nodes when there are no long edges; and
a processor in communication with the memory, programmed to
receive from a user a current selection of a partial configuration comprising one or more families with one feature selected for each family, wherein the partial configuration has been validated as a valid configuration,
generate an availability bitset indicative of which features are available for further selection, consistent with the valid configuration and without violating constraints imposed by the current selection,
determine a feature state for all features based on the current selection and the availability bitset,
present to the user features possible for selection, based on the availability bitset,
receive from the user, selection of one of the possible features for a next family and set that feature in the partial configuration as Selected resulting in a new partial configuration,
perform validation of the new partial configuration using a configuration engine,
if the new partial configuration is invalid, prompt the user to make changes, or allow the configuration engine to make the changes according to a predefined hierarchy,
set the new partial configuration as the partial configuration and the current selection,
regenerate the availability bitset indicative of which features are available for further selection, consistent with the valid configuration and without violating constraints imposed by the current selection, and
repeat the process starting from presenting to the user the features possible for selection by the user until all families are included m the valid configuration.

10. The system of claim 9, wherein the availability bitset indicates a first value of '1' for a feature when the feature is available for selection without violating the constraints imposed by the current selection, and a second value of '0' for the feature when the feature is excluded and not available for selection due to violating the constraints imposed by the current selection if selected.

11. The system of claim 9, wherein the feature state for each of the one or more features indicates one of:
(i) selected for a feature that has been explicitly selected by a user,
(ii) available for a feature that is free for selection without violating the constraints imposed by the current selection,
(iii) included for a feature that is the only available choice in a family due to user selection of one or more features that require it,
(iv) default for a feature that is selected due to automatic completion of the configuration,
(v) excluded for a feature that conflicts with existing constraints, and
(vi) forbidden for a feature that violates an external constraint independent of the possible configurations specified by the MDD that cannot be resolved if selected.

12. The system of claim 9. wherein the processor is further programmed to:
perform a downward traversal of the MDD from the root node to identify downward-marked nodes that are not excluded by the selection;
perform an upward traversal of the MDD from the truth node to identify upward-marked nodes that are not excluded by the selection; and
generate the availability bitset by identifying the features available for further selection, consistent with the valid configuration and without violating constraints imposed by the current selection, as the nodes that are both downward-marked and upward-marked.

13. The system of claim 9, wherein the processor is further programmed to:
perform a first restricted domain calculation using the feature state to identify which additional feature selections outside of the families having feature selections are compatible with the current selection;
perform, for each family in which a feature is selected, a second restricted domain calculation to identify which additional features in that family are compatible with the current selection; and
generate the availability bitset by identifying the features available for further selection according to the first and the second restricted domain calculations.

14. The system of claim 9, Wherein the processor is further programmed to:
identify a feature as excluded by the selection when the feature is not selected or available; and
identify an included feature as a feature that is unselected but included in a family having exactly one available feature.

15. A non-transitory computer-readable medium comprising instructions that, when executed by a processor, cause the processor to:
store data representative of a multi-valued decision diagram (MDD) indicating a Boolean function specifying a buildable space of all possible configurations of features of a vehicle, the MDD including a root node, a truth node, a false node, and at least one level of intervening nodes between the root node and either the truth node or the false node, each level of the MDD corresponding to a family of mutually-exclusive features and represented by at least one node, each node of a level connecting to nodes of a next adjacent level by outgoing edges having labels each indicating one or more features of the family that are available for the possible configurations including the node, such that a complete path from the root node through the outgoing edges to the truth node defines one valid configuration, wherein each complete path from the root node to the truth node is of the same length in nodes when there are no long edges;

receive from a user a current selection of a partial configuration comprising one or more families with one feature selected for each family, wherein the partial configuration has been validated as a valid configuration;

generate an availability bitset indicative of which features are available for further selection, consistent with the valid configuration and without violating constraints imposed by the current selection;

determine a feature state for all features based on the current selection and the availability bitset;

present to the user features possible for selection, based on the availability bitset;

receive from the user selection of one of the possible features for a next family and set that feature in the partial configuration as Selected resulting in a new partial configuration;

perform validation of the new partial configuration using a configuration engine;

if the new partial configuration is invalid, prompt the user to make changes, or allow the configuration engine to make the changes according to a predefined hierarchy;

set the new partial configuration as the partial configuration and the current selection;

regenerate the availability bitset indicative of which features are available for further selection, consistent with the valid configuration and without violating constraints imposed by the current selection; and repeat the process starting from presenting to the user the features possible for selection by the user until all families are included in the valid configuration.

16. The medium of claim 15, wherein the availability bitset indicates a first value of '1' for a feature when the feature is available for selection without violating the constraints imposed by the current selection, and a second value of '0' for the feature when the feature is excluded and not available for selection due to violating the constraints imposed by the current selection if selected.

17. The medium of claim 15, wherein the feature state for each of the one or more features indicates one of:
(i) selected for a feature that has been explicitly selected by a user,
(ii) available for a feature that is free for selection without violating the constraints imposed by the current selection,
(iii) included for a feature that that is the only available choice in a family due to user selection of one or more features that require it,
(iv) default for a feature that is selected due to automatic completion of the configuration,
(v) excluded for a feature that conflicts with existing constraints, and
(vi) forbidden for a feature that violates an external constraint independent of the possible configurations specified by the MDD that cannot be resolved if selected.

18. The medium of claim 15, further comprising instructions that, when executed by a processor, cause the processor to:
perform a downward traversal of the MDD from the root node to identify downward-marked nodes that are not excluded by the selection;
perform an upward traversal of the MDD from the truth node to identify upward-marked nodes that are not excluded by the selection; and
generate the availability bitset by identifying the features available for further selection, consistent with the valid configuration and without violating constraints imposed by the current selection, as the nodes that are both downward-marked and upward-marked.

19. The medium of claim 15, further comprising instructions that, when executed by a processor, cause the processor to:
perform a first restricted domain calculation using the feature stale to identify which additional feature selections outside of the families having feature selections are compatible with the current selection;
perform, for each family in which a feature is selected, a second restricted domain calculation to identify which additional features in that family are compatible with the current selection; and
generate the availability bitset by identifying the features available for further selection according to the first and second restricted domain calculations.

20. The medium of claim 15, further comprising:
instructions that, when executed by a processor, cause the processor to identify a feature as excluded by the selection when the feature is not selected or available; and
instructions that, when executed by a processor, cause the processor to identify an included feature as a feature that is unselected but included in a family having exactly one available feature.

* * * * *